US009818693B2

(12) United States Patent
Toyama et al.

(10) Patent No.: US 9,818,693 B2
(45) Date of Patent: Nov. 14, 2017

(54) THROUGH-MEMORY-LEVEL VIA STRUCTURES FOR A THREE-DIMENSIONAL MEMORY DEVICE

(71) Applicant: SANDISK TECHNOLOGIES LLC, Plano, TX (US)

(72) Inventors: Fumiaki Toyama, Cupertino, CA (US); Hiroyuki Ogawa, Yokkaichi (JP); Yoko Furihata, Yokkaichi (JP); James Kai, Santa Clara, CA (US); Yuki Mizutani, San Jose, CA (US); Jixin Yu, Milpitas, CA (US); Jin Liu, Milpitas, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/269,017

(22) Filed: Sep. 19, 2016

(65) Prior Publication Data

US 2017/0179026 A1 Jun. 22, 2017

Related U.S. Application Data

(60) Provisional application No. 62/271,210, filed on Dec. 22, 2015.

(51) Int. Cl.
*H01L 23/528* (2006.01)
*H01L 23/522* (2006.01)
(Continued)

(52) U.S. Cl.
CPC .... *H01L 23/5283* (2013.01); *H01L 21/76816* (2013.01); *H01L 21/76831* (2013.01);
(Continued)

(58) Field of Classification Search
CPC ......... H01L 27/11582; H01L 27/11556; H01L 2924/0002; H01L 27/11575;
(Continued)

(56) References Cited

U.S. PATENT DOCUMENTS 5,915,167 A 6/1999 Leedy
8,394,716 B2 * 3/2013 Hwang ............ H01L 27/11551 257/315
(Continued)

OTHER PUBLICATIONS

International Search Report and Written Opinion of the International Search Authority for International Patent Application No. PCT/US2016/054018, dated Dec. 19, 2016, 15 pages.
(Continued)

*Primary Examiner* — Jonathan Han
(74) *Attorney, Agent, or Firm* — The Marbury Law Group PLLC

(57) ABSTRACT

A three dimensional NAND memory device includes word line driver devices located on or over a substrate, an alternating stack of word lines and insulating layers located over the word line driver devices, a plurality of memory stack structures extending through the alternating stack, each memory stack structure including a memory film and a vertical semiconductor channel, and through-memory-level via structures which electrically couple the word lines in a first memory block to the word line driver devices. The through-memory-level via structures extend through a through-memory-level via region located between a staircase region of the first memory block and a staircase region of another memory block.

20 Claims, 143 Drawing Sheets

(51) Int. Cl.
*H01L 21/768* (2006.01)
*H01L 27/11524* (2017.01)
*H01L 27/11556* (2017.01)
*H01L 27/11529* (2017.01)
*H01L 27/1157* (2017.01)
*H01L 27/11582* (2017.01)
*H01L 27/11573* (2017.01)

(52) U.S. Cl.
CPC .... *H01L 21/76877* (2013.01); *H01L 23/5226* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ........... H01L 27/1157; H01L 27/11573; H01L 27/11578; H01L 27/11565
USPC ......... 257/314, 324, E27.081, 326, E29.309; 438/268
See application file for complete search history.

(56) References Cited

U.S. PATENT DOCUMENTS 9,190,150 B2 11/2015 Sakanushi
9,224,747 B2 12/2015 Mizutani et al.
9,236,392 B1 1/2016 Izumi et al.
9,356,034 B1 5/2016 Yada et al.
9,401,309 B2 7/2016 Izumi et al.
9,449,987 B1 9/2016 Miyata et al.
2011/0092038 A1 4/2011 Choi et al.
2011/0204420 A1 8/2011 Kim et al.
2012/0061744 A1* 3/2012 Hwang ............. H01L 27/11565 257/324
2012/0208347 A1 8/2012 Hwang et al.
2013/0126957 A1* 5/2013 Higashitani ....... H01L 27/11519 257/314
2014/0241026 A1* 8/2014 Tanzawa ................ G11C 5/063 365/72
2015/0236038 A1* 8/2015 Pachamuthu ..... H01L 27/11582 257/326
2016/0276268 A1 9/2016 Yada et al.

OTHER PUBLICATIONS

U.S. Appl. No. 14/739,284, filed Jun. 15, 2015, SanDisk Technologies Inc.
U.S. Appl. No. 14/739,354, filed Jun. 15, 2015, SanDisk Technologies Inc.
U.S. Appl. No. 15/043,761, filed Feb. 15, 2016, SanDisk Technologies Inc.
U.S. Appl. No. 15/046,780, filed Feb. 18, 2016, SanDisk Technologies Inc.
U.S. Appl. No. 15/175,450, filed Jun. 7, 2016, SanDisk Technologies LLC.
U.S. Appl. No. 15/176,674, filed Jun. 8, 2016, SanDisk Technologies LLC.
U.S. Appl. No. 15/269,017, filed Sep. 19, 2016, SanDisk Technologies LLC.
U.S. Appl. No. 15/269,041, filed Sep. 19, 2016, SanDisk Technologies LLC.
U.S. Appl. No. 15/269,112, filed Sep. 19, 2016, SanDisk Technologies LLC.
U.S. Appl. No. 15/269,294, filed Sep. 19, 2016, SanDisk Technologies LLC.
USPTO Office Communication, Non-Final Office Action in a Corresponding U.S. Appl. No. 15/269,041, dated May 15, 2017, 23 pages.
USPTO Office Communication, Non-Final Office Action in a Corresponding U.S. Appl. No. 15/269,946, dated May 16, 2017, 28 pages.

* cited by examiner

THROUGH-MEMORY-LEVEL VIA STRUCTURES FOR A THREE-DIMENSIONAL MEMORY DEVICE

RELATED APPLICATIONS

The present application claims the benefit of priority from U.S. Provisional Application Ser. No. 62/271,210 filed on Dec. 22, 2015, the entire content of which is incorporated herein by reference.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels. As three-dimensional memory devices scale to smaller device dimensions, the device area for peripheral devices can take up a significant portion of the total chip area. Thus, a method of providing various peripheral devices, such as word line driver circuits, without significantly increasing the total chip size is desired. Further, an efficient power distribution network in the array of memory stack structures can increase performance of three-dimensional memory devices. A method of enhancing power distribution without excessively increasing the footprint of a semiconductor chip is also desired.

SUMMARY

According to an aspect of the present disclosure, a three dimensional NAND memory device includes word line driver devices located on or over a substrate, an alternating stack of word lines and insulating layers located over the word line driver devices, a plurality of memory stack structures extending through the alternating stack, each memory stack structure including a memory film and a vertical semiconductor channel, and through-memory-level via structures which electrically couple the word lines in a first memory block to the word line driver devices. The through-memory-level via structures extend through a through-memory-level via region located between a staircase region of the first memory block and a staircase region of another memory block.

According to an aspect of the present disclosure a semiconductor structure is provided, which includes: a memory-level assembly located over a semiconductor substrate and including at least one alternating stack and memory stack structures vertically extending through the at least one alternating stack, wherein the at least one alternating stack includes alternating layers of respective insulating layers and respective electrically conductive layers; a plurality of laterally-elongated contact via structures that vertically extend through the memory-level assembly, laterally extend along a first horizontal direction, and laterally divides the at least one alternating stack into a plurality of laterally spaced-apart blocks, wherein the plurality of blocks comprises a set of three neighboring blocks including, in order, a first block, a second block, and third block arranged along a second horizontal direction that is perpendicular to the first horizontal direction; and a through-memory-level via region located on a lengthwise end of the second block and between a staircase region of the first block and a staircase region of the third block. Each staircase region of the first and third blocks includes terraces in which each underlying electrically conductive layer extends farther along the first horizontal direction than any overlying electrically conductive layer in the memory-level assembly. The through-memory-level via region comprises through-memory-level via structures that vertically extend at least from a first horizontal plane including a topmost surface of the memory-level assembly to a second horizontal plane including a bottommost surface of the memory-level assembly.

According to another aspect of the present disclosure, a method of forming a semiconductor structure is provided. A memory-level assembly is formed over a semiconductor substrate. The memory-level assembly includes at least one alternating stack and memory stack structures vertically extending through the at least one alternating stack. The at least one alternating stack includes alternating layers of respective insulating layers and respective electrically conductive layers, and the at least one alternating stack comprises staircase regions that include terraces in which each underlying electrically conductive layer extends farther along a first horizontal direction than any overlying electrically conductive layer in the memory-level assembly. A plurality of laterally-elongated contact via structures is formed through the memory-level assembly. The plurality of laterally-elongated contact via structures laterally extends along the first horizontal direction and laterally divides the at least one alternating stack into a plurality of laterally spaced-apart blocks. The plurality of blocks comprises a set of three neighboring blocks including, in order, a first block, a second block, and third block arranged along a second horizontal direction that is perpendicular to the first horizontal direction and including a respective first staircase region, a second staircase region, and a third staircase region, respectively. The second staircase region is removed. Through-memory-level via structures are formed in an area of the removed second staircase region while the first and third staircase regions remain intact. Each of the through-memory-level via structures vertically extends at least from a first horizontal plane including a topmost surface of the memory-level assembly to a second horizontal plane including a bottommost surface of the memory-level assembly.

According to yet another aspect of the present disclosure, a three dimensional NAND memory device, comprises word line driver devices located over a substrate, an alternating stack of word lines and insulating layers located over the word line driver devices, a plurality of memory stack structures extending through the alternating stack, each memory stack structure comprising a memory film and a vertical semiconductor channel, and through-memory-level via structures which electrically couple the word lines in a first memory block to the word line driver devices. The through-memory-level via structures extend through a dielectric fill material portion located between a staircase region of the first memory block and a staircase region of another memory block.

According to yet another aspect of the present disclosure, a semiconductor structure is provided, which includes: word line switching devices comprising field effect transistors and located on a semiconductor substrate; and a memory-level assembly overlying the semiconductor substrate and comprising at least one alternating stack and memory stack structures vertically extending through the at least one alternating stack. Each of the at least one alternating stack comprises alternating layers of respective insulating layers and respective electrically conductive layers that comprise word lines for the memory stack structures. A plurality of laterally-elongated contact via structures vertically extends through the memory-level assembly, laterally extends along a first horizontal direction, and laterally divides the memory-level assembly into a plurality of laterally spaced-apart blocks. The plurality of blocks comprises a set of three neighboring blocks including, in order, a first block, a second block, and third block arranged along a second horizontal direction that is perpendicular to the first horizontal direction. A through-memory-level via region is located directly above an area of the word line switching devices on a lengthwise end of the second block and between a staircase region of the first block and a staircase region of the third block, each staircase region of the first and third blocks including terraces in which each underlying electrically conductive layer extends farther along the first horizontal direction than any overlying electrically conductive layer within the memory-level assembly, and the through-memory-level via region comprises through-memory-level via structures, each of which providing an electrically conductive path between a respective word line switching device and a respective word line.

According to still another aspect of the present disclosure, a method of forming a semiconductor structure is provided. Word line switching devices comprising field effect transistors are formed on a semiconductor substrate. A memory-level assembly is formed over a semiconductor substrate, the memory-level assembly including at least one alternating stack and memory stack structures vertically extending through the at least one alternating stack. Each of the at least one an alternating stack includes alternating layers of respective insulating layers and respective electrically conductive layers, and the at least one alternating stack comprises staircase regions that include terraces in which each underlying electrically conductive layer extends farther along a first horizontal direction than any overlying electrically conductive layer in the memory-level assembly. A plurality of laterally-elongated contact via structures is formed through the memory-level assembly. The plurality of laterally-elongated contact via structures laterally extends along the first horizontal direction and laterally divides the at least one alternating stack into a plurality of laterally spaced-apart blocks. The plurality of blocks comprises a set of three neighboring blocks including, in order, a first block including a first staircase region, a second block, and third block arranged along a second horizontal direction that is perpendicular to the first horizontal direction and including a first staircase region, a second staircase region, and a third staircase region, respectively. Nodes of the word line switching devices are electrically connected to portions of the electrically conducive layers in the first and third staircase regions employing through-memory-level via structures formed in an area of the second staircase region.

According to even another aspect of the present disclosure, a semiconductor structure is provided, which includes: a memory-level assembly located over a semiconductor substrate and comprising at least one first alternating stack of electrically conductive layers and first portions of insulating layers, and further comprising memory stack structures vertically extending through the at least one first alternating stack, wherein each of the memory stack structures comprises a memory film and a vertical semiconductor channel, wherein the electrically conductive layers constitute word lines for the memory stack structures; an insulating moat trench structure vertically extending through the memory-level assembly and defining an area of a through-memory-level via region laterally offset from the at least one first alternating stack; at least one second alternating stack located in the through-memory-level via region, wherein the at least one second alternating stack includes alternating layers of dielectric spacer layers and second portions of the insulating layers, and each of the dielectric spacer layers is located at a same level as a respective electrically conductive layer; and through-memory-level via structures located within the through-memory-level via region and vertically extending from a first horizontal plane including a topmost surface of the memory-level assembly and a bottommost surface of the memory-level assembly and comprising a conductive material.

According to further another aspect of the present disclosure, a method of forming a semiconductor structure is provided. At least one alternating stack of insulating layers and dielectric spacer layers is formed over a semiconductor substrate. Memory stack structures are formed through the at least one alternating stack. Each of the memory stack structures comprises a memory film and a vertical semiconductor channel. A moat trench defining an area of a through-memory-level via region is formed through the at least one alternating stack. A portion of the at least one alternating stack is present within the through-memory-level via region. Portions of the dielectric spacer layers outside the through-memory-level via region are replaced with electrically conductive layers while the portion of the at least one alternating stack in the moat trench remains intact. The electrically conductive layers constitute word lines for the memory stack structures. Through-memory-level via structures are formed within the through-memory-level via region. The through-memory-level via structures vertically extend from a first horizontal plane including a topmost surface of a remaining portion of the at least one alternating stack and a bottommost surface of the at least one alternating stack.

According to yet further another aspect of the present disclosure, a semiconductor structure is provided, which includes: a memory-level assembly located over a semiconductor substrate and comprising at least one alternating stack of electrically conductive layers and first portions of insulating layers, and further comprising memory stack structures vertically extending through the at least one alternating stack. Each of the memory stack structures comprises a memory film and a vertical semiconductor channel. The electrically conductive layers constitute word lines for the memory stack structures. A plurality of laterally-elongated contact via structures vertically extends through the memory-level assembly, laterally extends along a first horizontal direction, and laterally divides the at least one alternating stack into a plurality of laterally spaced-apart blocks within the memory-level assembly. At least one through-memory-level via structure is located in a through-memory-level via region in a block, wherein the through-memory-level via region is located between a pair of laterally-elongated contact via structures and between two groups of memory stack structures located in the block, wherein each of the at least one through-memory-level via structure vertically extends through the memory-level assembly.

According to still further another aspect of the present disclosure, a method of forming a semiconductor structure is provided. A memory-level assembly is formed over a semiconductor substrate. The memory-level assembly comprises at least one alternating stack of electrically conductive layers and first portions of insulating layers, and further comprises memory stack structures vertically extending through the at least one alternating stack. Each of the memory stack structures comprises a memory film and a vertical semiconductor channel. A plurality of laterally-elongated contact via structures is formed through the memory-level assembly. The plurality of laterally-elongated contact via structures laterally extends along a first horizontal direction, and laterally divides the at least one alternating stack into a plurality of laterally spaced-apart blocks within the memory-level assembly. At least one through-memory-level via structure is formed in a through-memory-level via region in a block. The through-memory-level via region is provided between a pair of laterally-elongated contact via structures and between two groups of memory stack structures located in the block and including through-memory-level via structures. Each of the at least one through-memory-level via structure vertically extends through the memory-level assembly.

BRIEF DESCRIPTION OF THE DRAWINGS

FIG. 65A is a vertical cross-sectional view of a sixth modification of the fourth exemplary structure after formation of sacrificial memory opening fill portions and sacrificial moat trench fill portions according to the fourth embodiment of the present disclosure.

FIG. 65B is a horizontal cross-sectional view of the sixth modification of the fourth exemplary structure along the horizontal plane B-B' in FIG. 65A. The zig-zag vertical plane A-A' corresponds to the plane of the vertical cross-sectional view of FIG. 65A.

FIG. 66A is a vertical cross-sectional view of the sixth modification of the fourth exemplary structure after formation of memory stack structures and dummy memory stack structures according to the fourth embodiment of the present disclosure.

FIG. 66B is a horizontal cross-sectional view of the sixth modification of the fourth exemplary structure along the horizontal plane B-B' in FIG. 66A. The zig-zag vertical plane A-A' corresponds to the plane of the vertical cross-sectional view of FIG. 66A.

FIG. 67A is a vertical cross-sectional view of the sixth modification of the fourth exemplary structure after formation of backside recesses according to the fourth embodiment of the present disclosure.

FIG. 67B is a horizontal cross-sectional view of the sixth modification of the fourth exemplary structure along the horizontal plane B-B' in FIG. 67A. The zig-zag vertical plane A-A' corresponds to the plane of the vertical cross-sectional view of FIG. 67A.

FIG. 68A is a vertical cross-sectional view of the sixth modification of the fourth exemplary structure after formation of electrically conductive layers and laterally-elongated contact via structures according to the fourth embodiment of the present disclosure.

FIG. 68B is a horizontal cross-sectional view of the sixth modification of the fourth exemplary structure along the horizontal plane B-B' in FIG. 68A. The zig-zag vertical plane A-A' corresponds to the plane of the vertical cross-sectional view of FIG. 68A.

FIG. 69A is a vertical cross-sectional view of the sixth modification of the fourth exemplary structure after formation of through-memory-level via structures and upper level metal interconnect structures according to the fourth embodiment of the present disclosure.

FIG. 69B is a horizontal cross-sectional view of the sixth modification of the fourth exemplary structure along the horizontal plane B-B' in FIG. 69A. The zig-zag vertical plane A-A' corresponds to the plane of the vertical cross-sectional view of FIG. 69A.

FIG. 70A is a vertical cross-sectional view of a seventh modification of the fourth exemplary structure after formation of memory stack structures and a contact level dielectric layer according to the fourth embodiment of the present disclosure.

FIG. 70B is a horizontal cross-sectional view of the seventh modification of the fourth exemplary structure along the horizontal plane B-B' in FIG. 70A. The zig-zag vertical plane A-A' corresponds to the plane of the vertical cross-sectional view of FIG. 70A.

Figure 71A:
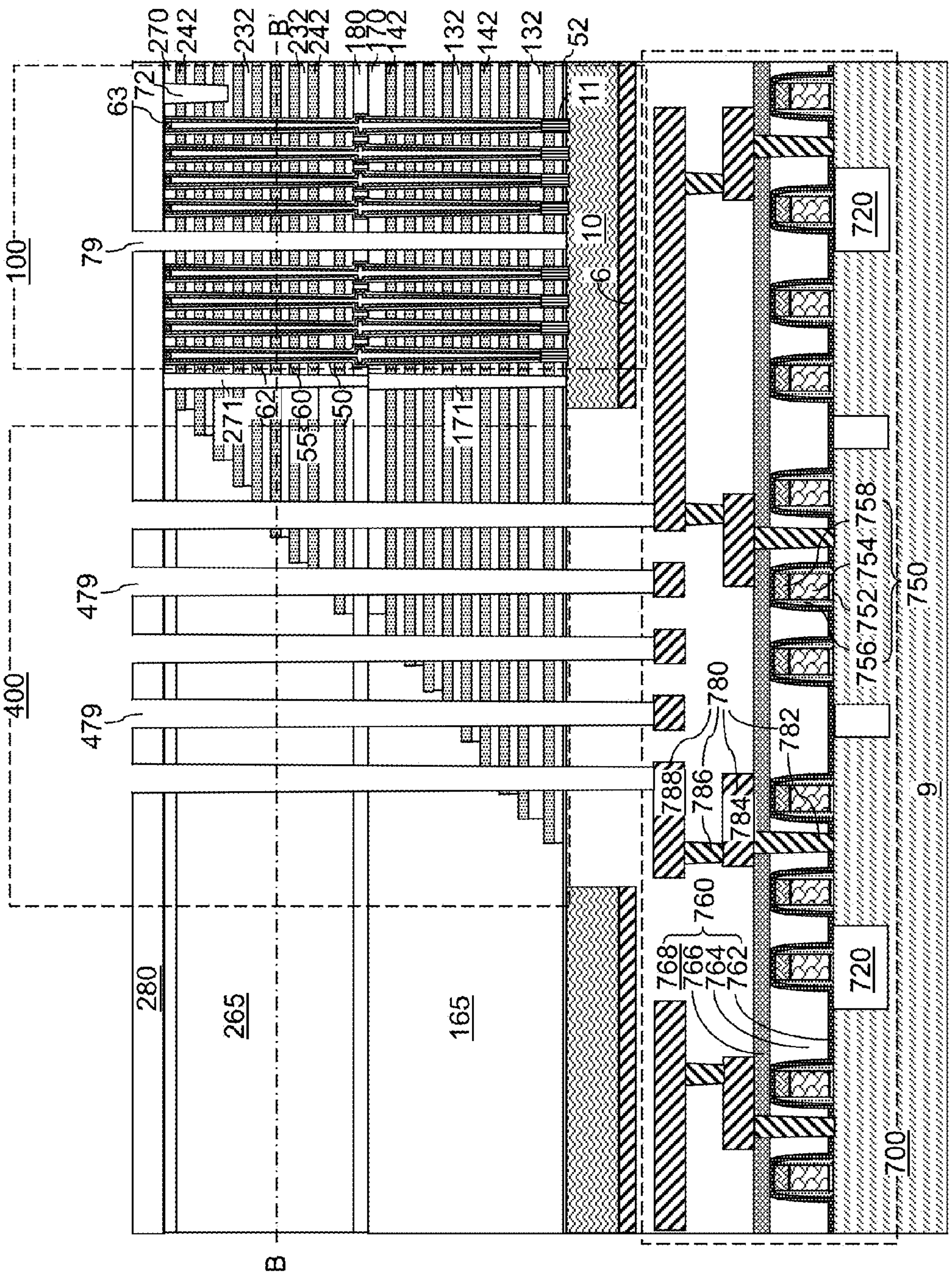

FIG. 71A is a vertical cross-sectional view of the seventh modification of the fourth exemplary structure after concurrent formation of backside contact trenches and through-memory-level via cavities according to the fourth embodiment of the present disclosure.

Figure 71B:
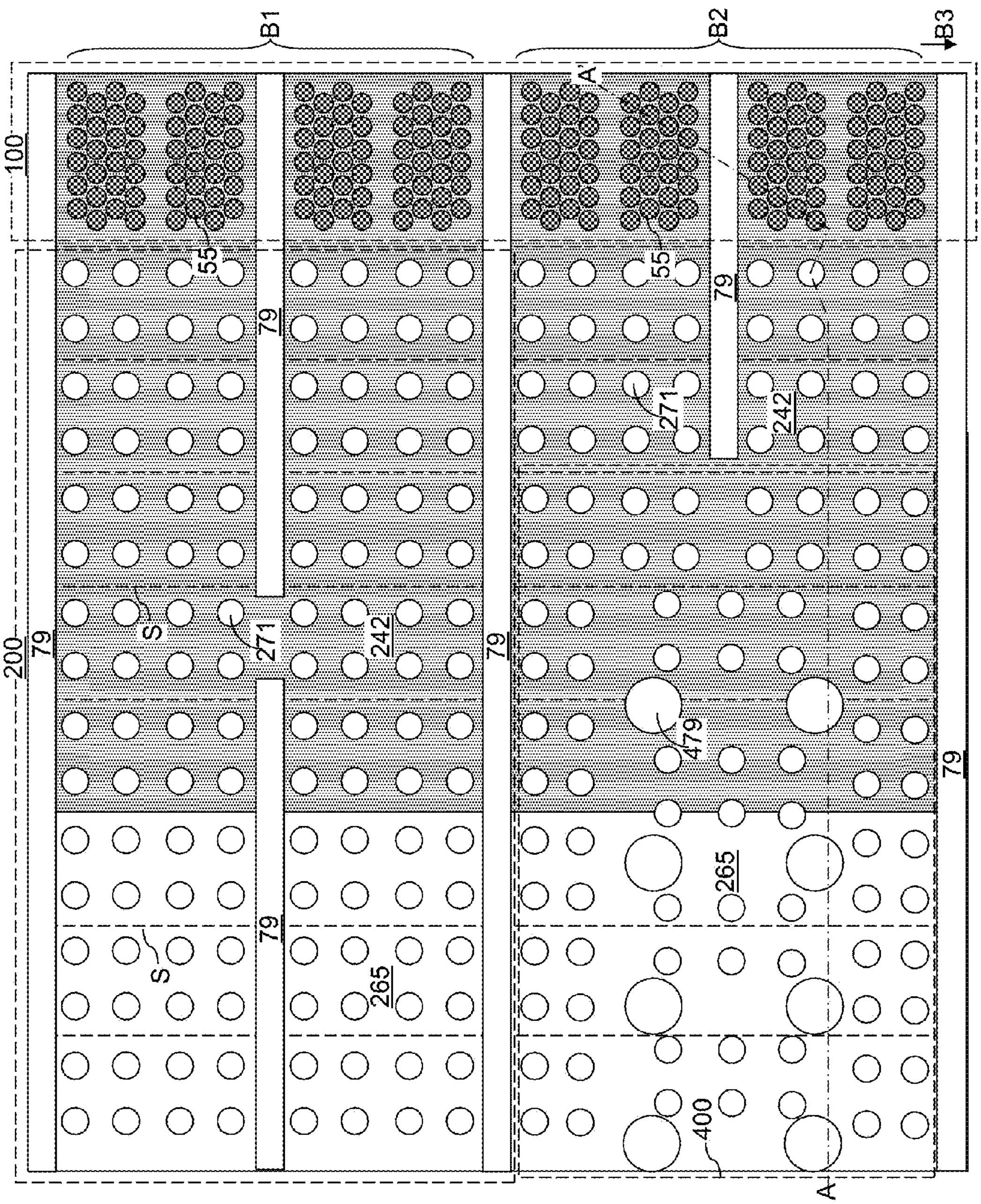

FIG. 71B is a horizontal cross-sectional view of the seventh modification of the fourth exemplary structure along the horizontal plane B-B' in FIG. 71A. The zig-zag vertical plane A-A' corresponds to the plane of the vertical cross-sectional view of FIG. 71A.

Figure 72A:
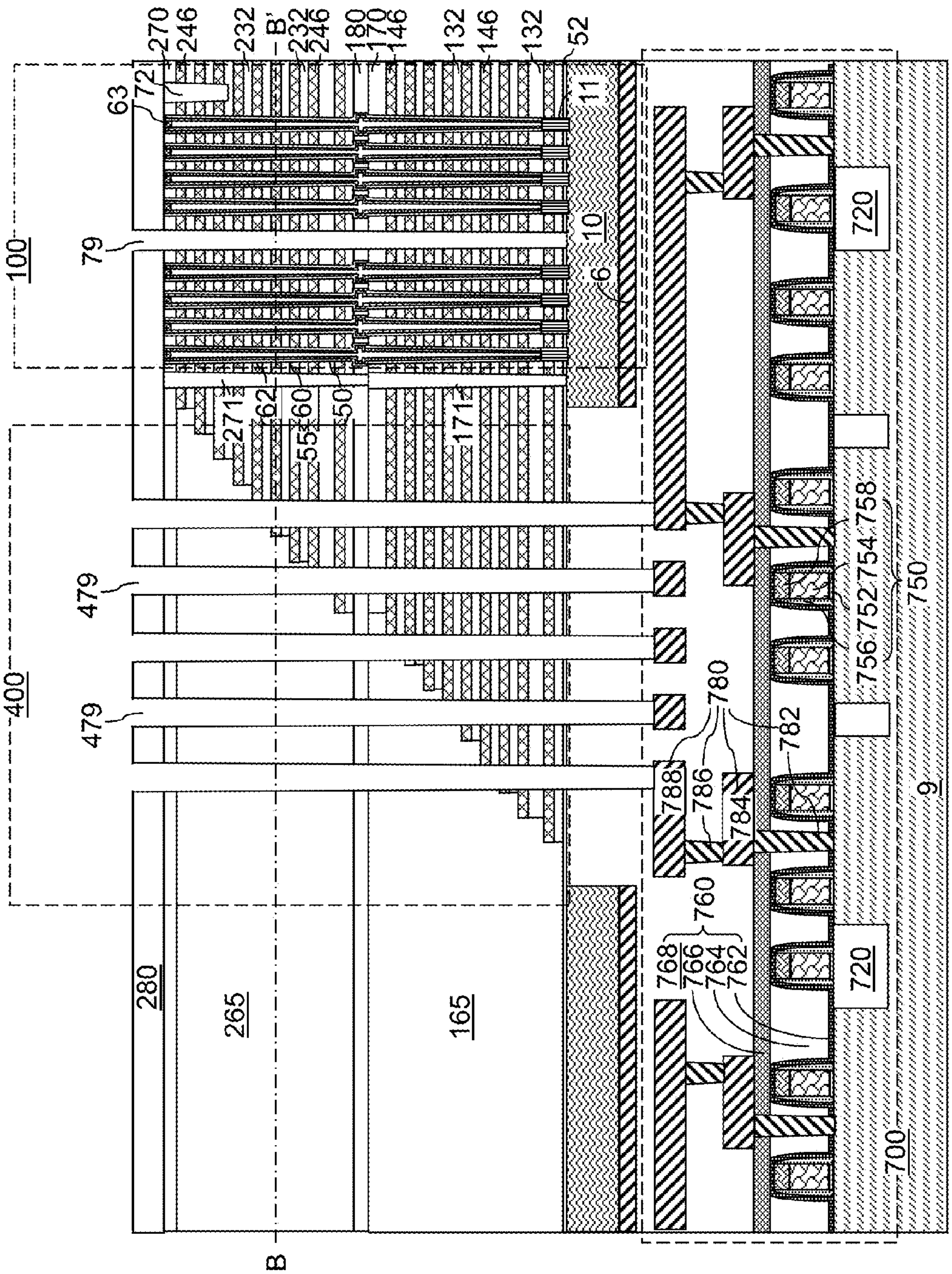

FIG. 72A is a vertical cross-sectional view of the seventh modification of the fourth exemplary structure after replacement of the sacrificial material layers with electrically conductive layers according to the fourth embodiment of the present disclosure.

Figure 72B:
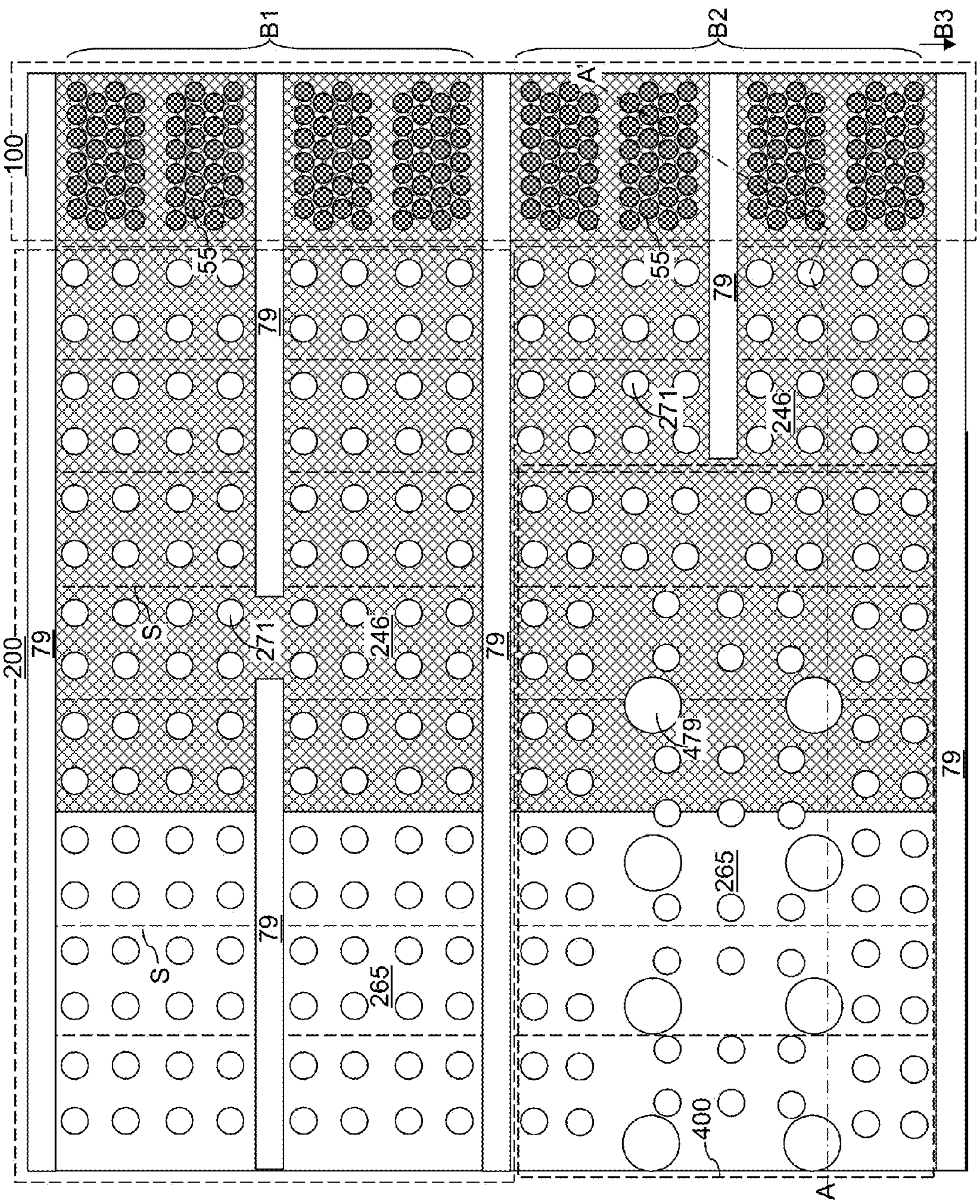

FIG. 72B is a horizontal cross-sectional view of the seventh modification of the fourth exemplary structure along the horizontal plane B-B' in FIG. 72A. The zig-zag vertical plane A-A' corresponds to the plane of the vertical cross-sectional view of FIG. 72A.

Figure 73A:
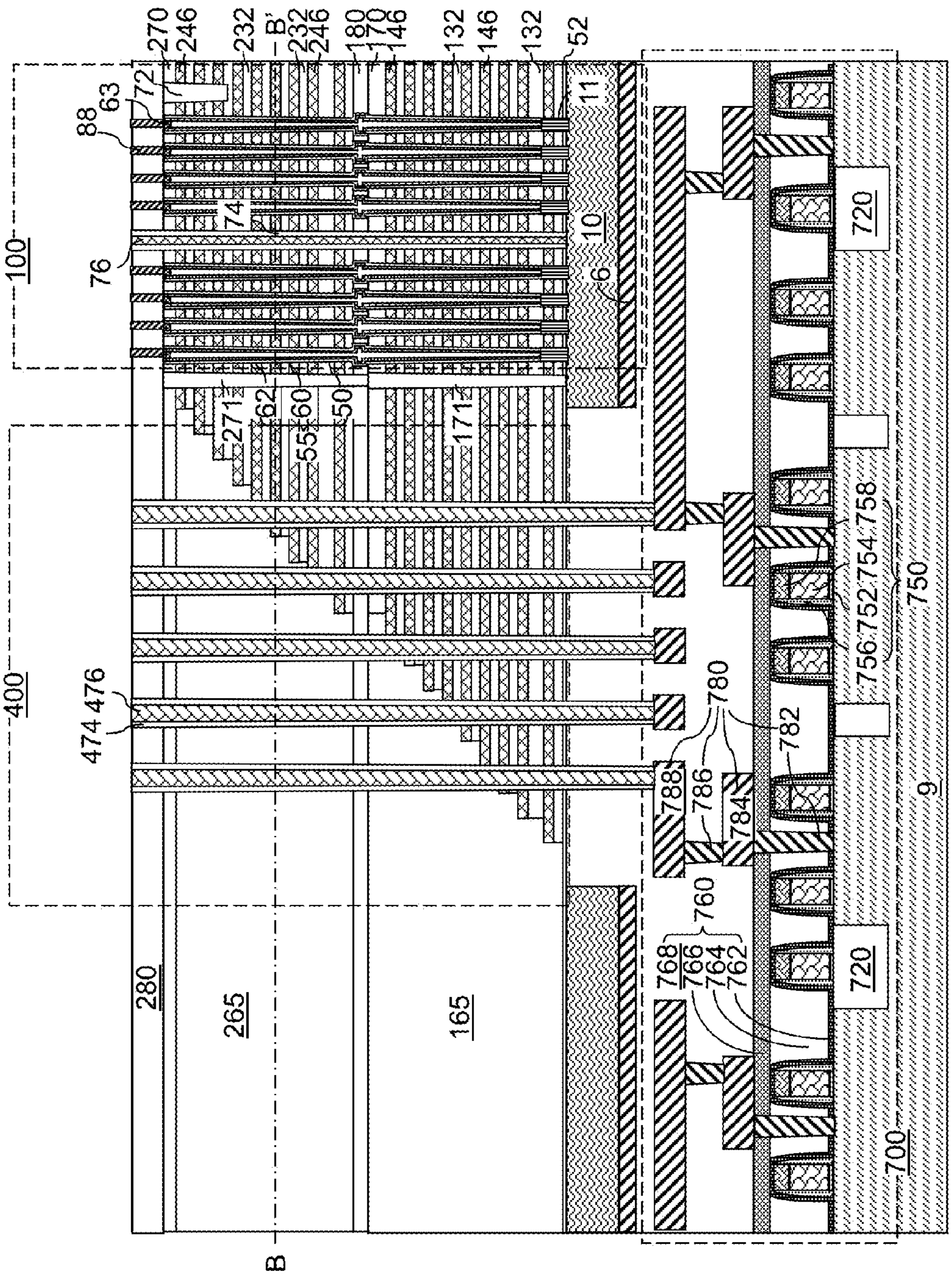

FIG. 73A is a vertical cross-sectional view of the seventh modification of the fourth exemplary structure after formation of laterally-extending contact via structures and through-memory-stack via structures according to the fourth embodiment of the present disclosure.

Figure 73B:
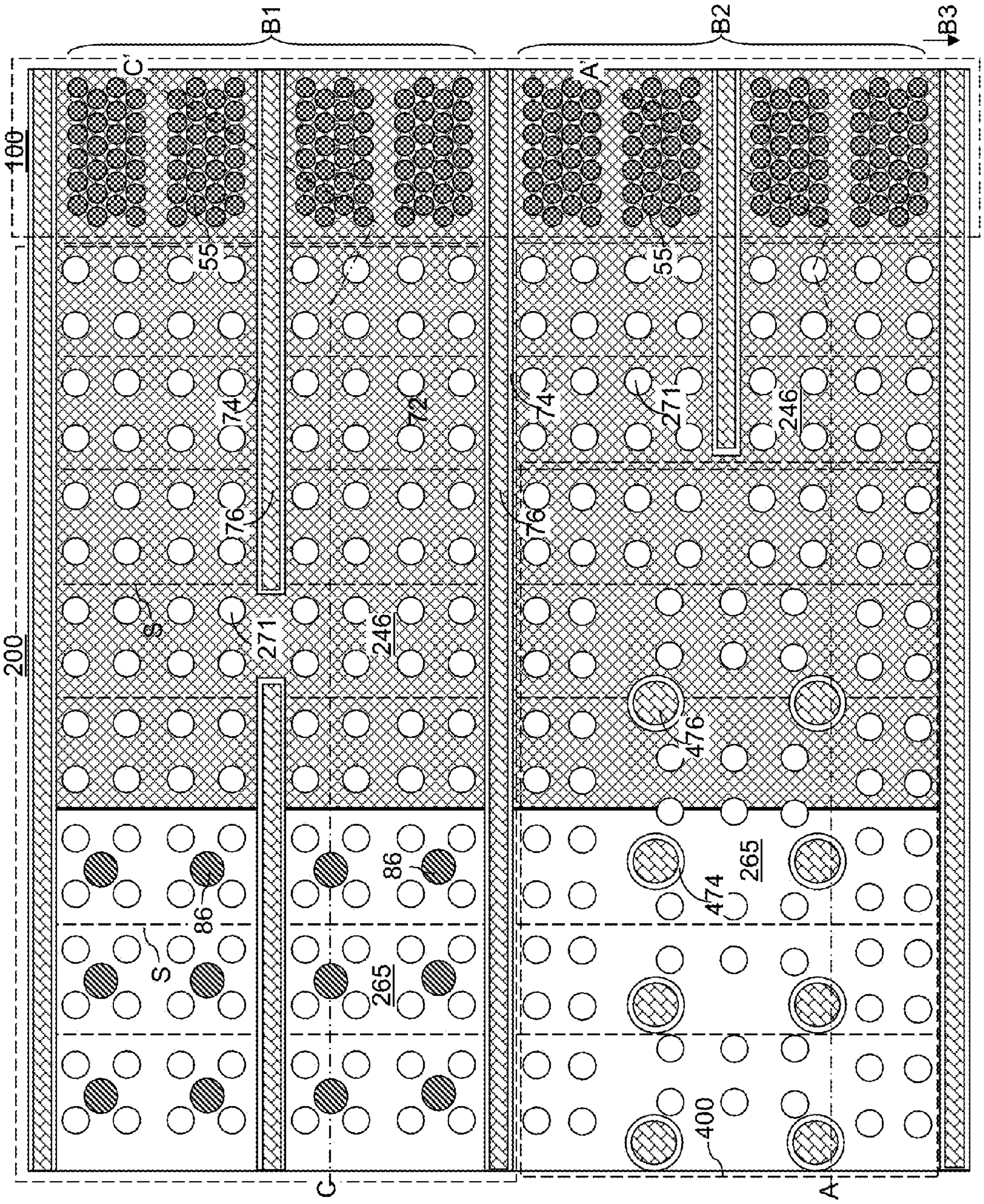

FIG. 73B is a horizontal cross-sectional view of the seventh modification of the fourth exemplary structure along the horizontal plane B-B' in FIG. 73A. The zig-zag vertical plane A-A' corresponds to the plane of the vertical cross-sectional view of FIG. 73A.

Figure 73C:
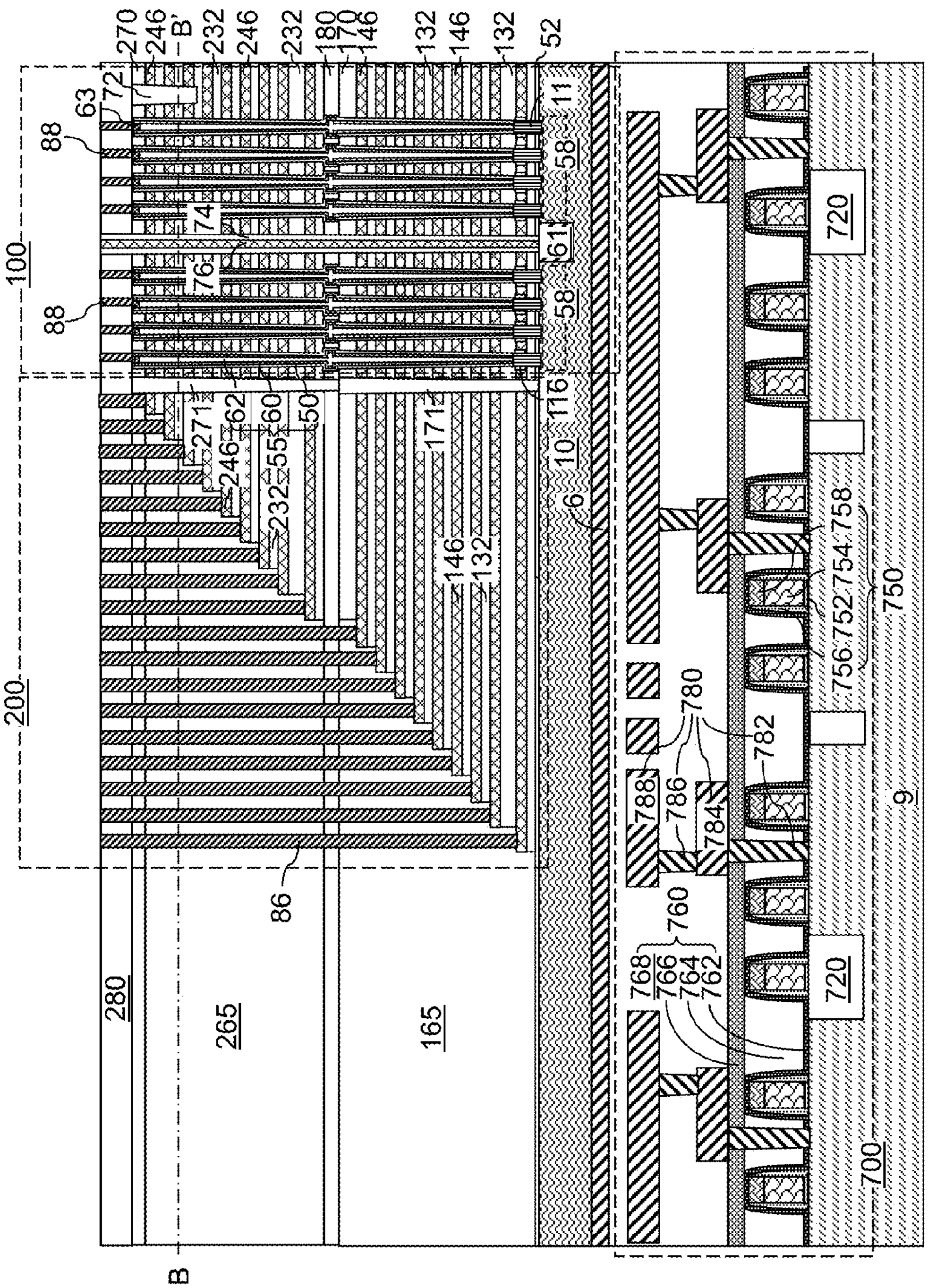

FIG. 73C is a vertical cross-sectional view of the seventh modification of the fourth exemplary structure along the zig-zag vertical plane C-C' in FIG. 73B according to the fourth embodiment of the present disclosure.

Figure 74:
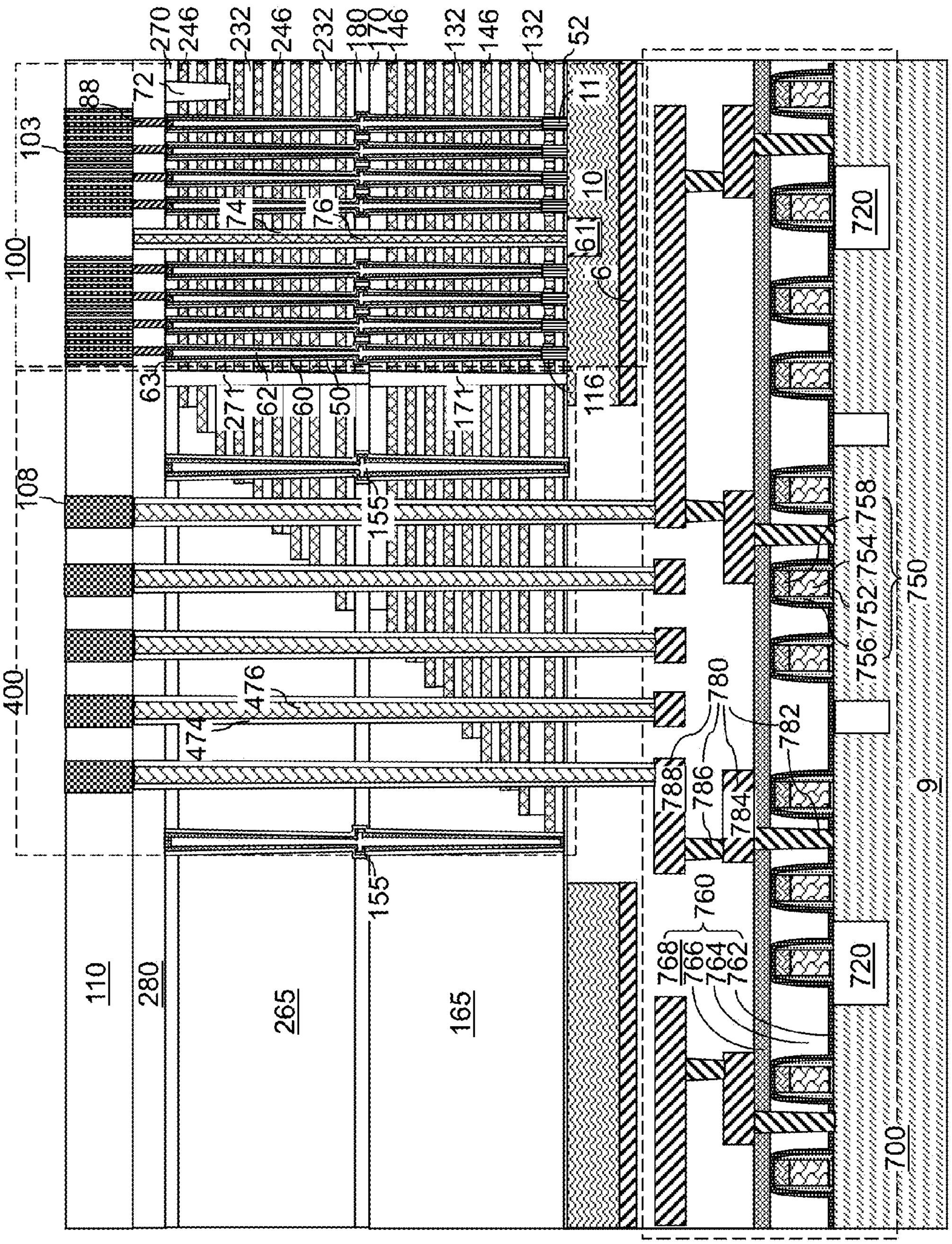

FIG. 74 is a vertical cross-sectional view of the seventh modification of the fourth exemplary structure after formation of upper metal interconnect structures according to the fourth embodiment of the present disclosure.

Figure 75A:
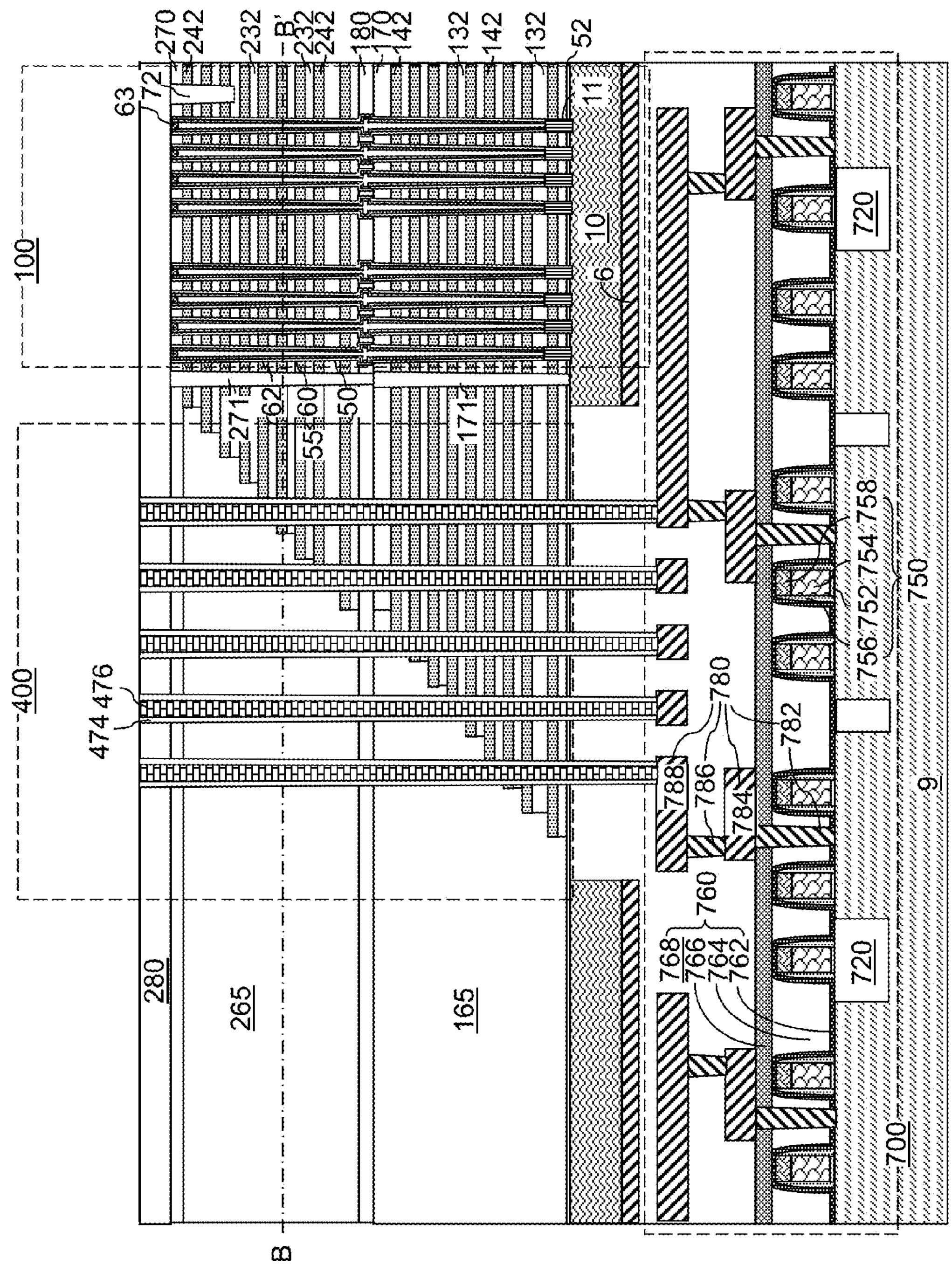

FIG. 75A is a vertical cross-sectional view of an eighth modification of the fourth exemplary structure after formation of through-memory-stack via structures according to the fourth embodiment of the present disclosure.

Figure 75B:
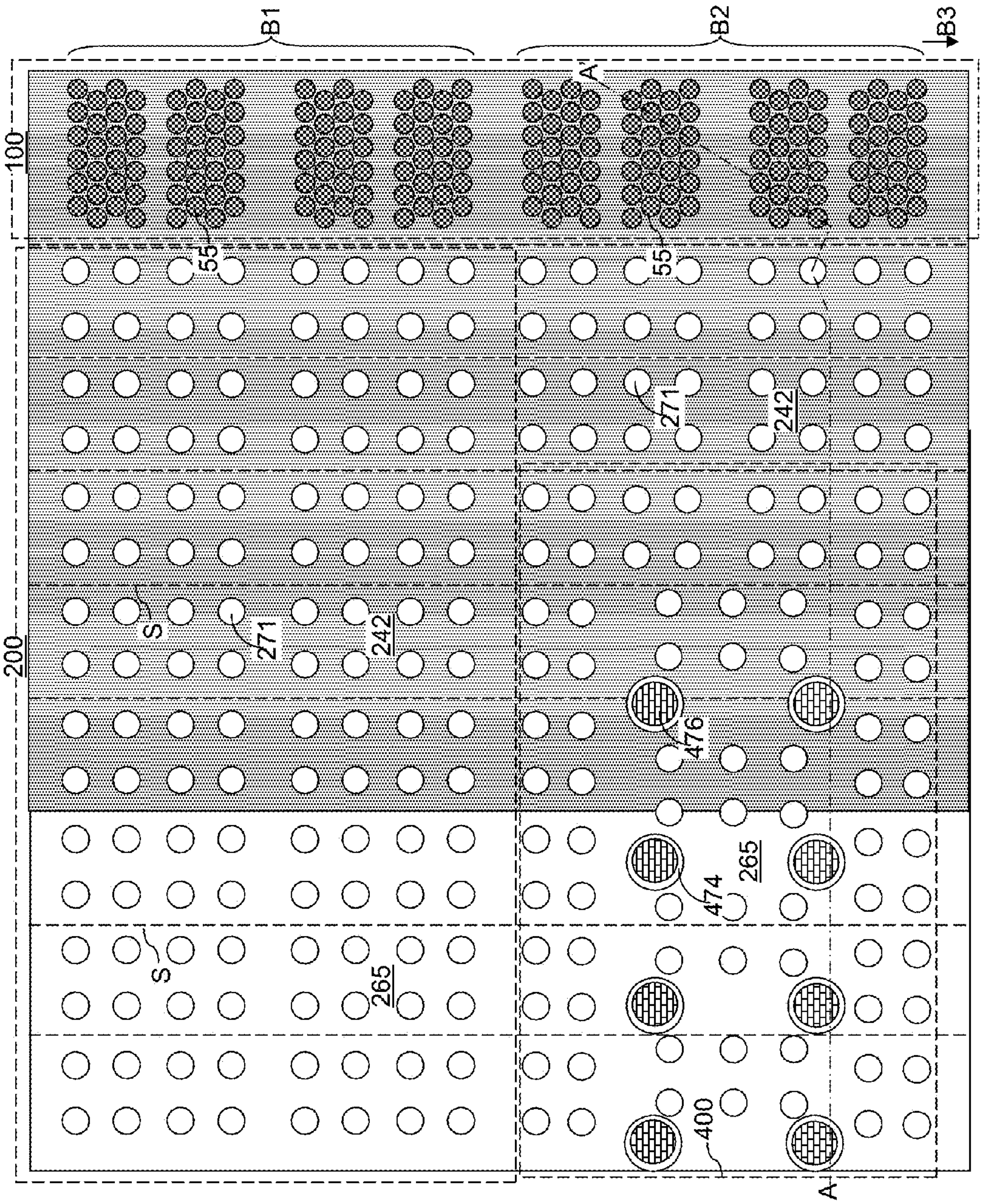

FIG. 75B is a horizontal cross-sectional view of the eighth modification of the fourth exemplary structure along the horizontal plane B-B' in FIG. 75A. The zig-zag vertical plane A-A' corresponds to the plane of the vertical cross-sectional view of FIG. 75A.

Figure 76:
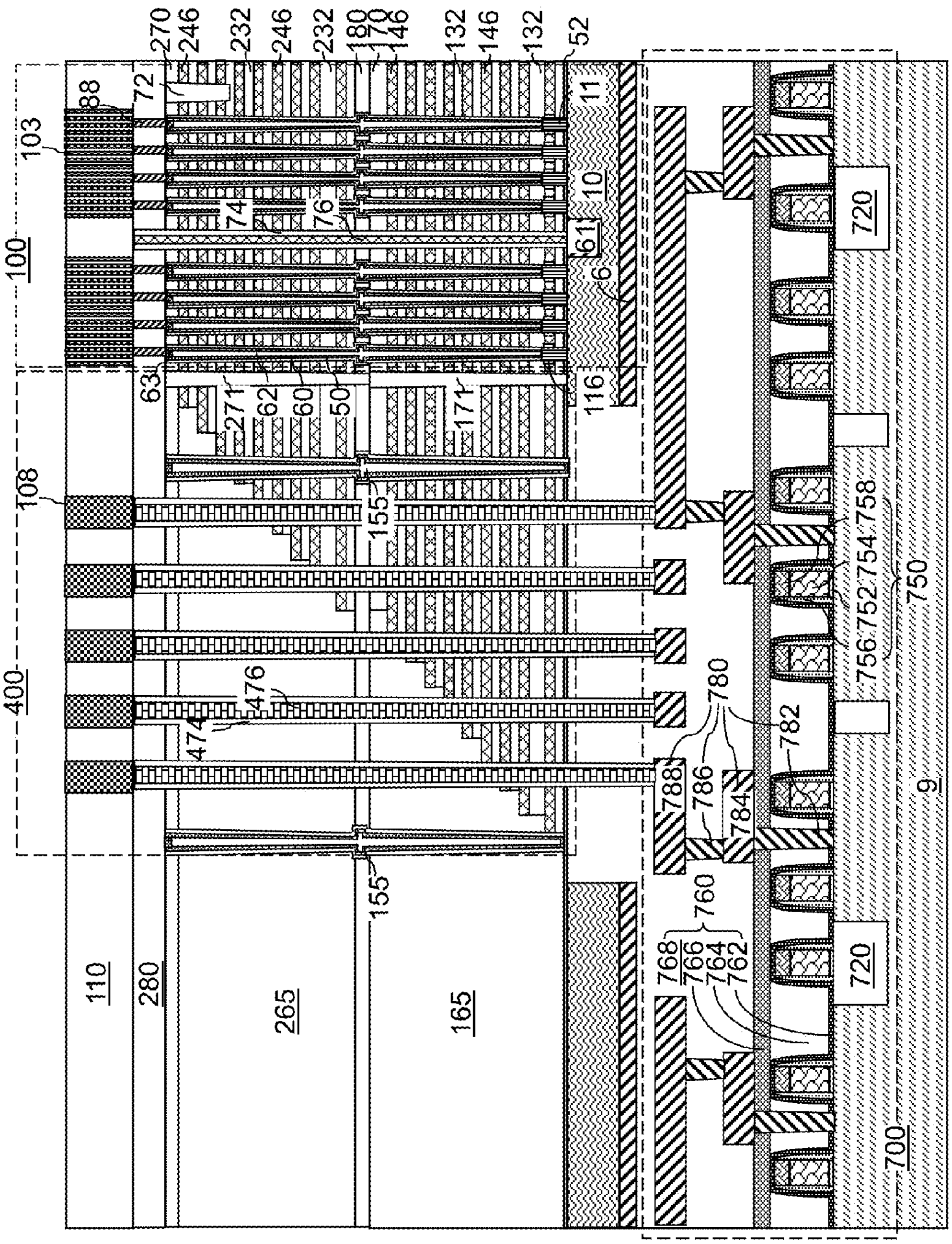

FIG. 76 is a vertical cross-sectional view of the eighth modification of the fourth exemplary structure after formation of upper metal interconnect structures according to the fourth embodiment of the present disclosure.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconductor material" refers to a material having electrical conductivity in the range from $1.0\times10^{-6}$ S/cm to $1.0\times10^{5}$ S/cm, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1A:
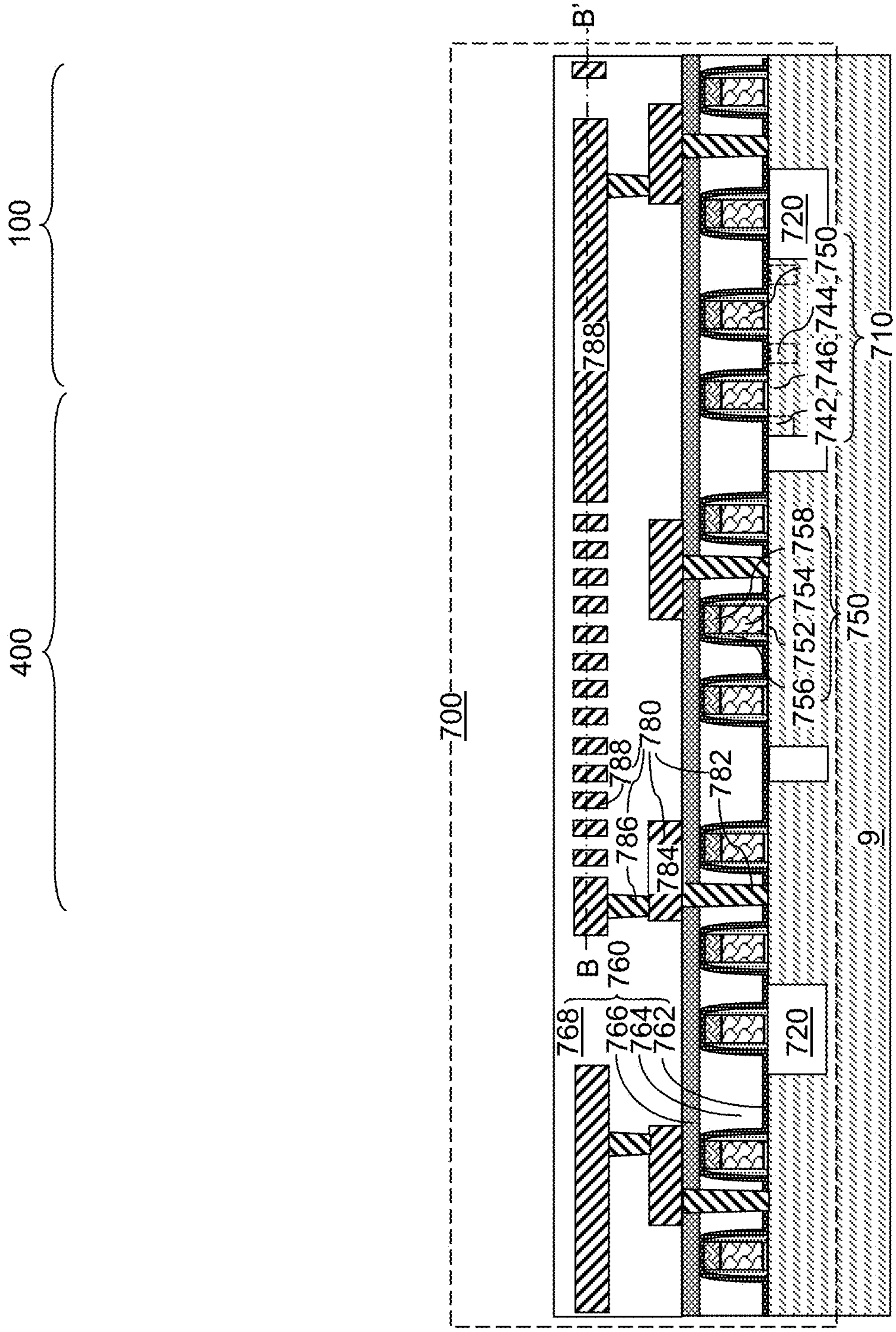
FIG. 1A is a vertical cross-sectional view of a first exemplary structure after formation of semiconductor devices, at least one lower level dielectric layer, and lower level metal interconnect structures on a semiconductor substrate according to a first embodiment of the present disclosure.
Figure 1B:
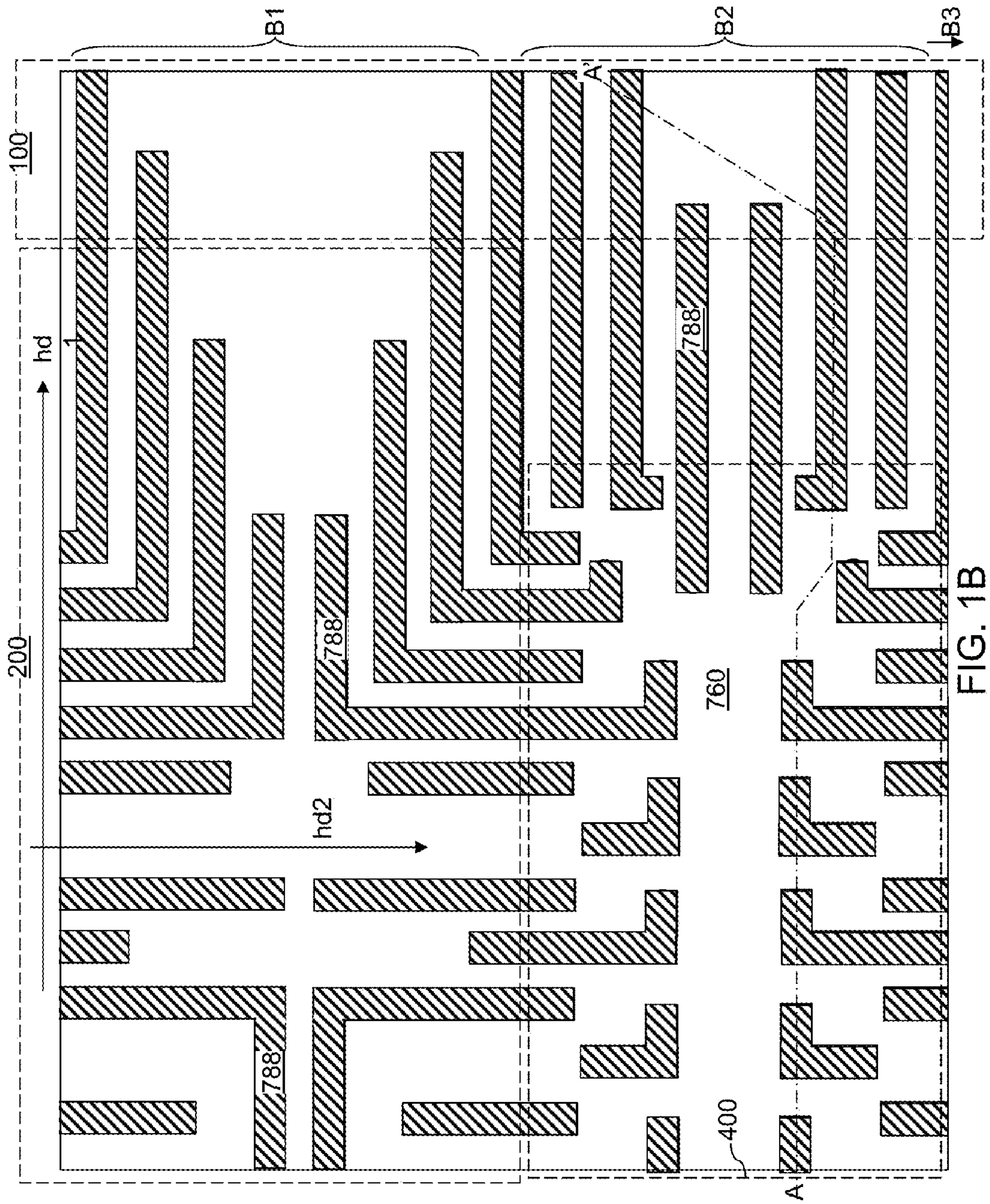
FIG. 1B is a horizontal cross-sectional view of the first exemplary structure of FIG. 1A along the horizontal plane B-B' in FIG. 1A. The zig-zag vertical plane A-A' corresponds to the plane of the vertical cross-sectional view of FIG. 1A.

Referring to FIGS. 1A and 1B, a first exemplary structure according to a first embodiment of the present disclosure is illustrated. The first exemplary structure includes a semiconductor substrate 9, and semiconductor devices 710 formed thereupon. Shallow trench isolation structures 720 can be formed in an upper portion of the semiconductor substrate 9 to provide electrical isolation among the semiconductor devices. The semiconductor devices 710 can include, for example, field effect transistors including respective source regions 742, drain regions 744, channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, an optional dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level metal interconnect structures 780 can be electrically shorted to nodes (e.g., source 742, drain 744 or gate electrodes 750) of the semiconductor devices 710 (e.g., CMOS devices), and are located at the level of the at least one lower level dielectric layer 760. The through-memory-level via structures (not shown in FIGS. 1A and 1B) can be subsequently formed directly on the lower level metal interconnect structures 780. In one embodiment, the pattern of the lower level metal interconnect structures 780 can be selected such that the lower level topmost metal structures 788, which are a subset of the lower level metal interconnect structures 780 located at the topmost portion of the lower level metal interconnect structures 780, can provide landing pad structures within a through-memory-level via region 400. The through-memory-level via region 400 is a region in which through-memory-level via structures that extend vertically through a memory-level assembly are subsequently formed.

The through-memory-level via region 400 can be located adjacent to a memory array region 100 in which an array of memory devices are subsequently formed, as shown in FIG. 1B. A word line contact via region 200 can be located adjacent to the through-memory-level via region 400 and the memory array region 100. In one embodiment, the through-memory-level via region 400 and the word line contact via region 200 can be located at a peripheral edge of the memory array region 100 that is perpendicular to a first horizontal direction h1 (e.g., word line direction) and runs parallel to a second horizontal direction hd2 (e.g., bit line direction). In one embodiment, the area of the first exemplary structure can be divided into multiple blocks (B1, B2, B3, . . . ) that are laterally separated along the second horizontal direction hd2 and can be one-to-one mapped with positive integers, i.e., can be indexed with positive integers. The same word line in a given device level may be used as a control gate electrode for each memory cell in the same device level in each respective memory block.

Multiple instances of the through-memory-level via region 400 and the word line contact via region 200 can alternate along the second horizontal direction hd2. In an illustrative example, each instance of the through-memory-level via region 400 can be located within an area of a respective even numbered block (such as B2, B4, etc.), and each instance of the word line contact via region 200 can be located within an area of a respective odd numbered block (such as B1, B3, etc.). A neighboring pair of an odd-numbered block and an even-numbered block (such as B1 and B2) can be periodically repeated along the second horizontal direction.

While a particular pattern for the lower level topmost metal structures 788 is illustrated herein, it is understood that the pattern for the lower level topmost metal structures 788 may be altered to optimize wiring in the underlying peripheral device region 700 as long as the lower level topmost metal structures 788 provide suitable landing pad areas for the through-memory-level via structures to be subsequently formed.

Figure 2:
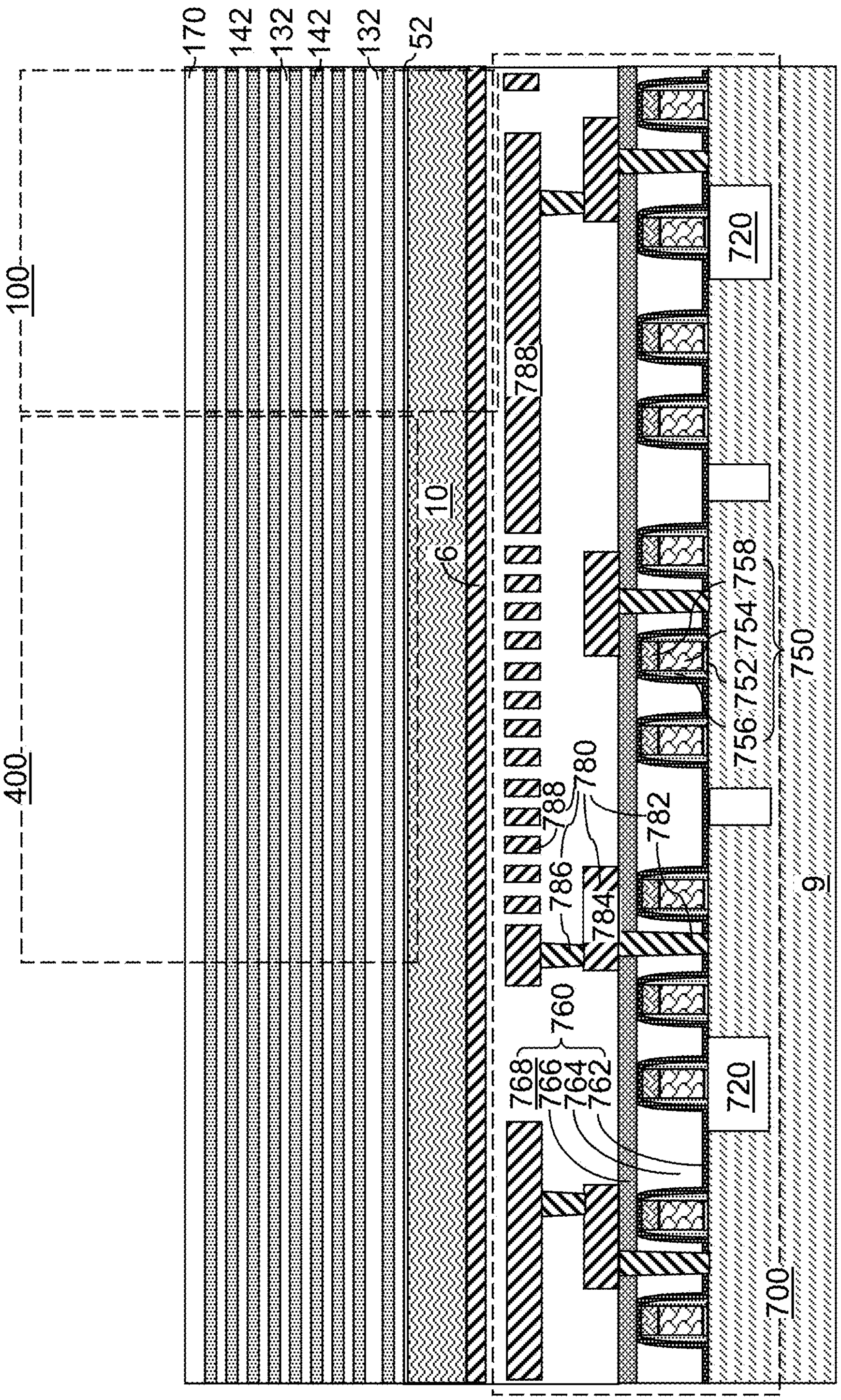
FIG. 2 is a vertical cross-sectional view of the first exemplary structure after formation of a planar semiconductor material layer and a first-tier alternating stack of first insulting layers and first spacer material layers according to the first embodiment of the present disclosure.

Referring to FIG. 2, an optional planar conductive material layer 6 and a planar semiconductor material layer 10 can be formed over the underlying peripheral device region 700. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 9 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type. A dielectric pad layer 52 can be formed on the top surface of the planar semiconductor material layer 10.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
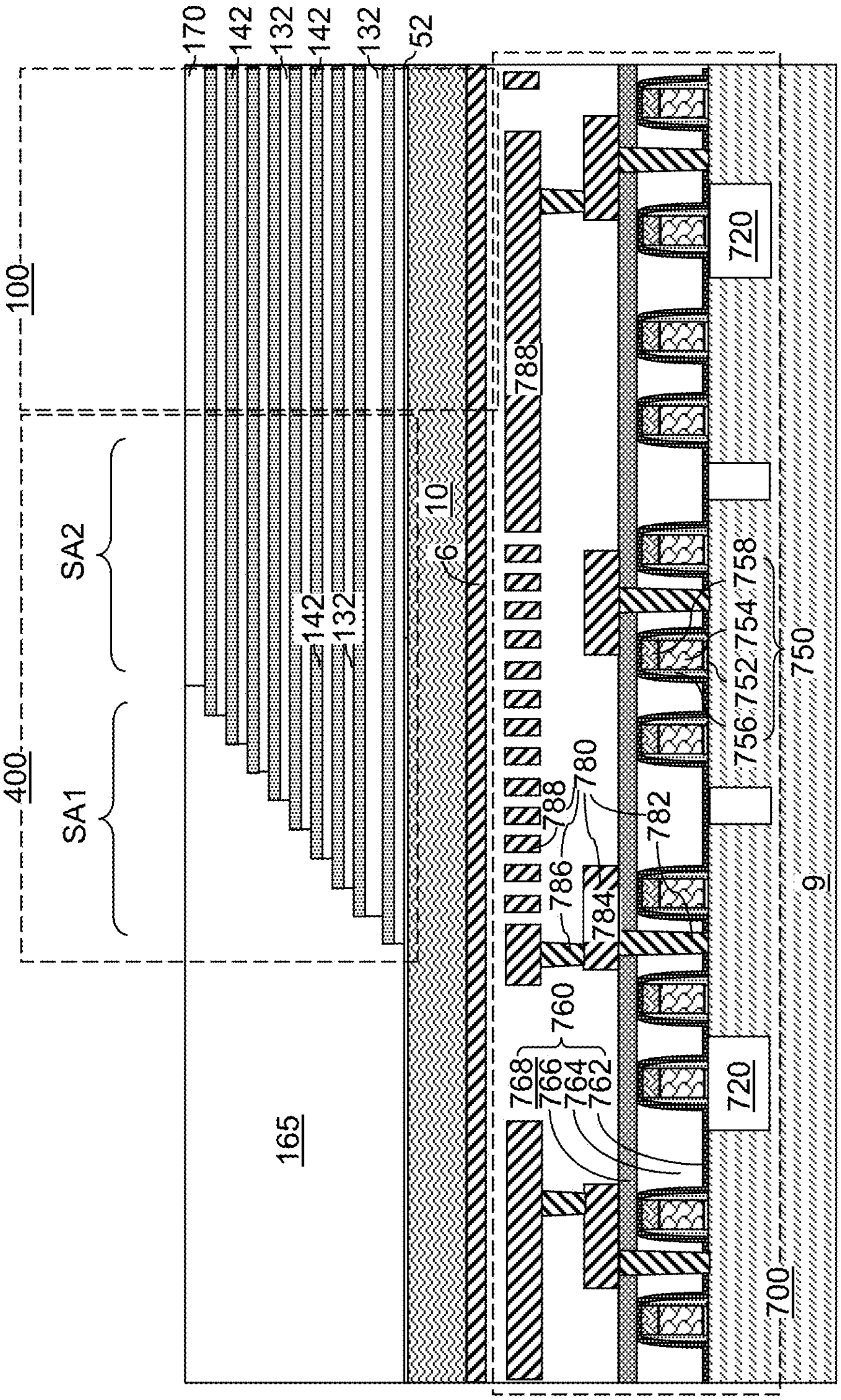
FIG. 3 is a vertical cross-sectional view of the first exemplary structure after patterning first-tier staircase regions on the first-tier alternating stack and forming a first-tier retro-stepped dielectric material portion according to the first embodiment of the present disclosure.

Referring to FIG. 3, the first insulating cap layer 170 and the first-tier alternating stack (132, 142) can be patterned to form first stepped surfaces in each through-memory-level via region 400 and each word line contact via region 200. Each of the through-memory-level via regions 400 and the word line contact via regions 200 can include a respective first stepped area SA1 in which the first stepped surfaces are formed, and a second stepped area SA2 in which additional stepped surfaces are to be subsequently formed in a second tier structure (to be subsequently formed over a first tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first tier structure, which is an in-process structure that is subsequently modified.

Figure 4A:
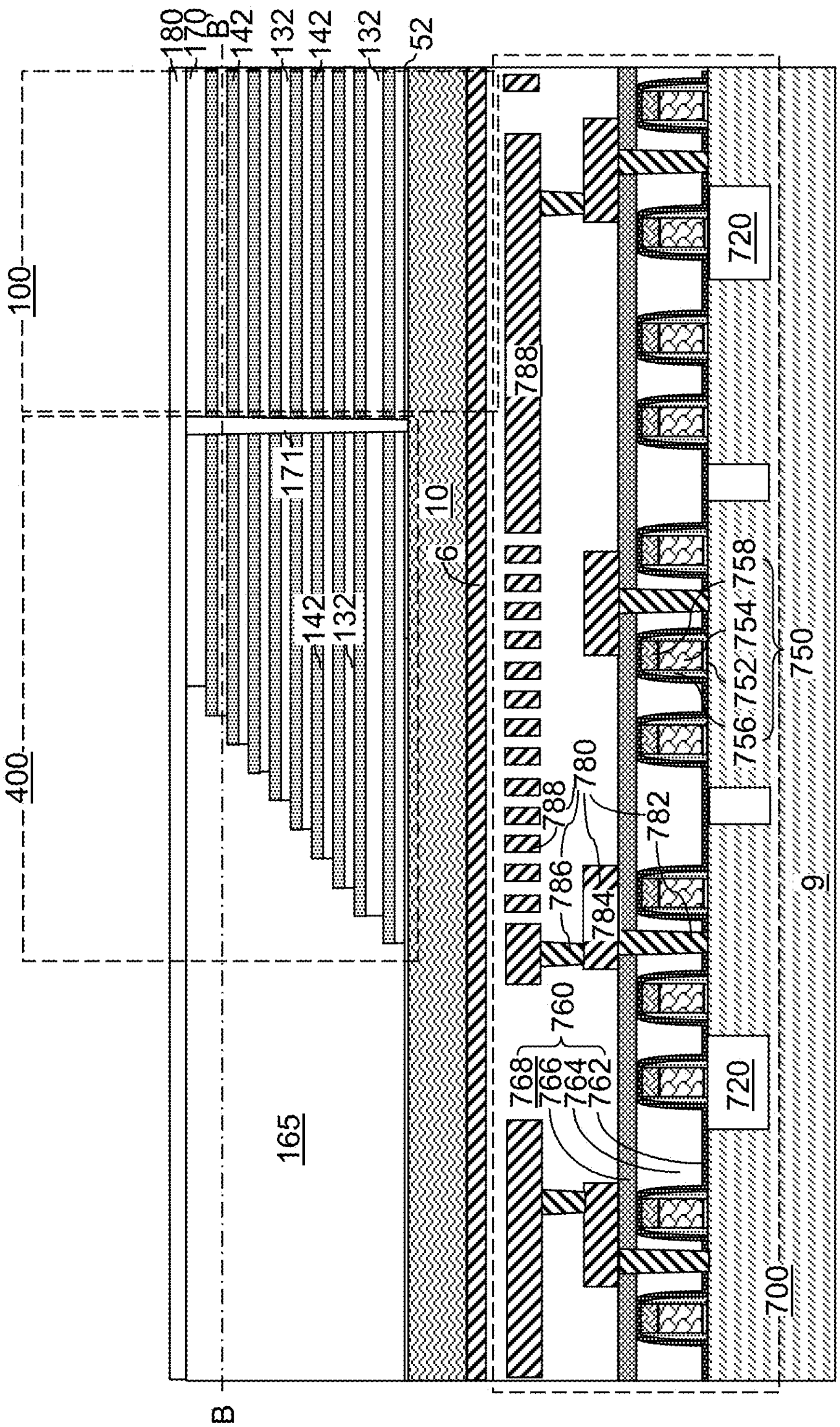
FIG. 4A is a vertical cross-sectional view of the first exemplary structure after formation of first-tier support pillar structures and an inter-tier dielectric layer according to the first embodiment of the present disclosure.
Figure 4B:
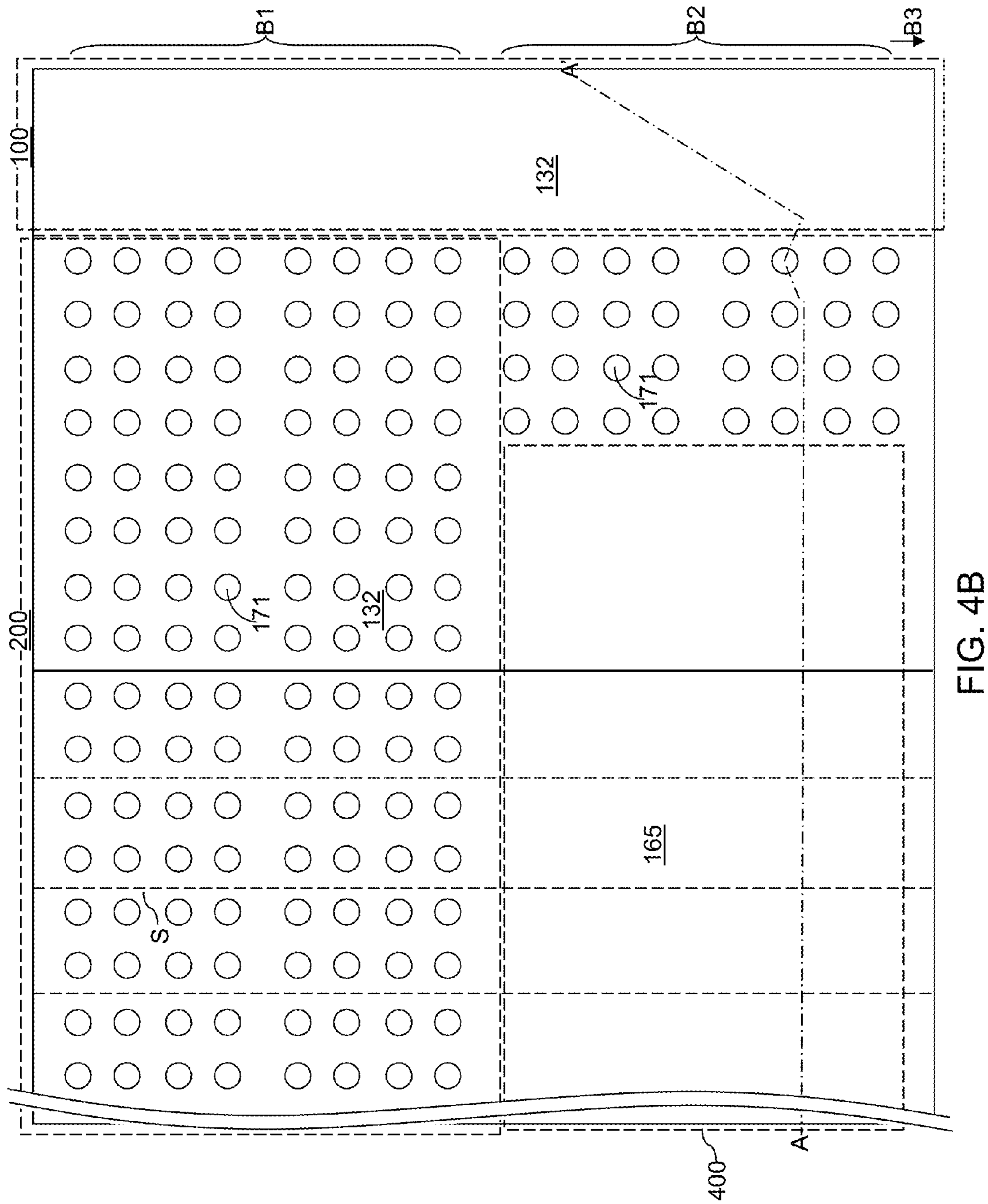
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, first-tier support pillar structures 171 can be formed in portions of the first-tier alternating stack (132, 142) in which memory stack structures are not formed at a sufficiently high density in subsequent processing steps. For example, the first-tier support pillar structures 171 can be formed in the through-memory-level via regions 400 and the word line contact via regions 200. The first-tier support pillar structures 171 can be formed, for example, by forming via cavities through the first-tier alternating stack (132, 142) and by filling the via cavities with a dielectric material such as silicon oxide and/or a dielectric metal oxide (such as aluminum oxide). Locations of steps S in the first-tier alternating stack (132, 142) are illustrated in FIG. 4B as dotted lines.

Optionally, an inter-tier dielectric layer 180 may be deposited over the first tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed.

Figure 5A:
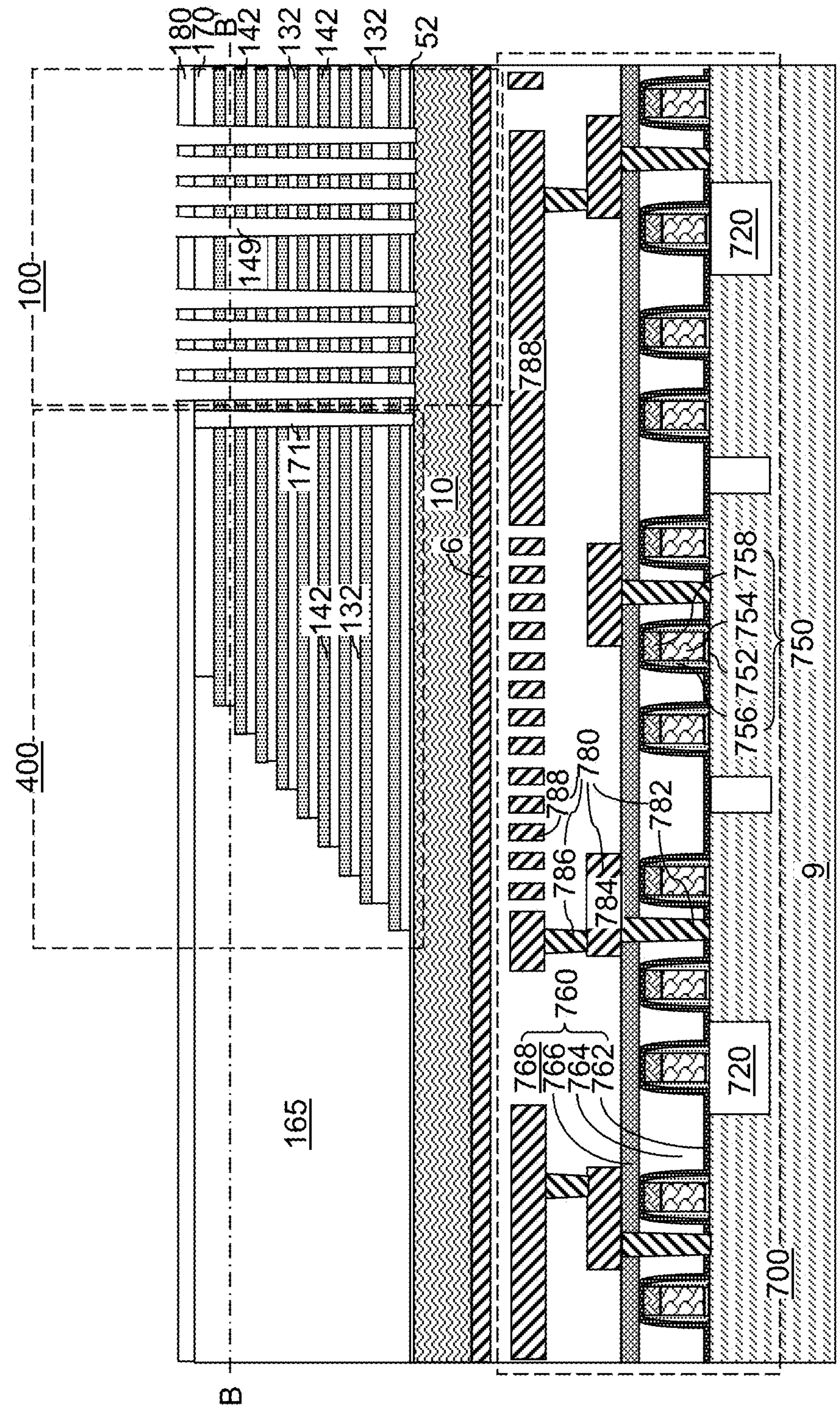
FIG. 5A is a vertical cross-sectional view of the first exemplary structure after formation of first-tier memory openings according to the first embodiment of the present disclosure.
Figure 5B:
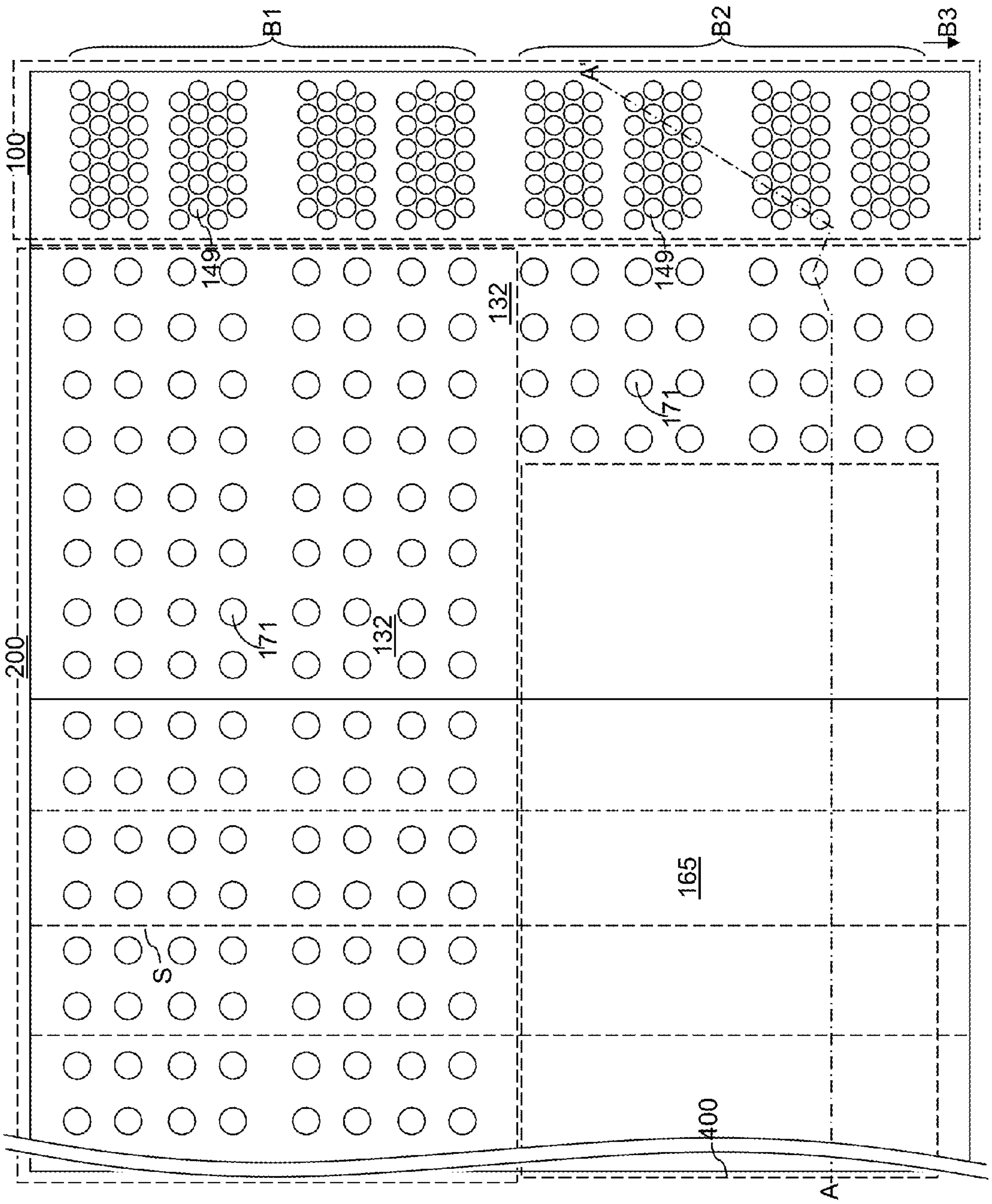
FIG. 5B is a horizontal cross-sectional view of the first exemplary structure along the horizontal plane B-B' in FIG. 5A. The zig-zag vertical plane A-A' corresponds to the plane of the vertical cross-sectional view of FIG. 5A.
Figure 6:
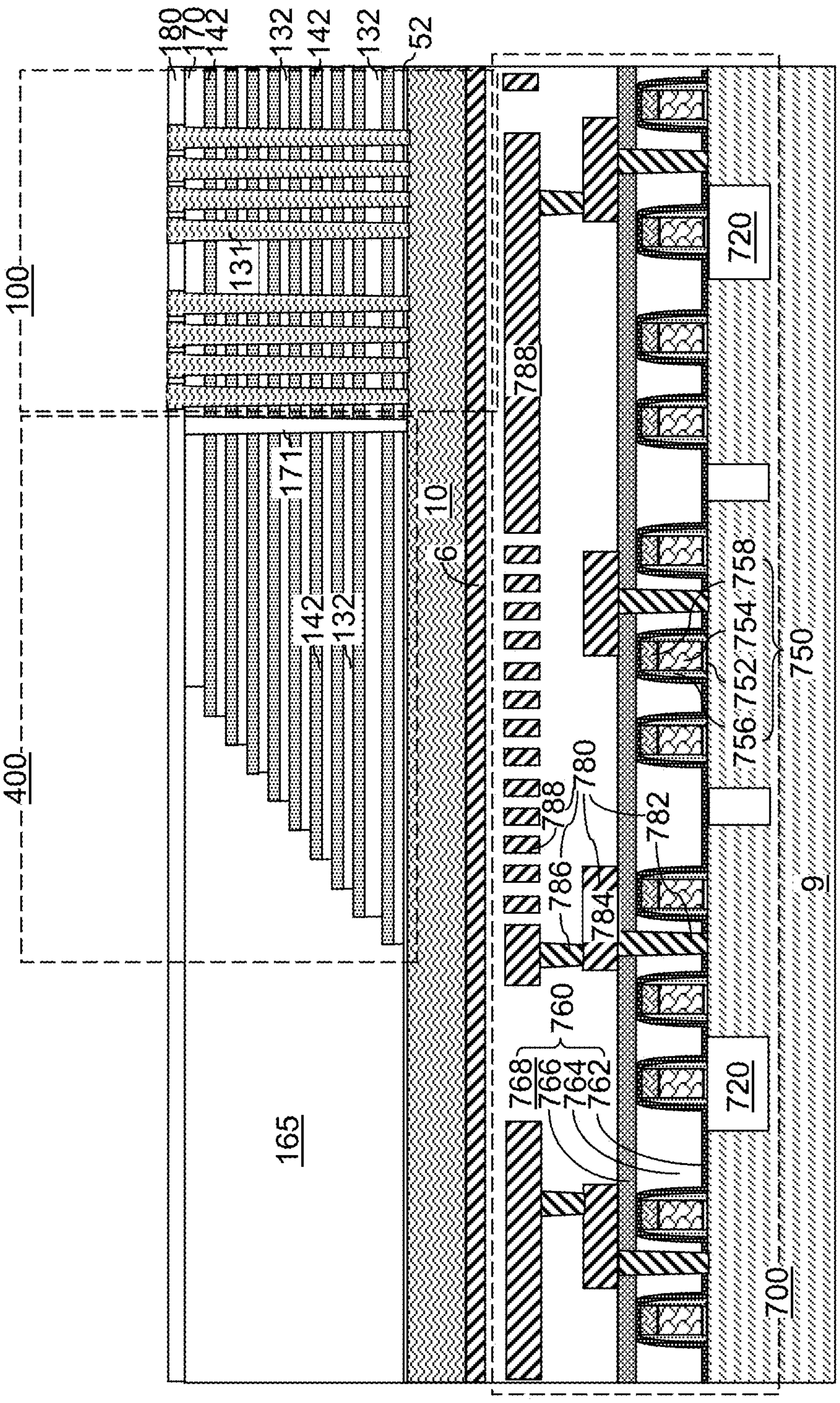
FIG. 6 is a vertical cross-sectional view of the first exemplary structure after formation of sacrificial memory opening fill portions according to the first embodiment of the present disclosure.

Referring to FIGS. 5A and 5B, first-tier memory openings 149 extending at least to a top surface of the planar semiconductor material layer 10 are formed through the first-tier alternating stack (132, 142). The first-tier memory openings 149 can be formed in the memory array region 100 at locations at which memory stack structures including vertical stacks of memory elements are to be subsequently formed. For example, a lithographic material stack (not shown) including at least a photoresist layer can be formed over the first insulating cap layer 170 (and optionally layer 180), and can be lithographically patterned to form openings within the lithographic material stack. The pattern in the lithographic material stack can be transferred through the first insulating cap layer 170 (and optionally layer 180), and through the entirety of the first-tier alternating stack (132, 142) by at least one anisotropic etch that employs the patterned lithographic material stack as an etch mask. Portions of the first insulating cap layer 170 (and optionally layer 180), and the first-tier alternating stack (132, 142) underlying the openings in the patterned lithographic material stack are etched to form the first-tier memory openings 149. In other words, the transfer of the pattern in the patterned lithographic material stack through the first insulating cap layer 170 and the first-tier alternating stack (132, 142) forms the first-tier memory openings 149.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 can be substantially vertical, or can be tapered. Subsequently, the patterned lithographic material stack can be subsequently removed, for example, by ashing.

Optionally, the portions of the first-tier memory openings 149 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Sacrificial memory opening fill portions 131 can be formed in the first-tier memory openings 149. For example, a sacrificial fill material layer is deposited in the first-tier memory openings 149. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and optionally layer 180 if present). For example, the sacrificial fill material layer can be recessed to a top surface of the first insulating cap layer 170 (and optionally layer 180 if present) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 131. The top surfaces of the sacrificial memory opening fill portions 131 can be coplanar with the top surface of the inter-tier dielectric layer 180. The sacrificial memory opening fill portion 131 may, or may not, include cavities therein.

Figure 7:
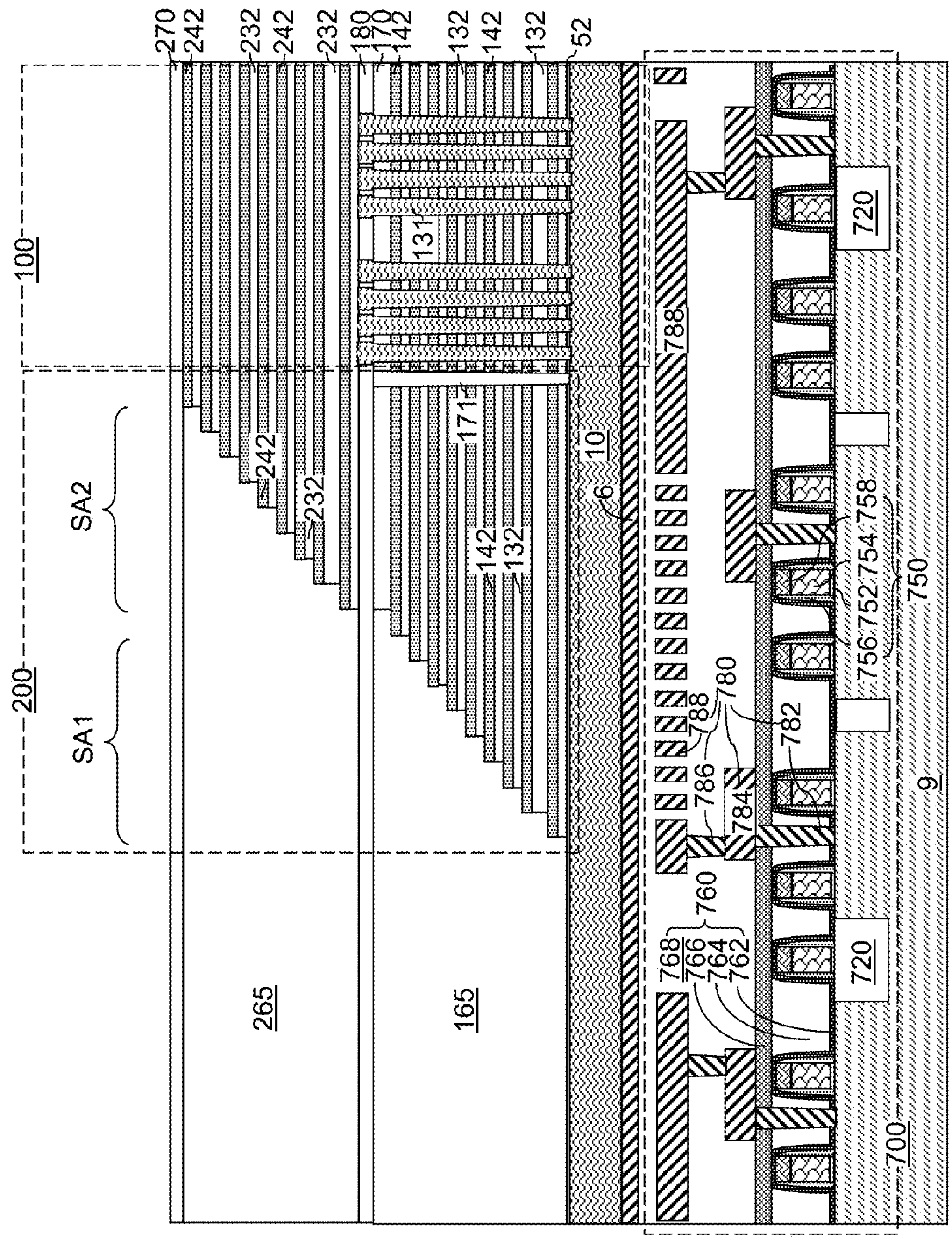
FIG. 7 is a vertical cross-sectional view of the first exemplary structure after formation of a second-tier alternating stack of second insulating layers and second spacer material layers, a second-tier retro-stepped dielectric material portion, and a second insulating cap layer according to the first embodiment of the present disclosure.

Referring to FIG. 7, a second tier structure can be formed over the first tier structure (132, 142, 170, 131). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area SA2 can be formed in the through-memory-level via regions 400 and the word line contact via regions 200 employing a same set of processing steps as the processing steps employed to form the first stepped surfaces in the first stepped area SA1 with suitable adjustment to the pattern of at least one masking layer. A second-tier retro-stepped dielectric material portion 265 can be formed over the second stepped surfaces in the through-memory-level via regions 400 and the word line contact via regions 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Figure 8A:
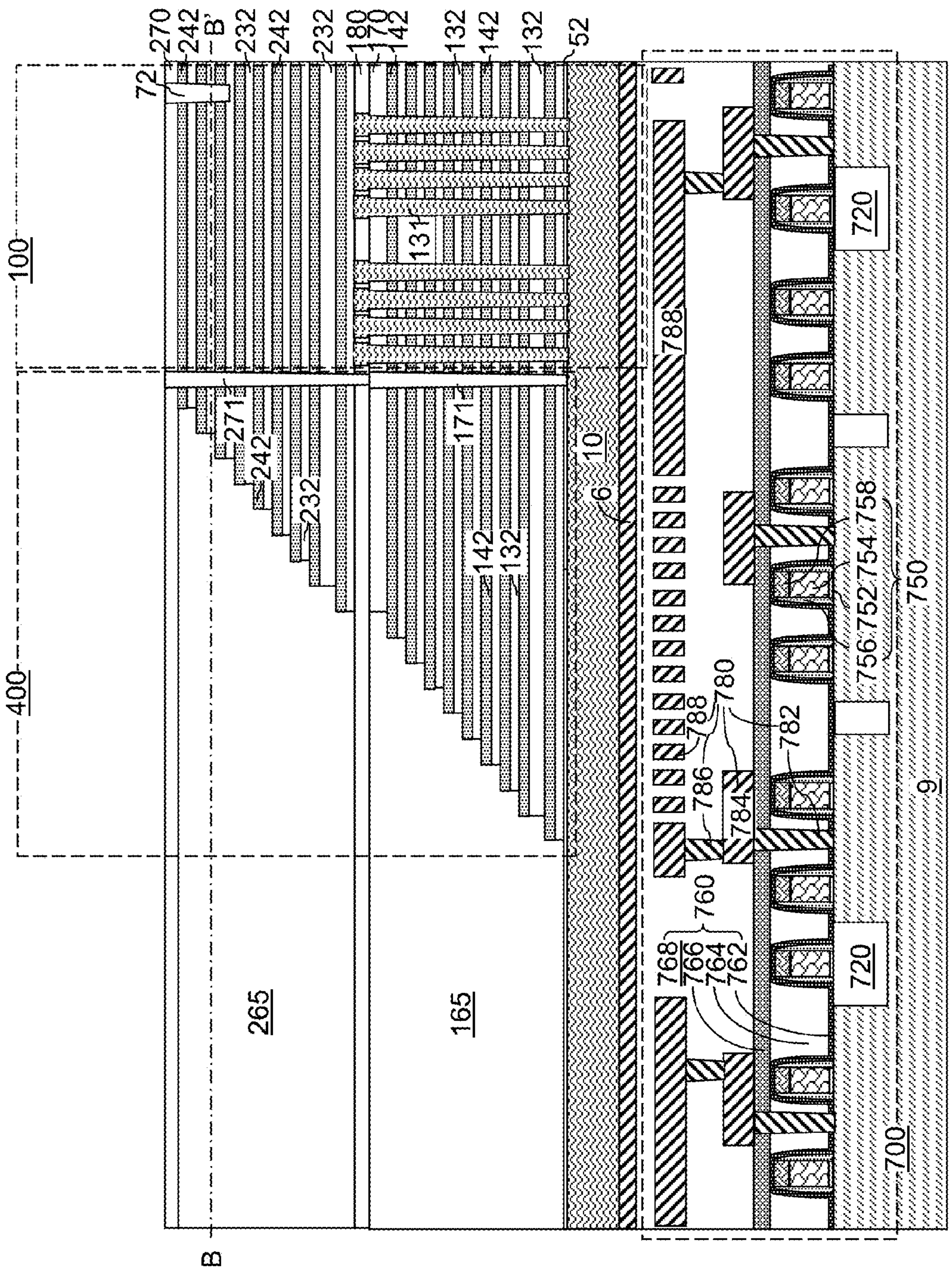
FIG. 8A is a vertical cross-sectional view of the first exemplary structure after formation of second-tier dielectric support pillars and drain-select-level shallow trench isolation structures according to the first embodiment of the present disclosure.
Figure 8B:
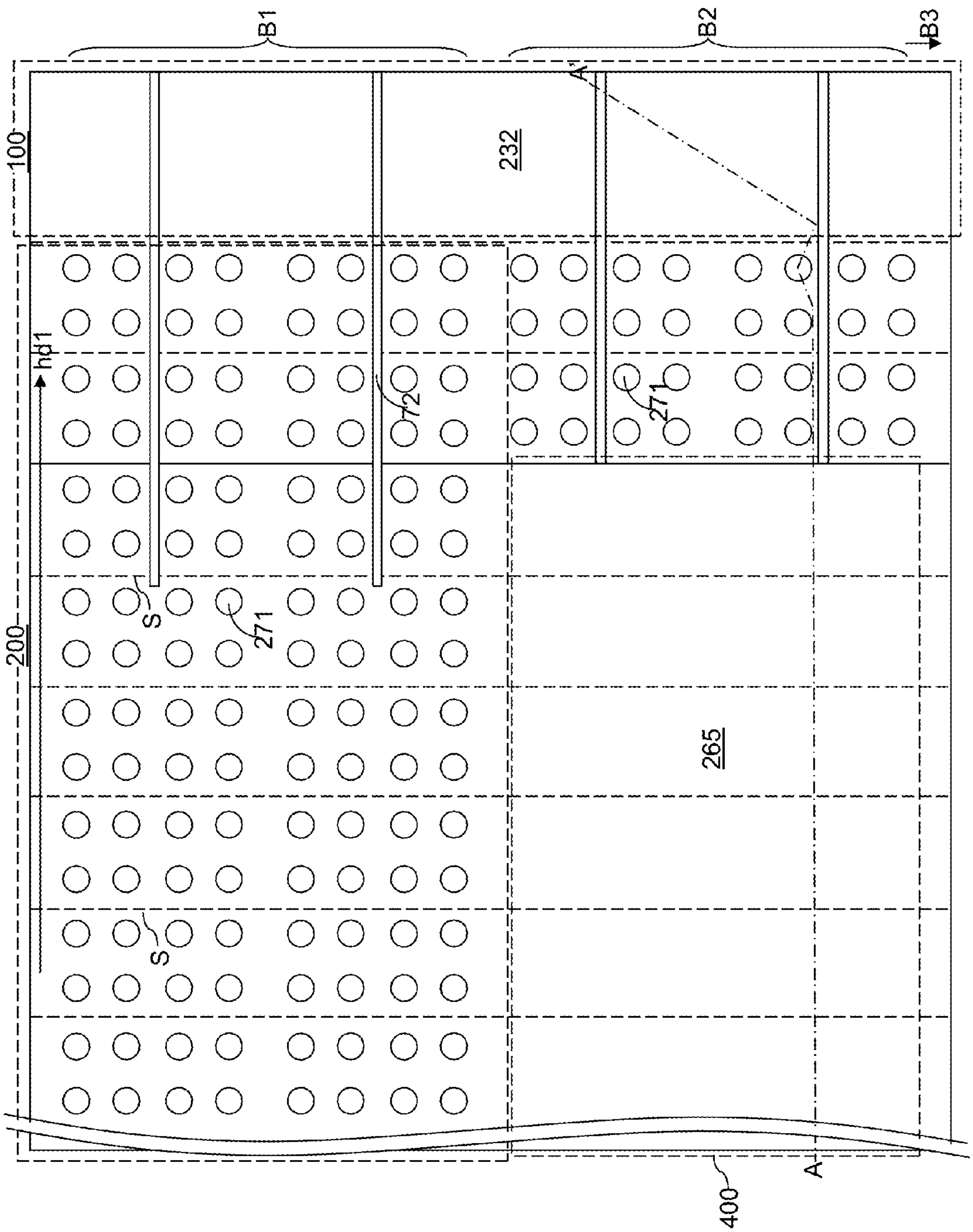
FIG. 8B is a horizontal cross-sectional view of the first exemplary structure along the horizontal plane B-B' in FIG. 8A. The zig-zag vertical plane A-A' corresponds to the plane of the vertical cross-sectional view of FIG. 8A.

Referring to FIGS. 8A and 8B, second-tier support pillar structures 271 can be formed in portions of the second-tier alternating stack (132, 142) that overlie the first-tier support pillar structures 171. For example, the second-tier support pillar structures 271 can be formed directly on top surfaces of the first-tier support pillar structures 171 in the through-memory-level via regions 400 and the word line contact via regions 200. The second-tier support pillar structures 271 can be formed, for example, by forming via cavities through the second-tier alternating stack (232, 242) and by filling the via cavities with a dielectric material such as silicon oxide and/or a dielectric metal oxide (such as aluminum oxide).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 divide blocks (B1, B2, B3, . . . ) into multiple sub-blocks along the first horizontal direction hd1. The drain-select-level shallow trench isolation structures 72 include a dielectric material such as silicon oxide. Locations of steps S in the first-tier alternating stack (132, 142) and the second-tier alternating stack (232, 242) are illustrated in FIG. 8B as dotted lines.

The staircase regions in the first, second and third memory block ascend in a same diagonal direction (e.g., from left to right).

Figure 9A:
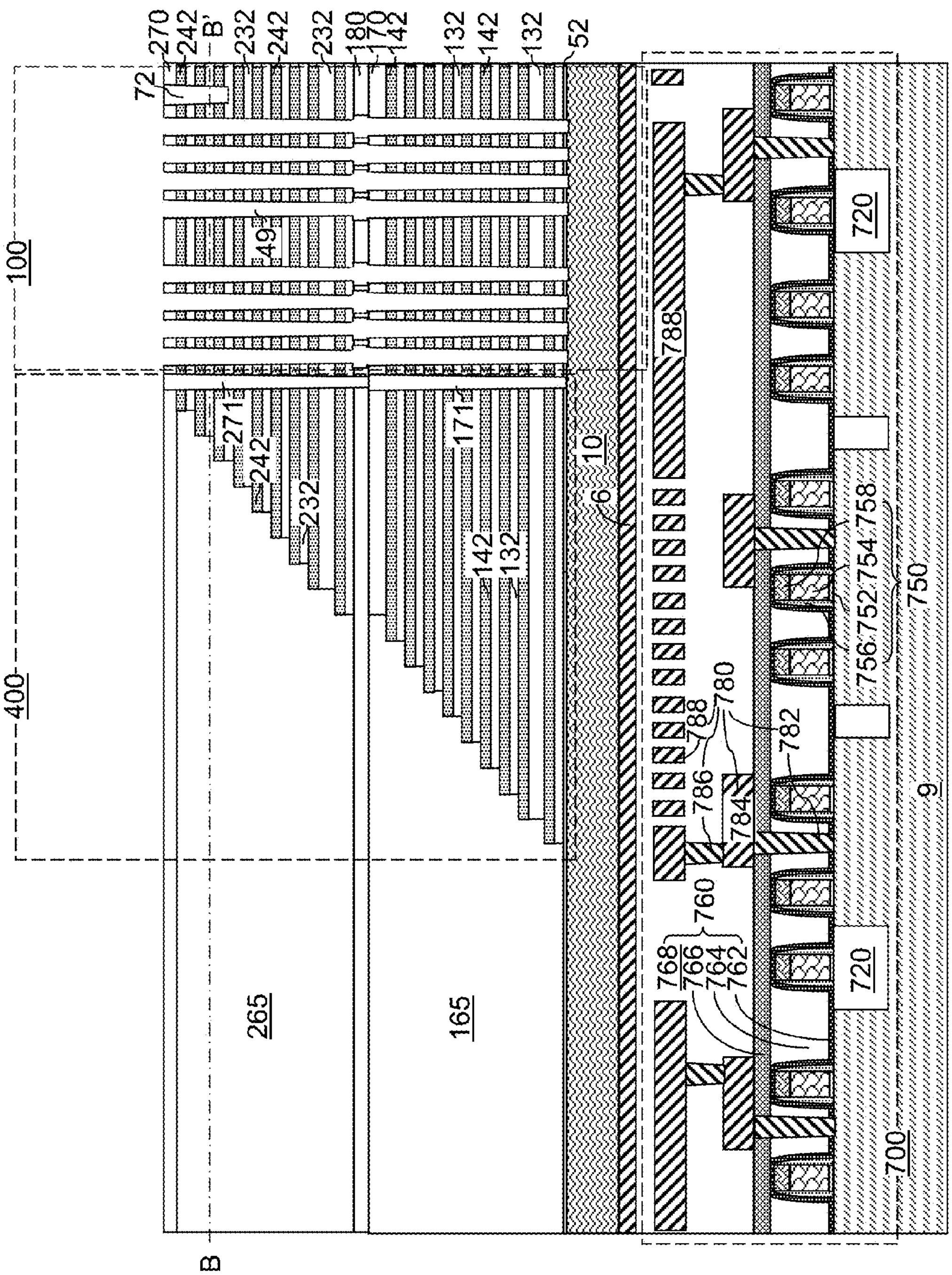
FIG. 9A is a vertical cross-sectional view of the first exemplary structure after formation of memory openings according to the first embodiment of the present disclosure.
Figure 9B:
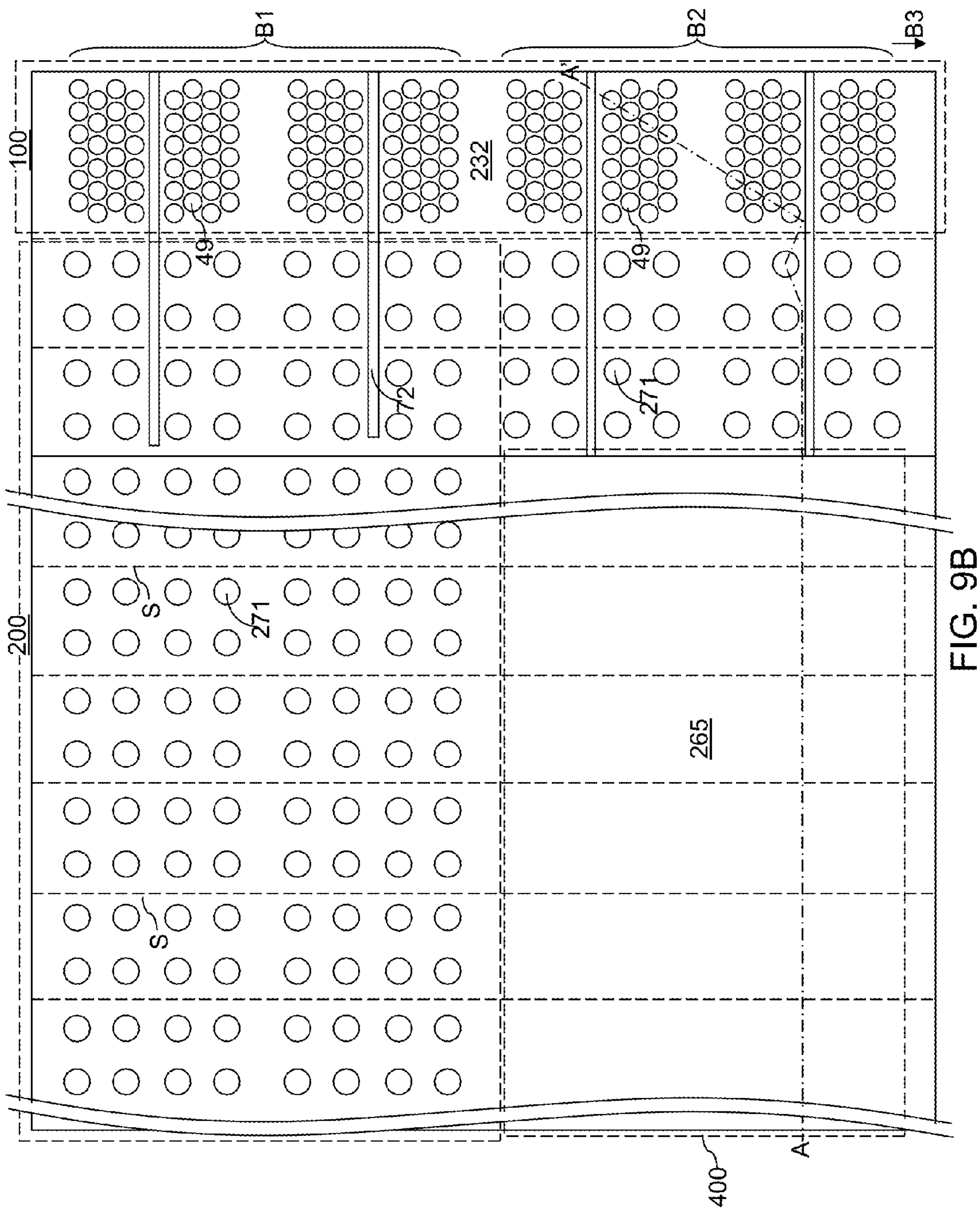
FIG. 9B is a horizontal cross-sectional view of the first exemplary structure along the horizontal plane B-B' in FIG. 9A. The zig-zag vertical plane A-A' corresponds to the plane of the vertical cross-sectional view of FIG. 9A.

Referring to FIGS. 9A and 9B, second-tier memory openings extending through the second tier structure (232, 242, 270) are formed in areas overlying the sacrificial memory opening fill portions 131. A photoresist layer can be applied over the second tier structure (232, 242, 270), and can be lithographically patterned to form a same pattern as the pattern of the sacrificial memory opening fill portion 131, i.e., the pattern of the first-tier memory openings. The lithographic mask employed to pattern the first-tier memory openings 149 can be employed to pattern the second-tier memory openings. An anisotropic etch can be performed to transfer the pattern of the lithographically patterned photoresist layer through the second tier structure (232, 242, 270). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 131 can be physically exposed at the bottom of each second-tier memory opening. After the top surfaces of the sacrificial memory opening fill portions 131 are physically exposed, an etch process can be performed, which removes the sacrificial material of the sacrificial memory opening fill portions 131 selective to the materials of the second-tier alternating stack (232, 242) and the first-tier alternating stack (132, 142) (e.g., $C_4F_8/O_2/Ar$ etch).

Upon removal of the sacrificial memory opening fill portions 131, each vertically adjoining pair of a second-tier memory opening and a first-tier memory opening 149 forms a continuous cavity that extends through the first-tier alternating stack (132, 142) and the second-tier alternating stack (232, 242). The continuous cavities are herein referred to as memory openings 49. A top surface of the planar semiconductor material layer 10 can be physically exposed at the bottom of each memory opening 49.

Figure 10A:
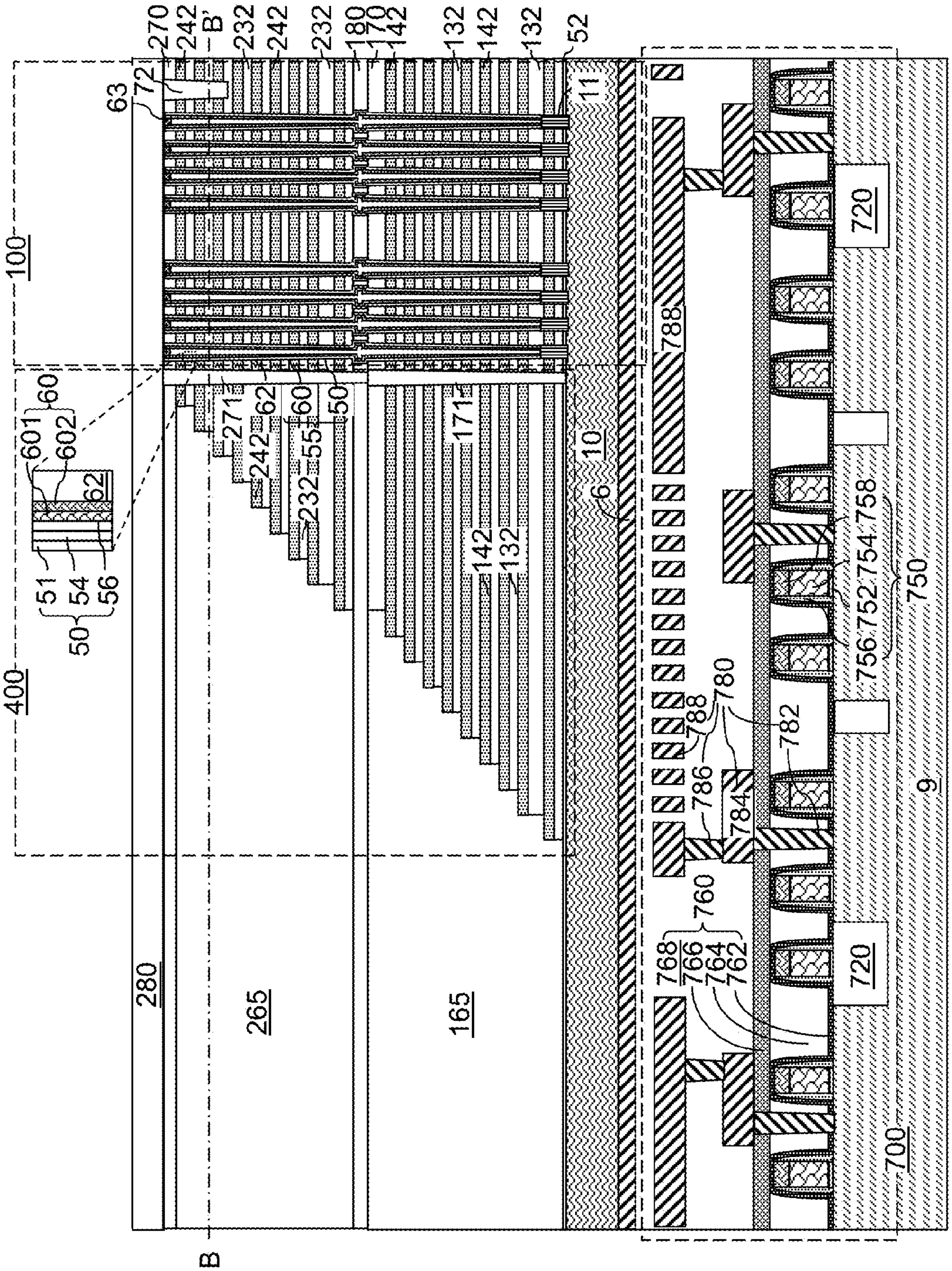
FIG. 10A is a vertical cross-sectional view of the first exemplary structure after formation of memory stack structures and contact level dielectric layer according to the first embodiment of the present disclosure.
Figure 10B:
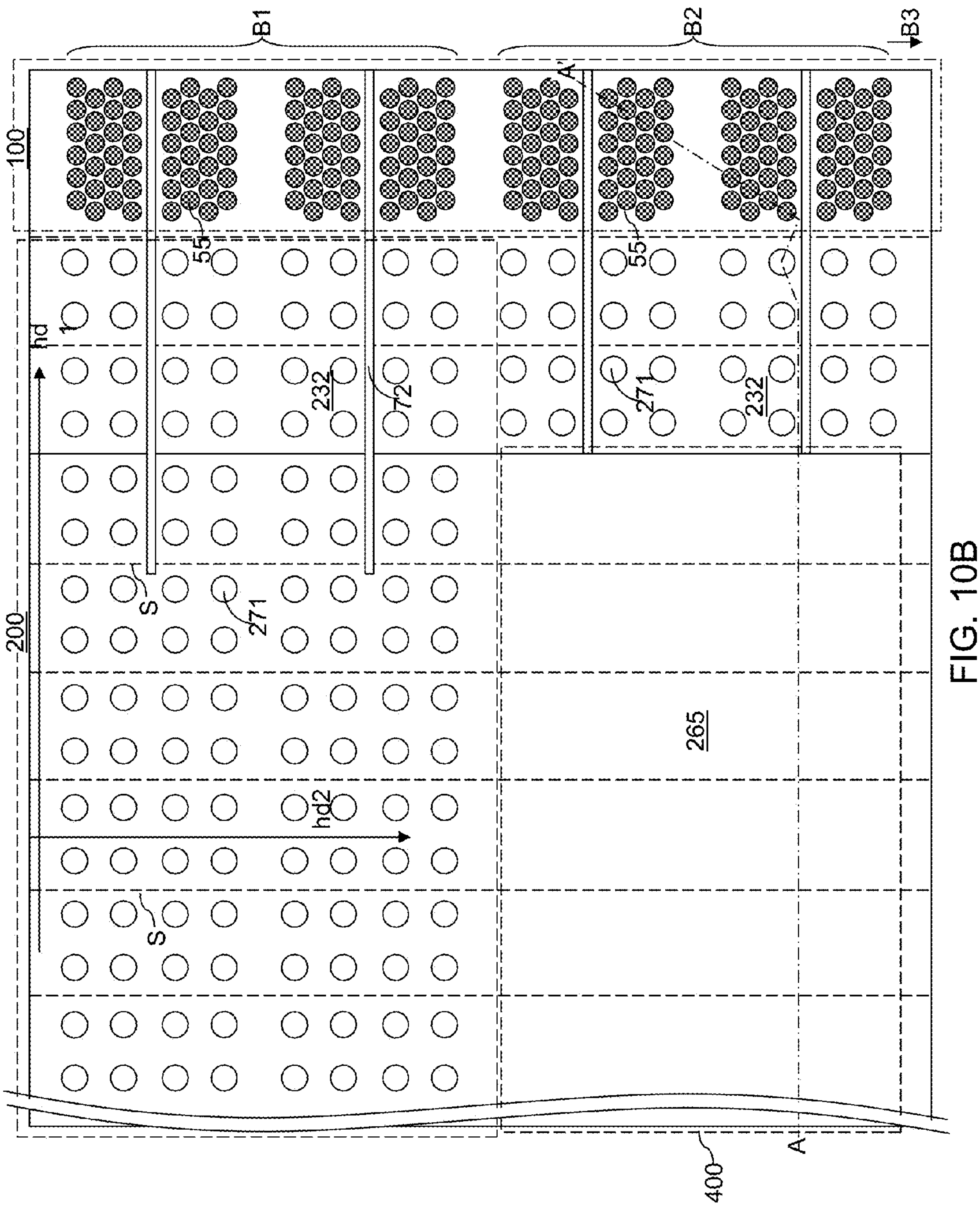
FIG. 10B is a horizontal cross-sectional view of the first exemplary structure along the horizontal plane B-B' in FIG. 10A. The zig-zag vertical plane A-A' corresponds to the plane of the vertical cross-sectional view of FIG. 10A.

Referring to FIGS. 10A and 10B, pedestal channel portions 11 can be optionally formed at the bottom of each memory opening 49 by a selective semiconductor deposition process. The selective semiconductor deposition grows a semiconductor material only from semiconductor surfaces, i.e., the physically exposed surfaces of the planar semiconductor material layer 10, and suppresses growth of the semiconductor material from insulator surfaces. During a selective semiconductor deposition process, a reactant (such as silane, dichlorosilane, trichlorosilane, disilane, etc.) can be flowed into a deposition chamber simultaneously with, or alternately with, an etchant (such as hydrogen chloride). Because a semiconductor material is deposited at a greater deposition rate on semiconductor surfaces than on insulator surfaces, a selective growth can be achieved by setting the etch rate between the deposition rate of the semiconductor material on semiconductor surfaces and the deposition rate of the semiconductor material on insulator surfaces. In one embodiment, the top surfaces of the pedestal channel portions 11 can extend across the levels of the source select levels in which source-select-level electrically conductive layers can be subsequently formed.

Memory stack structures 55 can be formed in the memory openings 49. In an illustrative example, each memory stack structure 55 can include a memory film 50, a vertical semiconductor channel 60, and an optional dielectric core 62. In one embodiment, each memory film 50 can include an optional blocking dielectric layer 51, a memory material layer 54, and a tunneling dielectric layer 56 as illustrated in the inset. In one embodiment, each vertical semiconductor channel 60 can include a first semiconductor channel 601 and a second semiconductor channel 602. While the memory openings 49 and support openings for the first-tier support pillar structures 171 are shown as being made in separate steps in FIGS. 5A and 4A, respectively, in another embodiment, the memory openings 49 and the support openings for the first-tier support pillar structures 171 are formed in the same step. In this embodiment, the first-tier support pillar structures 171 which comprise dummy memory stack structures which are not electrically connected to bit lines may be formed in the support openings at the same time as the memory stack structures 55 are formed in the memory openings 49.

The blocking dielectric layer 51 includes a blocking dielectric layer material such as silicon oxide, a dielectric metal oxide (such as aluminum oxide), or a combination thereof. Alternatively, the blocking dielectric layer 51 may be omitted during this processing step and instead be formed through backside recesses as will be described in more detail below. In one embodiment, the memory material layer 54 can be a charge trapping material including a dielectric charge trapping material, which can be, for example, silicon nitride.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. The thickness of the tunneling dielectric layer 56 can be in a range from 2 nm to 20 nm, although lesser and greater thicknesses can also be employed.

A first semiconductor channel layer can be deposited over the memory films 50 by a conformal deposition method such as low pressure chemical vapor deposition (LPCVD). The thickness of the first semiconductor channel layer can be in a range from 2 nm to 10 nm, although lesser and greater thicknesses can also be employed. The first semiconductor channel layer and the memory films 50 can be anisotropically etched to remove horizontal portions thereof. A horizontal bottom portion of each memory film 50 can be removed from the bottom of each memory opening. Each remaining portion of the first semiconductor channel layer constitutes a first semiconductor channel 601. The first semiconductor channels can include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channels 601 can include amorphous silicon or polysilicon.

A second semiconductor channel layer can be deposited on the first semiconductor channels 601 (i.e., the remaining vertical portions of the first semiconductor channel layer) and on top surface of the epitaxial channel portions 11 (or of the substrate semiconductor layer 10 in case the epitaxial channel portions 11 are not present). The second semiconductor channel layer includes a semiconductor material, which can be any semiconductor material that can be employed for the first semiconductor channel layer. The first and second semiconductor channel layers can have a doping of the first conductivity type (i.e., the same conductivity type as the substrate semiconductor layer 10) or can be substantially intrinsic, i.e., having a dopant concentration that does not exceed $1.0\times10^{17}/cm^3$. In one embodiment, the second semiconductor channel layer can include amorphous silicon or polysilicon. The thickness of the second semiconductor channel layer can be in a range from 2 nm to 10 nm, although lesser and greater thicknesses can also be employed.

A dielectric material can be deposited in cavities surrounded by the second semiconductor channel layer, and subsequently recessed below the top surface of the second insulating cap layer 270. Each remaining portion of the dielectric material in the memory openings constitutes a dielectric core 62. A doped semiconductor material having a second conductivity type (which is the opposite of the first conductivity type) can be deposited over the dielectric cores 62 and within the cavities in the memory openings to form drain regions 63. The doped semiconductor material can be, for example, doped polysilicon. Excess portions of the deposited semiconductor material can be removed from above the top surface of the second insulating tier cap layer 270, for example, by chemical mechanical planarization (CMP) or a recess etch to form the drain region 63. Each remaining portion of the second semiconductor channel layer constitutes a second semiconductor channel 602. A combination of a first semiconductor channel 601 and a second semiconductor channel 602 inside a memory opening constitutes a vertical semiconductor channel 60.

Each of the memory stack structures 55 comprises a memory film 50 and a vertical semiconductor channel 60 that is adjoined to a respective horizontal channel within the planar semiconductor material layer 10. Each memory film 50 can include a blocking dielectric layer 51 contacting a sidewall of the memory opening, a plurality of charge storage regions (embodied as portions of a memory material layer 54 at each level of the sacrificial material layers (142, 242)) located on an inner sidewall of the blocking dielectric layer 51, and a tunneling dielectric layer 56 located inside the plurality of charge storage regions.

The first tier structure (132, 142, 170, 165, 171), the second tier structure (232, 242, 270, 265, 271), the inter-tier dielectric layer 180, and the memory stack structures 55 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

A first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Figure 11A:
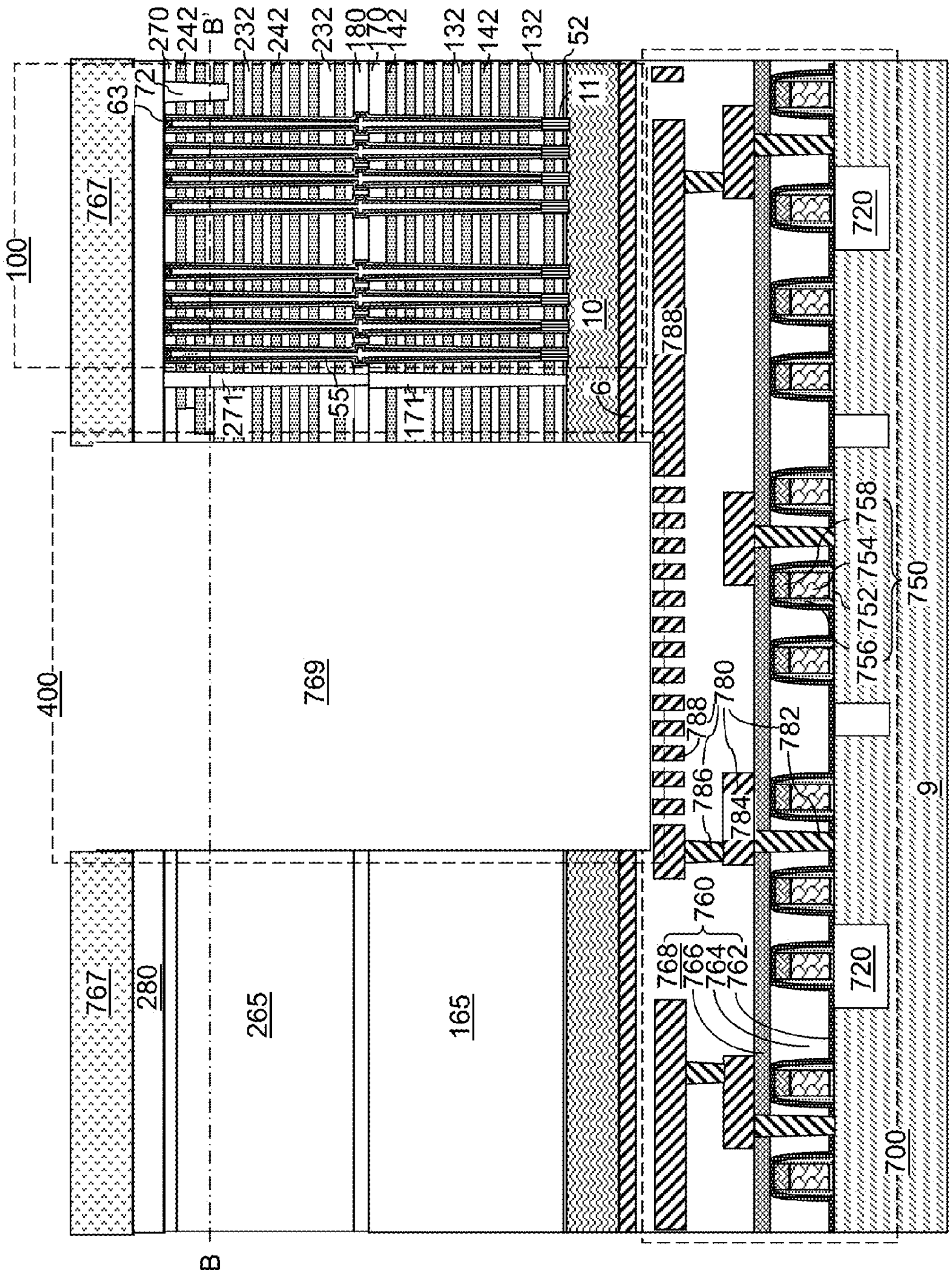
FIG. 11A is a vertical cross-sectional view of the first exemplary structure after formation of a through-memory-level opening according to the first embodiment of the present disclosure.
Figure 11B:
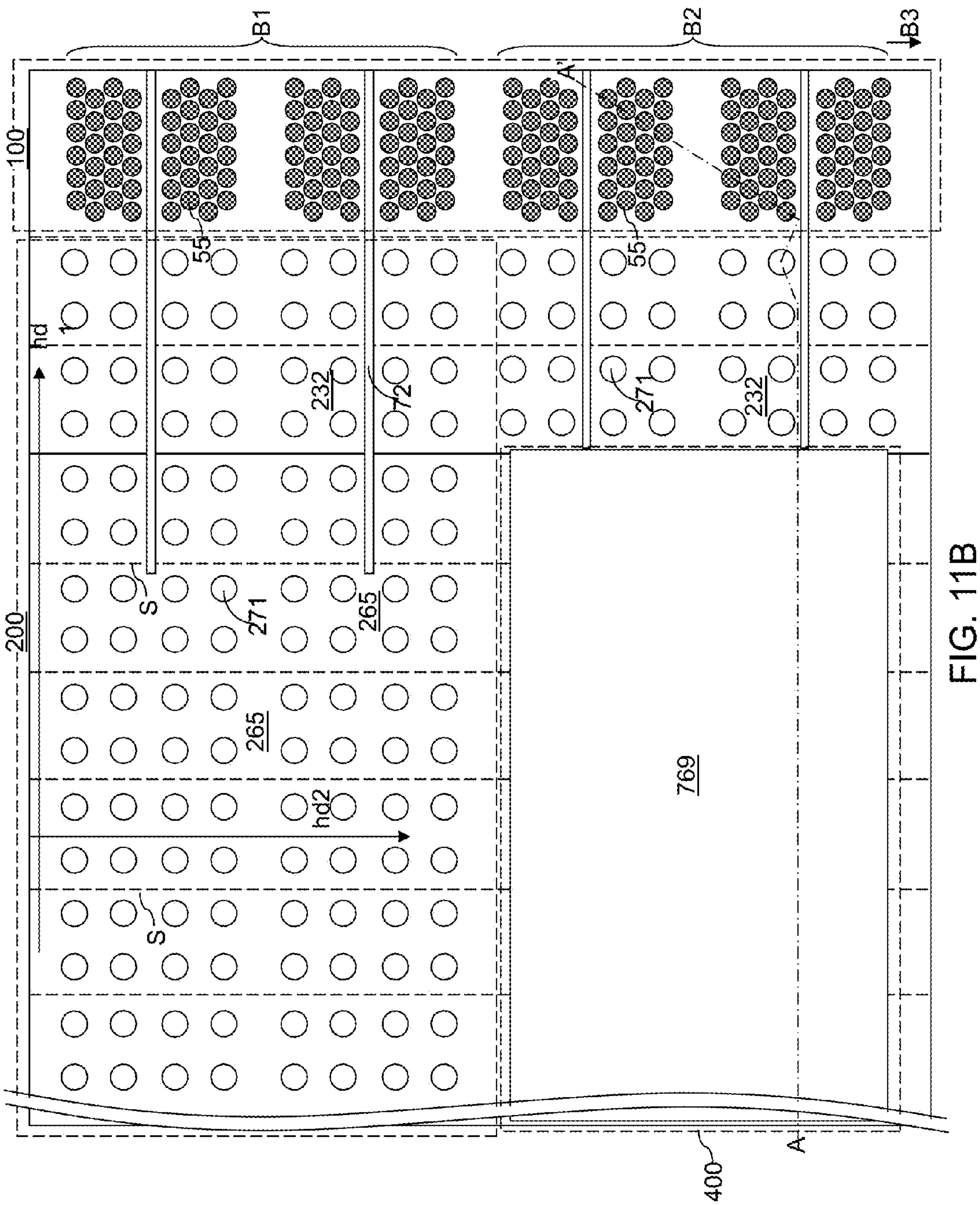
FIG. 11B is a horizontal cross-sectional view of the first exemplary structure along the horizontal plane B-B' in FIG. 11A. The zig-zag vertical plane A-A' corresponds to the plane of the vertical cross-sectional view of FIG. 11A.

Referring to FIGS. 11A and 11B, a through-memory-level opening 769 can be formed in each through-memory-level via region 400 through the memory-level assembly. For example, a through-memory-level opening 769 extending through the memory-level assembly can be formed in the area of the second staircase region. The through-memory-level openings 769 can be formed, for example, by applying a photoresist layer 767 over the first contact level dielectric layer 280, lithographically patterning the photoresist layer 767 to form an opening over each through-memory-level via region 400, and anisotropically etching the portions of the first contact level dielectric layer 280 and the memory-level assembly that underlie the openings in the photoresist layer. In one embodiment, the area of each opening can include a predominant portion (i.e., over 50%) of the total area of a respective through-memory-level via region 400.

The through-memory-level openings 769 are formed only in the through-memory-level via regions 400, and are not formed in the word line contact via regions 200 or in the memory array region 100. The areas of the word line contact via regions 200 or in the memory array region 100 are covered with a masking layer, such as the patterned photoresist layer 767.

The through-memory-level openings 769 can extend through the entirety of the memory-level assembly, the planar semiconductor material layer 10, the optional planar conductive material layer 6, and into the at least one lower level dielectric material layer 760. In one embodiment, the bottom surface of each through-memory-level opening 769 may be located above the topmost surface of the lower level metal interconnect structures 780. Alternatively, the topmost surface of the lower level metal interconnect structures 780 may be physically exposed in the through-memory-level openings 769. In one embodiment, the through-memory-level openings 769 can comprise substantially vertical sidewalls that extend through the memory-level assembly and the planar semiconductor material layer 10. As used herein, a sidewall is "substantially vertical" if the sidewall is vertical or deviates from a vertical plane by an angle less than 5 degrees.

Figure 12A:
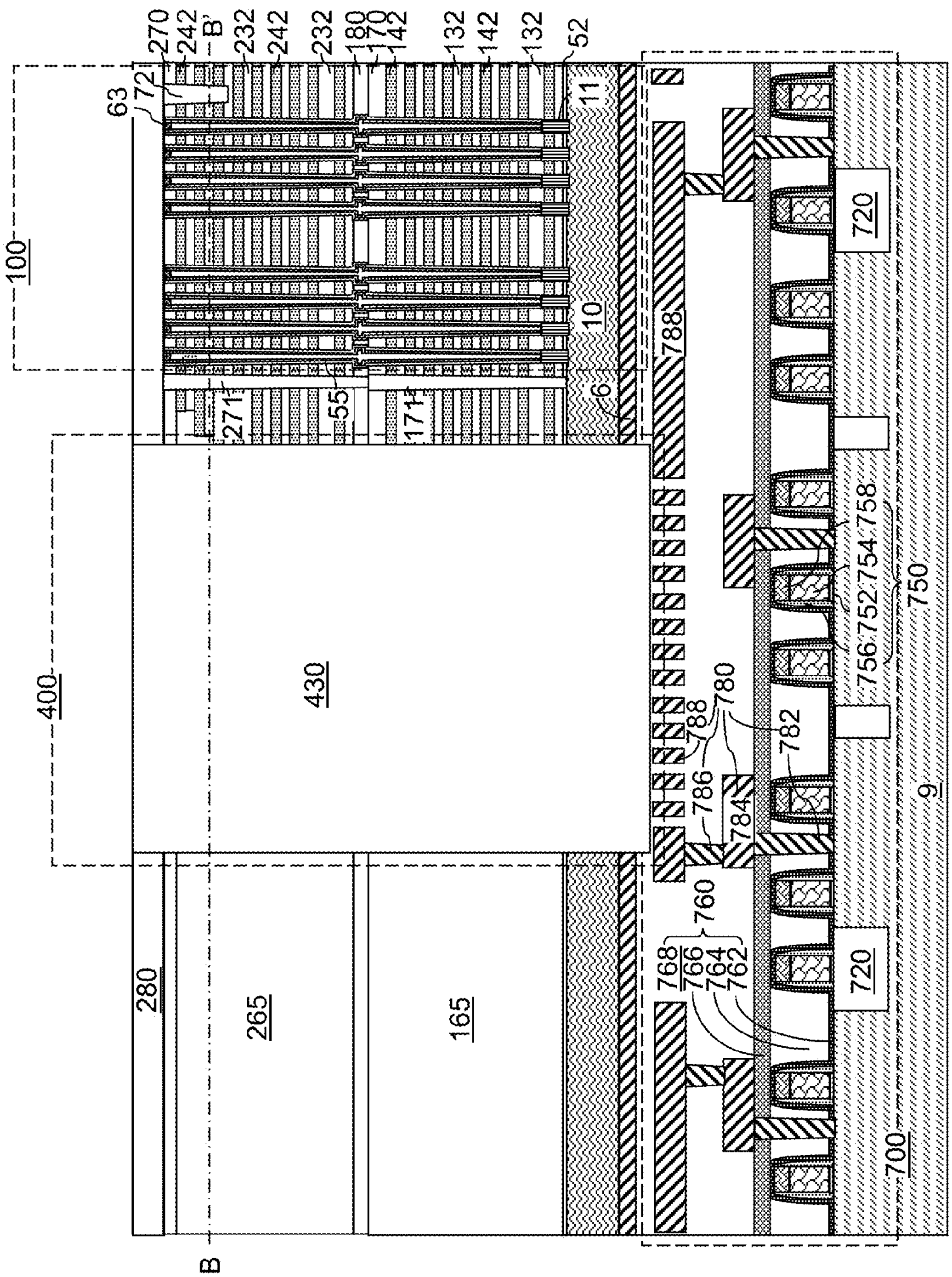
FIG. 12A is a vertical cross-sectional view of the first exemplary structure after formation of a dielectric fill material according to the first embodiment of the present disclosure.
Figure 12B:
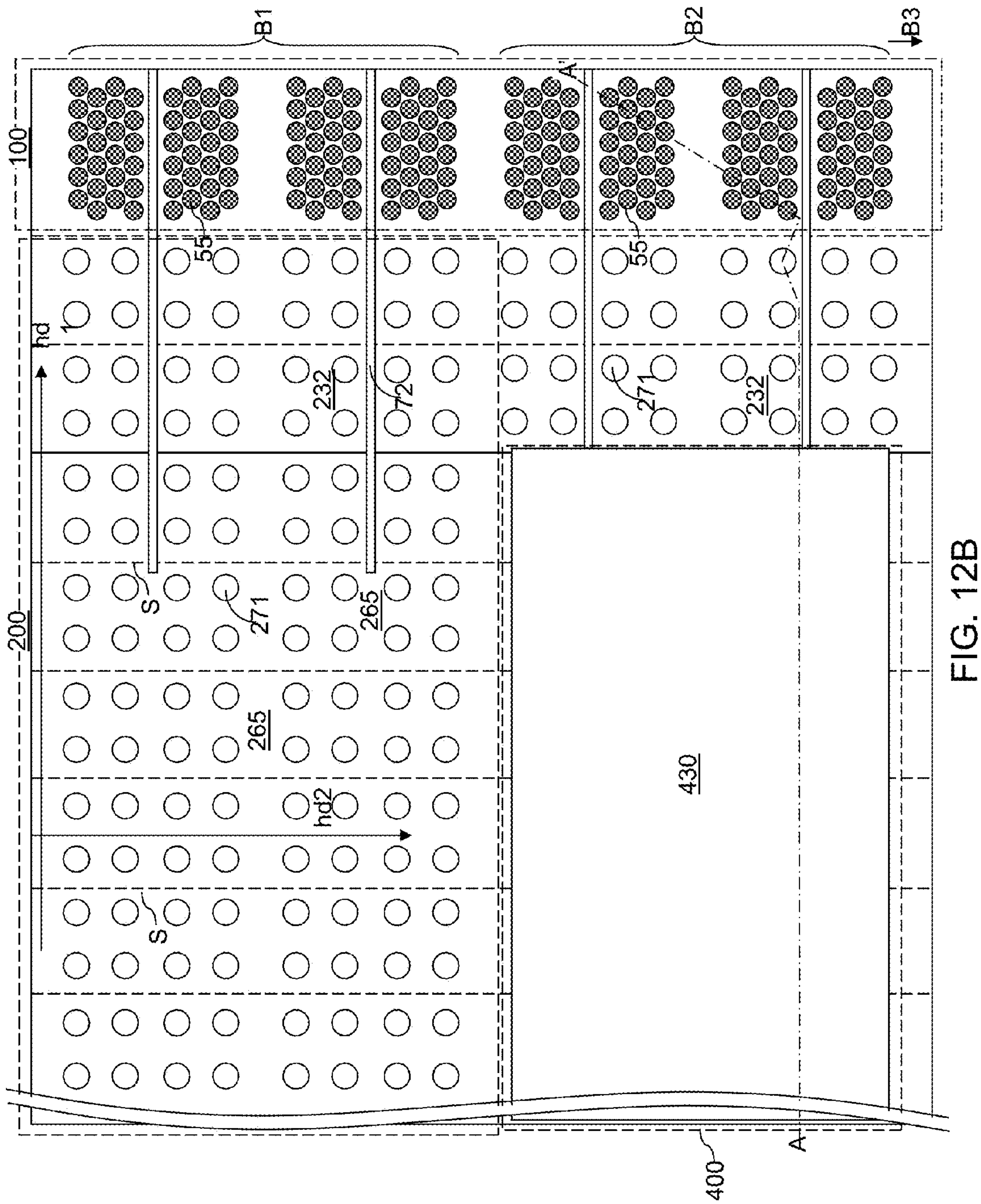
FIG. 12B is a horizontal cross-sectional view of the first exemplary structure along the horizontal plane B-B' in FIG. 12A. The zig-zag vertical plane A-A' corresponds to the plane of the vertical cross-sectional view of FIG. 12A.

Referring to FIGS. 12A and 12B, a dielectric fill material portion 430 is formed within each through-memory-level opening 769, for example, by deposition of a dielectric fill material and removal of the excess dielectric fill material from above a horizontal plane including the top surface of the first contact level dielectric layer 280. The dielectric fill material portion 430 includes a dielectric material such as undoped silicate glass (e.g., silicon oxide), doped silicate glass, or a spin-on glass (SOG). The dielectric fill material can be deposited by a conformal deposition process, a combination of a non-conformal deposition process and a reflow process, or a spin-on coating. Excess portions of the dielectric fill material can be removed by a recess etch, chemical mechanical planarization (CMP), or a combination thereof.

Figure 13A:
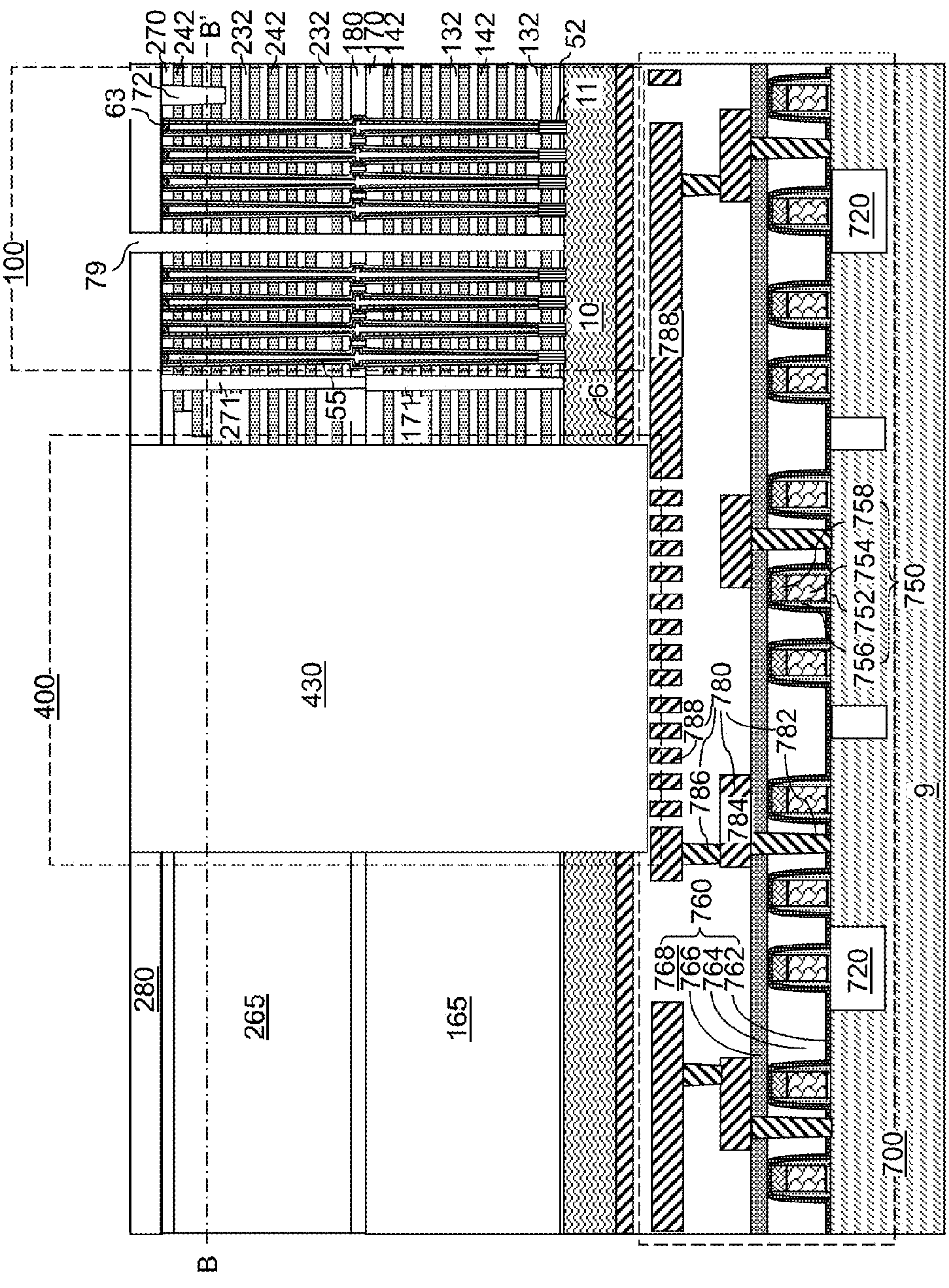
FIG. 13A is a vertical cross-sectional view of the first exemplary structure after formation of backside contact trenches according to the first embodiment of the present disclosure.
Figure 13B:
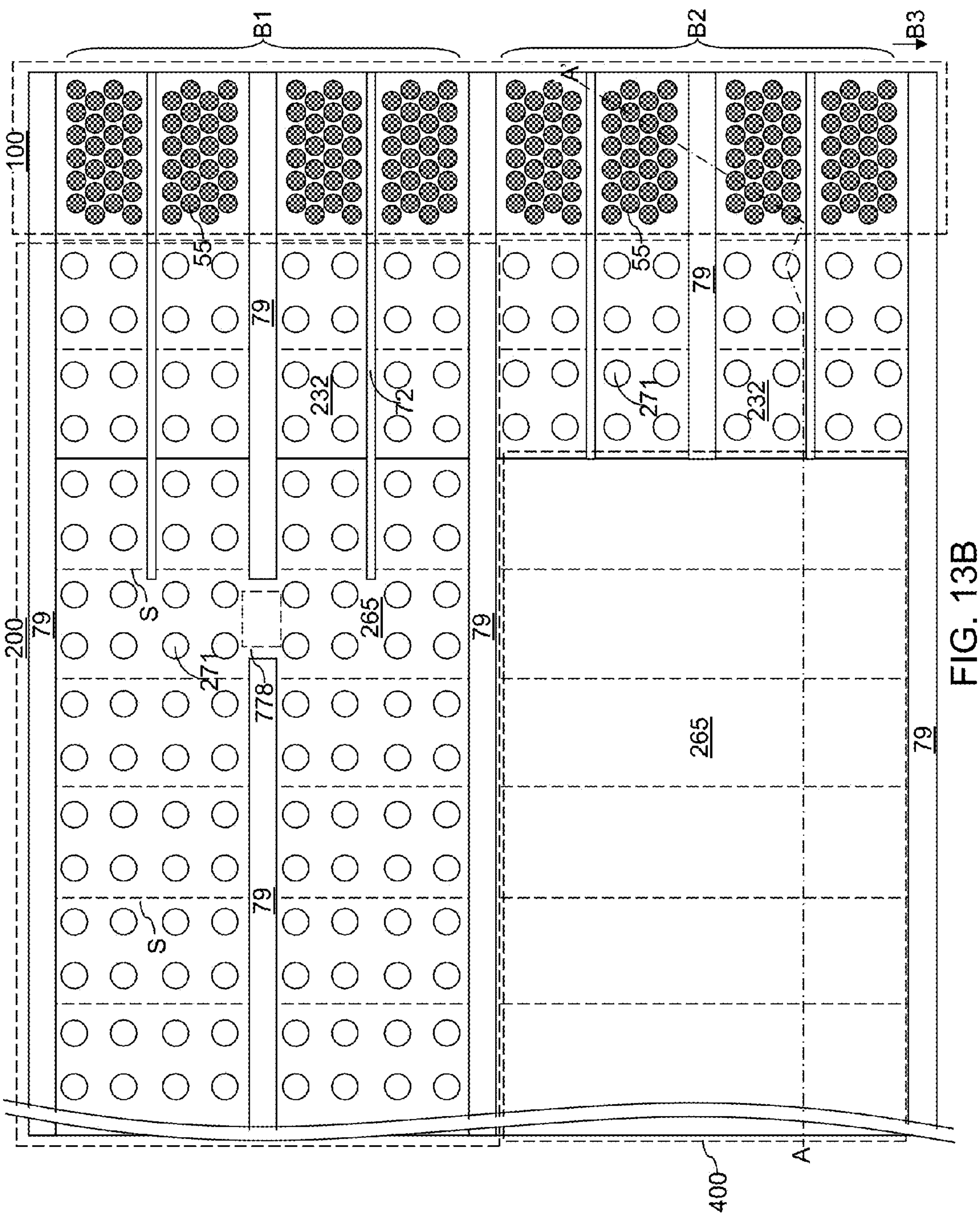
FIG. 13B is a horizontal cross-sectional view of the first exemplary structure along the horizontal plane B-B' in FIG. 13A. The zig-zag vertical plane A-A' corresponds to the plane of the vertical cross-sectional view of FIG. 13A.

Referring to FIGS. 13A and 13B, backside contact trenches 79 are subsequently formed through the first contact level dielectric layer 280 and the memory-level assembly. For example, a photoresist layer can be applied an lithographically patterned over the first contact level dielectric layer 280 to form elongated openings that extend along the first horizontal direction hd1 A subset of the openings in the patterned photoresist layer fall on the boundaries between blocks (B0, B1, B2, B3, . . . ). An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 include a first subset of backside contact trenches 79 that extend through a memory array region 100, adjoining word line contact via regions 200, and adjoining through-memory-level via regions 400. The first subset of the backside contact trenches 79 is formed through the memory-level assembly, laterally extends along the first horizontal direction hd1, and laterally divides the memory-level assembly (which generally includes at least one alternating stack (132, 142, 232, 242) into a plurality of laterally spaced-apart blocks (B0, B1, B2, B3, . . . ).

Each block (B0, B1, B2, B3, . . . ) includes a respective portion of the memory array region between a neighboring pair of backside contact trenches 79 among the first subset of the backside contact trenches 79. Each block (B0, B1, B2, B3, . . . ) can include the respective portion of the memory array region 100, a staircase region located on one lengthwise end of the respective portion of the memory array region 100 and including a word line contact via region 200, and another staircase region located on another lengthwise end of the respective portion of the memory array region 100 and including a through-memory-level via region 400. In one embodiment, the placement of the word line contact via regions 200 along consecutive blocks (B0, B1, B2, B3, . . . ) can alternate between two opposite sides. In an illustrative example, every odd numbered block (B1, B3, etc.) has a respective word line contact via region 200 on one side (such as a left side), and every even numbered block (B2, B4, etc.) has a respective word line contact via region 200 on an opposite side (such as a right side). Likewise, the placement of the through-memory-level via regions 400 along consecutive blocks (B0, B1, B2, B3, . . . ) can alternate between two opposite sides such that the through-memory-level via regions 400 do not overlap with the word line contact via regions 200. In an illustrative example, every even numbered block (B0, B2, B4, etc.) has a respective through-memory-level via regions 400 on one side (such as the left side), and every odd numbered block (B1, B3, etc.) has a respective word line contact via region 200 on an opposite side (such as the right side).

In an illustrative example, the plurality of blocks can comprise a set of three neighboring blocks (e.g., B1, B2, B3) including, in order, a first block B1, a second block B2, and third block B3 arranged along a second horizontal direction hd2 that is perpendicular to the first horizontal direction hd1. The first block B1, the second block B2, and the third block B3 can include a first staircase region (such as the region of the word line contact via region 200 on the left side of Block B1 illustrated in FIG. 10B), a second staircase region (such as the region of the through-memory-level via region 400 on the left side of Block B2 illustrated in FIG. 10B), and a third staircase region (that is a replica of the word line contact via region 200 on the left side of Block B3), respectively. As discussed above, a neighboring pair of an odd-numbered block and an even-numbered block (such as B1 and B2) can be periodically repeated along the second horizontal direction.

Optionally, a second subset of backside contact trenches 79 may be provided within each block (B0, B1, B2, B3, . . . ). If employed, the second subset of backside contact trenches 79 can extend along the first horizontal direction hd1, and can be positioned to suitably divide each block into a plurality of sub-blocks. Backside contact trenches 79 may comprise sub-block boundaries within each memory block. Backside contact trenches 79 may be discontinuous to permit the same word line to extend in connecting region 778 between two adjacent sub-blocks in the same block. If the drain-contact-level shallow trench isolation structures 72 are employed, the drain-contact-level shallow trench isolation structures 72 can extend along the first horizontal direction hd1 to divide a subset of layers in an upper portion of the second-tier alternating stack (232, 242) within each sub-block or within each block. Various design optimizations can be employed to divide a block into sub-blocks or subordinate units.

Figure 14A:
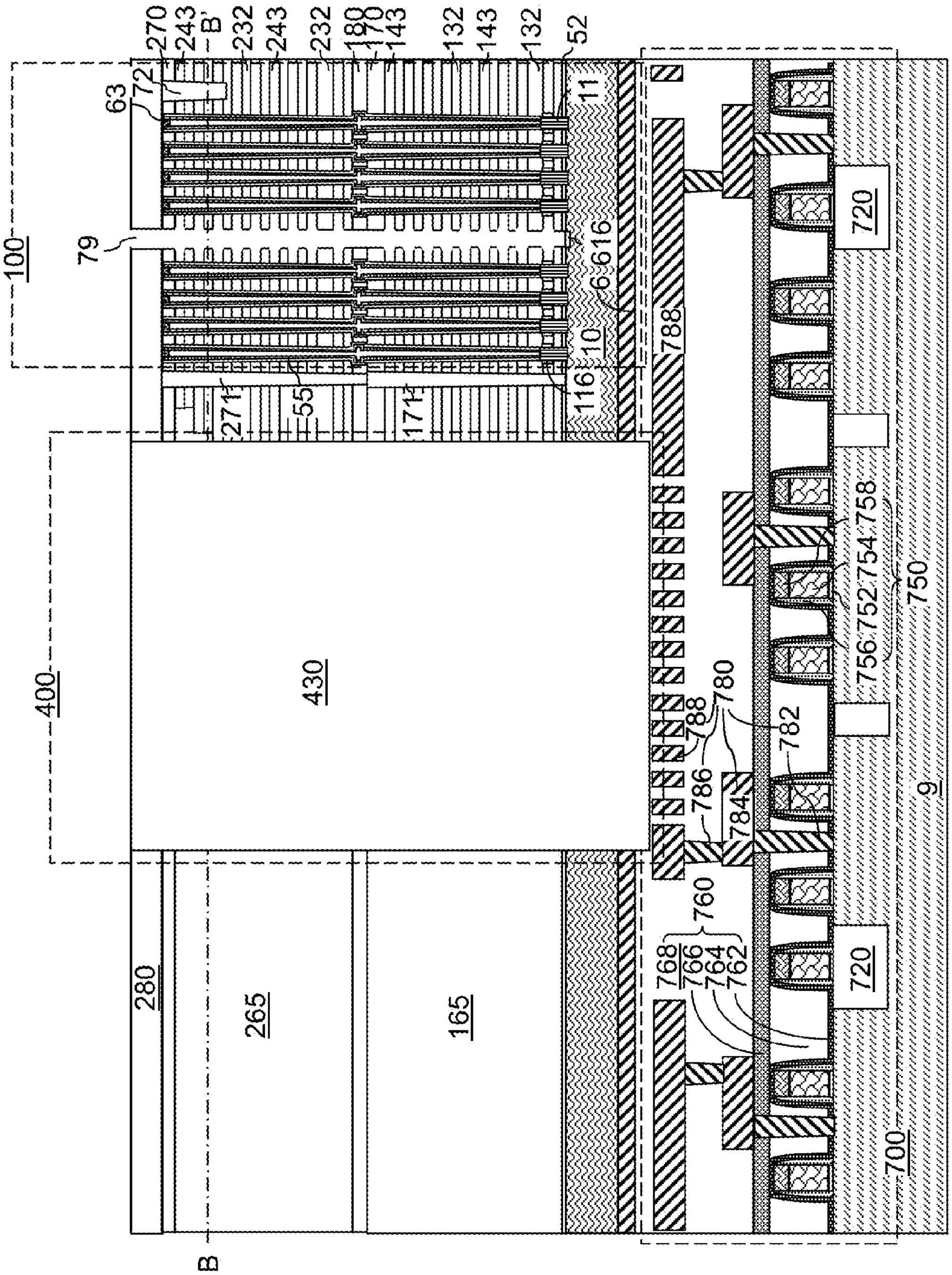
FIG. 14A is a vertical cross-sectional view of the first exemplary structure after formation of backside recesses by removal of the spacer material layers according to the first embodiment of the present disclosure.
Figure 14B:
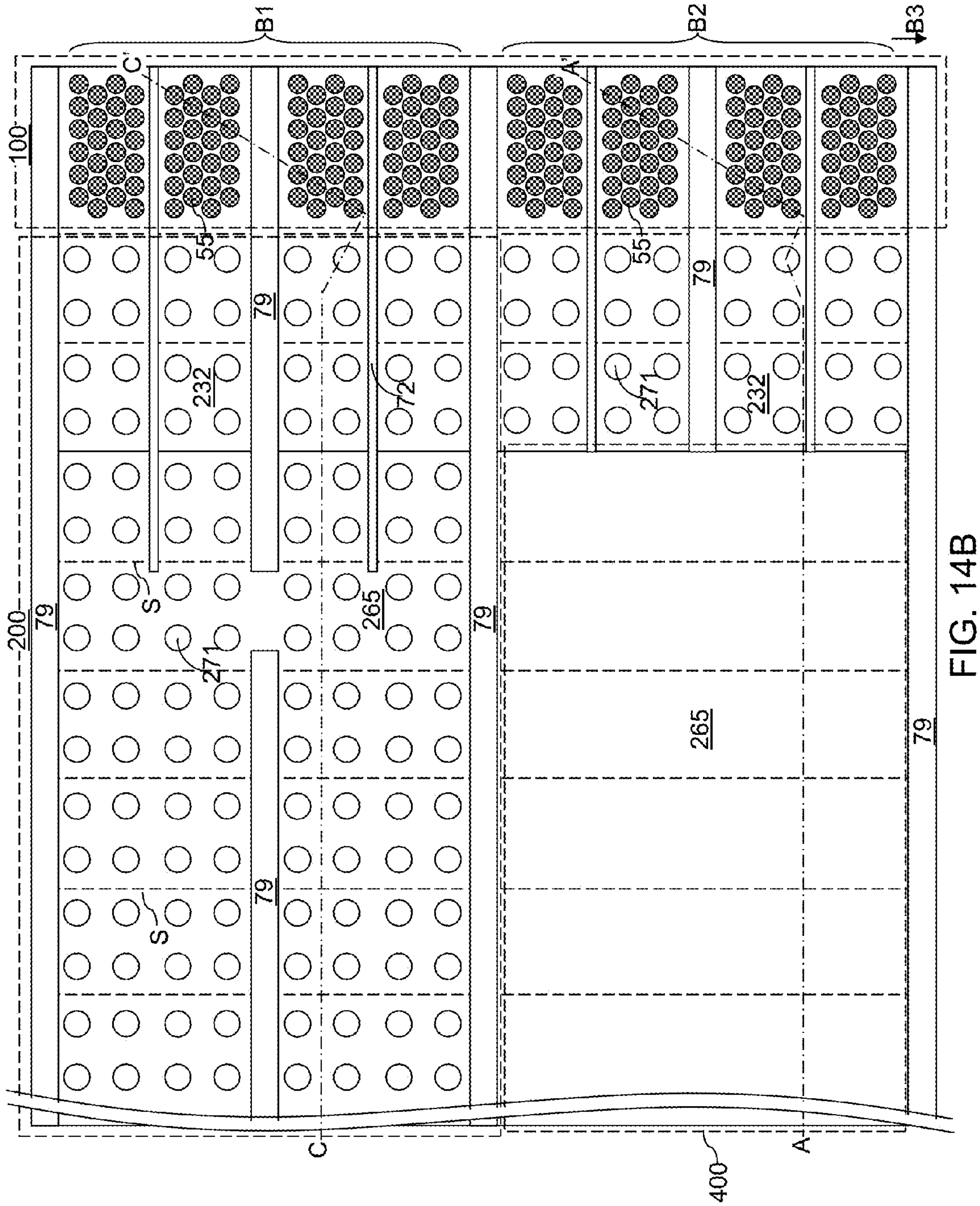
FIG. 14B is a horizontal cross-sectional view of the first exemplary structure along the horizontal plane B-B' in FIG. 14A. The zig-zag vertical plane A-A' corresponds to the plane of the vertical cross-sectional view of FIG. 14A.
Figure 14C:
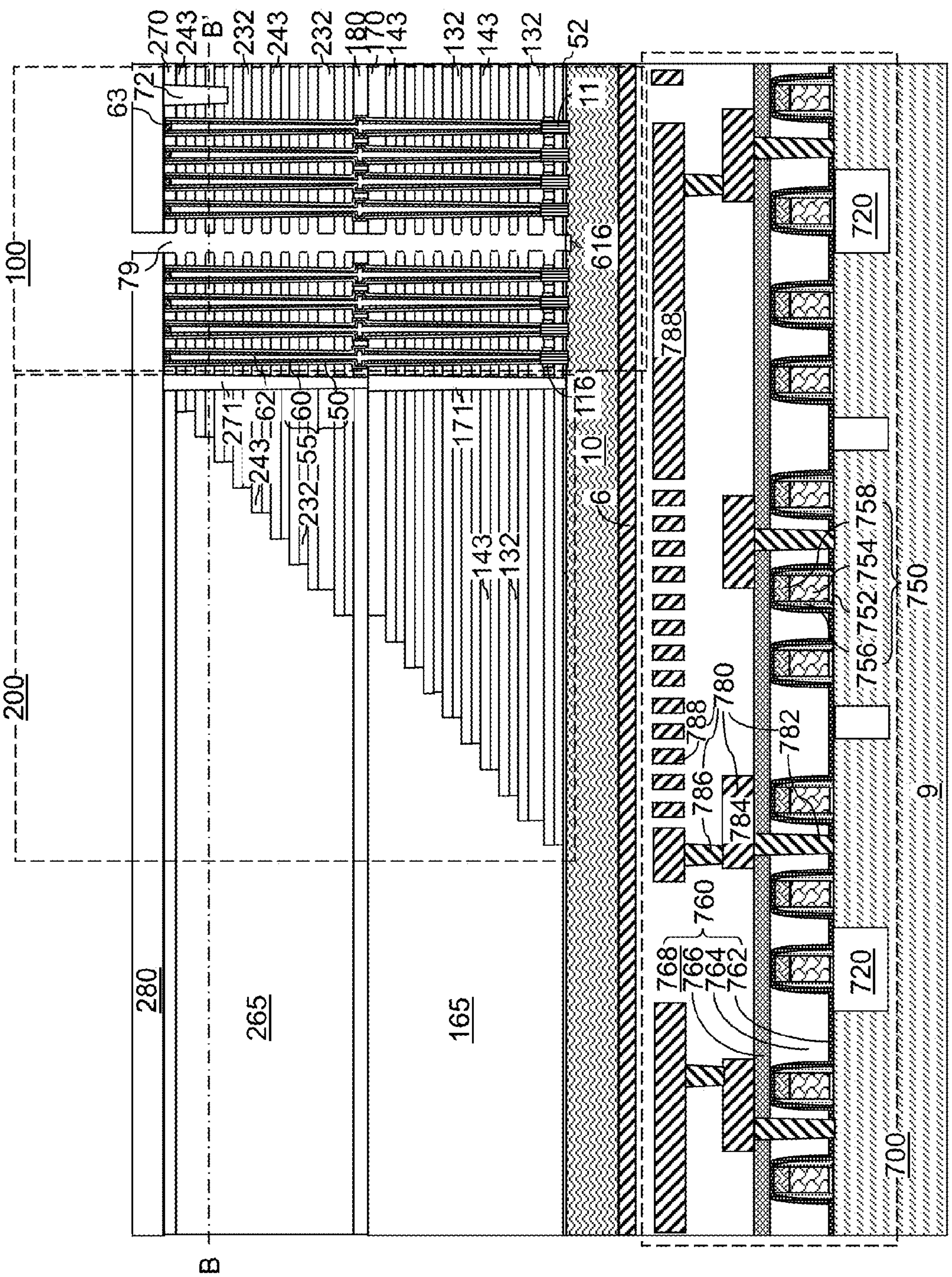
FIG. 14C is a vertical cross-sectional view of the first exemplary structure along the zig-zag vertical plane C-C' in FIG. 14B according to the first embodiment of the present disclosure.

Referring to FIGS. 14A-14C, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses 143 are formed in volumes from which the first sacrificial material layers 142 are removed. Second backside recesses 243 are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 9. A backside recess (143, 243) can be vertically bounded by a top surface of an underlying insulating layer (132 or 232) and a bottom surface of an overlying insulating layer (132 or 232). In one embodiment, each of the first and second backside recesses (143, 243) can have a uniform height throughout.

In one embodiment, a sidewall surface of each pedestal channel portion 11 can be physically exposed at each bottommost first backside recess 143 after removal of the first and second sacrificial material layers (142, 242). Further, a top surface of the planar semiconductor material layer 10 can be physically exposed at the bottom of each backside contact trench 79. An annular dielectric spacer 116 can be formed around each pedestal channel portion 11 by oxidation of a physically exposed peripheral portion of the pedestal channel portions 11. Further, a semiconductor oxide potion 616 can be formed from each physically exposed surface portion of the planar semiconductor material layer 10 concurrently with formation of the annular dielectric spacers 116.

Figure 15A:
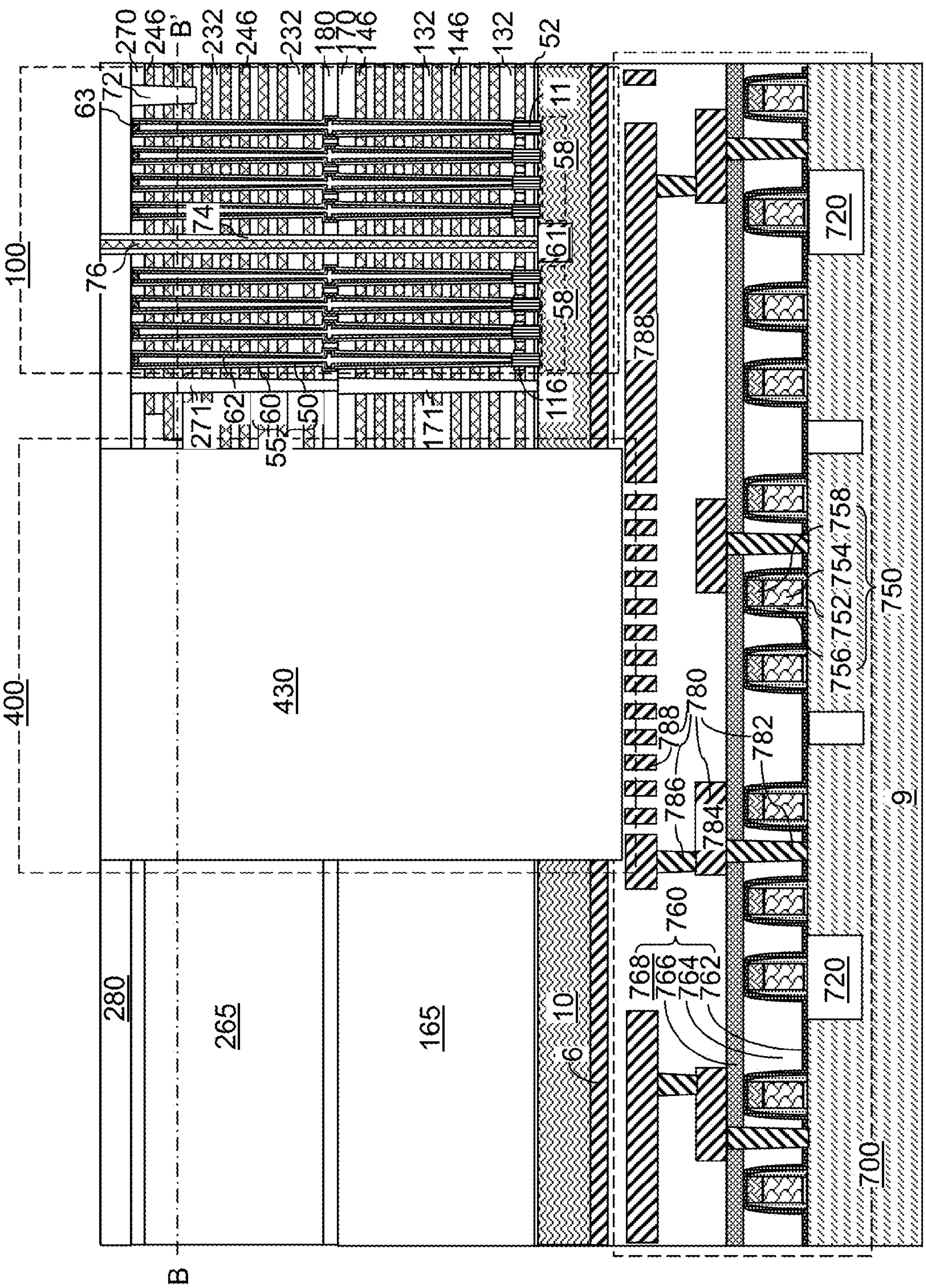
FIG. 15A is a vertical cross-sectional view of the first exemplary structure after formation of electrically conductive layers, insulating spacers, and backside contact via structures according to the first embodiment of the present disclosure.
Figure 15B:
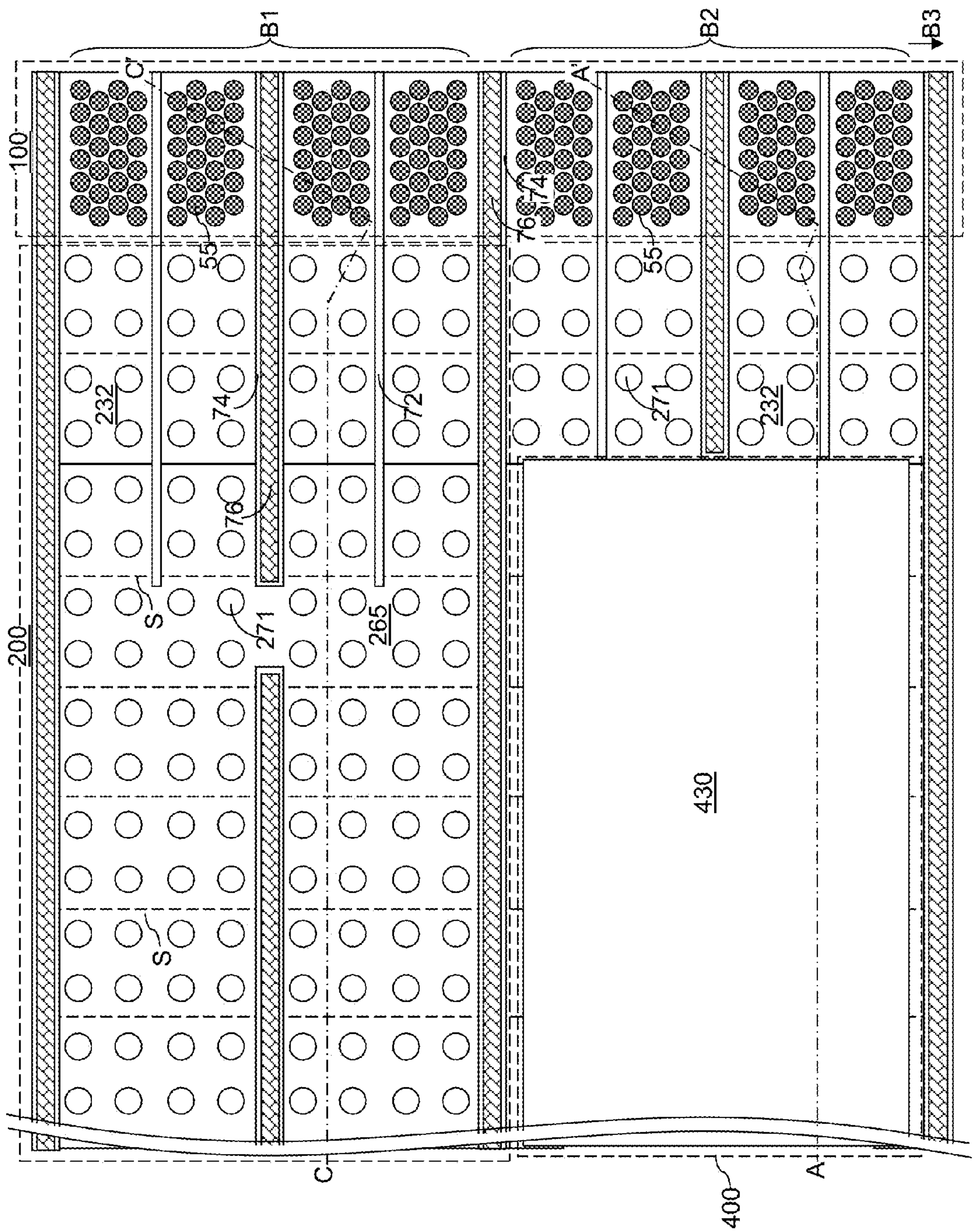
FIG. 15B is a horizontal cross-sectional view of the first exemplary structure along the horizontal plane B-B' in FIG. 15A. The zig-zag vertical plane A-A' corresponds to the plane of the vertical cross-sectional view of FIG. 15A.
Figure 15C:
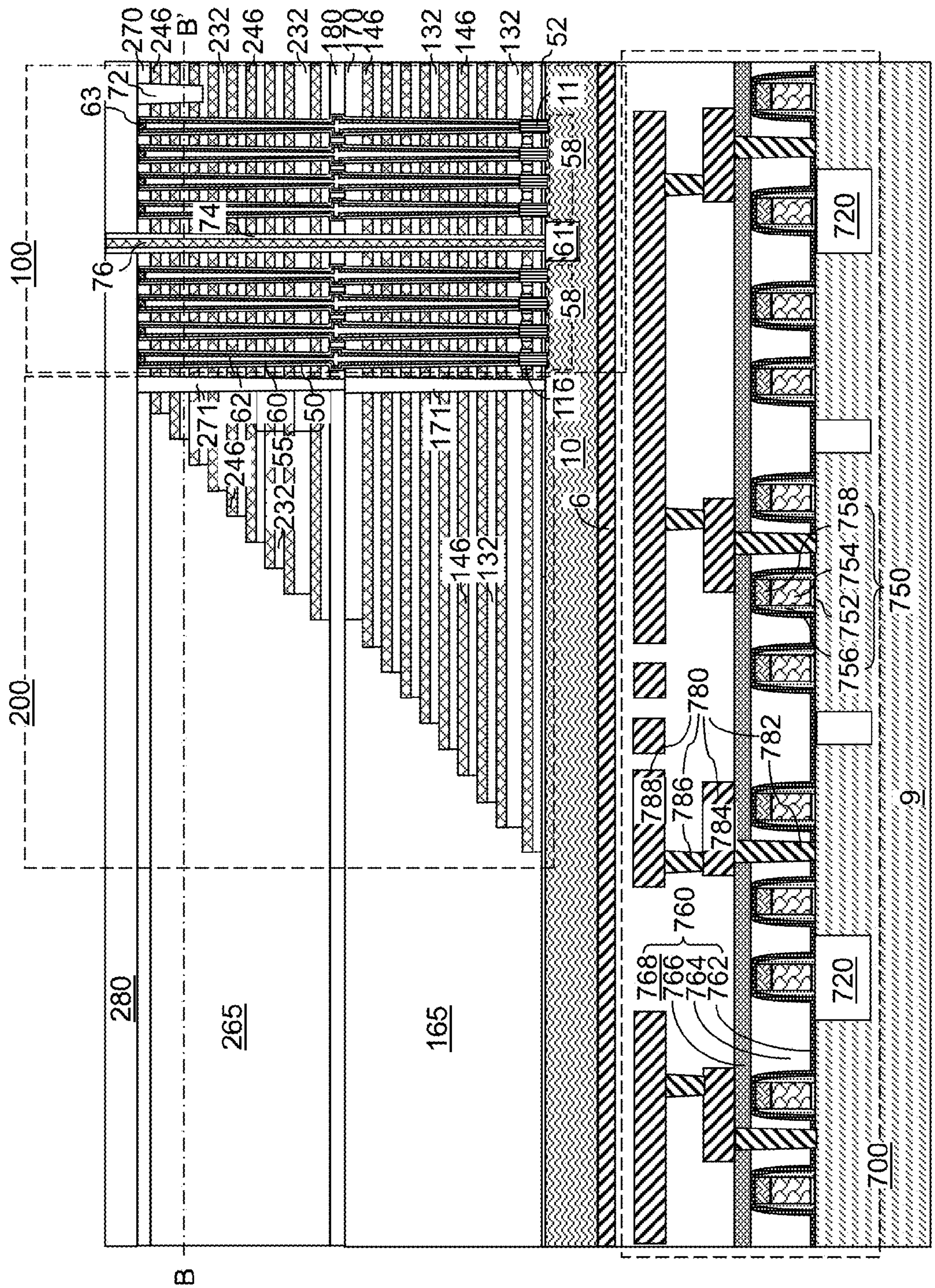
FIG. 15C is a vertical cross-sectional view of the first exemplary structure along the zig-zag vertical plane C-C' in FIG. 15B according to the first embodiment of the present disclosure.

Referring to FIGS. 15A-15C, a backside blocking dielectric layer (not shown) can be optionally deposited in the backside recesses (143, 243) and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses (143, 243), on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer 46L.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses (143, 243) include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses (143, 243) can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers 116 constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the semiconductor substrate 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the substrate semiconductor layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

The plurality of laterally-elongated contact via structures 76 laterally extend along the first horizontal direction hd1 and laterally divide the at least one alternating stack (132, 146, 232, 246) into a plurality of laterally spaced-apart blocks (B0, B1, B2, B3, . . . ), wherein the plurality of blocks comprises a set of three neighboring blocks including, in order, a first block B1, a second block b2, and third block B3 arranged along a second horizontal direction hd2 that is perpendicular to the first horizontal direction hd1 and including a first staircase region (such as the word line contact via region 200 illustrated in FIG. 13B), a second staircase region (such as the through-memory-level via region 400 illustrated in FIG. 13B), and a third staircase region (that can be located below the through-memory-level via region 400 in the third block B3 outside the area of FIG. 13B), respectively.

Figure 16A:
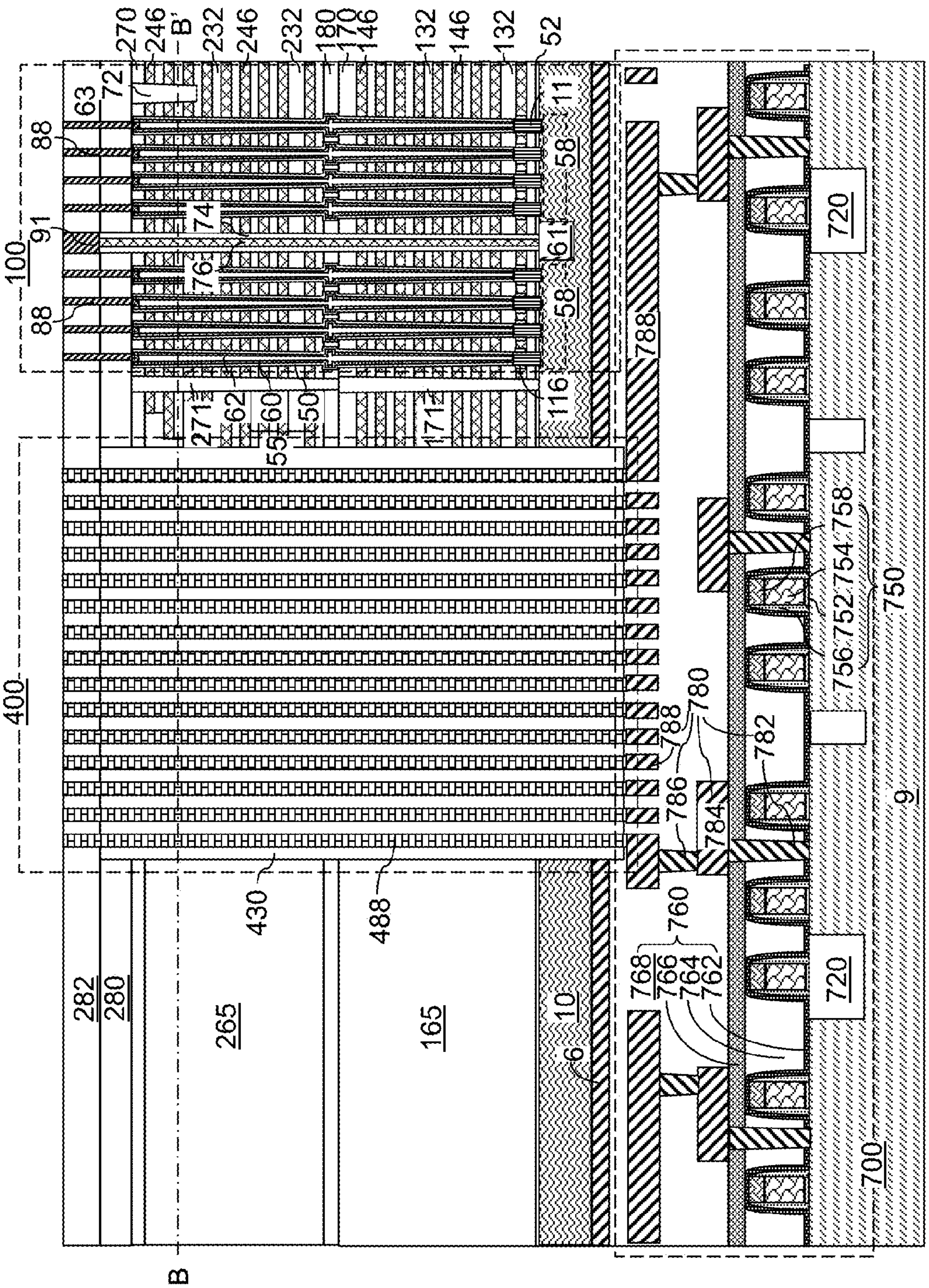
FIG. 16A is a vertical cross-sectional view of the first exemplary structure after formation of through-memory-level via structures, word line contact via structures, and upper level via structures according to the first embodiment of the present disclosure.
Figure 16B:
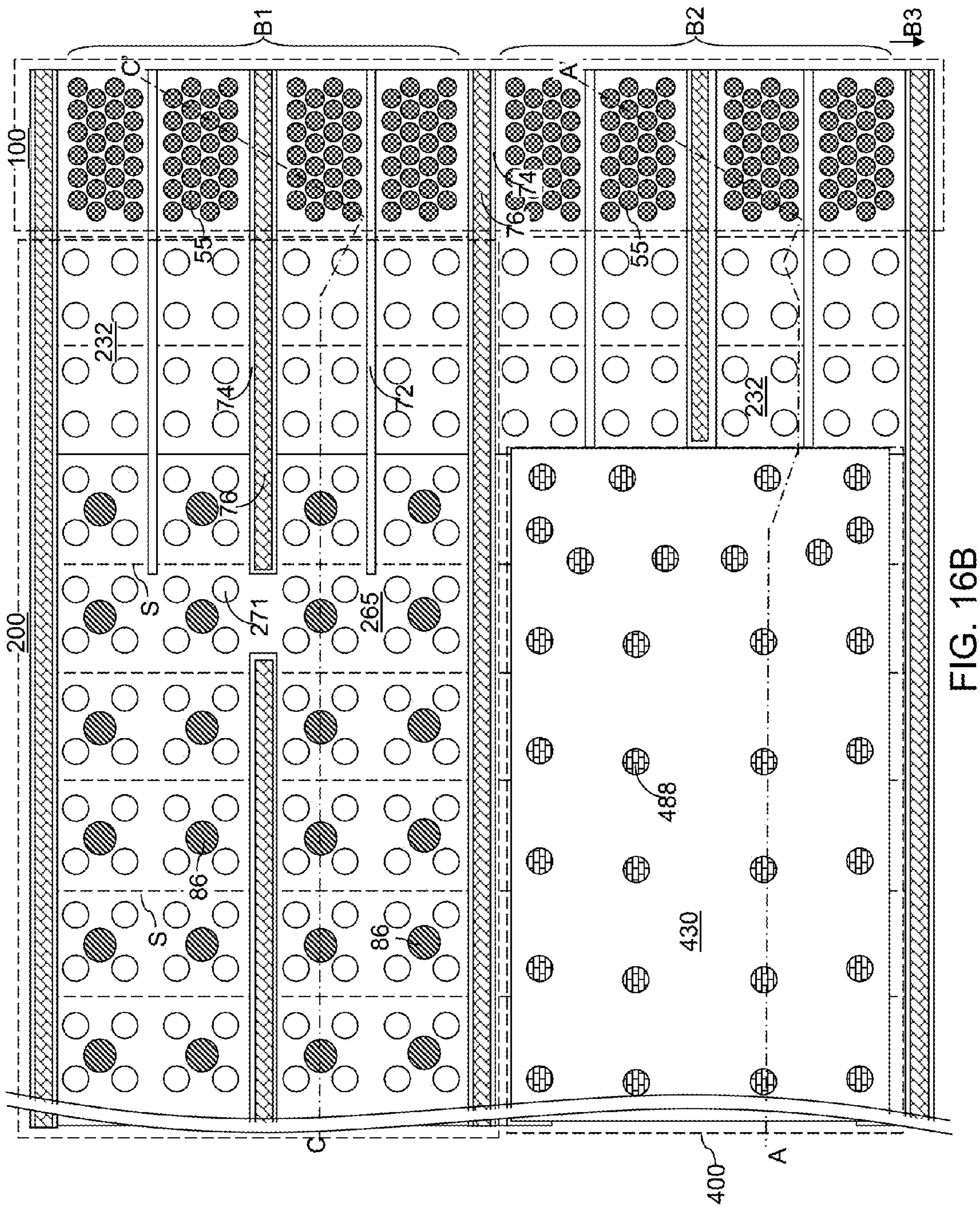
FIG. 16B is a horizontal cross-sectional view of the first exemplary structure along the horizontal plane B-B' in FIG. 16A. The zig-zag vertical plane A-A' corresponds to the plane of the vertical cross-sectional view of FIG. 16A.
Figure 16C:
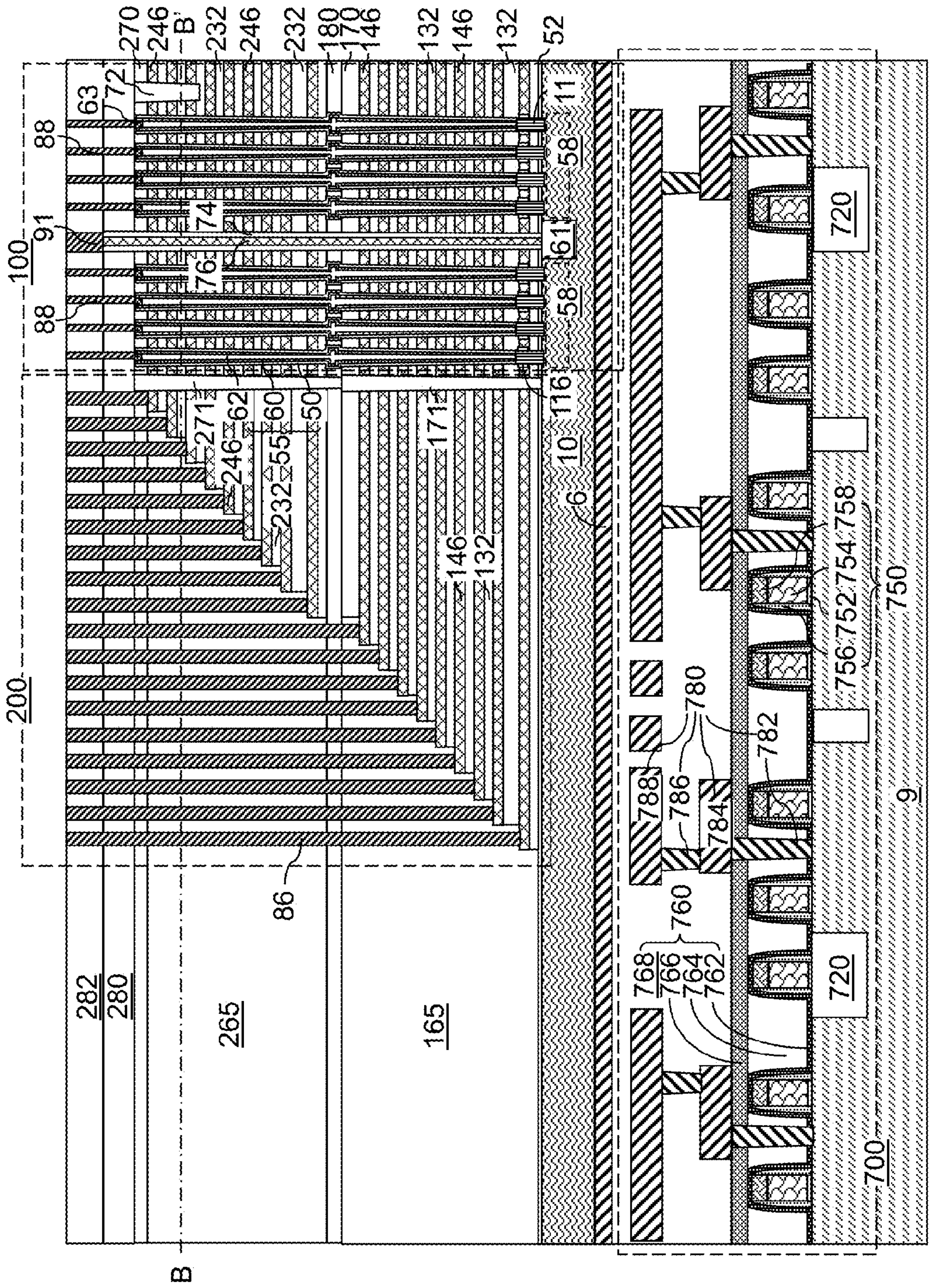
FIG. 16C is a vertical cross-sectional view of the first exemplary structure along the zig-zag vertical plane C-C' in FIG. 16B according to the first embodiment of the present disclosure.

Referring to FIGS. 16A-16C, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Various contact via structures can be formed through the contact level dielectric layers (280, 282), the dielectric fill material portion 430 and underlying dielectric materials on various nodes of the memory device in the memory-level assembly and on the lower level metal interconnect structures 780. Specifically, through-memory-level via structures 488 can be formed through the dielectric fill material portion 430 and optionally through the contact level dielectric layers (280, 282) to electrically contact (i.e., to be electrically coupled to) the lower level metal interconnect structures 780. Word line contact via structures 86 can be formed through the contact level dielectric layers (280, 282) and the second-tier retro-stepped dielectric material portion 265 in region 200.

A subset of the word line contact via structures 86 contacting the second electrically conductive layers 246 extends through the second-tier retro-stepped dielectric material portion 265 in region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in region 200.

Drain contact via structures 88 contacting the drain regions 63 can extend through the contact level dielectric layers (280, 282) and the second insulating cap layer 270 in the device region 100. A source connection via structure 91 can extend through the contact level dielectric layers (280, 282) to provide electrical connection to the laterally-elongated contact via structures 76 in region 100, 200 and/or 400.

Each via structure (488, 86, 88, 91) may be formed employing a respective set of patterning processes and fill processes. Alternatively, two or more types of via structures (488, 86, 88, 91) may be formed employing a common set of patterning processes and fill processes provided that the anisotropic etch process therein can control vertical extent of cavities at target height levels for each type of cavities that are simultaneously formed.

In one embodiment, the word line contact via structures 86 can be formed through the at least one retro-stepped dielectric material portion (165, 265) over the first staircase region (such as the illustrated word line contact via region 200 in FIG. 16B) and third staircase regions (another instance of the word line contact via region 200 below the illustrated area of FIG. 16B) and directly on respective portions of electrically conductive layers (146, 246) in the first and third blocks (B1, B3) (e.g., in odd numbered blocks), while not forming any contact via structure over the second staircase region (such as the illustrated through-memory-level via region 400 in FIG. 16B) (e.g., in even numbered blocks).

Each of the through-memory-level via structures 488 can be formed through the dielectric fill material portion 430 (e.g., in even numbered blocks). The through-memory-level via structures 488 may be formed separately from the other via structures (86, 88, 91) by patterning the dielectric fill material portion 430 and depositing a conductive material (e.g., TiN, WN, W, Al, Ti, Cu, etc.) into the openings in portion 430 to form the through-memory-level via structures 488. Alternatively, the through-memory-level via structures 488 may be formed during the same pattering and deposition steps as one or more of the other via structures (86, 88, 91) and/or of the backside contact via structures 76.

While odd and even numbered blocks are described above, it should be noted that regions 400 and 200 do not have to sequentially alternate on one side of region 100. For example, a set of two adjacent regions 200 may be separated by one region 400 or a set of adjacent two regions 400 on a given side (e.g., left or right side) of region 100. On one side (e.g., the left side) of the device region 100, a subset of the through-memory-level via structures 488 can be formed in regions 400 in the areas of even-numbered staircase regions after these even-numbered staircase regions, such as the second staircase region, are removed, while the odd-numbered staircase regions such as the first and third staircase regions remain intact. As used herein, a region or a structure "remains intact" if no substantial change in structure is made to the region or to the structure. Each of the through-memory-level via structures 488 vertically extends at least from a first horizontal plane including a topmost surface of the memory-level assembly to a second horizontal plane including a bottommost surface of the memory-level assembly.

Figure 17A:
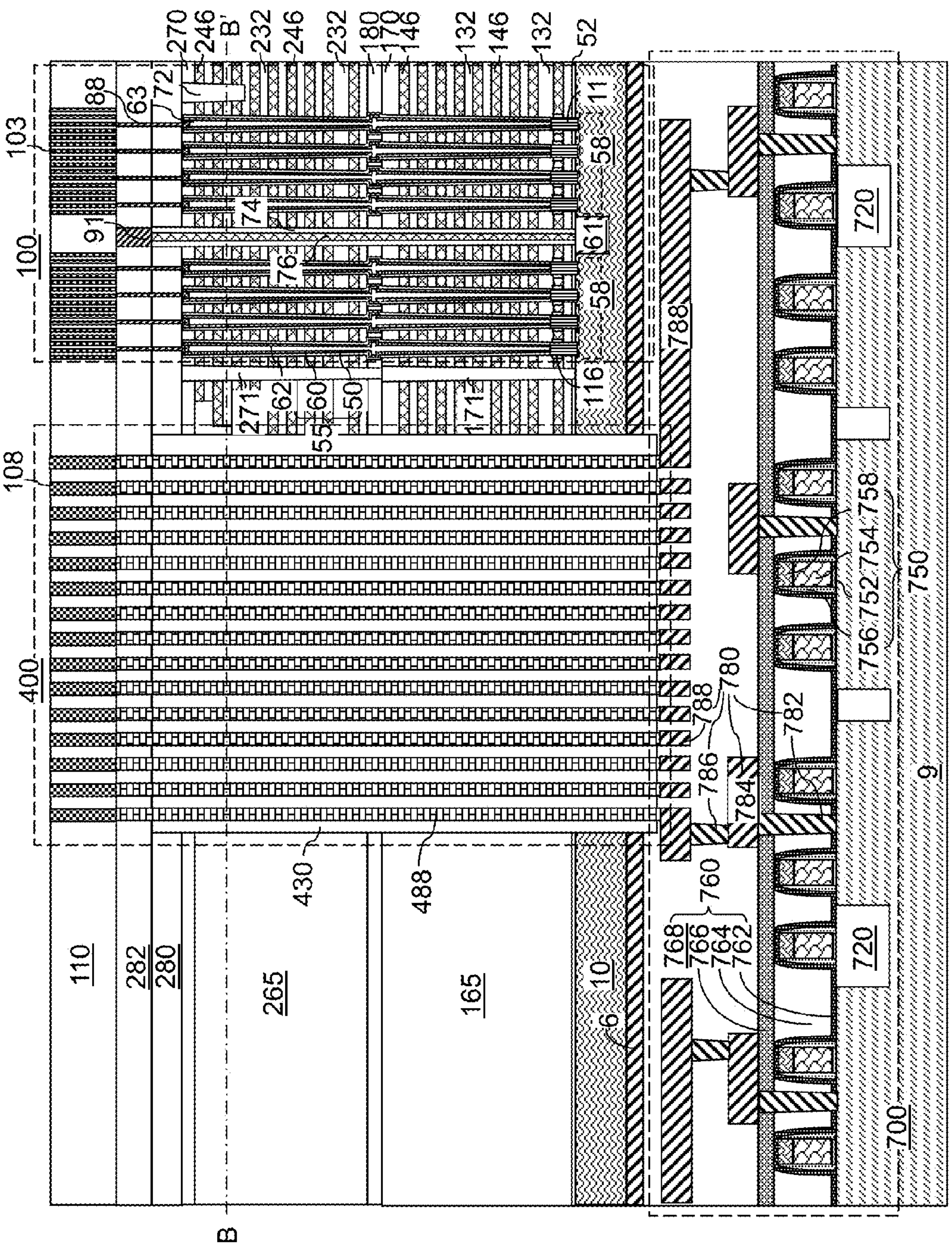
FIG. 17A is a vertical cross-sectional view of the first exemplary structure after formation of upper level line structures according to the first embodiment of the present disclosure.
Figure 17B:
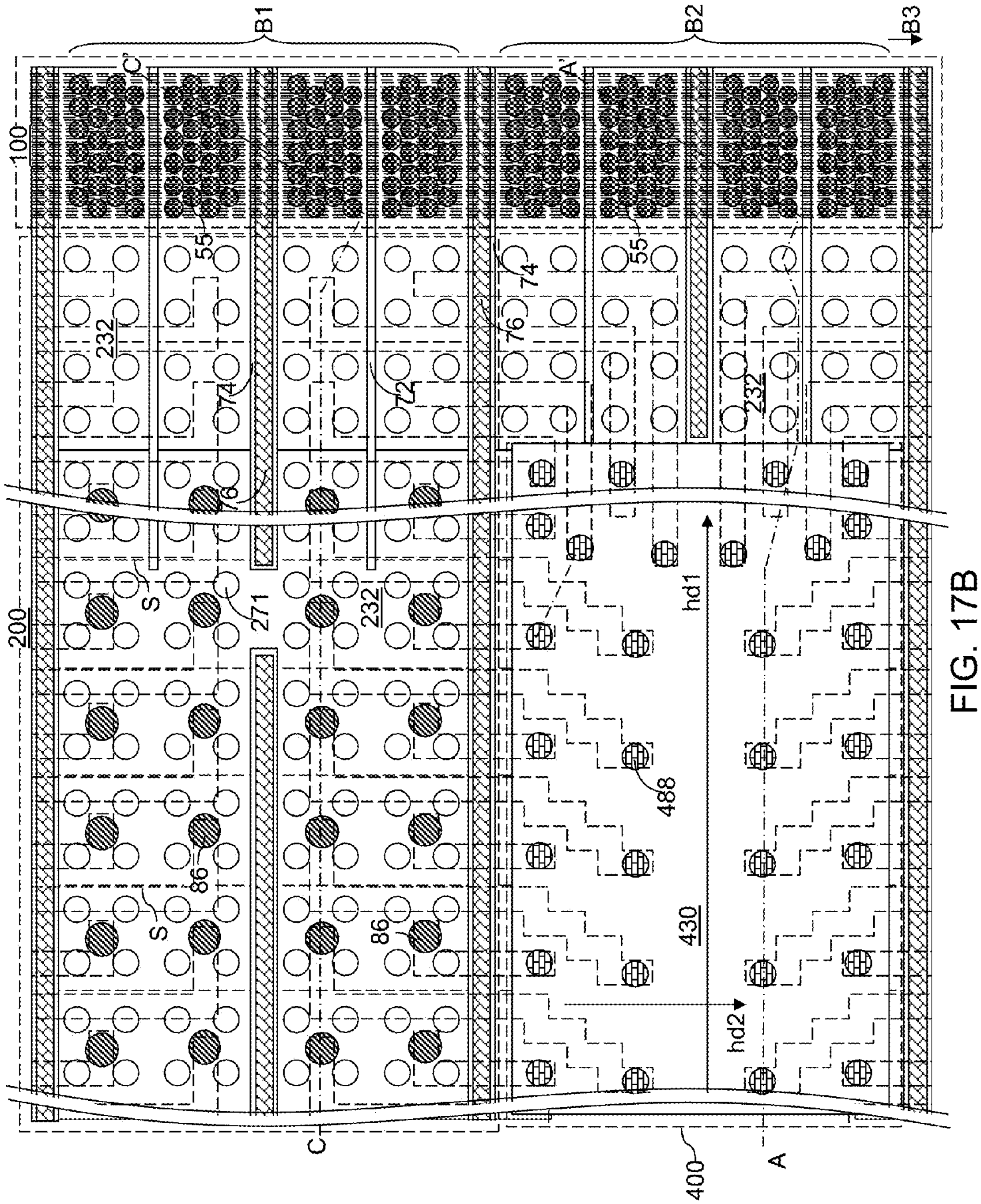
FIG. 17B is a horizontal cross-sectional view of the first exemplary structure along the horizontal plane B-B' in FIG. 17A. The zig-zag vertical plane A-A' corresponds to the plane of the vertical cross-sectional view of FIG. 17A. Patterns of the upper level line structures are overlaid in dotted shapes.
Figure 17C:
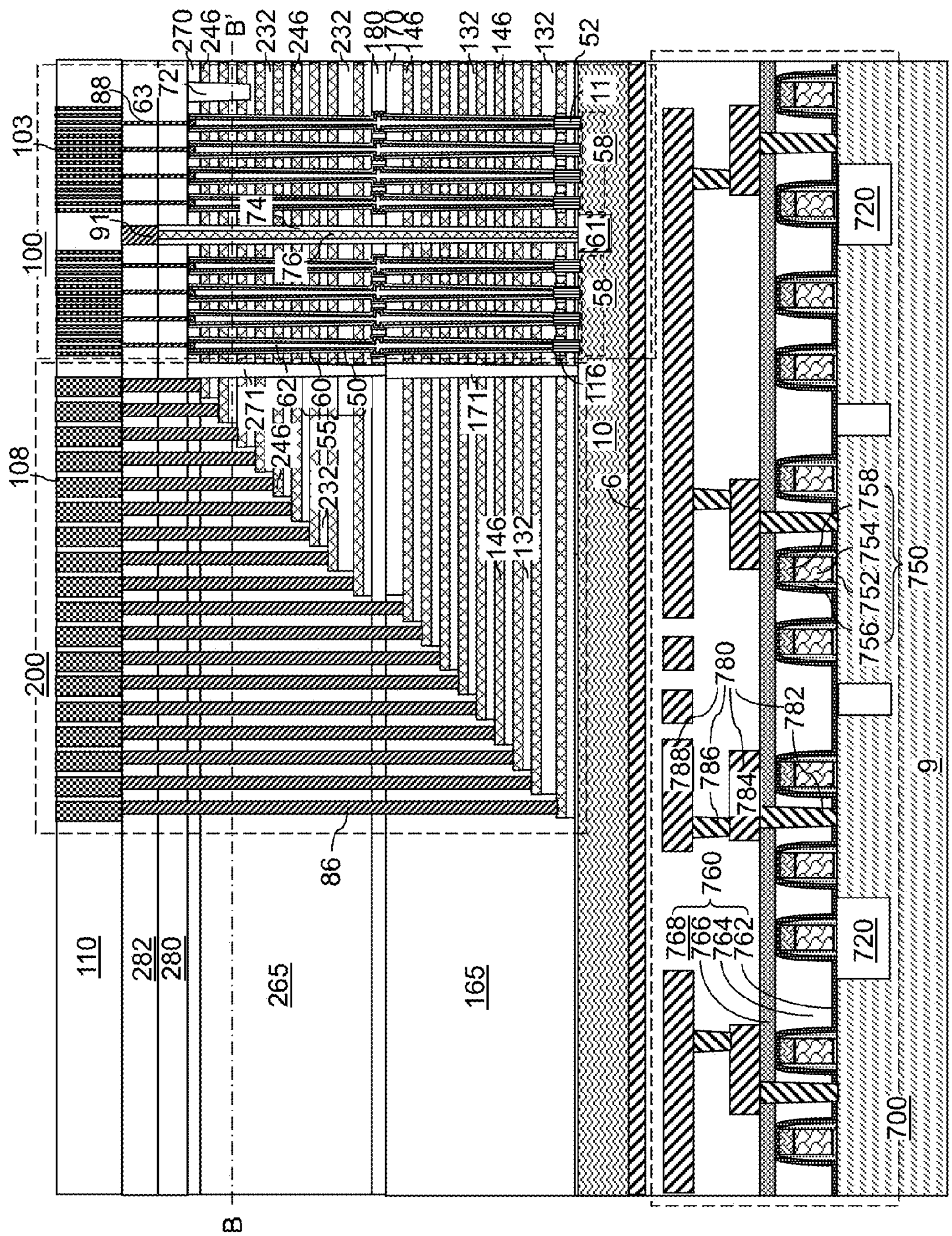
FIG. 17C is a vertical cross-sectional view of the first exemplary structure along the zig-zag vertical plane C-C' in FIG. 17B according to the first embodiment of the present disclosure.
Figure 17D:
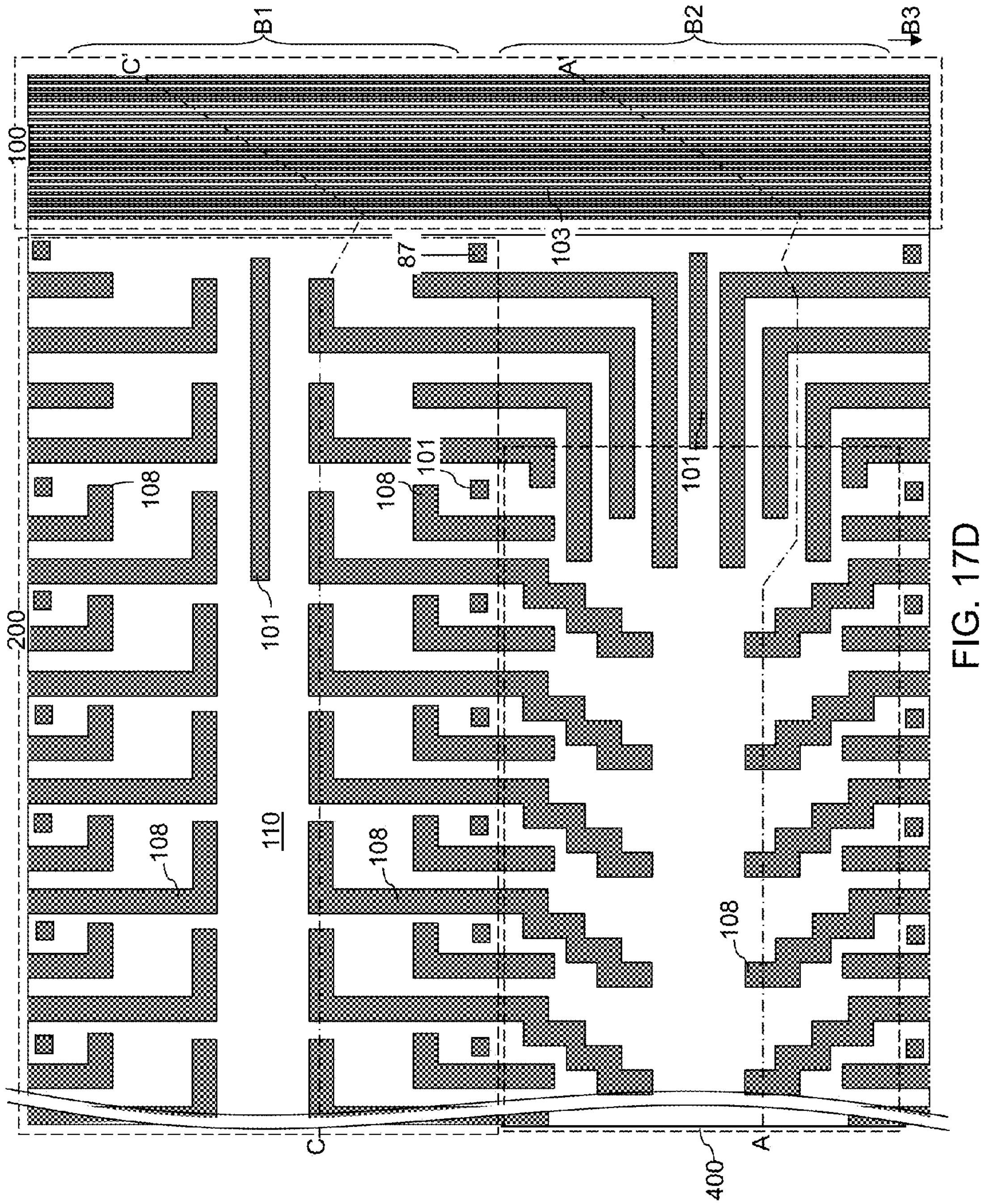
FIG. 17D is a top-down view of the first exemplary structure according to the first embodiment of the present disclosure.
Figure 17E:
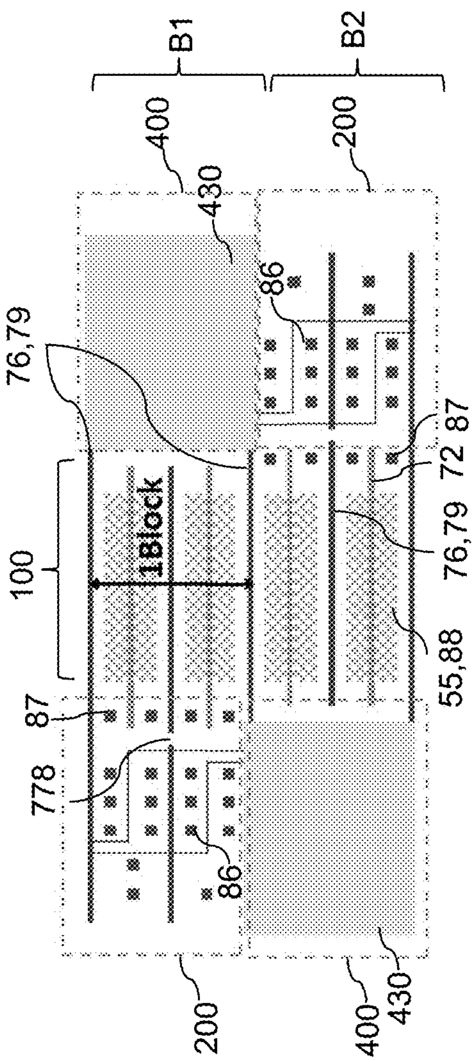
FIGS. 17E and 17F are top-down views of an alternative exemplary structure according to the first embodiment of the present disclosure.

In contrast, as shown in FIG. 17E, on the opposite side (e.g., right side) of region 100, subset of the through-memory-level via structures can be formed in regions 400 in the areas of odd-numbered staircase regions after these odd-numbered staircase regions, such as the first staircase region, are removed, while the even-numbered staircase regions, such as the second staircase region remains intact.

Thus, as shown in FIGS. 2 to 7, a plurality of alternating respective sacrificial layers (142, 242) and insulating layers (132, 232) are deposited to form the at least one alternating stack. A plurality of backside trenches 79 are then formed which laterally extend along the first horizontal direction hd1 through the at least one alternating stack, as shown in FIGS. 13A-13B. The sacrificial layers (142, 242) are selectively removed from the at least one alternating stack through the plurality of backside trenches 79 to form a plurality of backside recesses (143, 243) between the insulating layers (132, 232), as shown in FIGS. 14A-14C.

The plurality of electrically conductive layers (146, 246) are formed in the backside recesses through the plurality of backside trenches, the insulating spacers 74 are formed in the plurality of backside trenches 79, and the plurality of laterally-elongated contact via structures 76 are formed in the plurality of backside trenches 79 over the insulating spacers 74, as shown in FIGS. 15A-15C.

The step of forming the plurality of electrically conductive layers in the backside recesses through the plurality of backside trenches occurs after to the steps of removing the second staircase region and forming the dielectric fill material portion 430, shown in FIGS. 11A-12B. The step of removing the second staircase region comprises removing the insulating layers and the sacrificial layers in the second staircase region to form the through-memory-level opening 769. The electrically conductive layers 46 are not formed in the dielectric fill material portion 430 located in the through-memory-level opening 769.

Figure 17F:
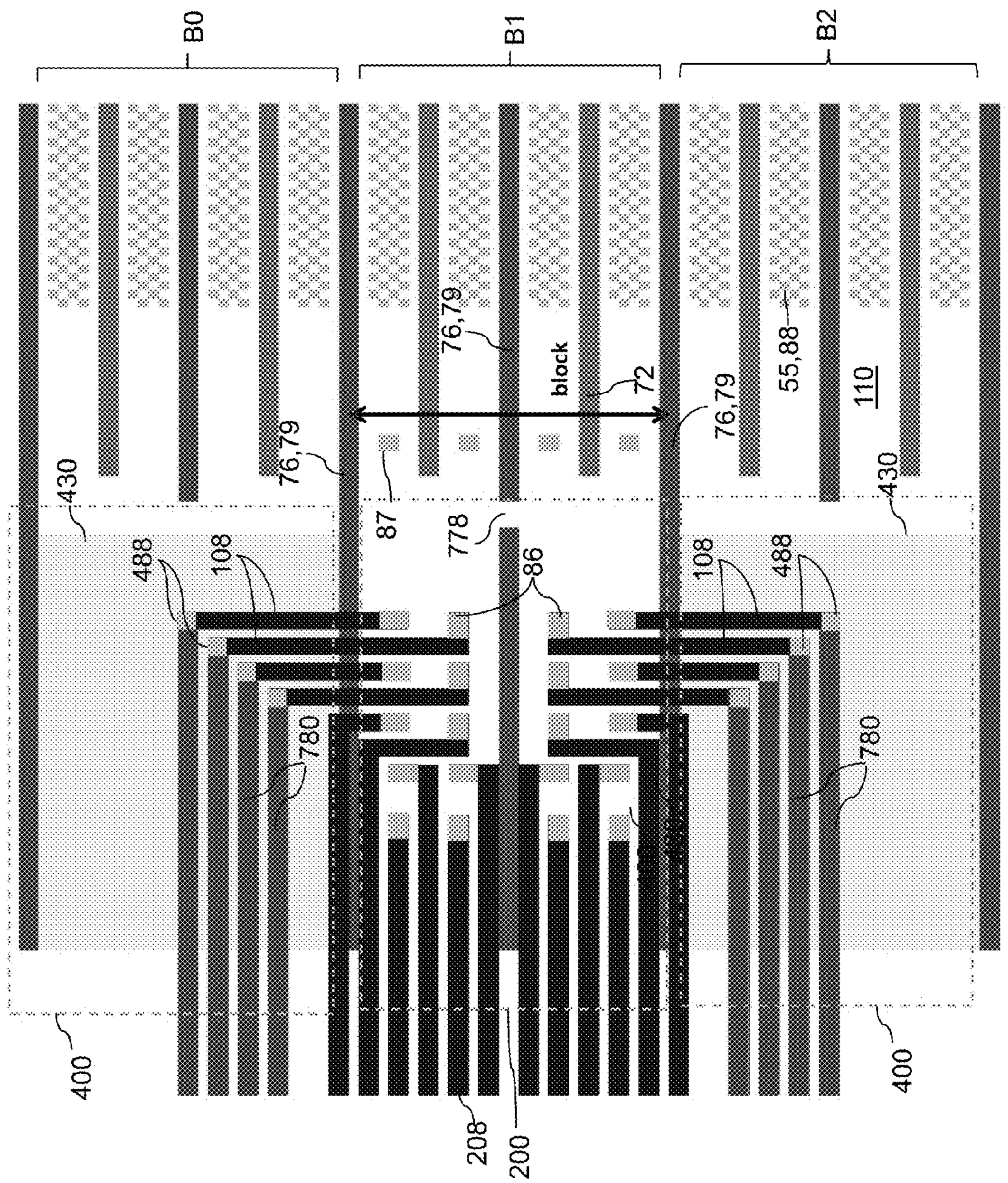

Referring to FIGS. 17A-17F, a line level dielectric layer 110 can be formed over the contact level dielectric layers (280, 282). Various metal interconnect structures (108, 103, 101) can be formed in the line level dielectric layer 110. The metal interconnect structures (108, 103, 101) can include upper level metal interconnect structures 108 that are electrically coupled to (e.g., formed on or in physical contact with) respective pairs of a word line contact via structure 86 and a through-memory-level via structure 488, bit lines 103 that extend along the second horizontal direction hd2 and perpendicular to the first horizontal direction hd1, and source connection line structures 101 that contact the source connection via structures 91 to provide electrically conductive paths for biasing the source regions 61 through the laterally-elongated contact via structures 76. Drain side select gate electrode contact via structures 87 are located in regions 200 adjacent to the device region 100. There may be two or more steps in each sub-block between adjacent backside contact trenches 79 in region 200 exposing two or more vertically separated word lines from adjacent device levels. In this case, there are two or more word line contact via structures 86 (e.g., two structures 86 as shown in FIGS. 17E and 17F) located parallel to each other in the same sub-block to contact the respective vertically separated word lines.

An exemplary layout for the upper level metal interconnect structures 108 is illustrated in FIGS. 17B and 17D. FIG. 17D is a top-down view, and FIG. 17B is a horizontal cross-sectional view in which the shapes of the upper level metal interconnect structures 108 and the bit lines 103 are illustrated in dotted lines. The upper level metal interconnect structures 108 can extend across neighboring blocks, i.e., straddle a respective laterally-elongated contact via structure 76. For example, some of the upper level metal interconnect structures 108 can extend across the second block and one of the first and third blocks. FIGS. 17E and 17F illustrate another exemplary layout of the upper level metal interconnect structures. In this embodiment, some upper level metal interconnect structures 108 are electrically coupled to the lower level metal interconnect structures 780 by the through-memory-level via structures 488 located in region 400 and are electrically coupled to the word lines 46 by the word line contact via structures 86 in region 200. Other upper level metal interconnect structures 208 are electrically coupled to the word lines 46 by the word line contact via structures 86 in region 200, but are not electrically coupled to the lower level metal interconnect structures 780 by the through-memory-level via structure 488 located in region 400. These upper level metal interconnect structures 208 may be electrically coupled to the driver circuit devices at a location other than region 400. The bit lines 103 are formed over the memory-level assembly, and are electrically coupled to nodes (e.g., drain regions 63) of the memory stack structures 55 by the drain contact via structures 88. As used herein, a first element is electrically coupled to a second element if there exists any one of an electrical short (i.e., Ohmic contact), electron tunneling communication, or a resistive (i.e., Schottky) contact between the first element and the second element. In this case, the upper level metal interconnect structures 108 can be electrically shorted to respective word lines as embodied as electrically conductive layers 46 by the word line contact via structures 86.

The first exemplary structure includes a memory-level assembly located over a semiconductor substrate 9 and including at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). A plurality of laterally-elongated contact via structures 76 vertically extend through the memory-level assembly, laterally extend along a first horizontal direction hd1, and laterally divides the at least one alternating stack (132, 146, 232, 246) into a plurality of laterally spaced-apart blocks (B0, B1, B2, B3, . . . ). The plurality of blocks (B0, B1, B2, B3, . . . ) comprise a set of at least three neighboring blocks including, in order, a first block B1, a second block B2, and third block B3 arranged along a second horizontal direction hd2 that is perpendicular to the first horizontal direction hd1. A through-memory-level via region 400 is located on a lengthwise end of the second block B2 and between a staircase region of the first block B1 and a staircase region of the third block B3.

Each staircase region of the first and third blocks (B1, B3) includes terraces in which each underlying electrically conductive layer (146 or 246) extends farther along the first horizontal direction hd1 than any overlying electrically conductive layer (146 or 246) in the memory-level assembly. The through-memory-level via region 400 comprises through-memory-level via structures 488 that vertically extend at least from a first horizontal plane including a topmost surface of the memory-level assembly to a second horizontal plane including a bottommost surface of the memory-level assembly.

At least one lower level dielectric layer 760 overlies the semiconductor substrate 9. A planar semiconductor material layer 10 overlies the at least one lower level dielectric layer 760, and includes horizontal semiconductor channels 58 electrically connected to vertical semiconductor channels 60 within the memory stack structures 55. Semiconductor devices 710 (e.g., CMOS transistors of the word line driver circuit(s)) can be located on the semiconductor substrate 9. Lower level metal interconnect structures 780 can be electrically shorted to nodes (e.g., source, drain and/or gate electrode) of the semiconductor devices 710 and embedded in the at least one lower level dielectric layer 760 that underlies the planar semiconductor material layer 10. The through-memory-level via structures 488 contact the lower level metal interconnect structures 780.

Upper level metal interconnect structures 108 overlie the memory-level assembly, and are embedded in at least one upper level dielectric layer 110. At least a portion of the upper level metal interconnect structures 108 are each electrically coupled to the respective lower level metal interconnect structure 780 by the respective through-memory-level via structure 488 located in region 400 and are electrically coupled to the respective word line 46 by the respective word line contact via structures 86 in region 200. Bit lines 103 also overlie the memory-level assembly and are electrically coupled to nodes of the memory stack structures 55 (through drain regions 63), and are embedded in at least one upper level dielectric layer 110. Each of the memory stack structures 55 comprises a vertical stack of memory elements located at each level of the electrically conductive layers (146, 246). The electrically conductive layers (146, 246) comprise word lines for the memory elements. In one embodiment, the semiconductor devices can comprise word line switch devices configured to control a bias voltage to respective word lines.

In one embodiment, each of the through-memory-level via structures 488 can contact a respective underlying lower level metal interconnect structure 780. In one embodiment, a subset of the semiconductor devices 710 on the semiconductor substrate 9 can be located underneath an area of the planar semiconductor material layer 10, i.e., has an areal overlap with the overlying planar semiconductor material layer 10.

In one embodiment, a dielectric fill material portion 430 can be located within the through-memory-level via region 400. The dielectric fill material portion 430 can laterally surround the through-memory-level via structures 488, and can vertically extend at least from a first horizontal plane including a topmost surface of the memory-level assembly to a second horizontal plane located underneath a bottommost surface of the memory-level assembly.

The planar semiconductor material layer 10 underlies the memory-level assembly, and can include horizontal semiconductor channels 58 electrically connected to vertical semiconductor channels 60 within the memory stack structures 55. The second horizontal plane is located underneath a bottom surface of the planar semiconductor material layer. In one embodiment, the dielectric fill material portion 430 can comprise substantially vertical sidewalls that extend through the memory-level assembly and the planar semiconductor material layer 10.

In one embodiment, a plurality of laterally-elongated contact via structures 76 can vertically extend through the memory-level assembly, laterally extend along a first horizontal direction hd1, and laterally divide the memory-level assembly into a plurality of laterally spaced-apart blocks (B0, B1, B2, B3, . . . ). The plurality of blocks can comprise, for example, a set of three neighboring blocks including, in order, a first block B1, a second block B2, and third block B3 arranged along a second horizontal direction hd2 that is perpendicular to the first horizontal direction hd1. The dielectric fill material portion 430 can be located on a lengthwise end of the second block B2 and between a staircase region of the first block B1 and a staircase region of the third block B3. Each staircase region of the first and third blocks (B1, B3) can include terraces in which each underlying electrically conductive layer (146 or 246) extends farther along the first horizontal direction than any overlying electrically conductive layer (146 or 246) within the memory-level assembly.

Each of the memory stack structures 55 can comprise a memory film 50 and a vertical semiconductor channel 60 that is adjoined to a respective horizontal channel 58 within the planar semiconductor material layer 10 underlying the memory-level assembly. The word line contact via structures 86 can extend through a retro-stepped dielectric material portion (265, 165) that overlies the staircase regions of the first and third blocks (B1, B3) in regions 200, and can contact respective portions of electrically conductive layers (146, 246) in the first and third blocks (B1, B3). The upper level metal interconnect structures 108 can electrically short respective pairs of a word line contact via structure 86 and a through-memory-level via structure 488, can overlie the memory-level assembly, and can straddle the second block B2 in region 400 and one of the first and third blocks (B1, B3) in region 200.

Figure 18:
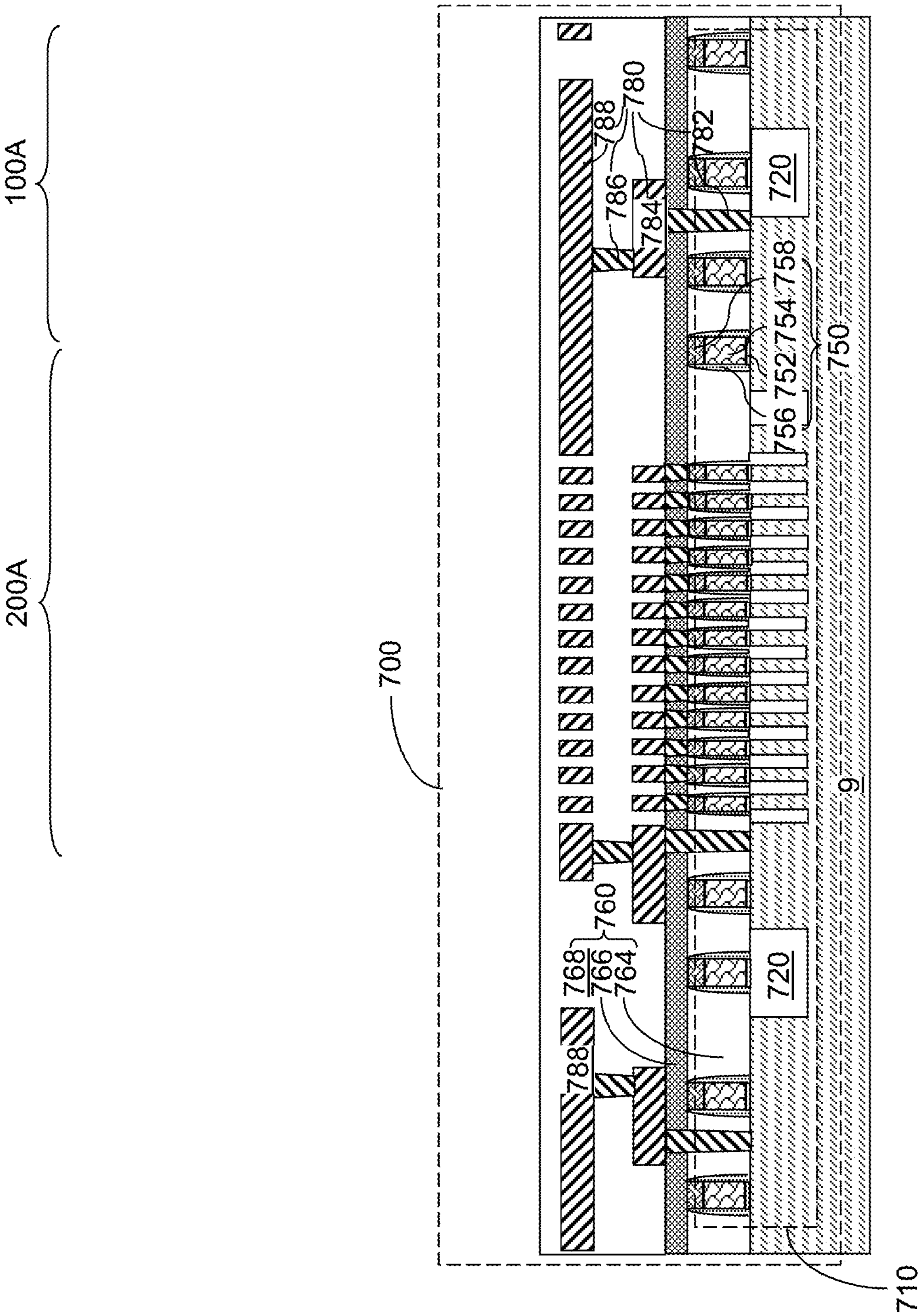
FIG. 18 is a vertical cross-sectional view of a second exemplary structure after formation of semiconductor devices, lower level metal interconnect structures, and at least one lower level dielectric layer according to a second embodiment of the present disclosure.

Referring to FIG. 18, a second exemplary structure according to a second embodiment of the present disclosure is illustrated. Specifically, in this second embodiment, the word line switching devices 710 employed for the semiconductor devices of the second exemplary structure are located in region 400 rather than under region 100 as in the first embodiment. Otherwise, the steps and structure described above with respect to the first embodiment can be used in the second embodiment. The second exemplary structure can be derived from the first exemplary structure of FIGS. 1A and 1B by altering the semiconductor devices and the pattern of the lower level metal interconnect structures 780.

In an illustrative example, the word line switching devices 710 can be field effect transistors in a CMOS configuration that are formed in the through-memory-level via regions 400. Optionally, a subset of the word line switching devices may be formed outside the areas of the through-memory-level via regions 400, such as a portion under the area of the memory array region 100 or under the areas of the word line contact via regions 200 and. The active regions 730 (source regions 742 and drain regions 744 shown in FIG. 1A) of the word line switching devices can be laterally surrounded by a shallow trench isolation structures 720.

The lower level metal interconnect structures 780 can be embedded in at least one lower level dielectric layer 760, and can be electrically shorted to nodes of the word line switching devices located on or over the semiconductor substrate 9. The lower level metal interconnect structures 780 can be configured such that the lower level topmost metal structures 788 provide suitable landing pads for through-memory-level via structures to be subsequently formed within each area of the through-memory-level via region 400.

Figure 19A:
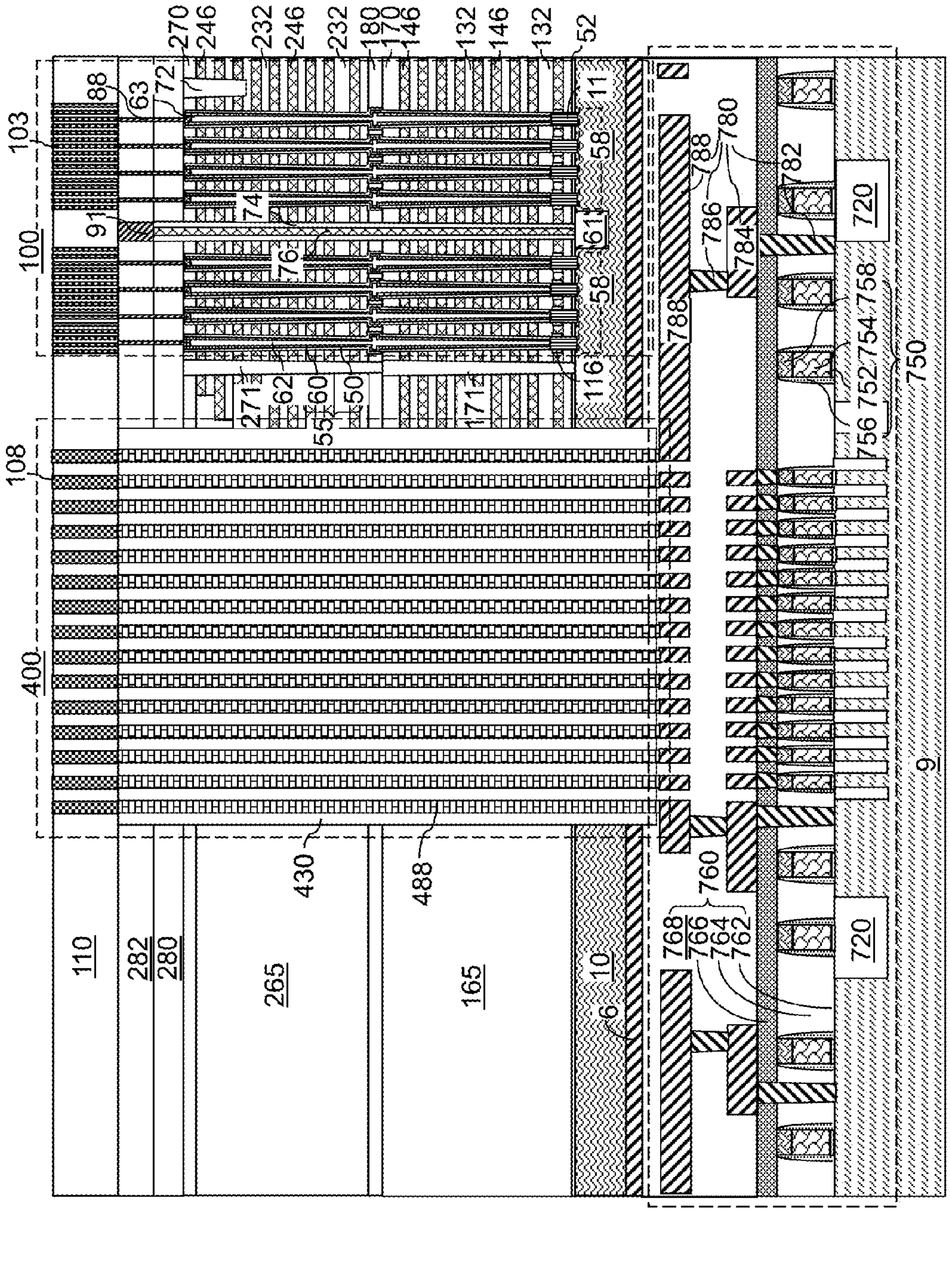
FIG. 19A is a vertical cross-sectional view of the second exemplary structure after formation of through-memory-level via structures and upper level metal interconnect structures according to the second embodiment of the present disclosure.
Figure 19B:
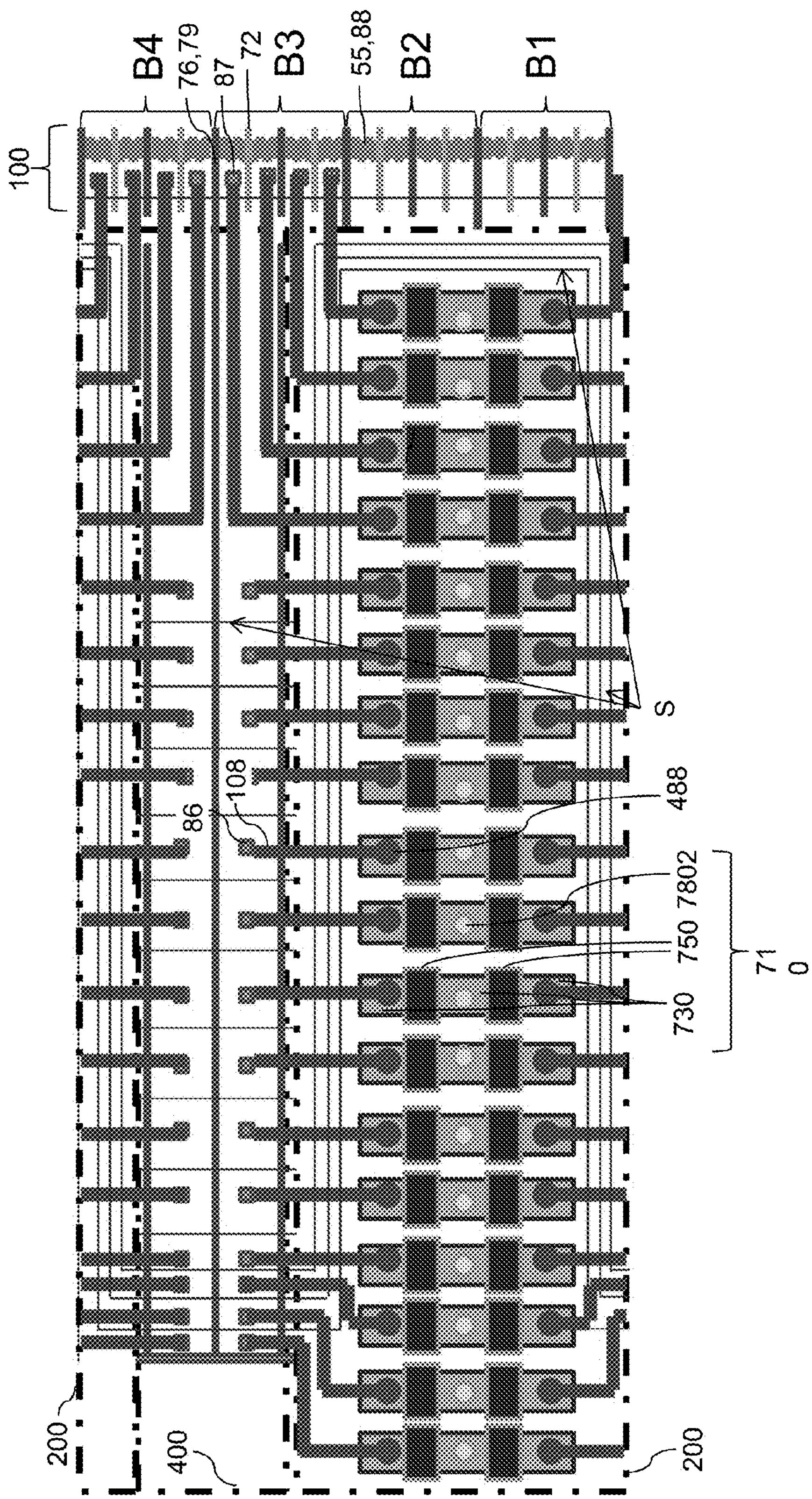
FIG. 19B is cutaway plan view of the metal interconnect structures according to the second embodiment of the present disclosure.

Referring to FIGS. 19A-19B, the processing steps of FIG. 2-FIGS. 17A-17D are performed to form a planar semiconductor material layer 10, a memory-level assembly, various contact via structures (88, 86, 91, 488), a line level dielectric layer 110, and metal interconnect structures (108, 101) and bit lines 103 embedded in the line level dielectric layer 110.

In one embodiment, the field effect transistors of the word line switching devices can be paired in a CMOS configuration as shown in FIG. 19B to share a common power supply node, which can be a source region or a drain region 730 that is connected to a power supply metal interconnect structure 7802. Gate structures 750 can straddle channel regions of the field effect transistors. Switched output node metal interconnect structures can be connected to an output node of each field effect transistor, which can be a drain region or the source region of the respective field effect transistor. The power supply metal interconnect structures 7802 and the switched output node metal interconnect structures are subsets of the lower level metal interconnect structures 780. The word line switching devices can be arranged as a periodic array that is repeated along the second horizontal direction hd2 with the periodicity of the width of two neighboring blocks (such as the width of the combination of the first block B1 and the second block B2).

Specifically, as shown in FIG. 19A, a planar semiconductor material layer 10 can be formed over the at least one lower level dielectric layer 760. The memory-level assembly can be formed over the planar semiconductor material layer 10, and the planar semiconductor material layer 10 can include horizontal semiconductor channels 58 electrically connected to vertical semiconductor channels 60 within the memory stack structures 55. A memory-level assembly can be formed over the semiconductor substrate 9 and the planar semiconductor layer 10. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). Each of the memory stack structures 55 comprises a vertical stack of memory elements located at each level of the electrically conductive layers (146, 246). The electrically conductive layers (146, 246) comprise word lines for the memory elements.

The at least one alternating stack (132, 146, 232, 246) comprises staircase regions that include terraces in which each underlying electrically conductive layer (146, 246) extends farther along a first horizontal direction than any overlying electrically conductive layer (146, 246) in the memory-level assembly. At least one retro-stepped dielectric material portion (165, 265) can be formed over the staircase regions on the at least one alternating stack (132, 146, 232, 246).

A plurality of laterally-elongated contact via structures 76 is formed through the memory-level assembly. The plurality of laterally-elongated contact via structures 76 laterally extends along the first horizontal direction hd1 and laterally divides the at least one alternating stack (132, 146, 232, 246) into a plurality of laterally spaced-apart blocks (B1, B2, B3, B4, . . . ). The plurality of blocks (B1, B2, B3, B4, . . . ) comprises a set of three neighboring blocks including, in order, a first block B1 a second block B2, a third block B3 and fourth block B4 arranged along a second horizontal direction hd2 that is perpendicular to the first horizontal direction hd1 and including a first staircase region (such as the word line contact via region 200 containing the remaining the staircases of the third and fourth blocks B3 and B4), and a second staircase region (from which the staircases was removed, such as the through-memory-level via region 400 of the first and second blocks B1 and B2), and a third staircase region (such as the word line contact via region 200 containing the remaining third staircase of the additional blocks, such as B0 (not shown for clarity)), respectively.

A through-memory-level opening 769 extending through the memory-level assembly can be formed in the areas of removed staircase regions such as the second staircase region. The through-memory-level opening 769 can extend into the at least one lower level dielectric material layer 760. The through-memory-level opening 769 can comprise substantially vertical sidewalls that extend through the memory-level assembly and the planar semiconductor material layer 10. A dielectric fill material portion 430 can be formed in the through-memory-level opening 769. These steps are then followed by forming the backside trenches 79, replacing the sacrificial material layers (142, 242) with electrically conductive layers (146, 246) and forming the insulating spacer 74 and the contact via structure (e.g., source electrode or local interconnect) 76 in the backside trenches 79, as described above.

The word line contact via structures 86 can be formed on, and over, the portions of the electrically conducive layers (146, 246) in the remaining staircase regions such as the first and third staircase regions, while not forming any contact via structure over removed staircase regions such as the second staircase region at the same time. The word line contact via structures 86 can be formed through the at least one retro-stepped dielectric material portion (165, 265) over the remaining staircase regions such as the first and third staircase regions and directly on respective portions of electrically conductive layers (146, 246) in the first and third blocks (B1, B3), while not forming any contact via structure over removed staircase regions such as the second staircase region B2 at the same time.

Each of the through-memory-level via structures 488 can be formed through the dielectric fill material portion 430 as described in the prior embodiment. Each of the through-memory-level via structures 488 vertically extends at least from a first horizontal plane including a topmost surface of the memory-level assembly to a second horizontal plane including a bottommost surface of the memory-level assembly.

Nodes of the word line switching devices can be electrically connected to portions of the electrically conducive layers (146, 246) in the remaining staircase regions such as the first and third staircase regions employing through-memory-level via structures 488 formed in the areas of removed staircase regions such as the second staircase region. For example, upper level metal interconnect structures 108 can be formed on the through-memory-level via structures 488 and over the memory-level assembly and on the word line contact via structures 86. For example, the upper level metal interconnect structures 108 can be formed on respective pairs of a word line contact via structure 86 and a through-memory-level via structure 488 over the memory-level assembly. At least one of the upper level metal interconnect structures 108 can extend across the second block B2 and the third block B3. In one embodiment, each of the upper level metal interconnect structures 108 can straddle a respective laterally-elongated contact via structure 76 located between the first block B1 and the third block B3.

Figure 20:
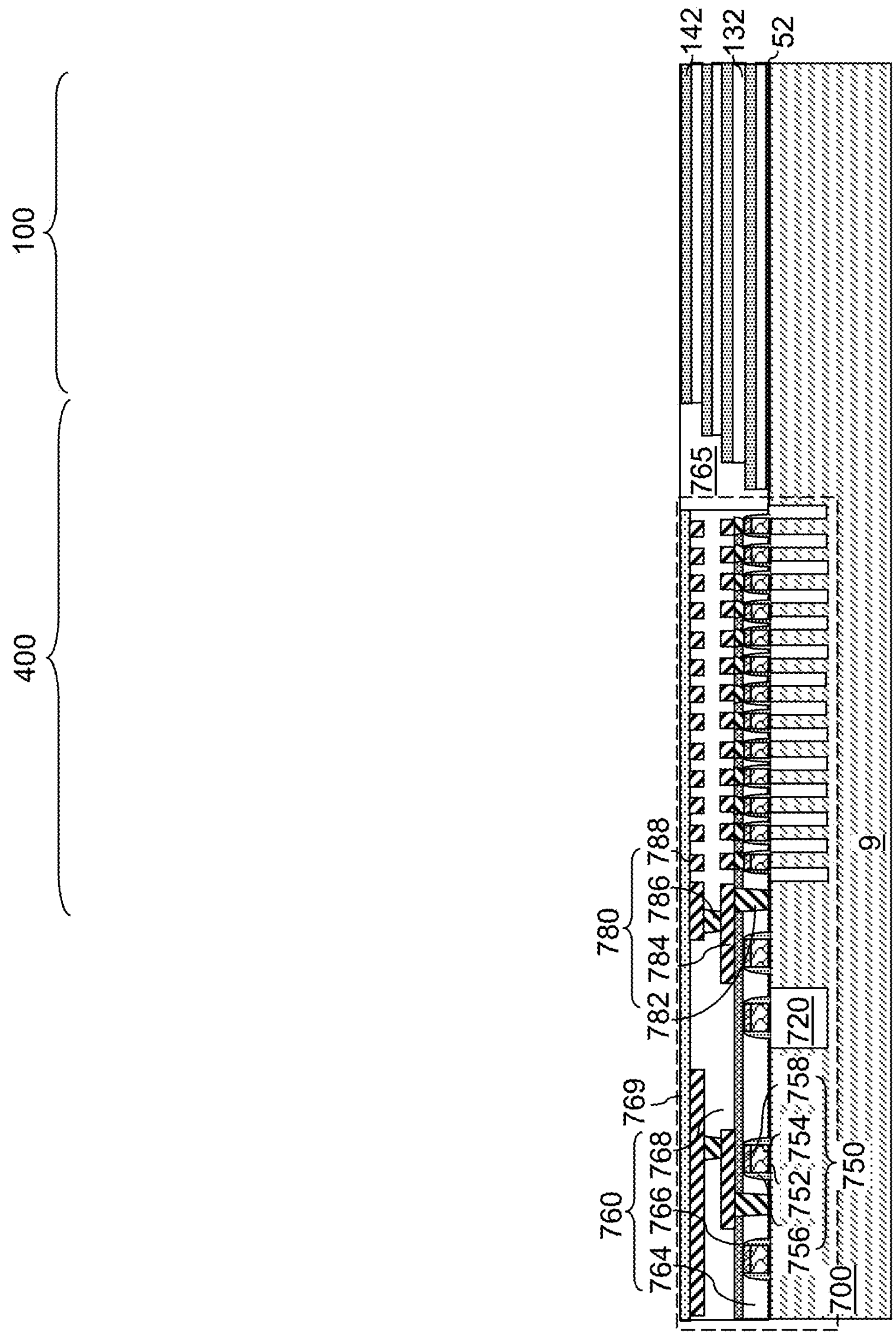
FIG. 20 is a vertical cross-sectional view of an modification of the second exemplary structure after formation of semiconductor devices, lower level metal interconnect structures, and at least one lower level dielectric layer according to the second embodiment of the present disclosure.

Referring to FIG. 20, a modification of the second exemplary structure is illustrated, which can be derived from the second exemplary structure of FIG. 18 by forming the optional dielectric pad layer 52 and a subset of the first-tier alternating stack (132, 142) at the same level as the word line switching devices, the at least one lower level dielectric layer 760, and the lower level metal interconnect structures 780. For example, the word line switching devices and the lower level metal interconnect structures 780 can be formed in the through-memory-level via regions 400 and outside of the area of the memory array region 100.

In one embodiment, the dielectric pad layer 52 and a subset of the first-tier alternating stack (132, 142) can be formed on the substrate 9. Subsequently, portions of the subset of the first-tier alternating stack (132, 142) can be removed from outside the memory array region 100, and staircase regions with terraces of the subset of the first-tier alternating stack (132, 142) can be formed at peripheral portions of the memory array region 100 that adjoin the through-memory-stack via regions 400 or the word line contact via regions 200. A lower level retro-stepped dielectric material portion 765 can be formed over each staircase region and removed in region 700. The semiconductor devices 710, the at least one lower level dielectric layer 760 and the lower level metal interconnect structures 780 are then formed over the substrate 9 in region 700. The lower level retro-stepped dielectric material portions 765 can have top surfaces that are substantially at the same level as the top surface of the deposited subset of the first-tier alternating stack and the top surface of the at least one lower level dielectric layer 760.

Figure 21:
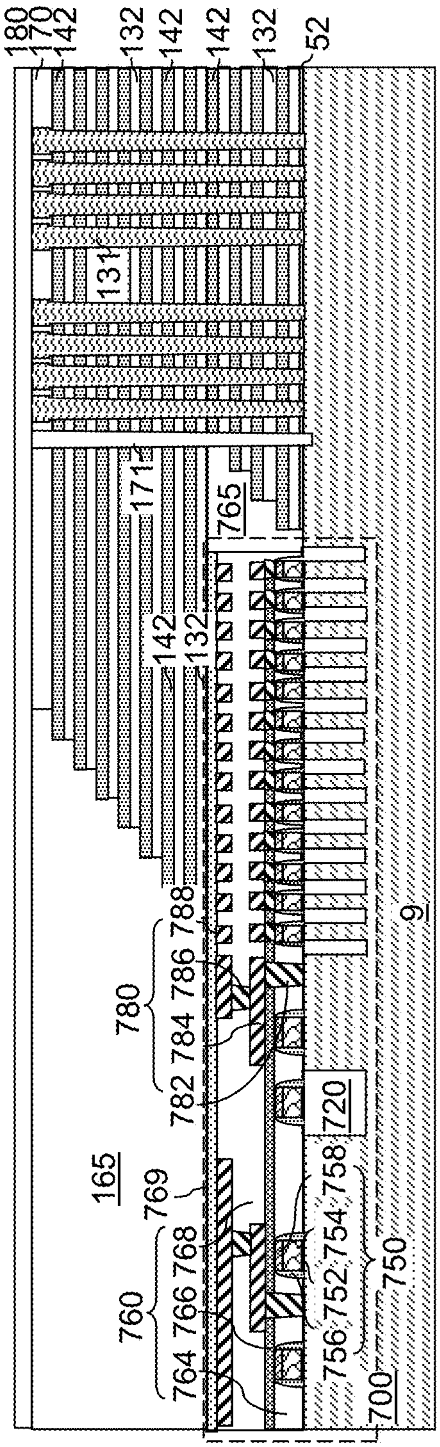
FIG. 21 is a vertical cross-sectional view of the modification of the second exemplary structure after formation of a first tier structure including sacrificial memory opening fill portions and first-tier support pillar structures according to the second embodiment of the present disclosure.
Figure 22:
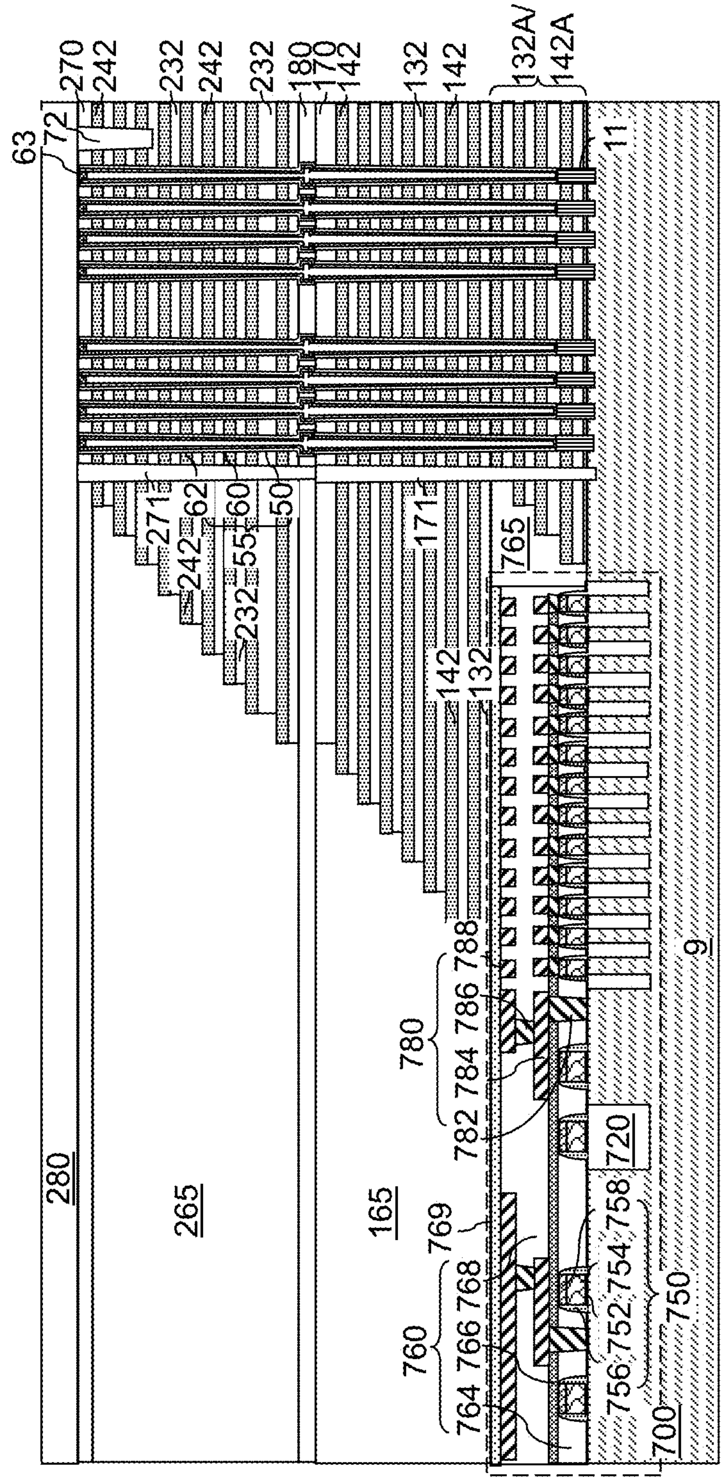
FIG. 22 is a vertical cross-sectional view of the modification of the second exemplary structure after formation of a second tier structure after formation of a second tier structure, memory stack structures, second-tier support pillar structures, a contact level dielectric layer, and backside contact trenches according to the second embodiment of the present disclosure.

Referring to FIG. 21, a complementary subset of the first-tier alternating stack (132, 142) can be formed over the deposited subset of the first-tier alternating stack (132, 142). The processing steps of FIGS. 3, 4A and 4B, 5A and 5B, and 6A and 6B can be performed to form a first tier structure. Referring to FIG. 22, the processing steps of FIGS. 7A and 7B through the processing steps of FIGS. 10A and 10B can be performed to form a second tier structure. In this embodiment the horizontal channel is located within the substrate 9 underlying the memory-level assembly because layer 10 may be omitted in this embodiment. Alternatively, layer 10 is formed directly on the substrate 9 outside region 10.

Figure 23:
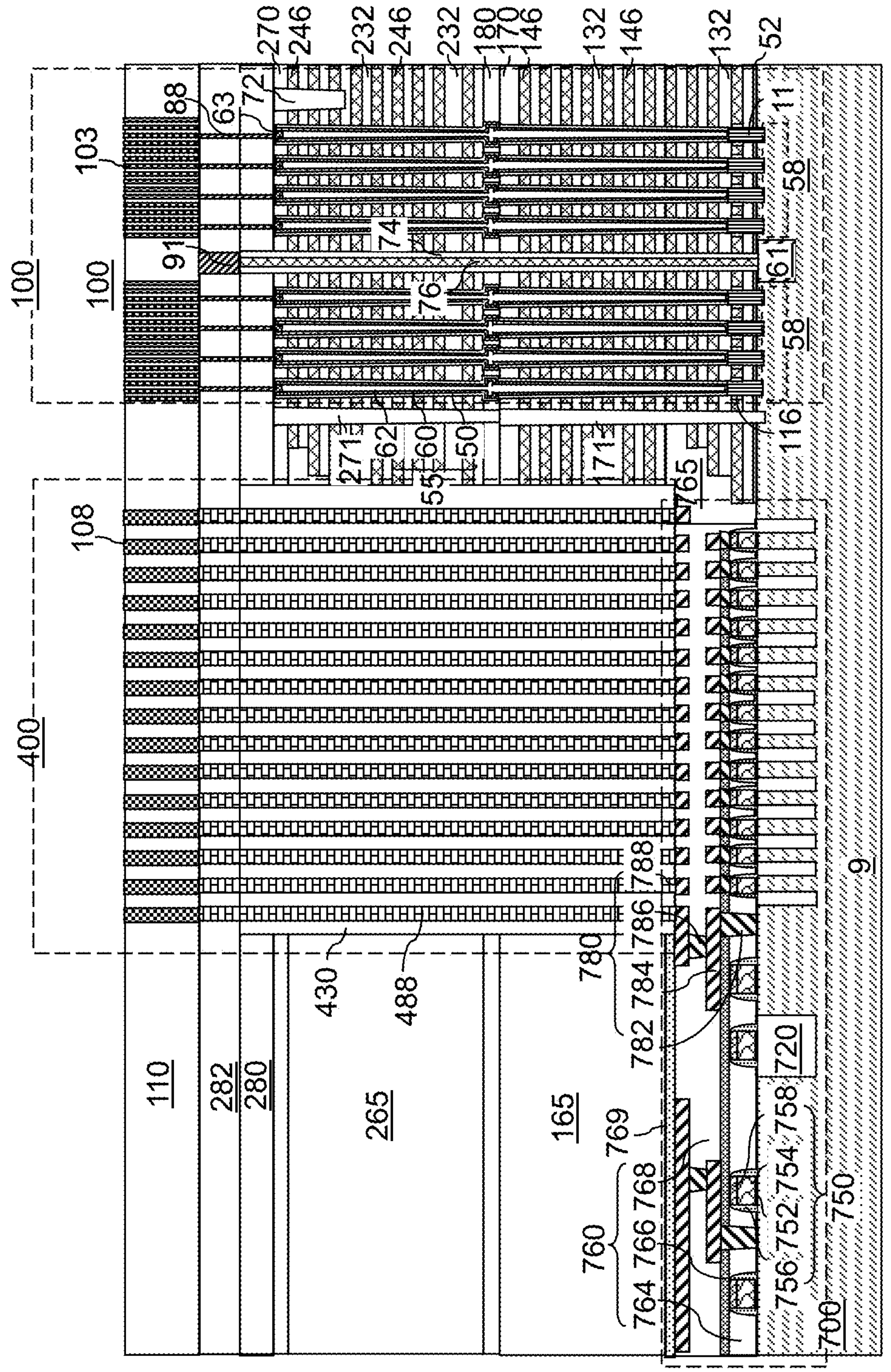
FIG. 23 is a vertical cross-sectional view of the modification of the second exemplary structure after formation of through-memory-level via structures according to the second embodiment of the present disclosure.

Referring to FIG. 23, the processing steps of FIGS. 11A and 11B through the processing steps of FIGS. 17A-17D can be performed to electrically connect the nodes of the word line switching devices to portions of the electrically conducive layers (146, 246) in the remaining staircase regions such as the first and third staircase regions employing through-memory-level via structures 488 formed in the areas of the removed staircase regions such as the second staircase region.

Figure 24A:
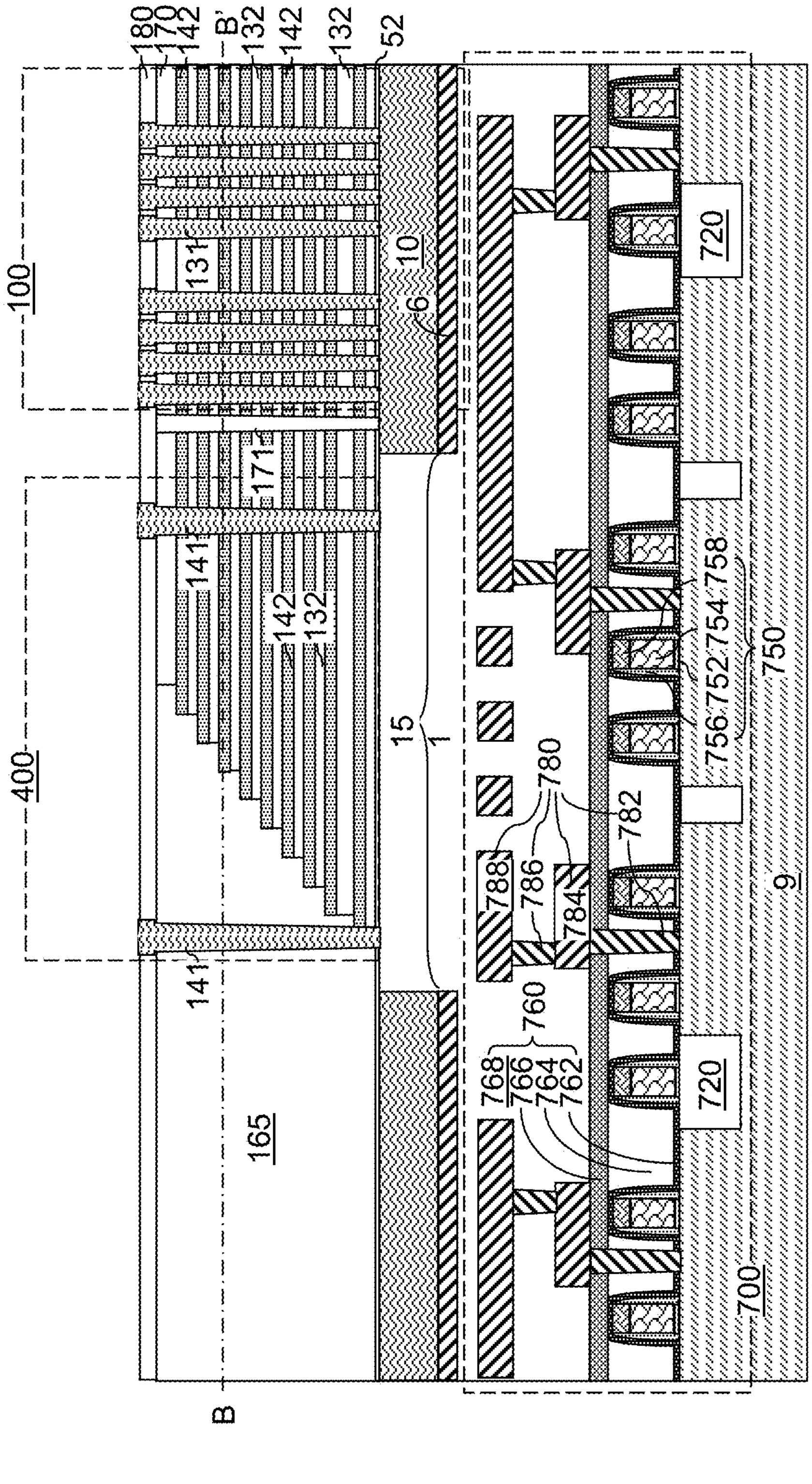
FIG. 24A is a vertical cross-sectional view of a third exemplary structure after formation of a first-tier alternating stack, first-tier support pillar structures, sacrificial memory opening fill portions, and sacrificial backside contact trench fill portions according to the third embodiment of the present disclosure.
Figure 24B:
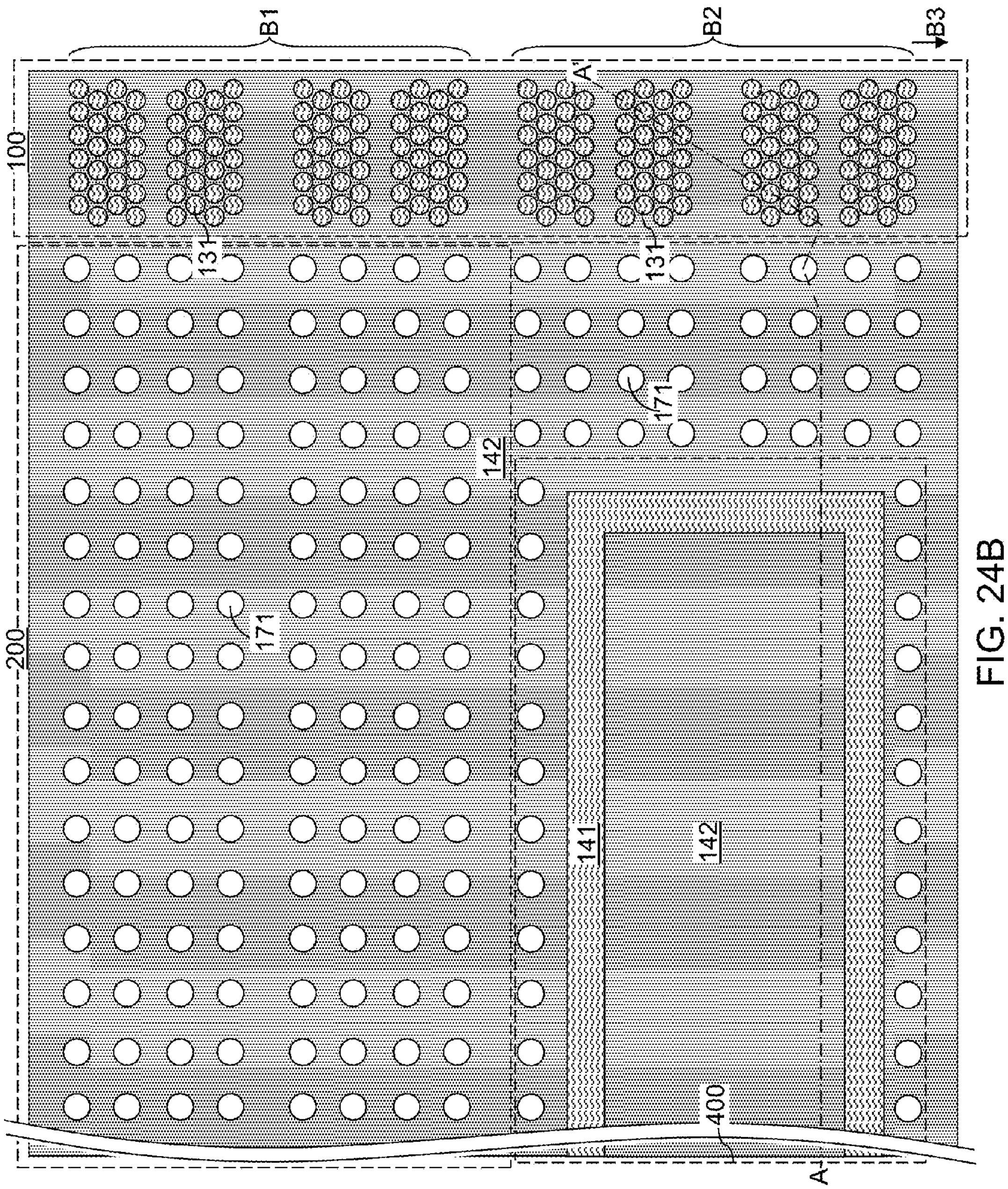
FIG. 24B is a horizontal cross-sectional view of the third exemplary structure along the horizontal plane B-B' in FIG. 24A. The zig-zag vertical plane A-A' corresponds to the plane of the vertical cross-sectional view of FIG. 24A.

Referring to FIGS. 24A and 24B, a third exemplary structure according to a third embodiment of the present disclosure includes a moat trench which separates the first part of the alternating stack of insulating layers and sacrificial insulating material layers from the second part of the alternating stack of the insulating stack in which the sacrificial insulating material layers are replaced with electrically conductive word line layers. The a third exemplary structure can be derived from the first exemplary structure, the second exemplary structure, or modifications thereof by performing the processing steps up to formation of the first-tier alternating stack. As in the first and second embodiments, the lower level metal interconnect structures 780 can be electrically shorted to nodes of the semiconductor devices, and can be embedded in at least one lower level dielectric layer 760, which is formed over the semiconductor substrate 9. The layout for the pattern of the first-tier support pillar structures 171 can be optionally altered to optionally remove the first-tier support pillar structures 171 from a center portion of each through-memory-stack via region 400. The processing steps of FIGS. 5A, 5B, and 6 can be performed with modification to the pattern employed to form the first-tier memory openings 149. The optional planar conductive material layer 6 and the planar semiconductor material layer 10 may be patterned to form an opening 151 extending through these layers to the underlying insulating layer 760. The opening 151 is located under region 400 and may be filled with another insulating material layer (e.g., a silicon oxide or doped silicate glass) 760.

Specifically, concurrently with formation of the first-tier memory openings 149, a first-tier moat trench can be formed in each through-memory-stack via region 400. For example, a photoresist layer can be applied after formation of the first insulating cap layer 170 or the inter-tier dielectric layer 180, and can be lithographically patterned to form a patterned photoresist layer including the pattern of memory openings and the pattern of first-tier moat trenches to be formed through the first-tier alternating stack (132, 142). An anisotropic etch is performed through the first-tier alternating stack (132, 142) to form first-tier memory openings 149 and first-tier moat trenches.

Sacrificial memory opening fill portions 131 can be formed in the first-tier memory openings 149, and sacrificial moat trench fill portions 141 can be formed in the first-tier moat trenches. For example, a sacrificial fill material layer is deposited in the first-tier memory openings 149 and the first-tier moat trenches, and excess portions of the sacrificial fill material layer can be removed from above the top surface of the inter-stack dielectric layer 180. The sacrificial fill material can include the same material as in the first and second embodiments.

Each remaining portion of the sacrificial material in a first-tier memory opening 149 constitutes a sacrificial memory opening fill portion 131. Each remaining portion of the sacrificial material in a first-tier moat trench constitutes a sacrificial moat trench fill portion 141. The top surfaces of the sacrificial memory opening fill portions 131 and the sacrificial moat trench fill portions 141 can be coplanar with the top surface of the first insulating cap layer 170. The sacrificial memory opening fill portion 131 may, or may not, include cavities therein.

Figure 25A:
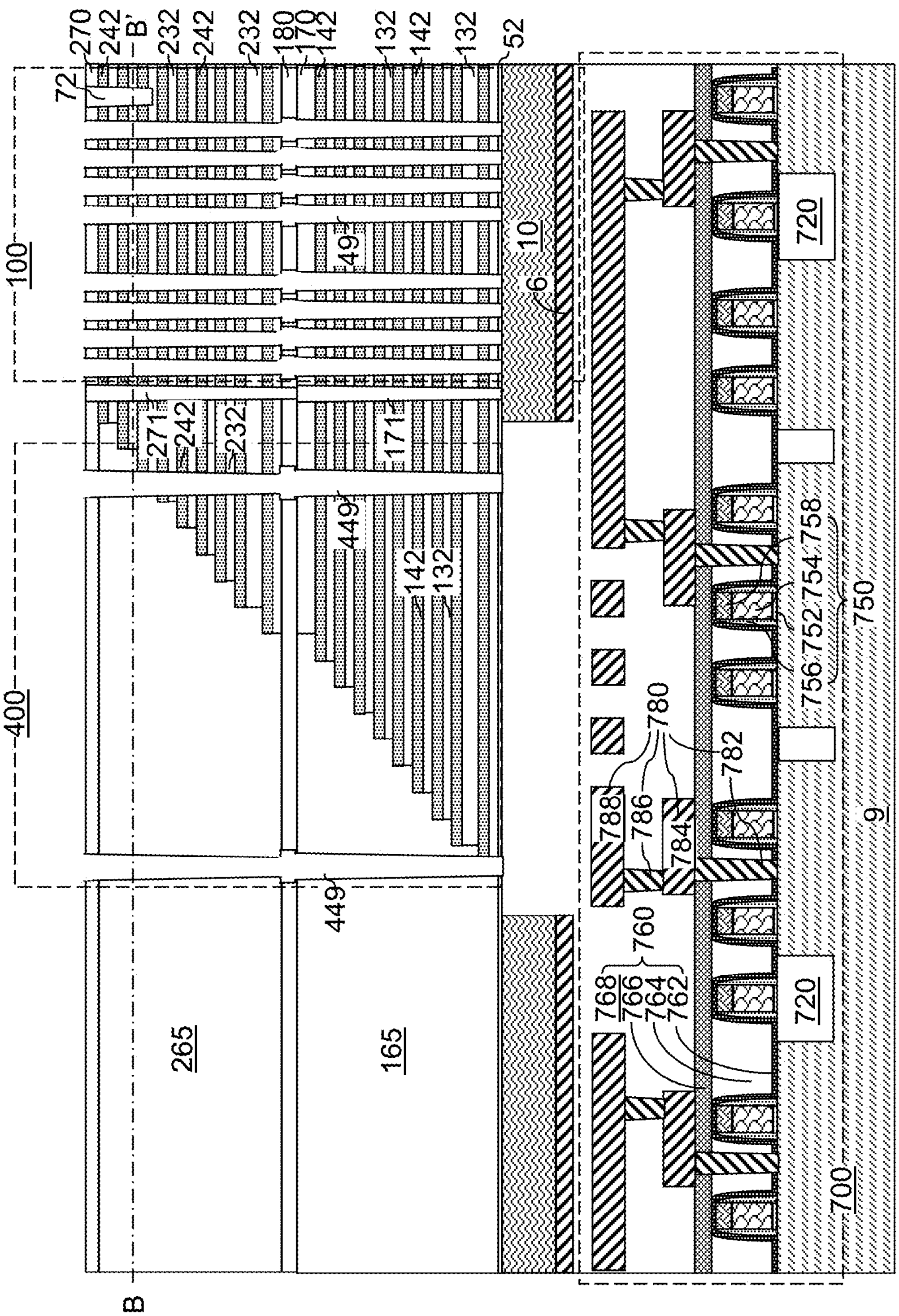
FIG. 25A is a vertical cross-sectional view of the third exemplary structure after formation of a second-tier alternating stack, second-tier support pillar structures, drain-select-level shallow trench structures, memory openings, and a moat trench according to the third embodiment of the present disclosure.
Figure 25B:
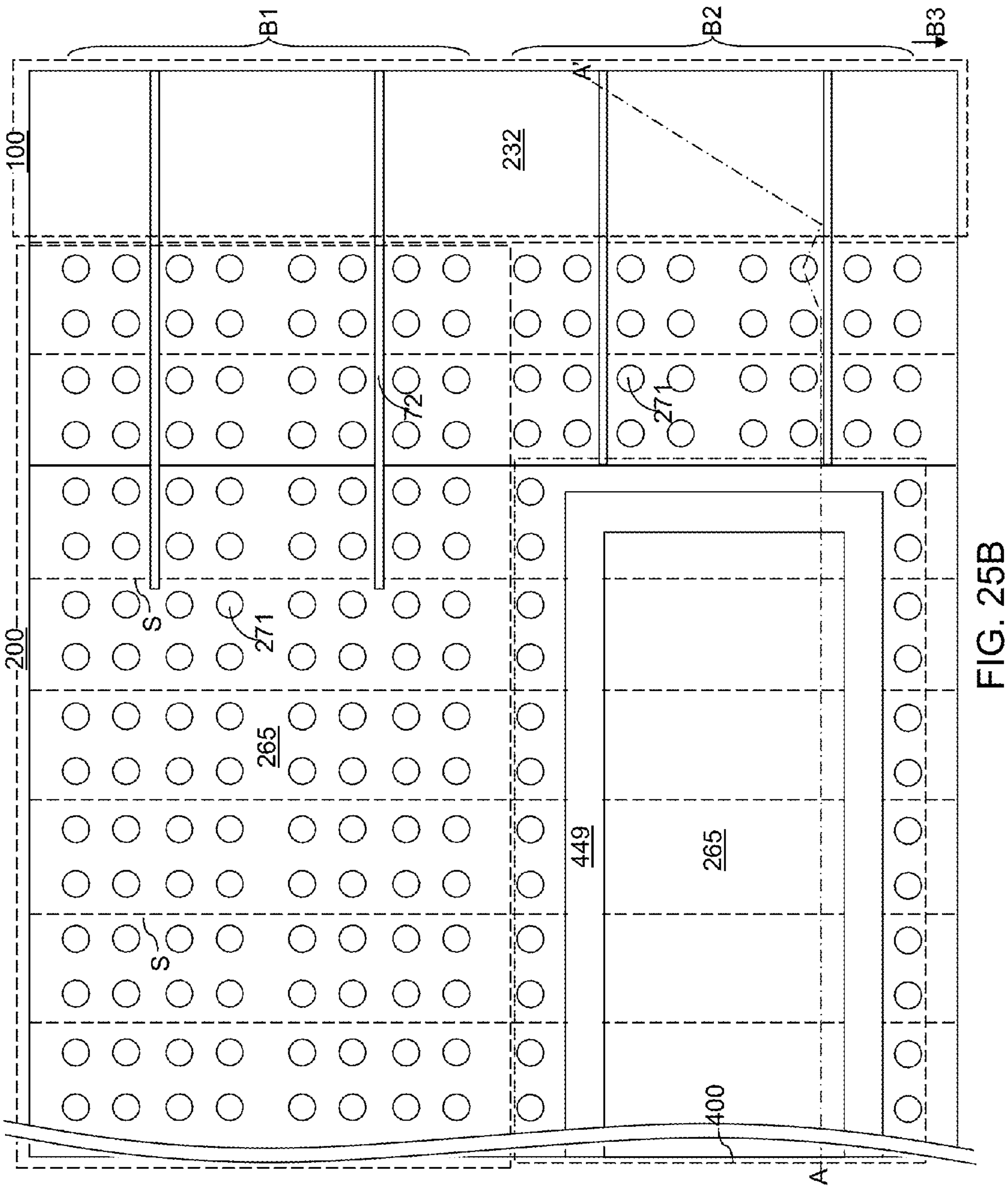
FIG. 25B is a horizontal cross-sectional view of the third exemplary structure along the horizontal plane B-B' in FIG. 25A. The zig-zag vertical plane A-A' corresponds to the plane of the vertical cross-sectional view of FIG. 25A.

Referring to FIGS. 25A and 25B, the processing steps of FIGS. 7, 8A, 8B, 9A, and 9B can be performed with a modification to the pattern employed to form the second-tier openings. Specifically, the pattern for the first-tier moat trenches can be added to the pattern for the second-tier memory openings. After the anisotropic etch process that transfers the pattern in the photoresist layer through the second-tier alternating stack (232, 242), second-tier moat trenches are formed over the first-tier moat trenches. The pattern of the second-tier moat trenches can be identical to the pattern of the first-tier moat trenches. The sacrificial memory opening fill portions 131 and the sacrificial moat trench fill portions 141 are then removed by selective etching or ashing (if portions 131 and 141 comprise a carbon based material). Each stack of a first-tier moat trench and a second-tier moat trench constitutes a moat trench 449. Memory openings 49 extending through the at least one alternating stack (132, 142, 232, 242) can be formed simultaneously with formation of the moat trenches 449.

In one embodiment, each moat trench 449 can have a U-shaped horizontal cross-sectional shape such that two open ends of the U-shape include vertical sidewalls composed of surfaces of the at least one retro-stepped dielectric material portion (165, 265). In this case, the two sides of each moat trench 449 can extend along the first horizontal direction hd1 parallel to the lengthwise direction of the backside contact trenches 79, can be adjoined to each other through a connecting portion of the moat trench 449. The two sides extend parallel to the second lengthwise direction hd2 at a proximal side of the moat trench 449, and can extend along the first horizontal direction beyond the area of the bottommost layers of the first-tier alternating stack (132, 142) at a distal side of the moat trench 449. As used herein, a "proximal" side of the moat trench 449 refers to the side that is proximal to the memory array region 100, and a "distal" side of the moat trench 449 refers to the side that is distal from the memory array region 100.

In another embodiment, each moat trench 449 can have a closed shape (e.g., polygon, circle, oval, irregular shape, etc.) such that an area of the memory-level assembly is located inside each moat trench 449, and a complementary area of the memory-level assembly is located outside each moat trench 449. In this case, the moat trench 449 separates the inside of the moat trench 449 from the outside of the moat trench 449 with closed shape area that corresponds to the area of the moat trench 449. As used herein, a closed shape is a shape having a closed outer periphery and an opening within the closed outer periphery that is defined by a closed inner periphery. The opening in the moat trench 449 is located above the opening 151 in layer 10, and may have the same or similar shape and/or dimensions to the opening 151.

The moat trench 449 defines the area of a corresponding through-memory-level via region 400, and extends through the at least one alternating stack (132, 142, 232, 242). A portion of the at least one alternating stack (132, 142, 232, 242) is present within the through-memory-level via region 400. Specifically, a portion of the at least one alternating stack (132, 142, 232, 242) containing insulating sacrificial material layers (142, 242) can be laterally enclosed within a set of inner sidewalls of the moat trench 449 in case the moat trench 449 has a closed shape, or within a combination of the set of inner sidewalls of the moat trench 449 and a vertical surface containing a plane that connects a pair of vertical edges of the moat trench 449 located at a distal end of the moat trench 449 in case the moat trench 449 is U-shaped.

Figure 26A:
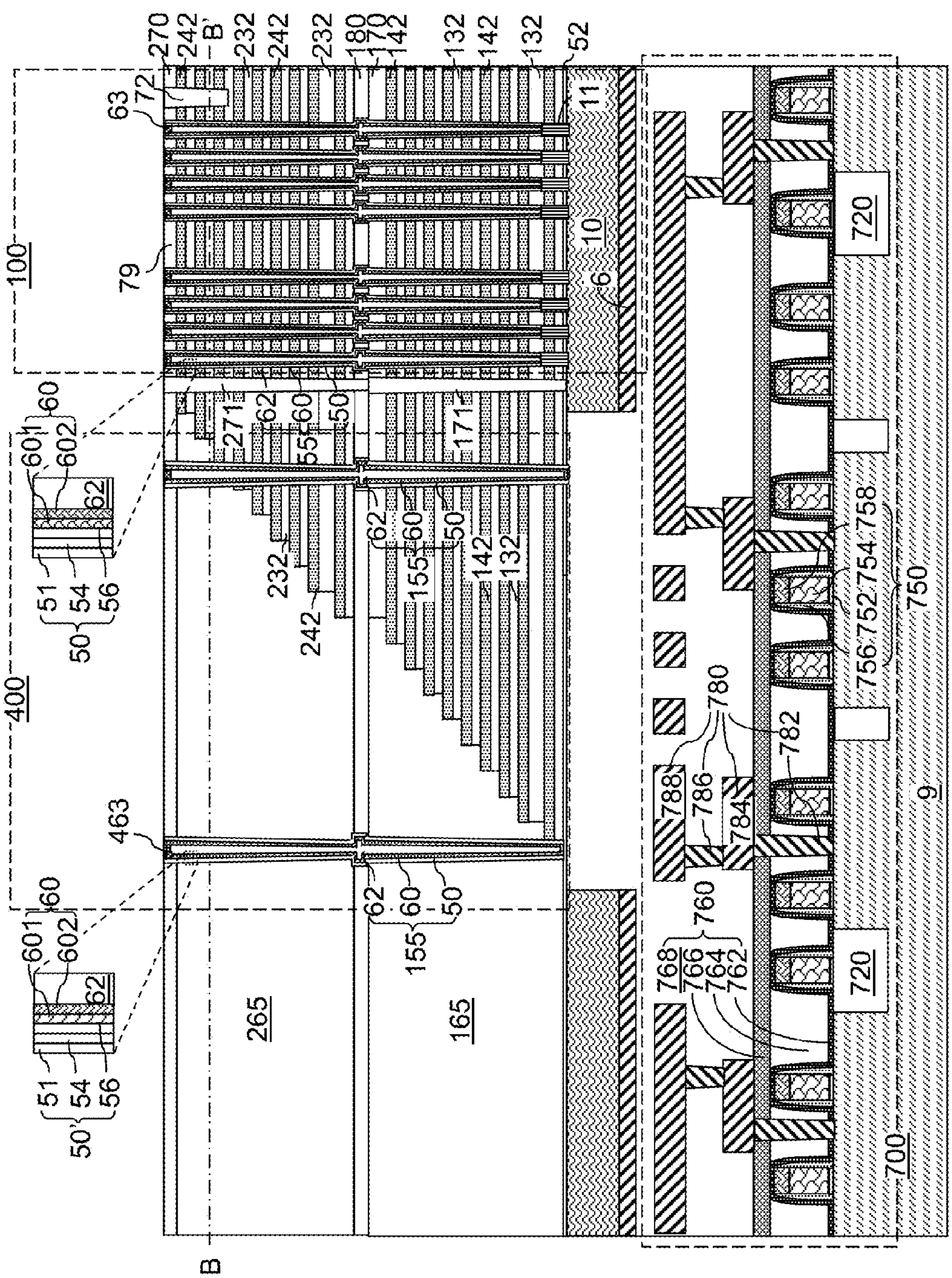
FIG. 26A is a vertical cross-sectional view of the third exemplary structure after formation of memory stack structures and an insulating moat trench structure according to the third embodiment of the present disclosure.
Figure 26B:
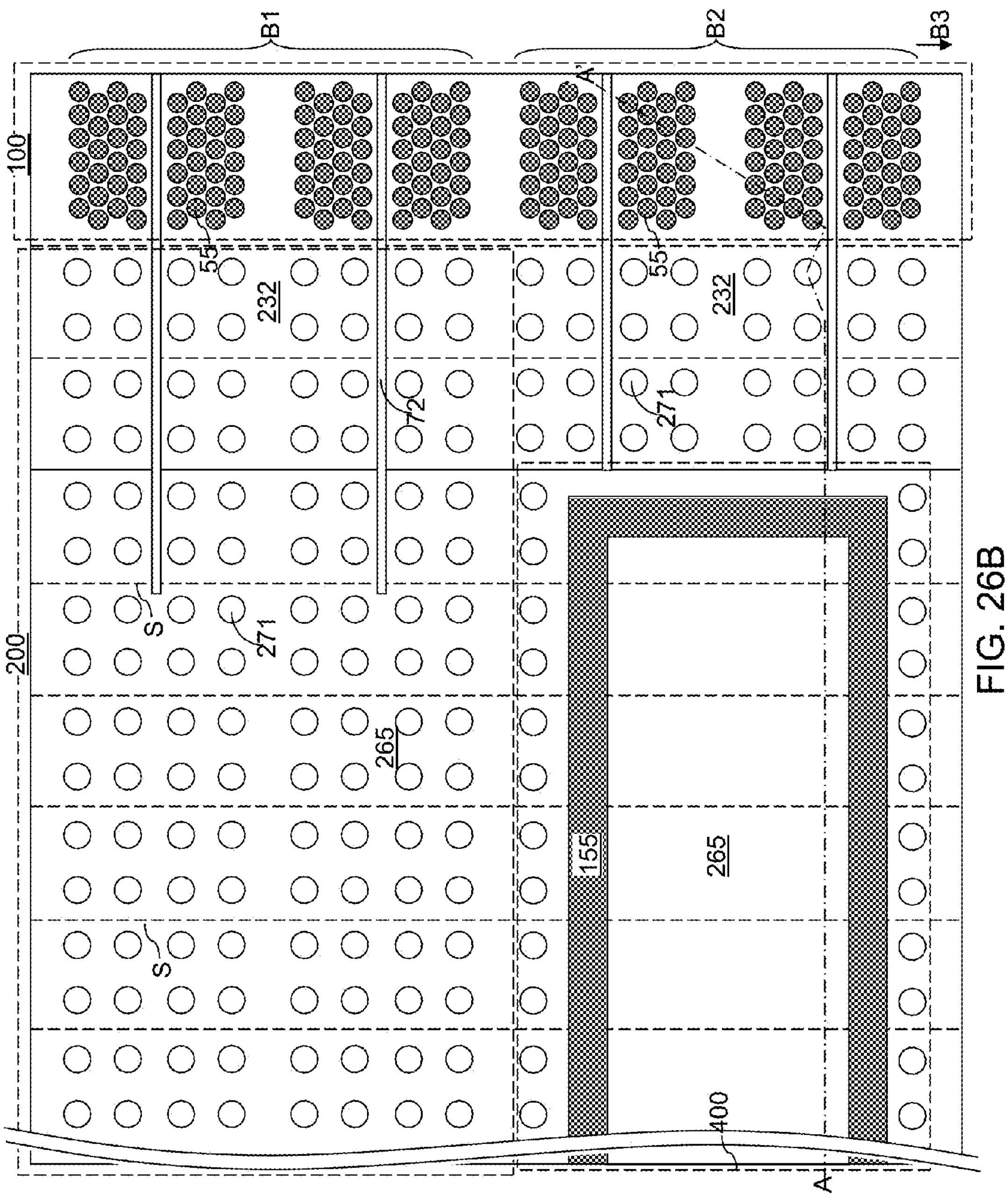
FIG. 26B is a horizontal cross-sectional view of the third exemplary structure along the horizontal plane B-B' in FIG. 26A. The zig-zag vertical plane A-A' corresponds to the plane of the vertical cross-sectional view of FIG. 26A.

Referring to FIGS. 26A and 26B, a subset of the processing steps of FIGS. 10A and 10B can be performed to form optional pedestal channel portions 11 and memory stack structures 55. Drain regions 63 can be formed on top of each vertical semiconductor channel 60.

In one embodiment, all of the surfaces of the moat trenches 449 can be dielectric surfaces. A selective semiconductor deposition process is employed to form the pedestal channel portions 11 such that the pedestal channel portions 11 grow only from the physically exposed semiconductor surfaces of the planar semiconductor material layer 10 at the bottom of each memory opening 49, while no semiconductor material is deposited in the moat trenches 449.

Concurrent with formation of the memory stack structures 55, a dummy memory stack structure 155 is formed within each moat trench 449. For example, a memory film 50 can be formed within each memory opening 49 simultaneously with formation of an insulating liner 50 in each moat trench 449 by depositing and anisotropically etching a stack of layers including at least one dielectric material layer (51, 54, 56). Subsequently, a conformal semiconductor material layer can be deposited on the memory films 50 and the insulating liners 50, and portions of the conformal semiconductor material layer can be removed from above the at least one alternating stack (132, 142, 232, 242) employing a planarization process. Each remaining portion of the conformal semiconductor material layer constitutes a vertical semiconductor channel 60, which can be an active channel of a vertical field effect transistor if present within a memory stack structure 55 or a semiconductor fill material portion 60 if present within a dummy memory stack structure 155 inside a moat trench 449.

Each dummy memory stack structure 155 can have an identical set of elements as a memory stack structure 55. A set of insulating films formed in the moat trenches 449 and having the same material stack as the memory film 50 is herein referred to as an insulating liner 50. A dummy drain region 463 can be formed on top of each dummy memory stack structure 155. The dummy memory stack structures 155 can be electrically isolated from all underlying elements and laterally surrounding elements. For example, each dummy memory stack structure 155 can contact a top surface of the at least one lower level dielectric layer 760 (such as the at least one lower level interconnect dielectric layer 768 which fills the opening 151) and sidewalls of the at least one alternating stack (132, 142, 232, 242), the inter-stack dielectric layer 180, the first insulating cap layer 170, and the second insulating cap layer 270.

Each combination of a dummy memory stack structure 155 and a dummy drain region 463 constitutes an insulating moat trench structure (155, 463) that fills a respective moat trench 449. The area of each through-memory-level via region 400 includes an area defined by a closed inner periphery of a respective insulating moat trench structure (155, 463).

Figure 27A:
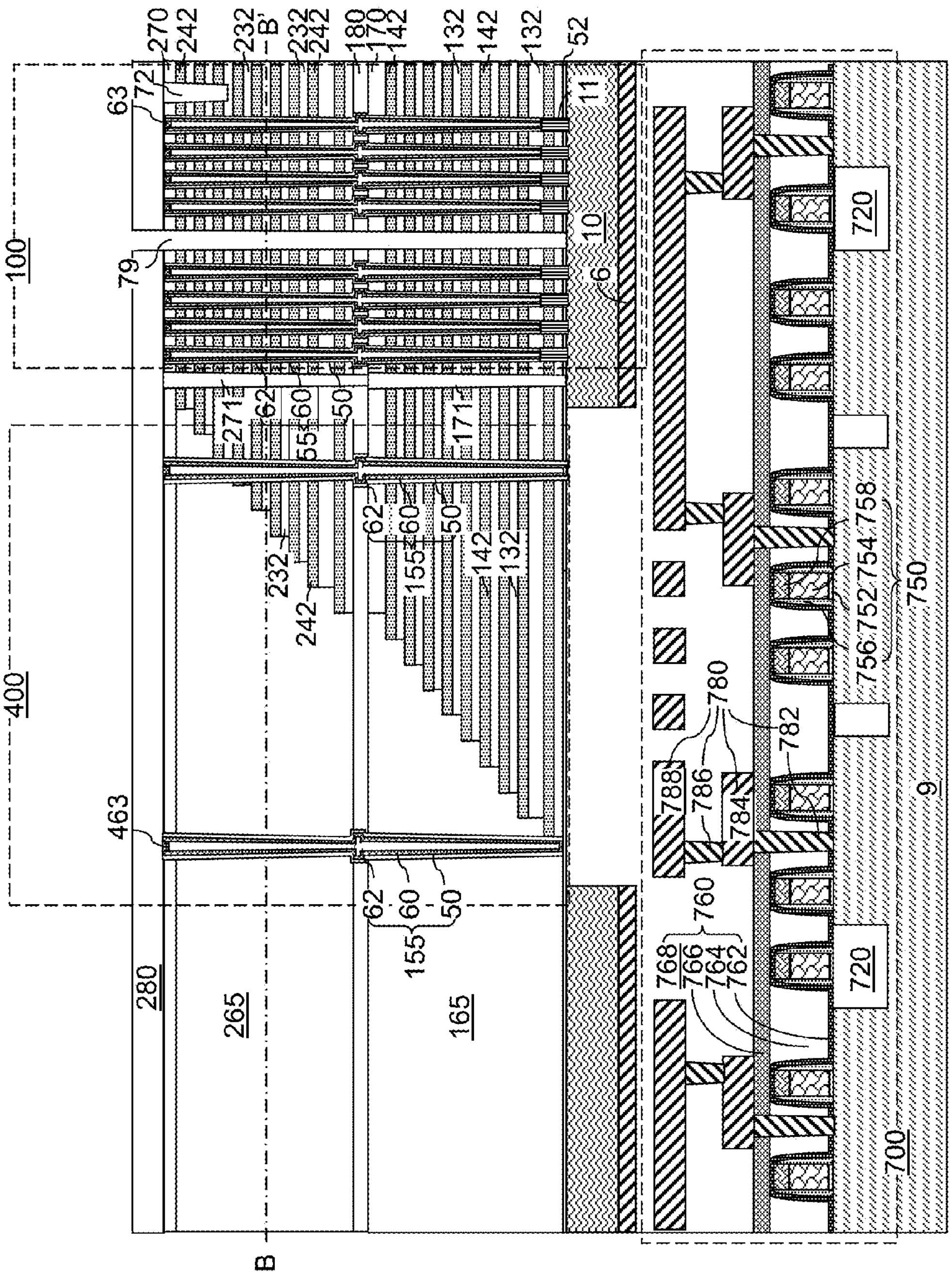
FIG. 27A is a vertical cross-sectional view of the third exemplary structure after formation of backside contact trenches according to the third embodiment of the present disclosure.
Figure 27B:
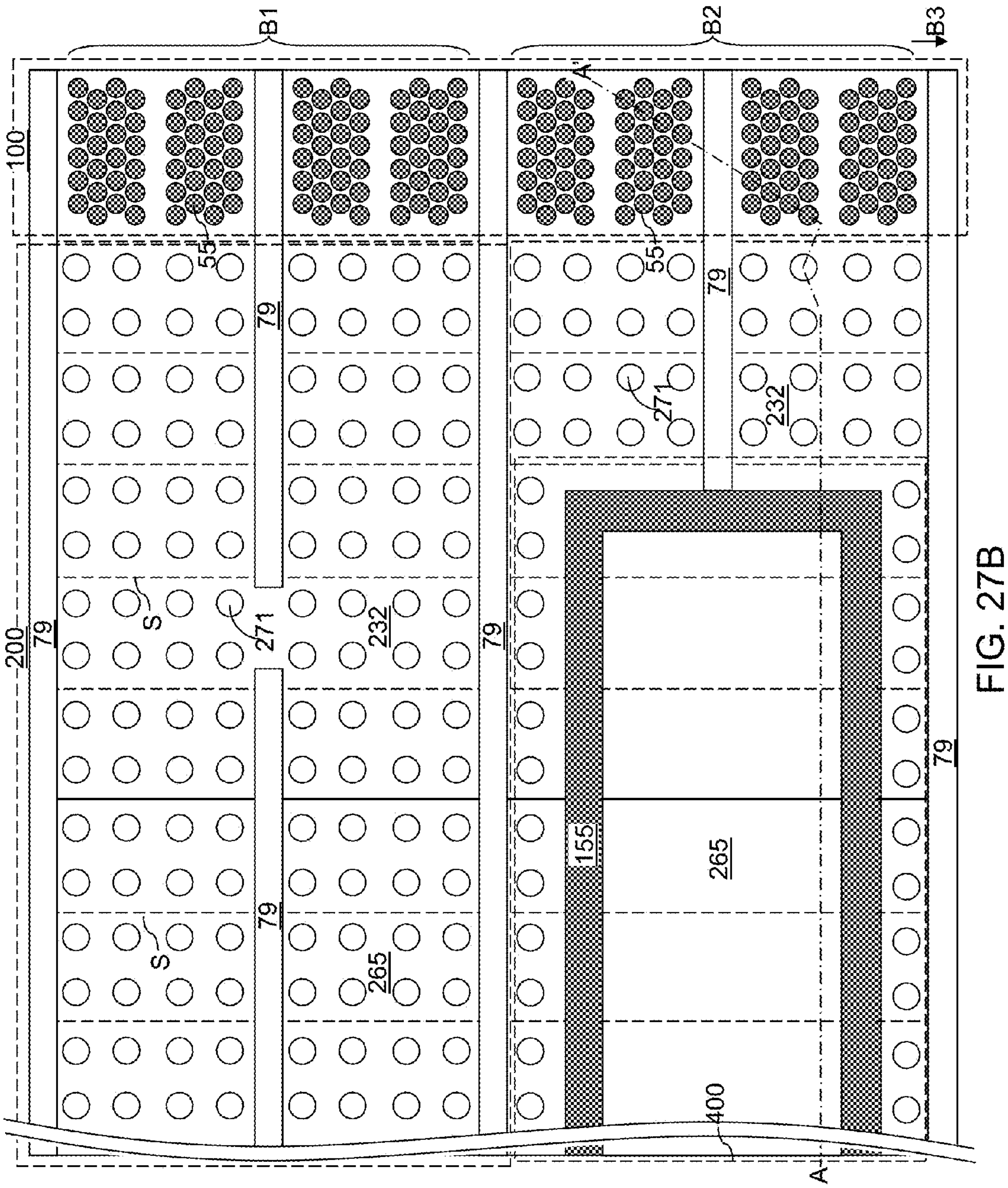
FIG. 27B is a horizontal cross-sectional view of the third exemplary structure along the horizontal plane B-B' in FIG. 27A. The zig-zag vertical plane A-A' corresponds to the plane of the vertical cross-sectional view of FIG. 27A.

Referring to FIGS. 27A and 27B, a complementary subset of the processing steps of FIGS. 13A and 13B can be performed to form a first contact level dielectric layer 280 and backside contact trenches 79.

Figure 28A:
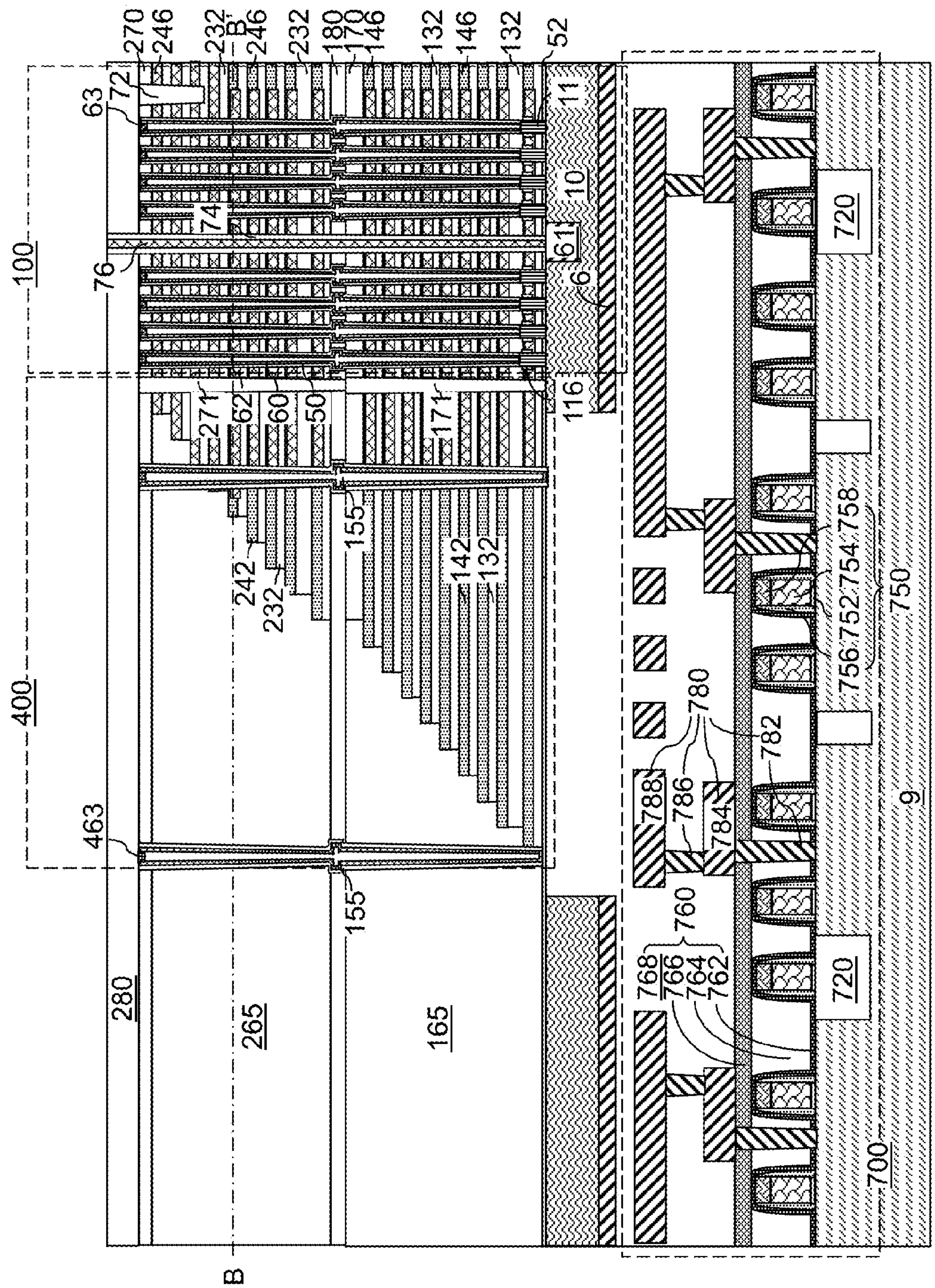
FIG. 28A is a vertical cross-sectional view of the third exemplary structure after formation of laterally-elongated contact via structures according to the third embodiment of the present disclosure.
Figure 28B:
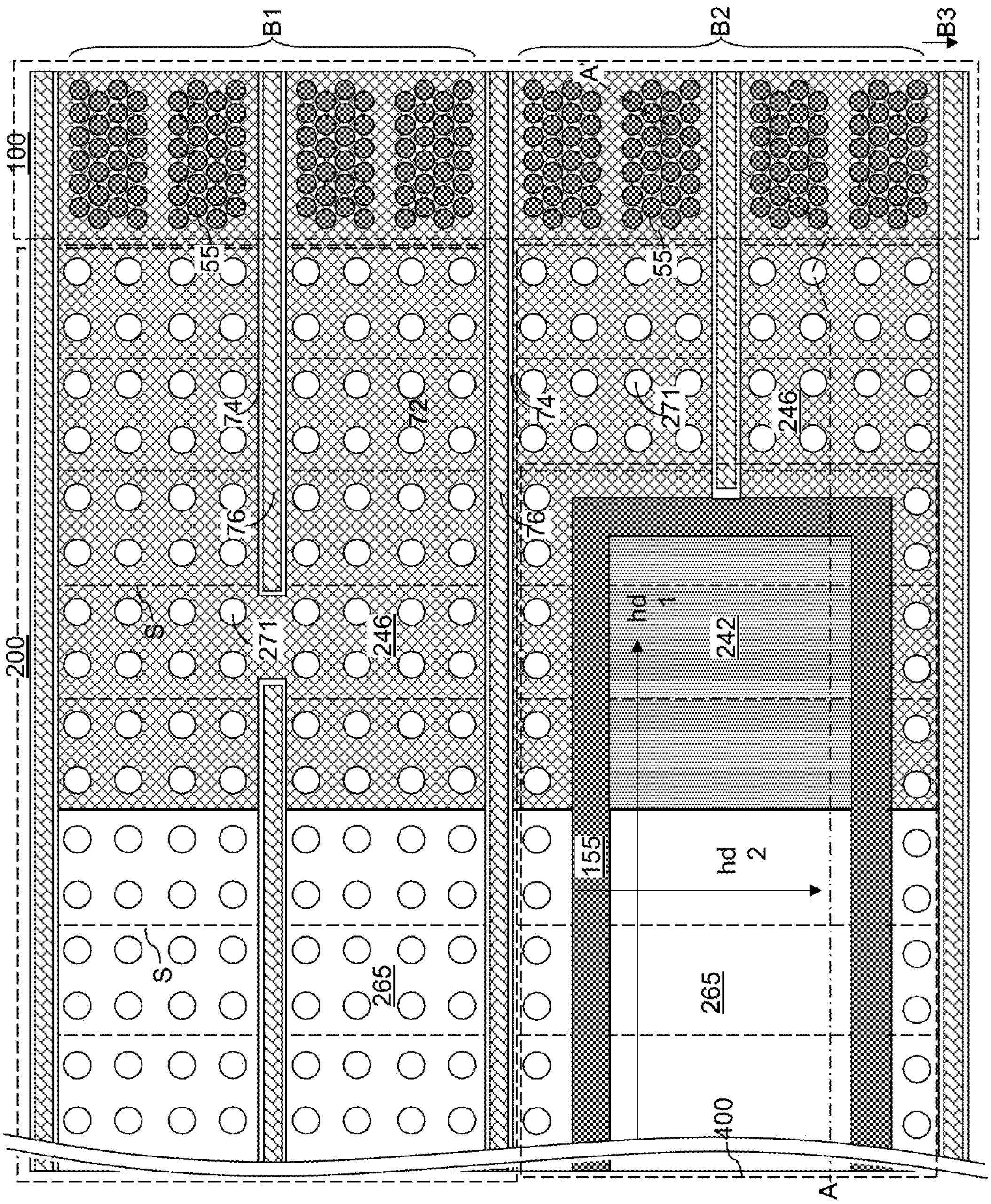
FIG. 28B is a horizontal cross-sectional view of the third exemplary structure along the horizontal plane B-B' in FIG. 28A. The zig-zag vertical plane A-A' corresponds to the plane of the vertical cross-sectional view of FIG. 28A.

Referring to FIGS. 28A and 28B, the processing steps of FIGS. 14B, 14C, 15B and 15C can be performed to replace the sacrificial material layers (142, 242) with electrically conductive layers (246, 246). In one embodiment, the sacrificial material layers (142, 242) can include dielectric spacer layers, i.e., dielectric material layers that vertical space the insulating layers (132, 232). The insulating moat trench structures (155, 463), either alone or in combination with the retro-stepped dielectric material portions (165, 265), block the lateral propagation of etchants into the areas laterally enclosed by the insulating moat trench structures (155, 463) such that no backside recess (143, 243) are formed inside the region 400 surrounded by the moat trench structure (155, 463). Portions of the dielectric spacer layers (i.e., the sacrificial material layers (142, 242)) located outside the moat trench structure (i.e., outside the through-memory-level via regions 400) are replaced with electrically conductive layers (146, 246) while the portions of the at least one alternating stack (132, 142, 232, 242) in each moat trench 449 remains intact. The electrically conductive layers (146, 246) constitute word lines for the memory stack structures 55, which are formed outside the moat trench structure (i.e., outside region 400) but which are not formed inside the moat trench structure (i.e., inside region 400).

Subsequently, a conformal insulating material layer is deposited and anisotropically etched within each backside contact trench 79 to form insulating spacers 74. A laterally-extending contact via structure 76 within each backside contact trench 79. A plurality of laterally-elongated contact via structures 76 extending along the first horizontal direction hd1 laterally divides the memory-level assembly into a plurality of laterally spaced-apart blocks (B1, B2, B3, . . . ). The plurality of blocks (B1, B2, B3, . . . ) can comprise a set of three neighboring blocks including, in order, a first block B1, a second block B2, and third block B3 arranged along a second horizontal direction hd2 that is perpendicular to the first horizontal direction hd1.

In case the moat trenches 449 are U-shaped, a remaining portion of the retro-stepped dielectric material portion (265 or 165) can continuously extend over portions of the electrically conductive layers (146, 246) in the first staircase region (such as the illustrated word line contact via region 200 in the first block B1 in FIG. 28B) and remaining portions of the dielectric spacer layers (i.e., the sacrificial material layers (142, 242)) in the second staircase region, such as the through-memory-level via region 400 in the second block B2 in FIG. 28B.

Figure 29A:
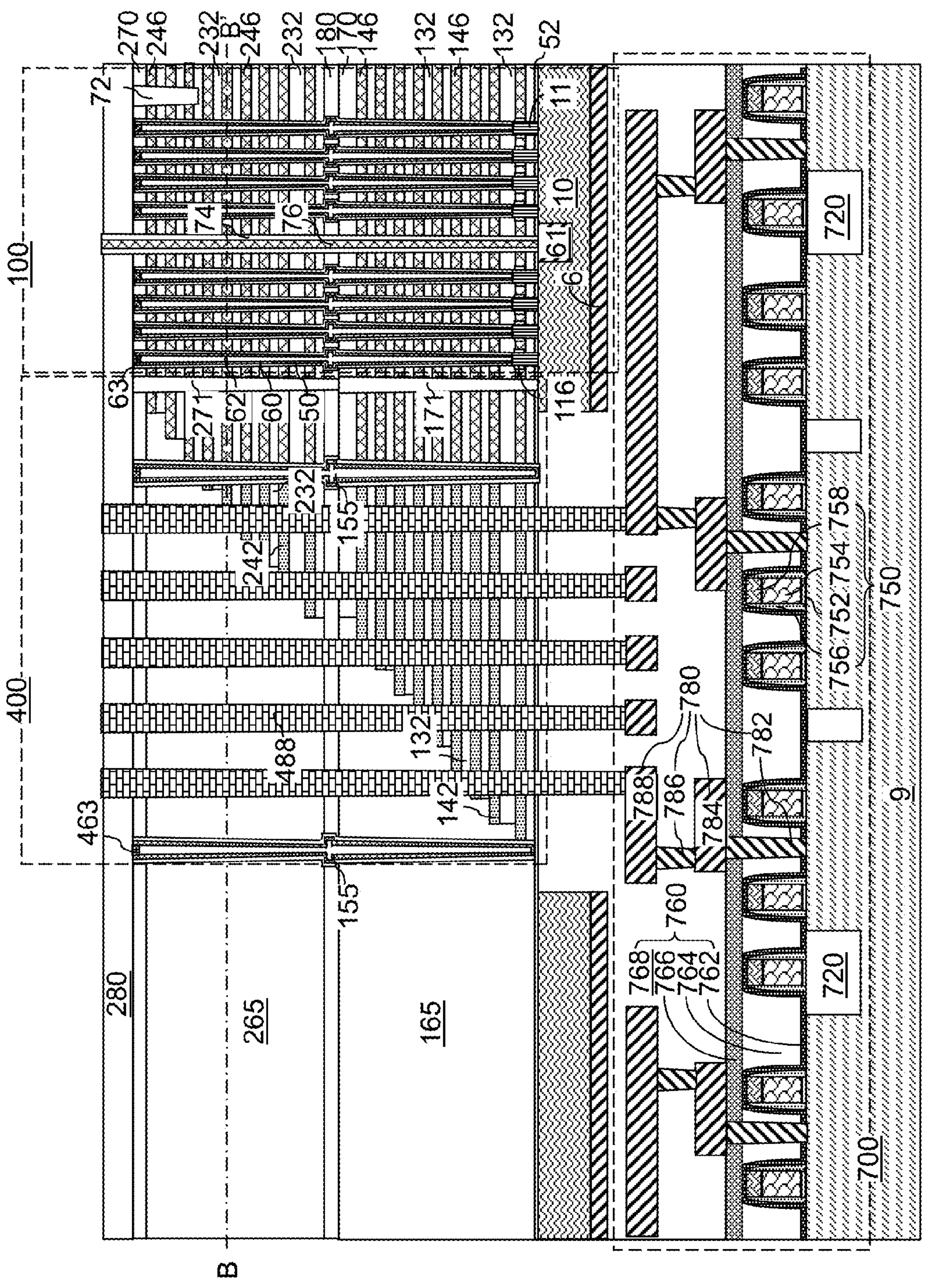
FIG. 29A is a vertical cross-sectional view of the third exemplary structure after formation of through-memory-level via structures according to the third embodiment of the present disclosure.
Figure 29B:
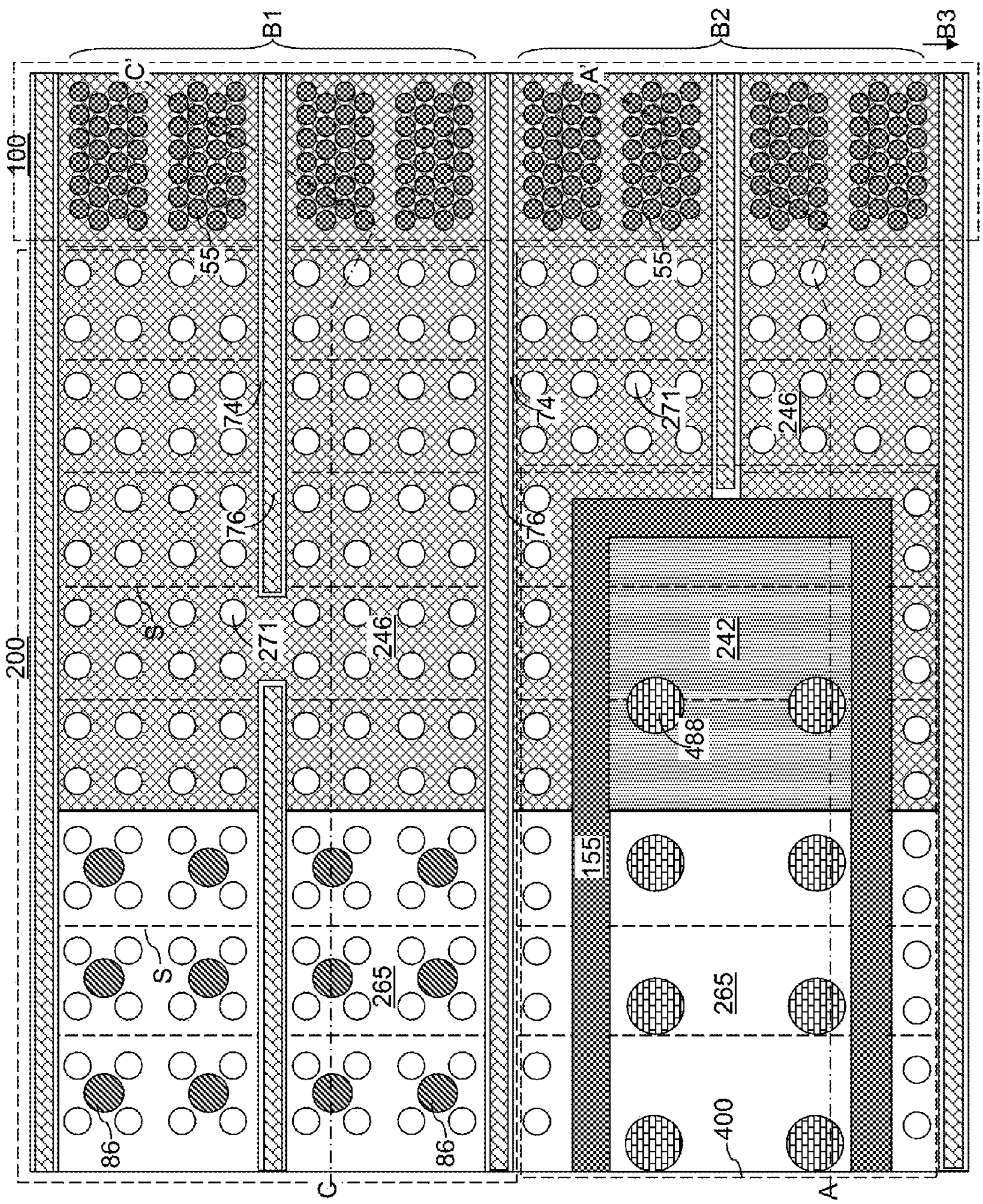
FIG. 29B is a horizontal cross-sectional view of the third exemplary structure along the horizontal plane B-B' in FIG. 29A. The zig-zag vertical plane A-A' corresponds to the plane of the vertical cross-sectional view of FIG. 29A.
Figure 29C:
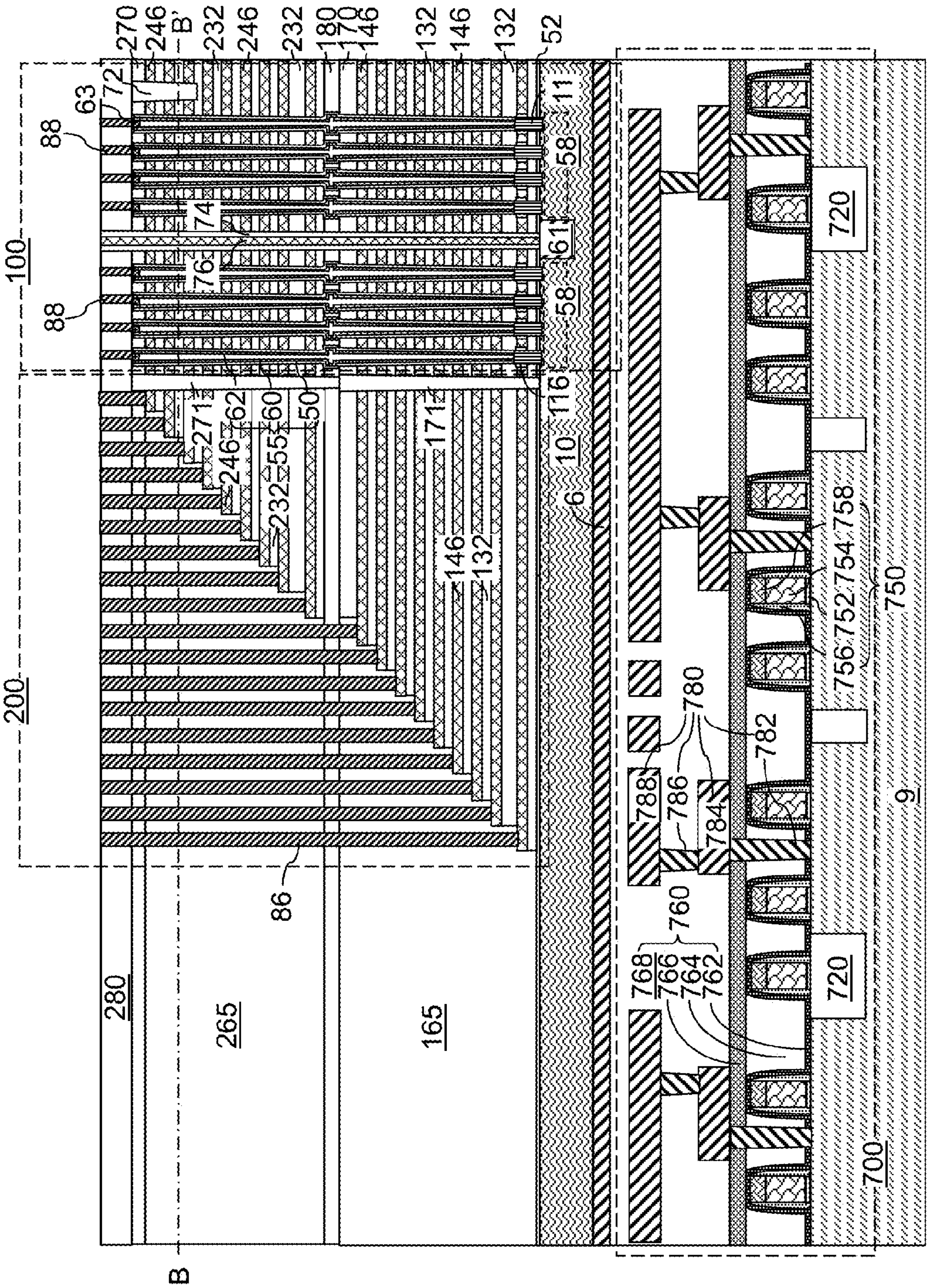
FIG. 29C is a vertical cross-sectional view of the third exemplary structure along the zig-zag vertical plane C-C' in FIG. 29B according to the third embodiment of the present disclosure.

Referring to FIGS. 29A-29C, through-memory-level via structures 488 can be formed in each through-memory-level via region 400. For example, via cavities can be formed, which extend through the first contact level dielectric layer 280, a remaining portion of the second-tier alternating stack of the second insulating layers 232 and the second sacrificial layers 242, a remaining portion of the first-tier alternating stack of the first insulating layers 132 and the first sacrificial layers 142, and an upper portion of the at least one lower level dielectric layer 760. Generally, the through-memory-level via structures 488 can vertically extend from a first horizontal plane including a topmost surface of a remaining portion of the at least one alternating stack (132, 142, 232, 242) and a bottommost surface of the at least one alternating stack (132, 142, 232, 242). Various additional via structures (86, 87, 88) can be formed employing the same processing steps as the processing steps of FIGS. 16A-16C. Since the alternating stack materials in region 400 are electrically insulating, the through-memory-level via structures 488 extending through the insulating layers of the alternating stack in region 400 are not short circuited to each other or to all word lines in the stack outside region 400.

Figure 30:
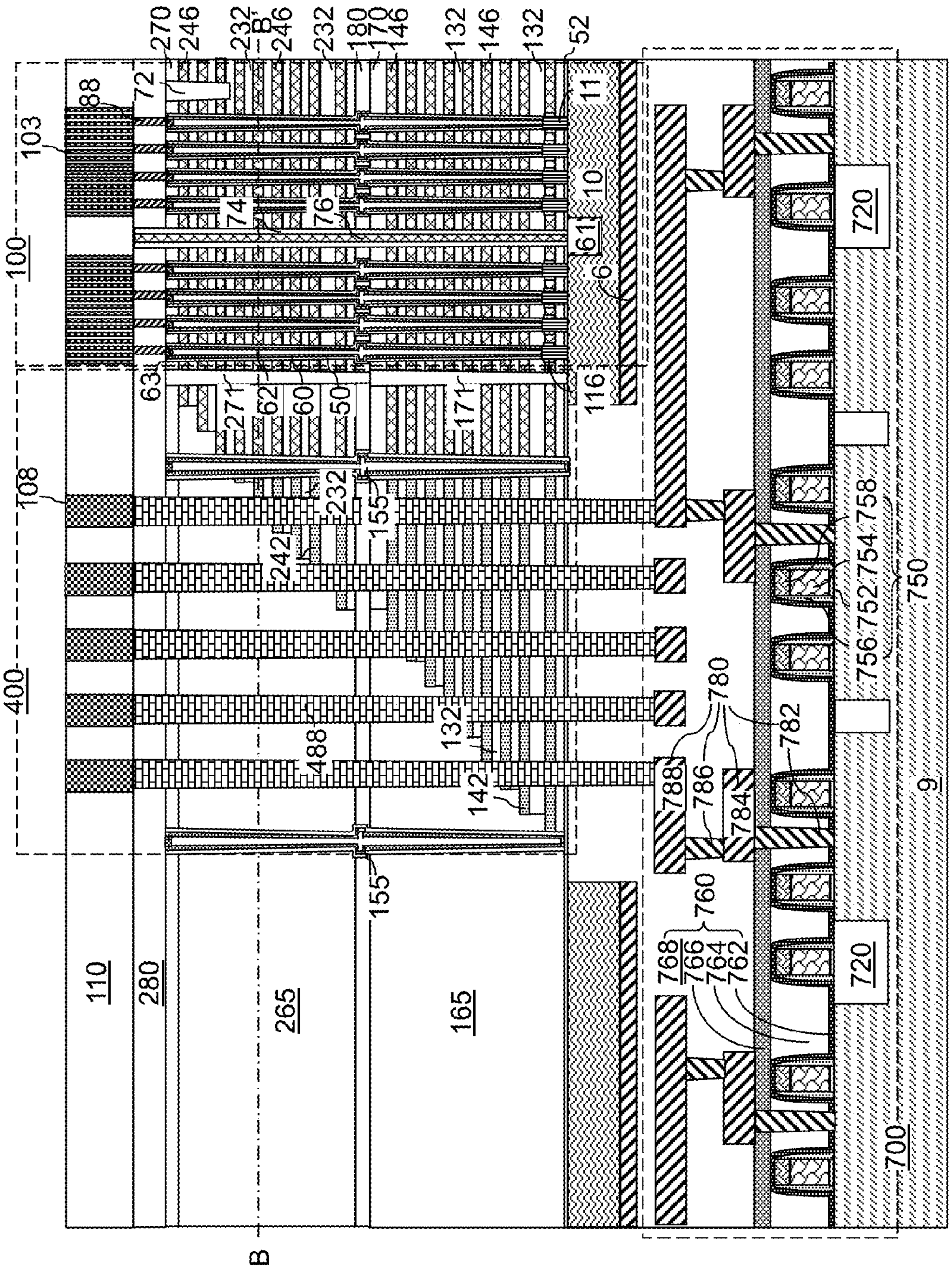
FIG. 30 is a vertical cross-sectional view of the third exemplary structure after formation of upper level metal interconnect structures according to the third embodiment of the present disclosure.

Referring to FIG. 30, a line level dielectric layer 110 can be formed over the contact level dielectric layers (280, 282). Various metal interconnect structures (108, 101) and bit lines 103 can be formed in the line level dielectric layer 110 employing the processing steps of FIGS. 17A-17D. As in the first and second embodiments, the bit lines 103 can overlie the memory-level assembly, can be electrically coupled to nodes (e.g., drain regions 63) of the memory stack structures 55, and can be embedded in at least one upper level dielectric layer such as the line level dielectric layer 110. The through-memory-level via structures 488 can contact respective pairs of an upper level metal interconnect structure 108 and a lower level metal interconnect structure 780. The upper level metal interconnect structures 108 interconnect respective pairs of via structures (86, 488) and (87, 488).

Figure 31A:
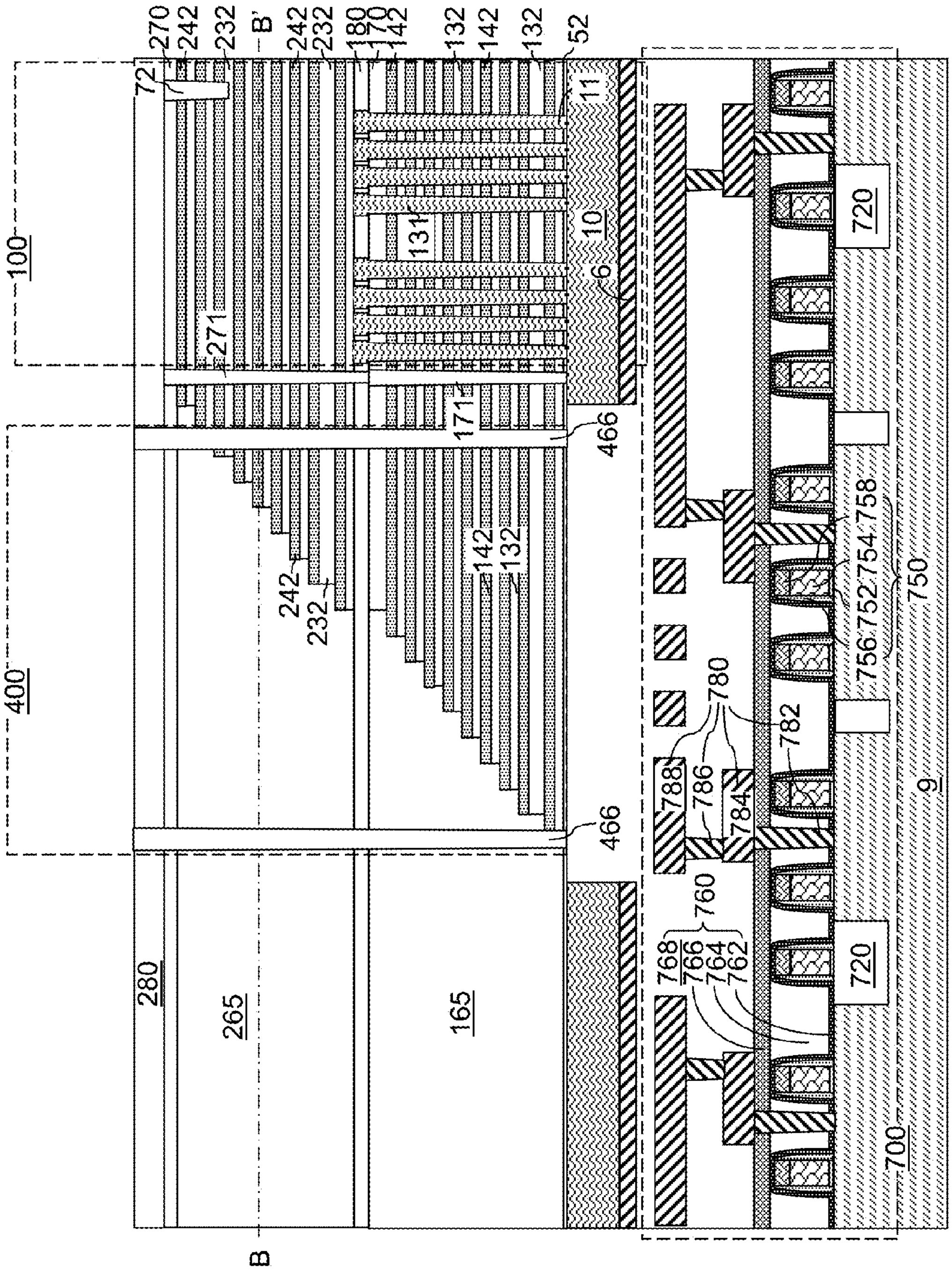
FIG. 31A is a vertical cross-sectional view of a modification of the third exemplary structure after formation of an insulating moat trench structure according to the third embodiment of the present disclosure.
Figure 31B:
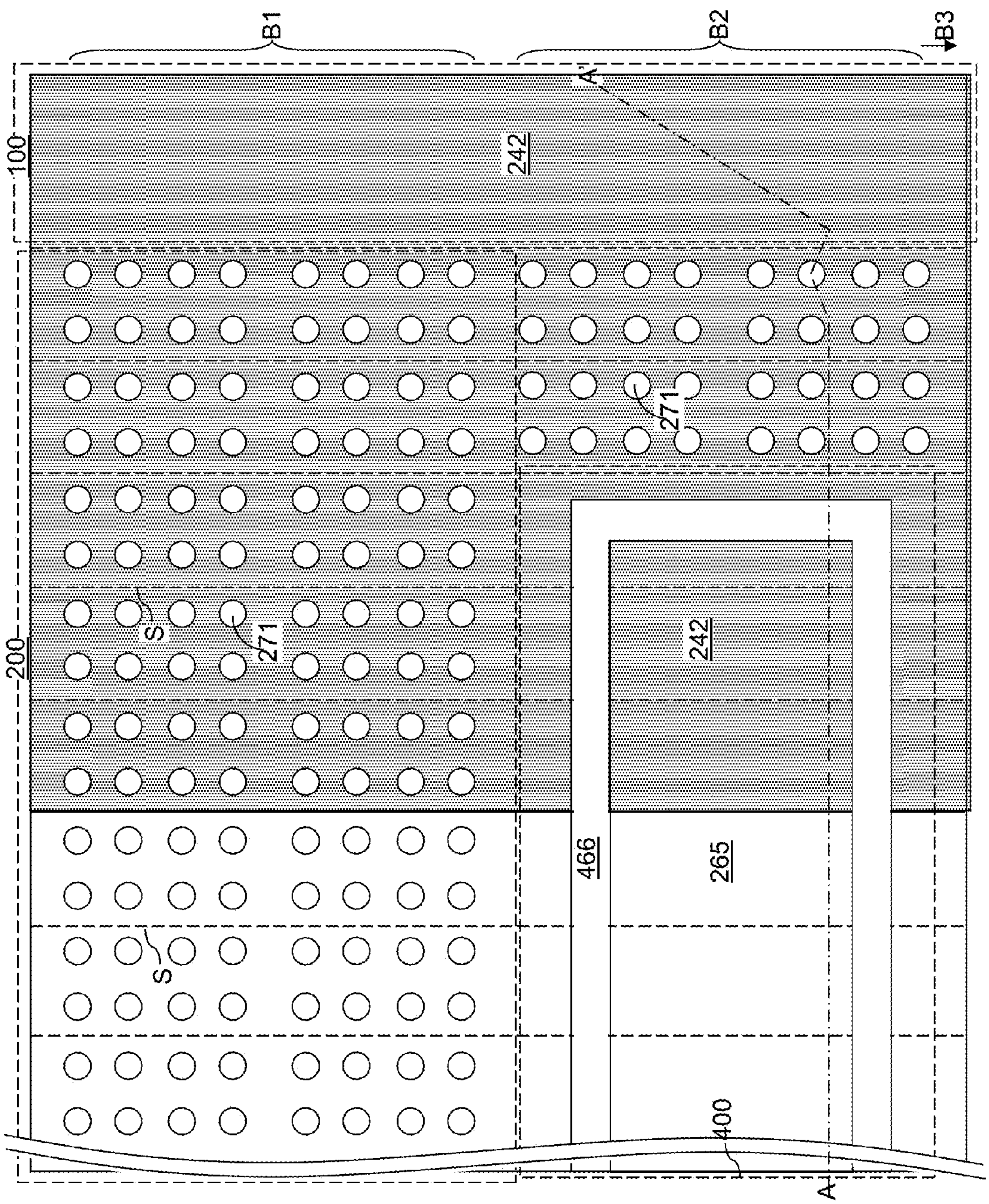
FIG. 31B is a horizontal cross-sectional view of the modification of the third exemplary structure along the horizontal plane B-B' in FIG. 31A. The zig-zag vertical plane A-A' corresponds to the plane of the vertical cross-sectional view of FIG. 31A.

Referring to FIGS. 31A and 31B, a modification of the third exemplary structure can be derived from the third exemplary structure by forming the moat trenches 149 and the insulating moat trench structures 466 in separate steps from forming respective memory openings 49 and memory stack structures 55. The method of making third exemplary structure can be derived from the method steps shown in FIGS. 8A and 8B by forming moat trenches prior to formation of second-tier memory openings. For example, a photoresist layer can be applied over the first exemplary structure of FIGS. 8A and 8B, and can be lithographically patterned to form openings corresponding to the pattern of the moat trenches illustrated in FIGS. 25A and 25B. An anisotropic etch is performed through the second-tier alternating stack (232, 242) and the first-tier alternating stack (132, 142) to form the moat trenches.

The moat trenches can be subsequently filled with a dielectric material such as silicon oxide to form deep trench isolation structures, which are moat trench fill structures 466 filling the moat trenches. In one embodiment, the moat trench fill structures 466 can consist essentially of the dielectric material. In one embodiment, the area of a through-memory-level via region 400 can comprise a closed inner periphery of the insulating moat trench structure 466.

Figure 32A:
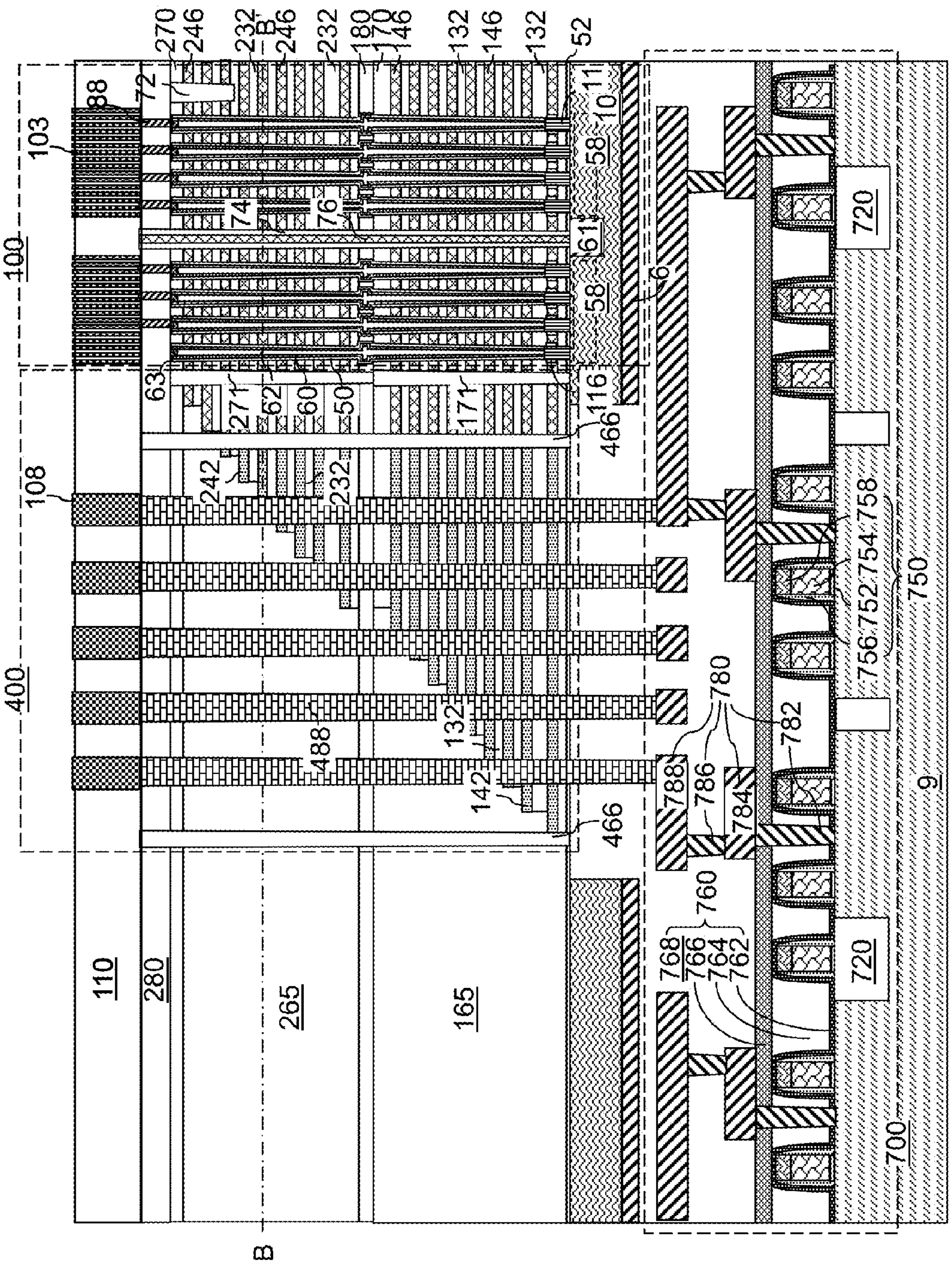
FIG. 32A is a vertical cross-sectional view of the modification of the third exemplary structure after formation of memory stack structures, laterally-elongated contact via structures, and through-memory-level via structures according to the third embodiment of the present disclosure.
Figure 32B:
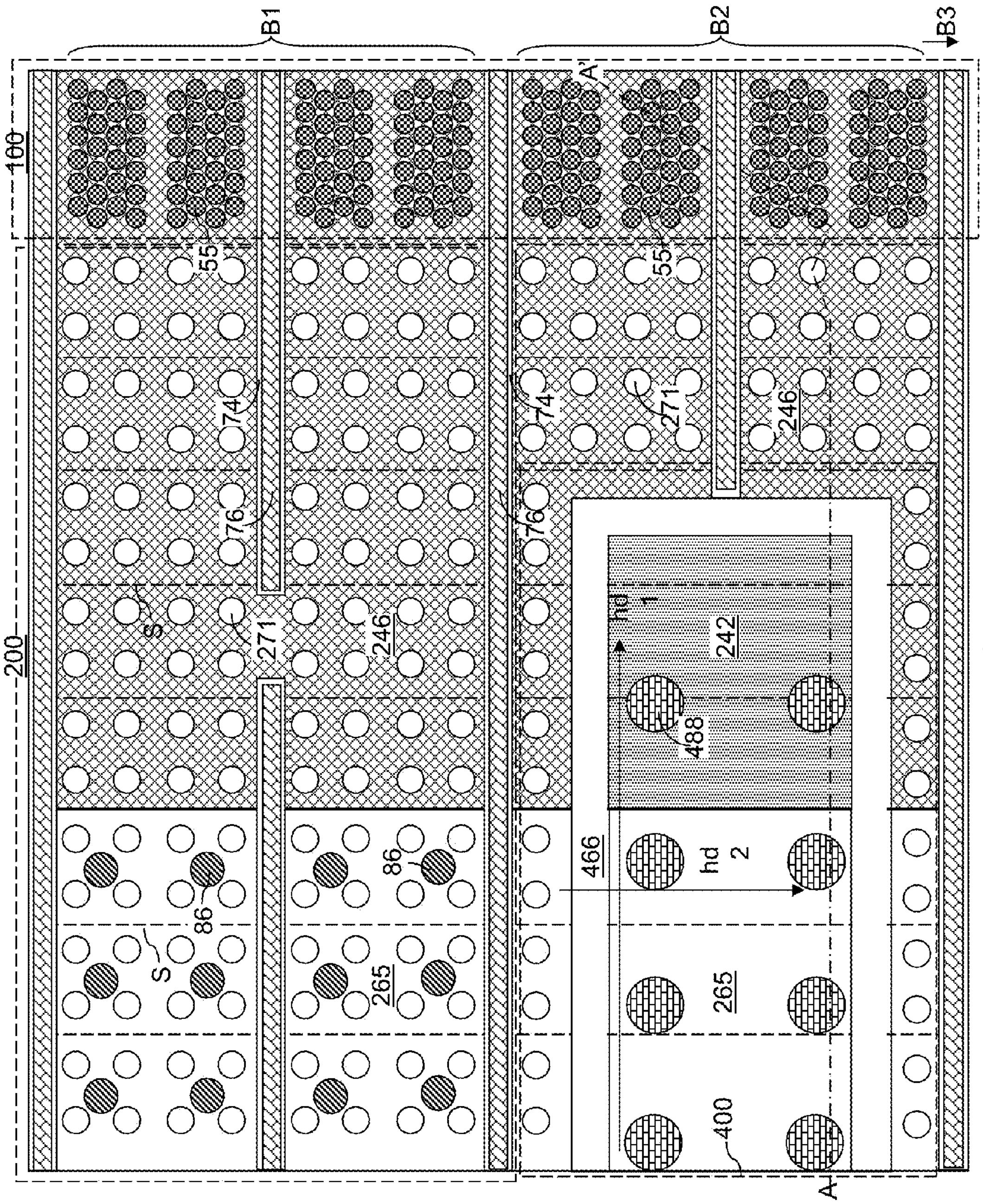
FIG. 32B is a horizontal cross-sectional view of the modification of the third exemplary structure along the horizontal plane B-B' in FIG. 32A. The zig-zag vertical plane A-A' corresponds to the plane of the vertical cross-sectional view of FIG. 32A.

Referring to FIGS. 32A and 32B, the processing steps of FIGS. 9A to 15C can be sequentially performed to replace the sacrificial material layers (142, 242) with electrically conductive layers (246, 246), and to form insulating spacers 74 and laterally-extending contact via structures 76. Subsequently, through-memory-level via structures 488 can be formed in each through-memory-level via region 400 employing the processing steps of FIGS. 29A-29C. Various additional via structures (86, 87, 88) can be formed employing the same processing steps as the processing steps of FIGS. 16A-16C. Subsequently, a line level dielectric layer 110 can be formed over the contact level dielectric layers (280, 282), and various interconnect structures (108, 101)

and bit lines 103 can be formed in the line level dielectric layer 110 employing the processing steps of FIGS. 17A-17D.

The third exemplary structure illustrated in FIG. 30 and the modification illustrated in FIGS. 32A and 32B include a semiconductor structure, which includes a memory-level assembly located over a semiconductor substrate 9 and comprising at least one first alternating stack of electrically conductive layers (146, 246) and first portions of insulating layers (132, 232), and further comprising memory stack structures 55 vertically extending through the at least one first alternating stack. Each of the memory stack structures 55 comprises a memory film 50 and a vertical semiconductor channel 60. The electrically conductive layers (146, 246) constitute word lines for the memory stack structures 55. The semiconductor structure further includes an insulating moat trench structure {466 or (155, 463)} vertically extending through the memory-level assembly and defining an area of a through-memory-level via region 400 laterally spaced from the at least one first alternating stack (132, 146, 232, 246). The semiconductor structure further includes at least one second alternating stack located in the through-memory-level via region 400. The at least one second alternating stack includes alternating layers of dielectric spacer layers (142, 242) and second portions of the insulating layers (132, 232), and each of the dielectric spacer layers (142, 242) is located at a same level as a respective electrically conductive layer (146, 246). The semiconductor structure further comprises through-memory-level via structures 488 located within the through-memory-level via region 400 and vertically extending from a first horizontal plane including a topmost surface of the memory-level assembly and a bottommost surface of the memory-level assembly and comprising a conductive material.

In one embodiment, the area of the through-memory-level via region 400 includes a closed inner periphery of the insulating moat trench structure {466 or (155, 463)}. In this case, the entire set of outer sidewalls of the at least one second alternating stack (132, 142, 232, 242) can contact an inner sidewall of the insulating moat trench structure {466 or (155, 463)}.

In one embodiment, a plurality of laterally-elongated contact via structures 76 can extend along the first horizontal direction hd1, and can laterally divide the memory-level assembly into a plurality of laterally spaced-apart blocks (B1, B2, B3, . . . ). In one embodiment, the plurality of blocks (B1, B2, B3, . . . ) can comprise a set of three neighboring blocks including, in order, a first block B1, a second block B2, and third block B3 arranged along a second horizontal direction hd2 that is perpendicular to the first horizontal direction hd1. The insulating moat trench structure {466 or (155, 463)} can be located on a lengthwise end of the second block B2 and between a staircase region of the first block B1 and a staircase region of the third block B3. Each staircase region of the first and third blocks (B1, B3) can include terraces in which each underlying electrically conductive layer (146, 246) extends farther along the first horizontal direction hd1 than any overlying electrically conductive layer (146, 246) within the memory-level assembly.

In one embodiment, stepped bottom surfaces of a retro-stepped dielectric material portion (265 or 165) can contact stepped top surfaces of the first and third staircase regions in respective first and third blocks (B1, B3). In one embodiment, an additional retro-stepped dielectric material portion (265 or 165) can be present within an inner sidewall of the insulating moat trench structure {466 or (155, 463)}. In this case, stepped bottom surfaces of the additional retro-stepped dielectric material portion can comprise the same material as the retro-stepped dielectric material portion (165, 265), and can be laterally spaced from the retro-stepped dielectric material portion by the insulating moat trench structure {466 or (155, 463)}, and can contact stepped top surfaces of the at least one second alternating stack (132, 142, 232, 242).

In one embodiment, the insulating moat trench structure {466 or (155, 463)} can be U-shaped. In this case, additional stepped bottom surfaces of the retro-stepped dielectric material portion (165 or 265) can contact stepped top surfaces of the at least one second alternating stack (132, 142, 232, 242).

In one embodiment, each of the plurality of laterally-elongated contact via structures 76 can be laterally surrounded by an insulating spacer 74. The insulating moat trench structure (155, 463) can comprise an insulating liner 50 comprising a same material as a memory film 50 in a memory stack structure 55.

In one embodiment, the plurality of laterally-elongated contact via structures 76 can comprise source lines contacting respective underlying source regions 61 that contact respective horizontal channels 58.

In one embodiment, the insulating moat structure (155, 463) can comprise a layer stack including a same set of layers as layers included in each of the memory stack structures 55, i.e., the memory film 50 and the vertical semiconductor channel 60.

In one embodiment, the insulating moat structure 466 can consist essentially of a dielectric fill material portion.

The semiconductor structure can further comprise semiconductor devices located on the semiconductor substrate 9, lower level metal interconnect structures 780 electrically shorted to nodes of the semiconductor devices and embedded in at least one lower level dielectric layer 760 that overlies the semiconductor substrate 9, and a planar semiconductor material layer 10 overlying the at least one lower level dielectric layer 760 and including horizontal semiconductor channels 58 connected to vertical semiconductor channels 60 within the memory stack structures 55.

In one embodiment, the semiconductor structure can further include upper level metal interconnect structures 108 overlying the memory-level assembly, electrically coupled to nodes of the memory stack structures 55, and embedded in at least one upper level dielectric layer 110. The through-memory-level via structures 488 can vertically extend through the memory-level assembly, and can contact respective pairs of an upper level metal interconnect structure 108 and a lower level metal interconnect structure 780.

Figure 33A:
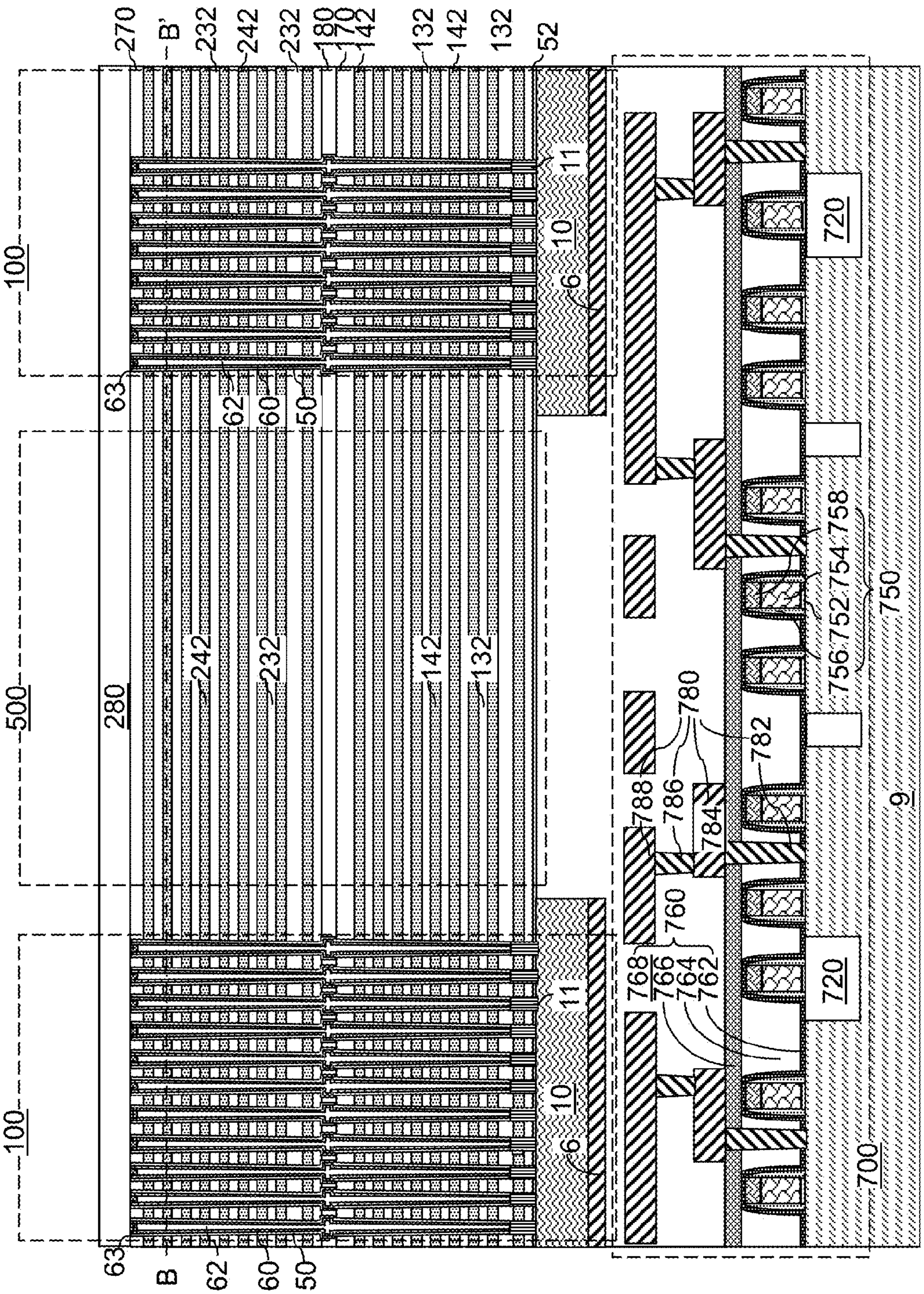
FIG. 33A is a vertical cross-sectional view of a fourth exemplary structure after formation of a first-tier alternating stack, a second-tier alternating stack, and memory stack structures according to a fourth embodiment of the present disclosure.
Figure 33B:
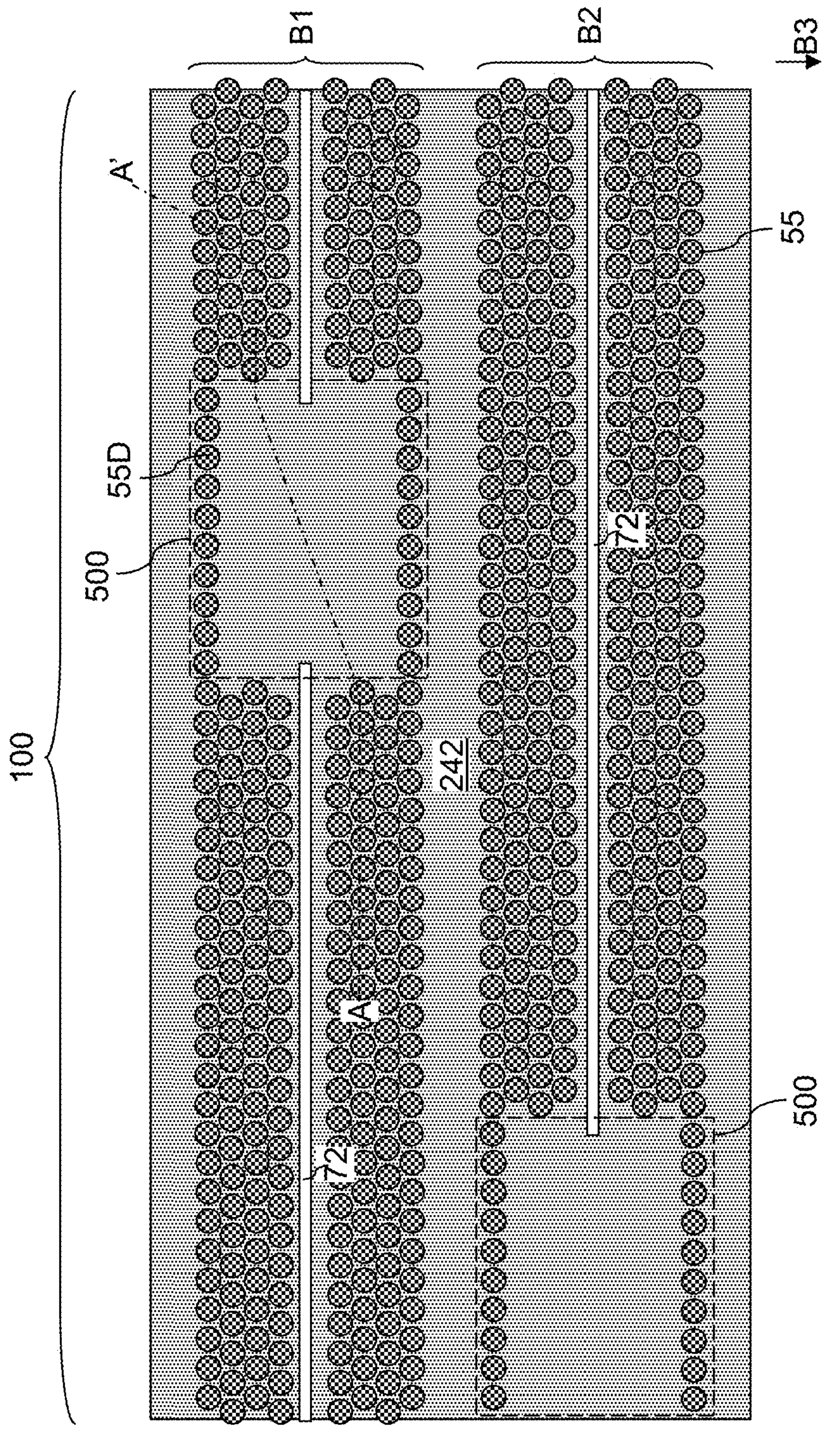
FIG. 33B is a horizontal cross-sectional view of the fourth exemplary structure along the horizontal plane B-B' in FIG. 33A. The zig-zag vertical plane A-A' corresponds to the plane of the vertical cross-sectional view of FIG. 33A.

Referring to FIGS. 33A and 33B, a fourth exemplary structure according to a fourth embodiment of the present disclosure, which can be formed concurrently with formation of any of the first, second, and third exemplary structures or modifications thereof, or can be formed as a stand-alone structure. The fourth exemplary structure illustrated in FIGS. 33A and 33B can be formed employing the same processing steps as the processing steps employed to form the first exemplary structure of FIGS. 10A and 10B without forming the backside contact trenches 79. Through-memory-level via regions 500 can be formed within the memory array region 100. Each through-memory-level via region 500 can be formed entirely within a block (B1, B2, etc.). The through-memory-level via regions 500 can be formed without forming additional through-memory-level via regions 400 of the first, second, and third embodiments, or can be formed in addition to the through-memory-level via regions 400 of the first, second, and third embodiments through the same memory-level assembly.

Each of the at least one alternating stack of insulating layers (132, 232) and sacrificial material layers (142, 242) is an in-process alternating stack, which is modified in subsequent processing steps. While an embodiment is described herein in which the through-memory-level via regions 500 are formed within the memory array region 100, embodiments are also contemplated herein in which additional, or substitutional, through-memory-level via regions 500 are formed in the staircase regions. Various dummy memory stack structures 55D can be formed around the through-memory-level via regions 500, which are not electrically connected as device components, but are employed for structural support during formation of backside recesses in subsequent processing steps.

Figure 34A:
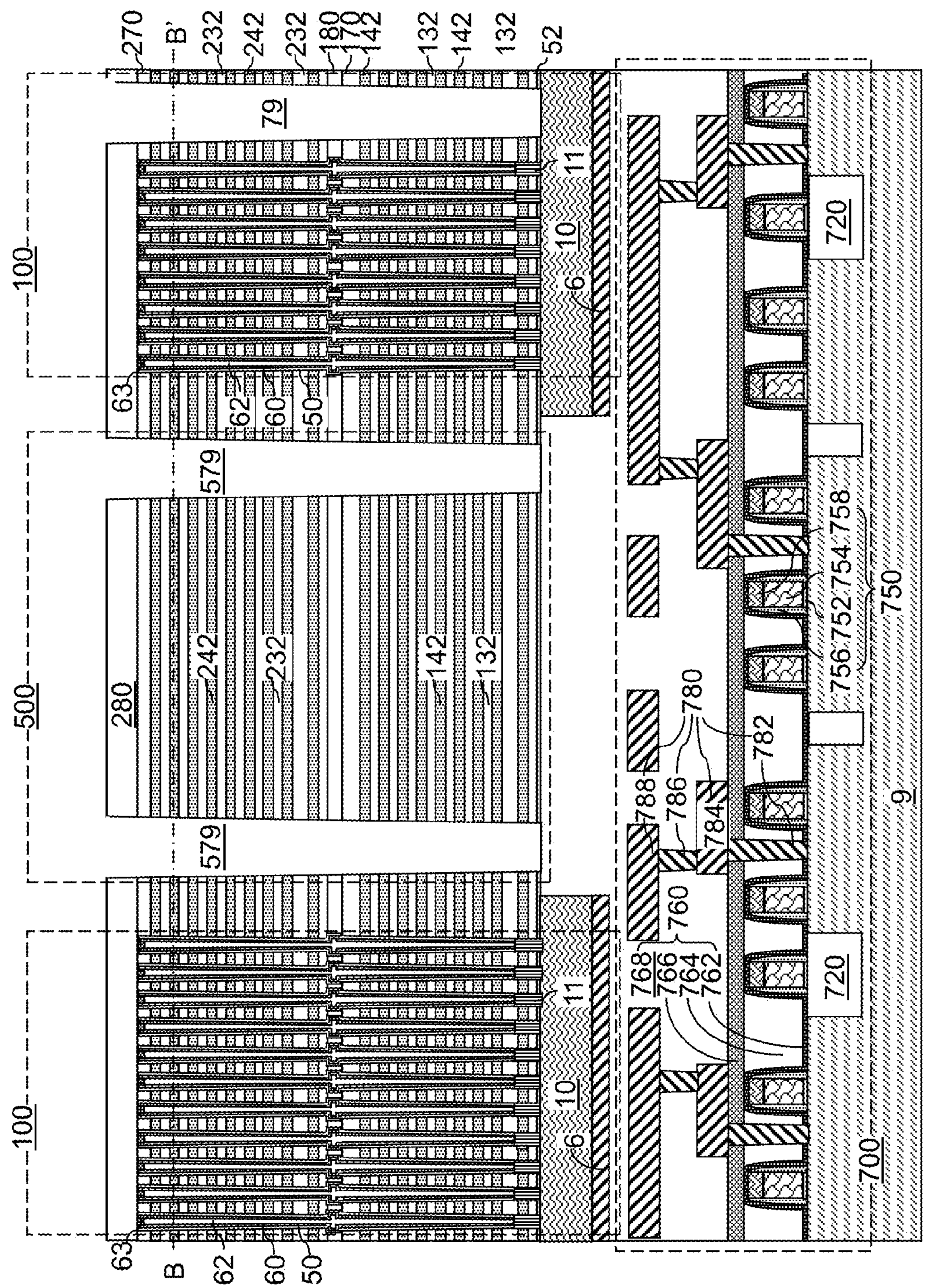
FIG. 34A is a horizontal cross-sectional view of the fourth exemplary structure after formation of through-memory-level openings and backside contact trenches according to the fourth embodiment of the present disclosure.
Figure 34B:
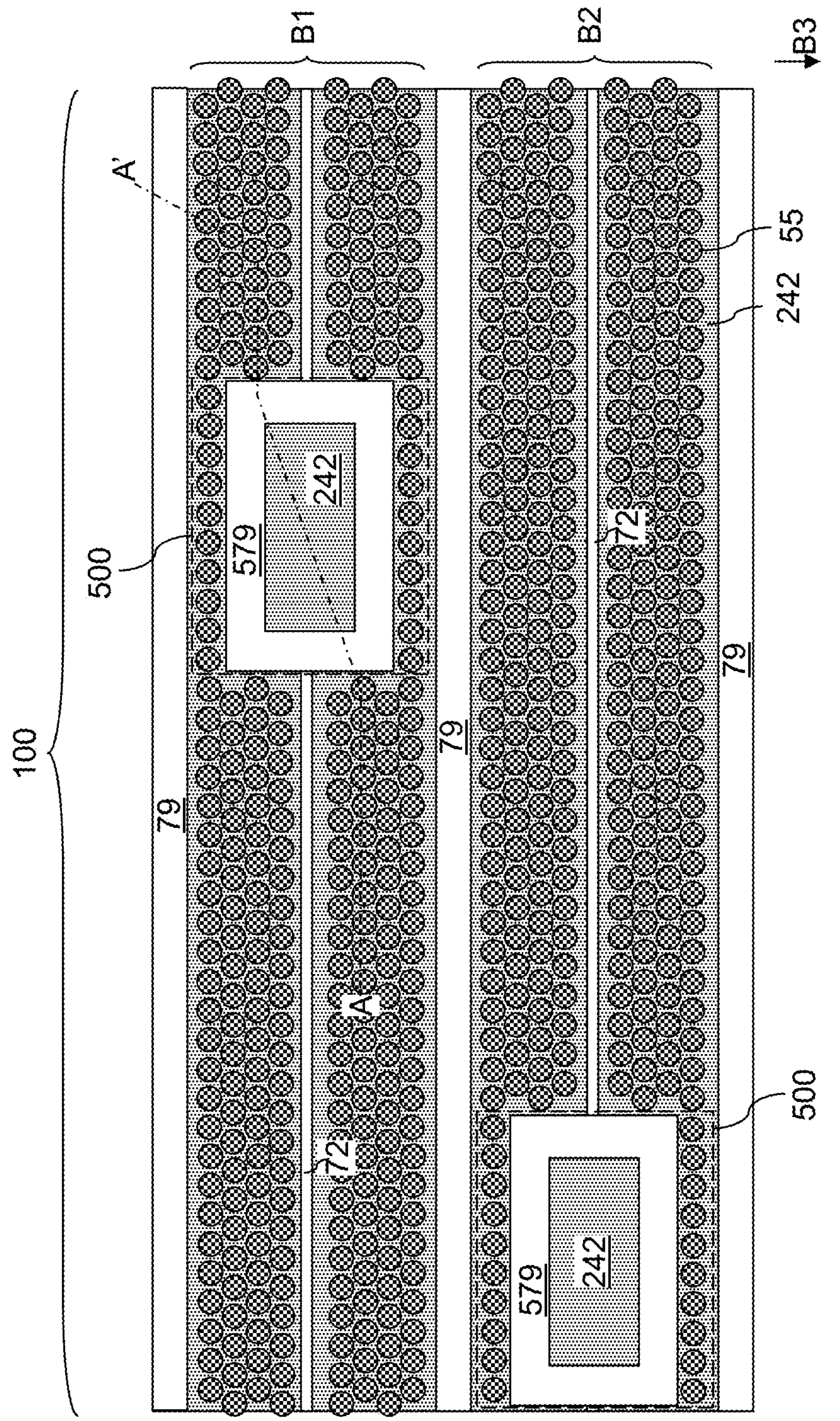
FIG. 34B is a horizontal cross-sectional view of the fourth exemplary structure along the horizontal plane B-B' in FIG. 34A. The zig-zag vertical plane A-A' corresponds to the plane of the vertical cross-sectional view of FIG. 34A.

Referring to FIGS. 34A and 34B, backside contact trenches 79 and moat trenches 579 can be simultaneously formed through the memory-level assembly. For example, a photoresist layer can be applied over the first contact level dielectric layer 280, and can be lithographically patterned to form openings including the pattern of the backside contact trenches 79 as in the previous embodiments and the pattern of moat trenches, which can be the same as the pattern of moat trenches of the third embodiment or the modification thereof. An anisotropic etch is performed to transfer the pattern in the patterned photoresist layer through the memory-level assembly, thereby forming the backside contact trenches 79 and the moat trenches 579. The photoresist layer can be subsequently removed, for example, by ashing. Each moat trench 579 can include an area of the through-memory-level via region 400 within an outer periphery thereof.

Figure 35A:
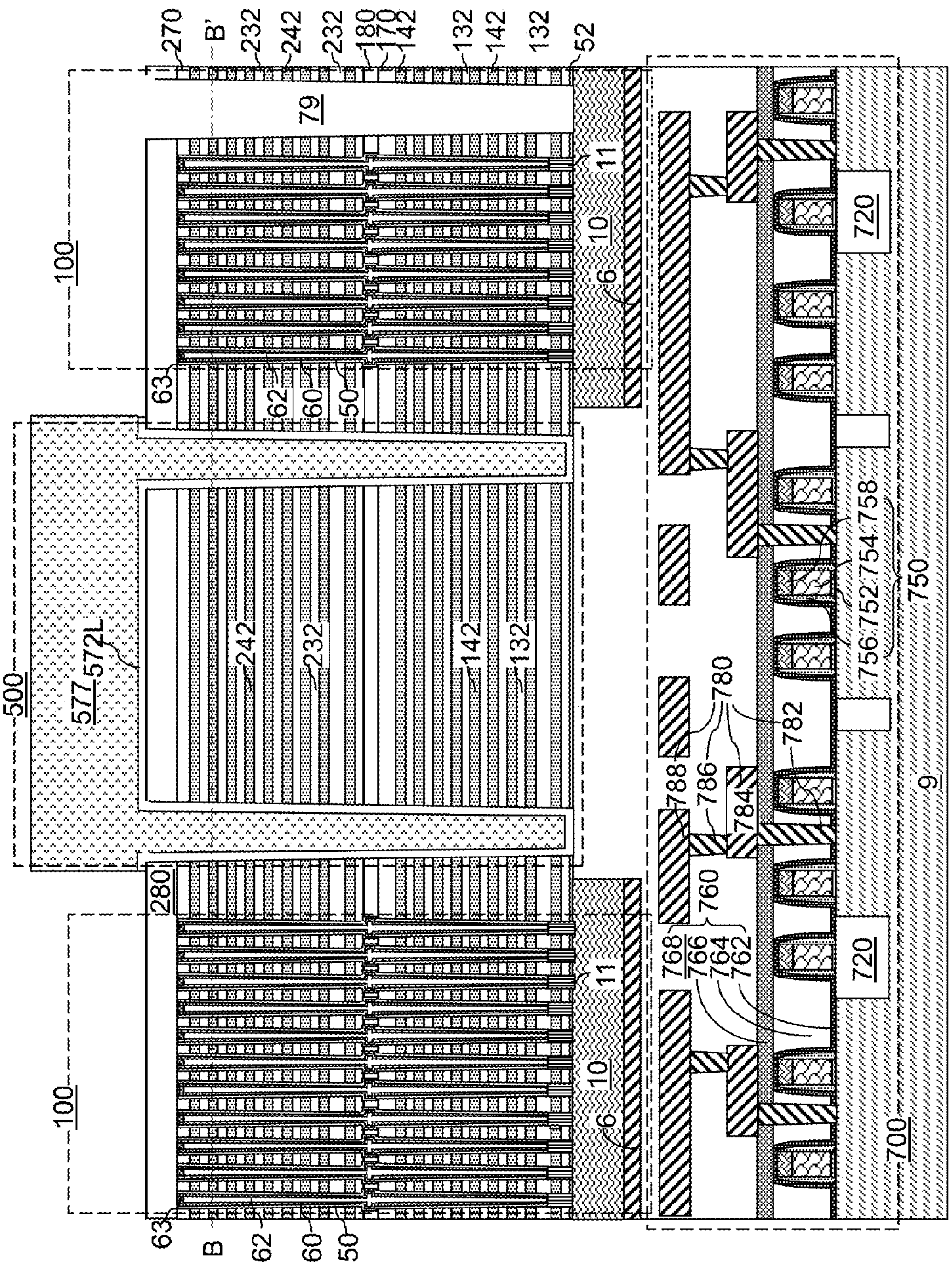
FIG. 35A is a vertical cross-sectional view of the fourth exemplary structure after deposition and patterning of an insulating liner layer according to the fourth embodiment of the present disclosure.
Figure 35B:
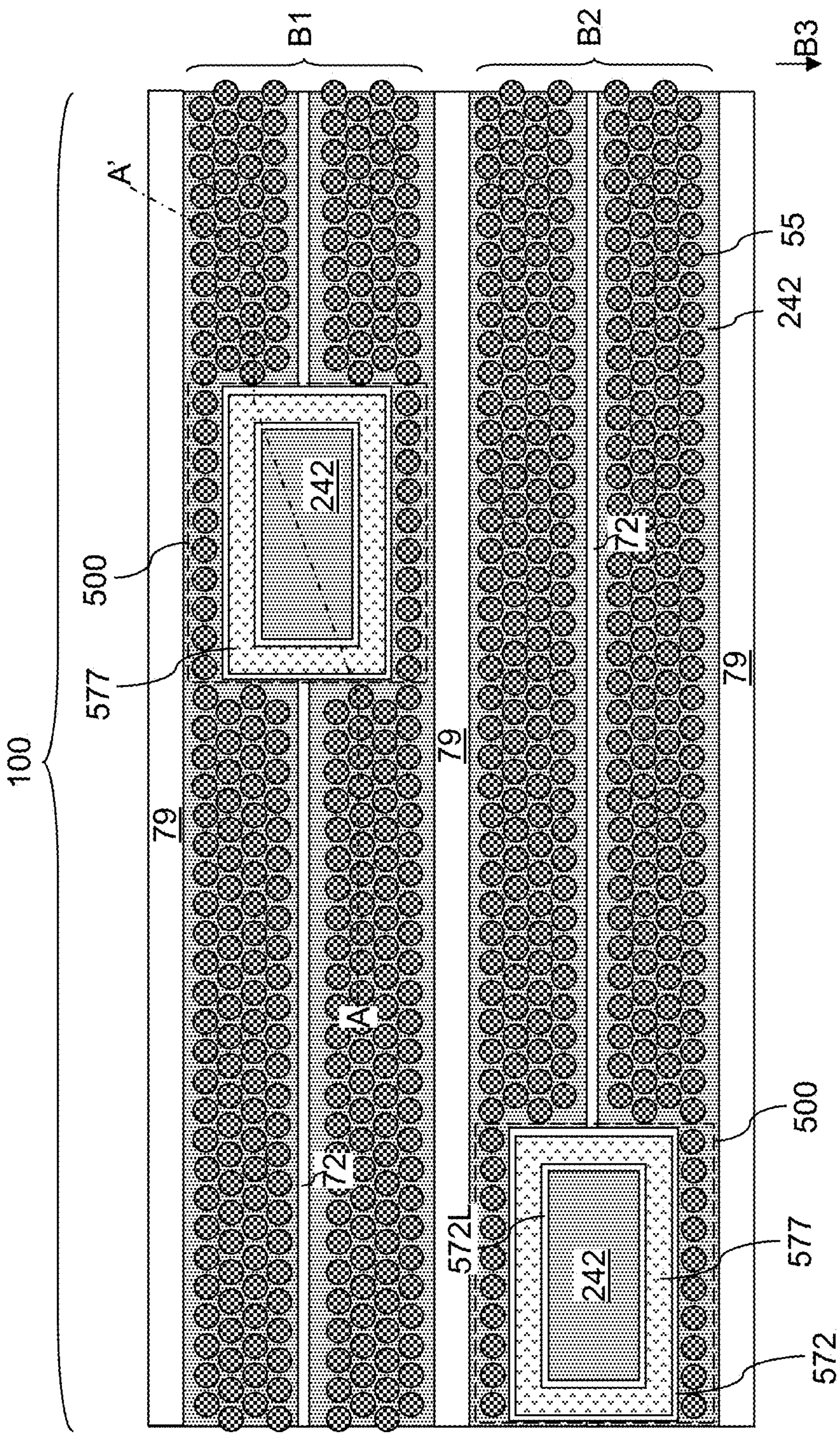
FIG. 35B is a horizontal cross-sectional view of the fourth exemplary structure along the horizontal plane B-B' in FIG. 35A. The zig-zag vertical plane A-A' corresponds to the plane of the vertical cross-sectional view of FIG. 35A.

Referring to FIGS. 35A and 35B, an insulating liner layer 572L can be deposited in the moat trenches 579 and the backside contact trenches 79. The insulating liner layer 572L includes a dielectric material such as silicon oxide, silicon nitride, and/or a dielectric metal oxide such as aluminum oxide. The insulating liner layer 572L can be deposited as a conformal material layer by a conformal deposition method such as chemical vapor deposition or atomic layer deposition. The thickness of the insulating liner layer 572L can be in a range from 3 nm to 60 nm, although lesser and greater thicknesses can also be employed.

A photoresist layer 577 can be applied over the insulating liner layer 572L, and can be lithographically patterned to cover the insulating liner layer 572L in the through-memory-level via regions 500, while the insulating liner layer 572L is not covered by the photoresist layer outside the through-memory-level via regions 500. An etch process (which may be an isotropic etch or an anisotropic etch) can be employed to remove physically exposed portions of the insulating liner layer 572L from outside the through-memory-level via regions 500. A patterned insulating liner layer 572L is formed on sidewalls of the moat trenches 579 and over portions of the first contact level dielectric layer 280 within the through-memory-level via regions 500. Sidewalls of the backside contact trenches 76 are physically exposed to an ambient. As used herein, an “ambient” refers to any gaseous ambient that a semiconductor substrate can be physically exposed to during a manufacturing sequence, and includes air, vacuum, an inert environment, and reduced pressure environment. The photoresist layer 577 is subsequently removed, for example, by ashing.

Figure 36A:
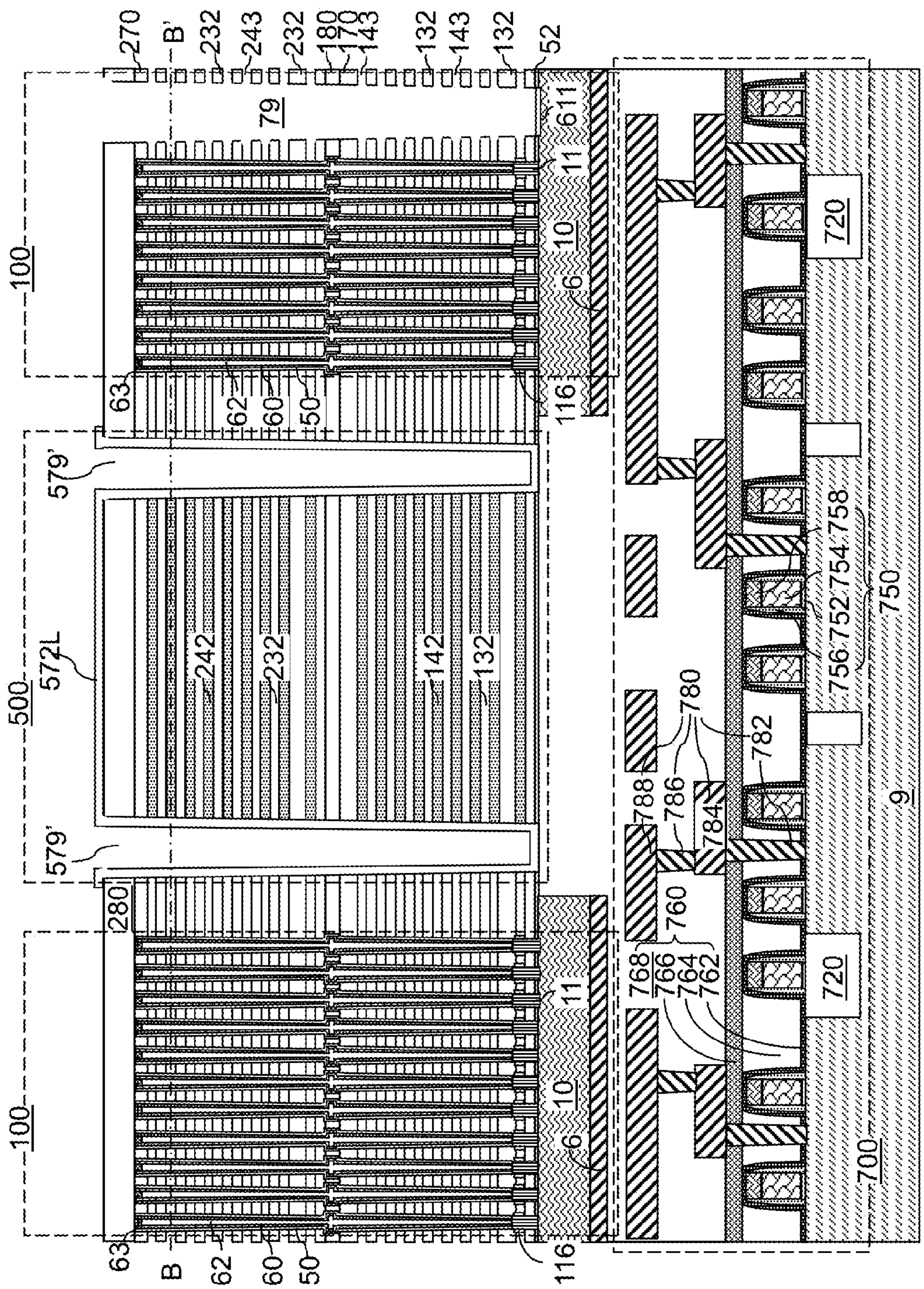
FIG. 36A is a vertical cross-sectional view of the fourth exemplary structure after formation of backside recesses according to the fourth embodiment of the present disclosure.
Figure 36B:
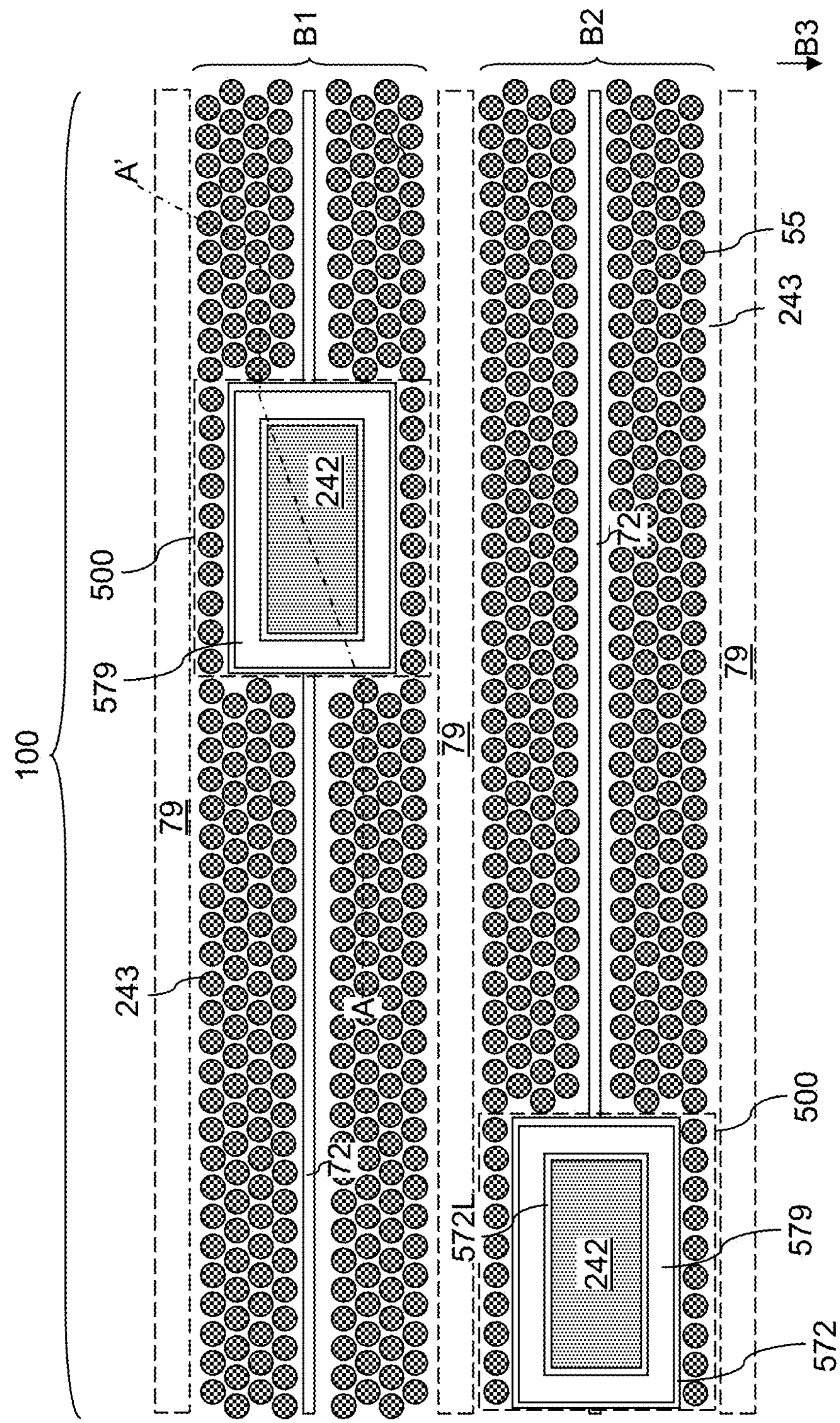
FIG. 36B is a horizontal cross-sectional view of the fourth exemplary structure along the horizontal plane B-B' in FIG. 36A. The zig-zag vertical plane A-A' corresponds to the plane of the vertical cross-sectional view of FIG. 36A.
Figure 37A:
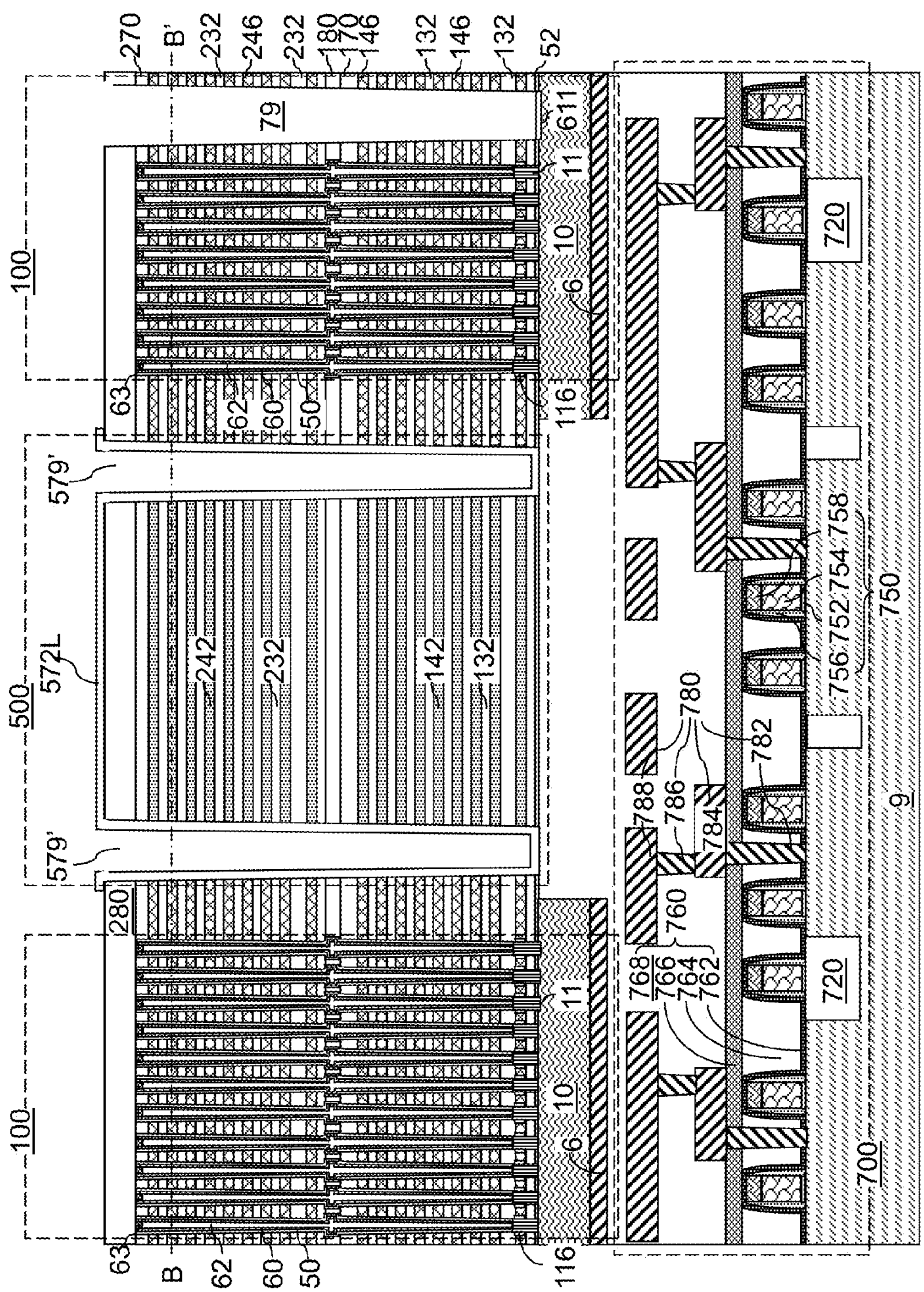
FIG. 37A is a vertical cross-sectional view of the fourth exemplary structure after formation of electrically conductive layers according to the fourth embodiment of the present disclosure.

Referring to FIGS. 36A and 37A, the processing steps of FIGS. 11A and 11B can be performed to remove the sacrificial material layers (142, 242) selective to the insulating layers (132, 232). Specifically, an etchant can be introduced through the backside contact trenches 79 to form backside recesses (143, 243). A patterned insulating liner layer 572L covers all sidewalls of each moat trench 579, and prevents the etchant from etching the portion of the at least one alternating stack (132, 142, 232, 242) enclosed therein. Thus, each portion of the at least one alternating stack (132, 142, 232, 242) laterally enclosed by the vertical portion of a respective patterned insulating liner layer 572L remains intact during formation of the backside recesses (143, 243).

Figure 37B:
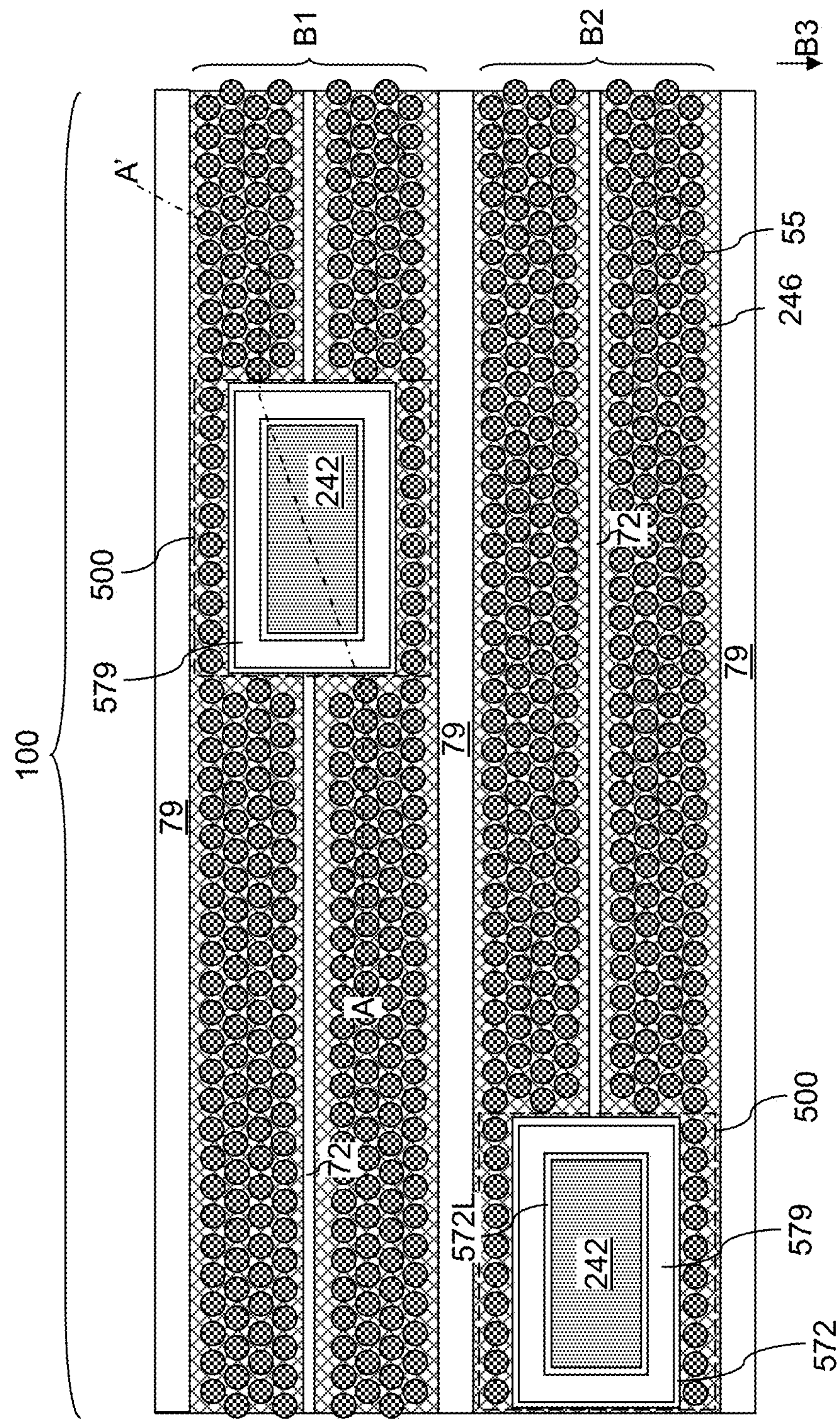
FIG. 37B is a horizontal cross-sectional view of the fourth exemplary structure along the horizontal plane B-B' in FIG. 37A. The zig-zag vertical plane A-A' corresponds to the plane of the vertical cross-sectional view of FIG. 37A.

Referring to FIGS. 37A and 37B, the processing steps of FIGS. 12A and 12B can be performed to form the electrically conductive layers (146, 246) in the backside recesses (143, 243). The electrically conductive layers (146, 246) can be formed by introducing a reactant through the backside contact trenches 79, thereby forming the at least one alternating stack of insulating layers (132, 232) and electrically conductive layers (146, 246). A trench cavity 579' is present within each patterned insulating liner layer 572L. A remaining portion of the at least one in-process alternating stack (132, 142, 232, 242) remains within each area enclosed by a moat trench 579.

Figure 38A:
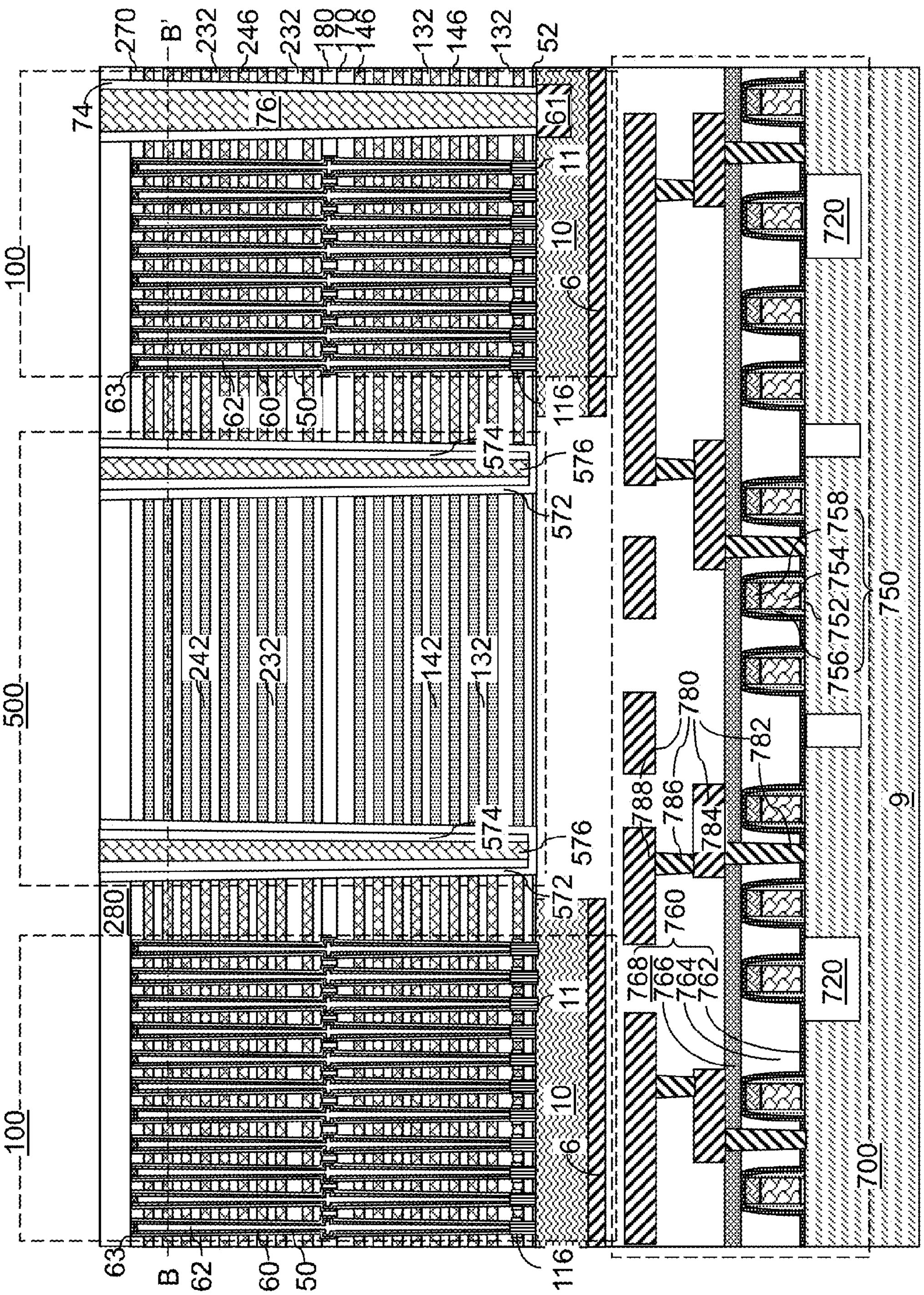
FIG. 38A is a vertical cross-sectional view of the fourth exemplary structure after formation of insulating moat trench structures and laterally-elongated contact via structures according to the fourth embodiment of the present disclosure.
Figure 38B:
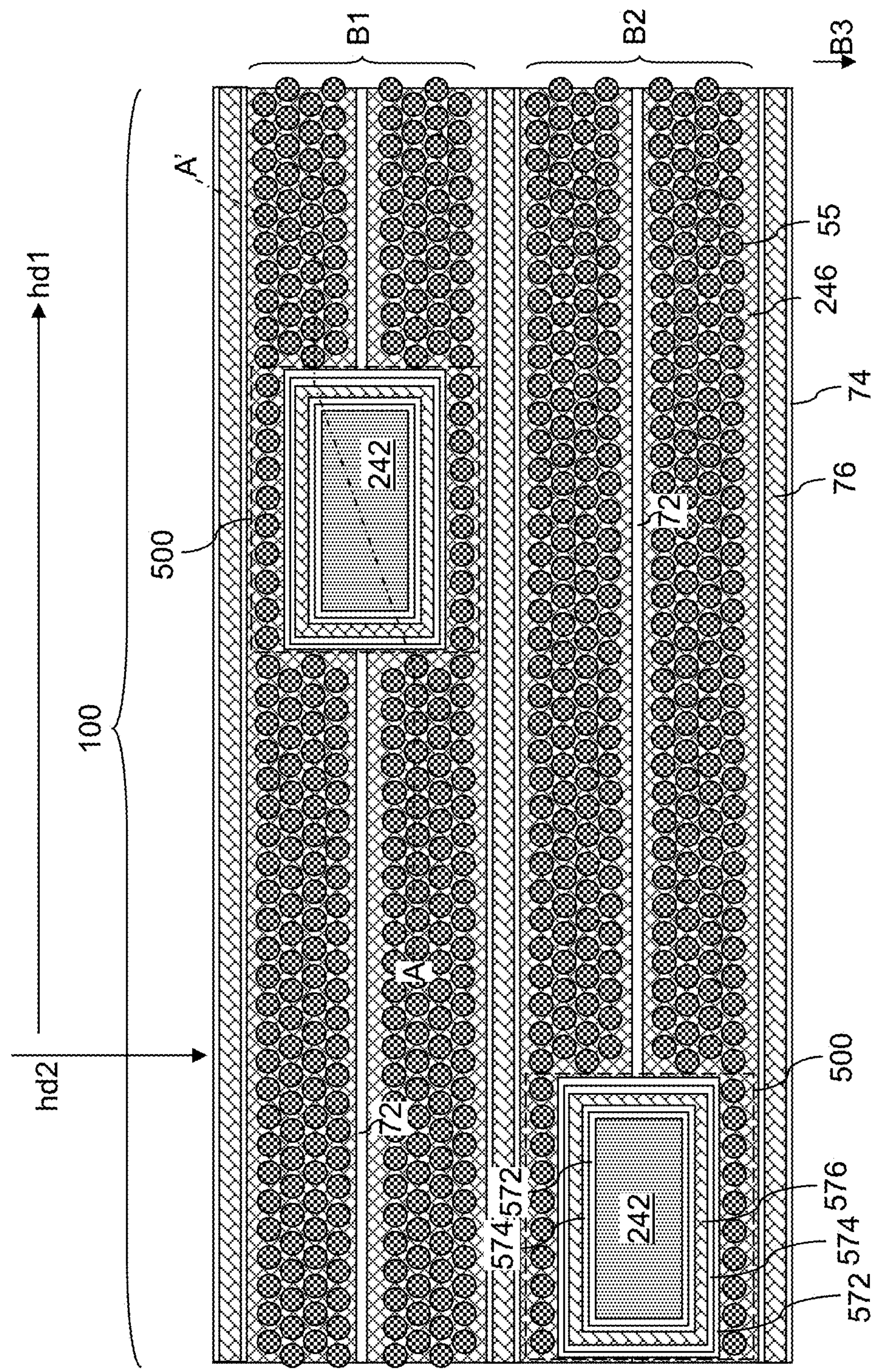
FIG. 38B is a horizontal cross-sectional view of the fourth exemplary structure along the horizontal plane B-B' in FIG. 38A. The zig-zag vertical plane A-A' corresponds to the plane of the vertical cross-sectional view of FIG. 38A.

Referring to FIGS. 38A and 38B, the processing steps of FIGS. 13A and 13B can be performed to form insulating spacers 74 and laterally-elongated contact via structures 76. Specifically, an insulating material layer can be conformally deposited and anisotropically etched to form an insulating spacer 74 in each backside contact trench 79 and an inner insulating liner 574 in each trench cavity 579'. An inner insulating liner 574 can be formed within each patterned insulating liner layer 572L concurrently with formation of the insulating spacers 74. The insulating spacers 74 and insulating liners (i.e., the inner insulating liners 574) can be simultaneously formed in the backside contact trenches 79 and the moat trenches 579, respectively. The inner insulating liners 574 and the insulating spacers 74 can include the same dielectric material, and can have the same thickness.

A conductive material is deposited to fill remaining volumes of the backside contact trenches 79 and the trench cavities 579'. Excess portions of the conductive material can be removed from above the horizontal plane including the top surface of the first contact level dielectric layer 280 by a planarization process such as chemical mechanical planarization. Each remaining portion of the conductive material within an insulating spacer 74 constitutes a laterally-elongated contact via structure 76. Each remaining portion of the conductive material within an inner insulating liner 574 constitutes a conductive fill portion 576. The plurality of laterally-elongated contact via structures 76 and the conductive fill material portions 576 can be simultaneously formed on the insulating spacers 74 and the insulating liners, respectively. Horizontal portions of the patterned insulating liner layers 572L can be removed from above the top surface of the first contact level dielectric layer 280. Each remaining portion of the patterned insulating liner layers 572L constitutes an outer insulating liner 572.

A plurality of laterally-elongated contact via structures 76 is formed through the memory-level assembly. The plurality of laterally-elongated contact via structures 76 laterally extends along a first horizontal direction hd1, and laterally divides the at least one alternating stack into a plurality of laterally spaced-apart blocks (B1, B2, B3, . . . ) within the memory-level assembly.

Figure 39A:
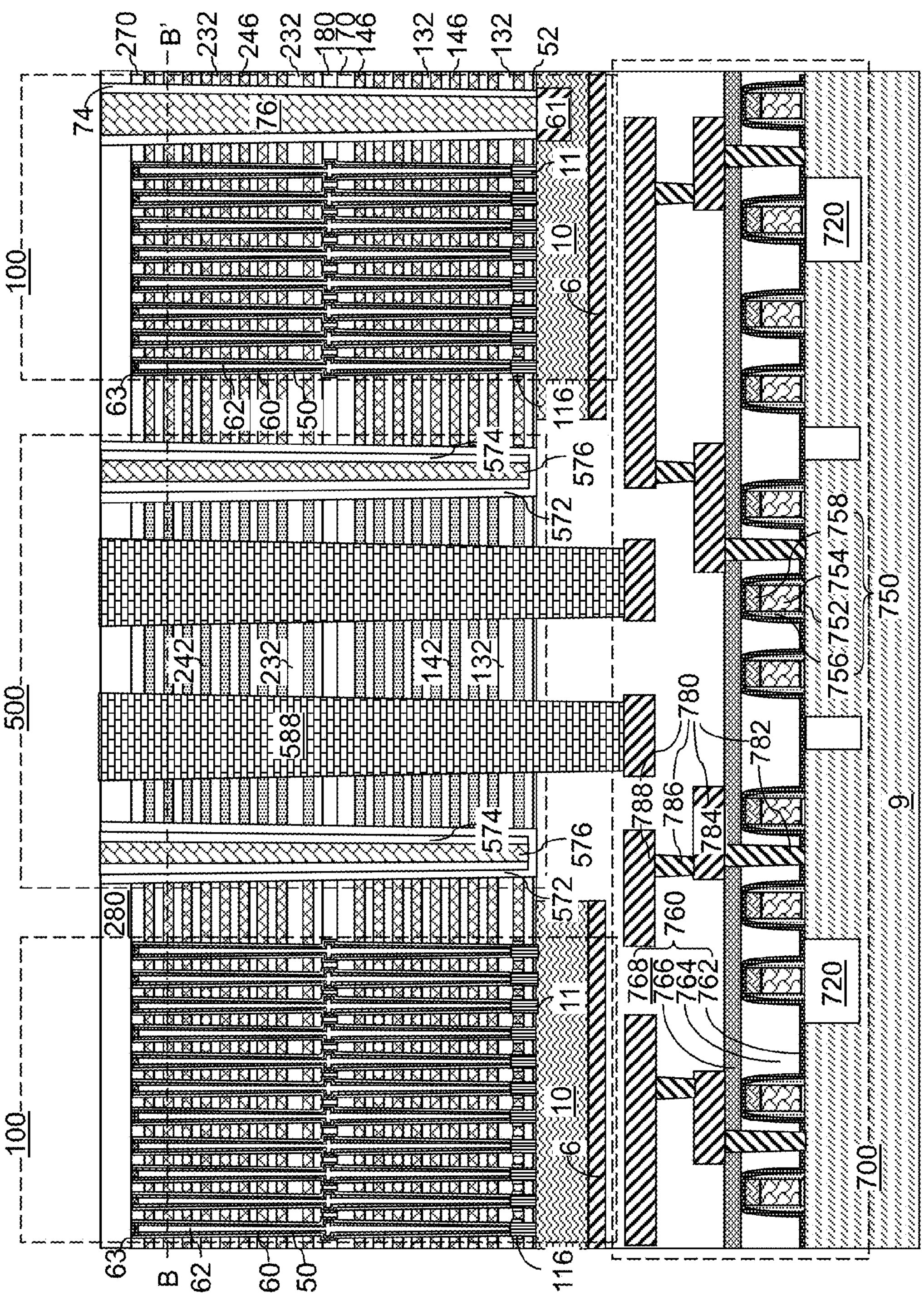
FIG. 39A is a vertical cross-sectional view of the fourth exemplary structure after formation of through-memory-level via structures according to the fourth embodiment of the present disclosure.
Figure 39B:
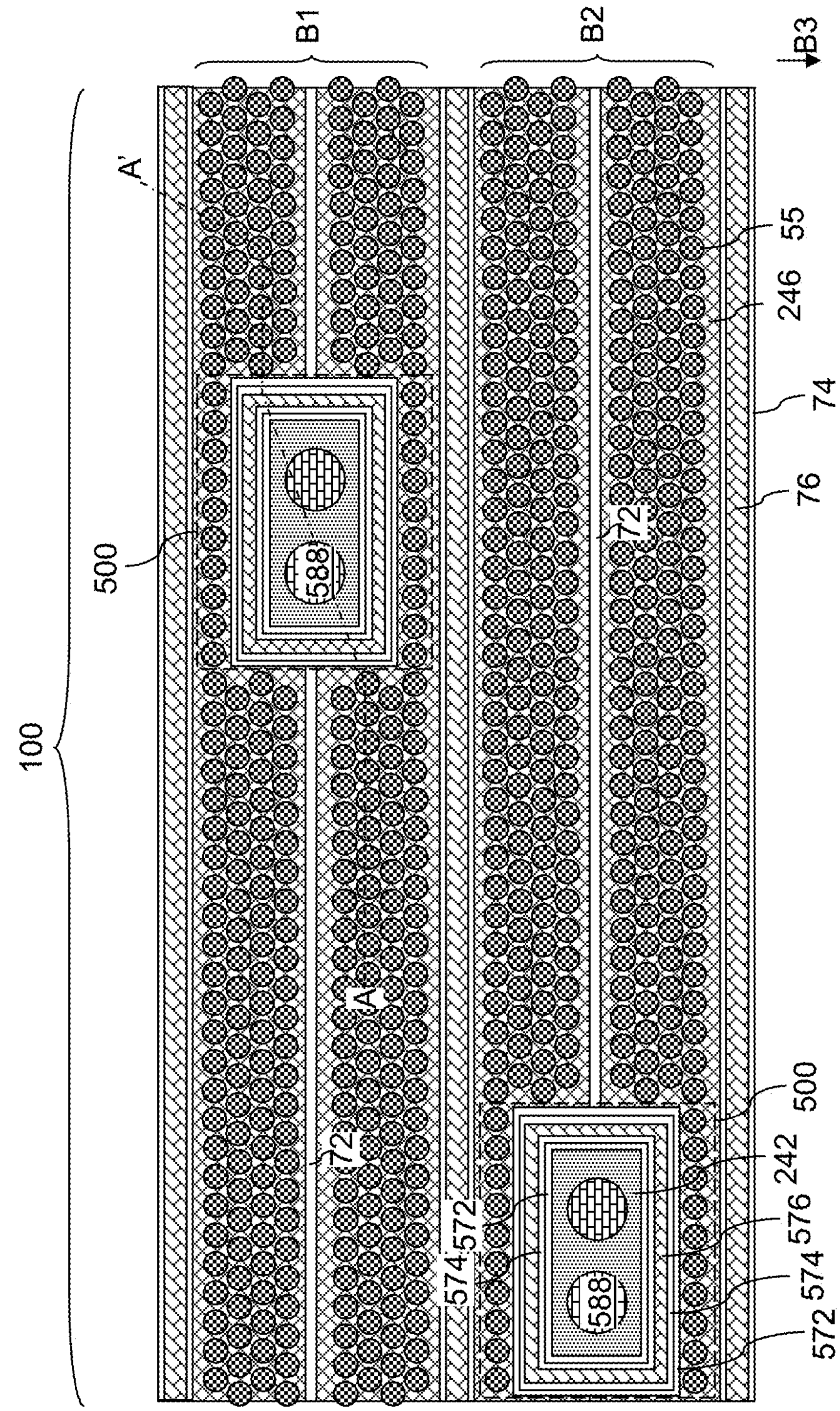
FIG. 39B is a horizontal cross-sectional view of the fourth exemplary structure along the horizontal plane B-B' in FIG. 39A. The zig-zag vertical plane A-A' corresponds to the plane of the vertical cross-sectional view of FIG. 39A.

Referring to FIGS. 39A and 39B, at least one through-memory-level opening is formed through the memory-level assembly within the areas of each through-memory-level via region 500. A lithographically patterned mask including openings in the areas of the through-memory-level via regions 500 can be employed during an anisotropic etch that etches the material of the at least one alternating stack (132, 142, 232, 242) as originally formed at the processing steps of FIGS. 2 and 7 and the material of the at least one lower level dielectric layer 760. A top surface of lower level metal interconnect structures 780 can be physically exposed at the bottom of each through-memory-level opening. A conductive material is deposited in the through-memory-level cavities, and excess portions of the conductive material can be removed from above the horizontal plane including the top surface of the first contact level dielectric layer 280. Each remaining portion of the conductive material in the through-memory-level openings constitutes a through-memory-level via structure 588, which can contact a respective underlying lower level metal interconnect structure 780.

In one embodiment, at least one through-memory-level via structure 588 can be formed in a through-memory-level via region 500 in a block. The through-memory-level via region 500 can be provided between a pair of laterally-elongated contact via structures 76 and between two groups of memory stack structures 55 located in the block. The through-memory-level via region 500 can include through-memory-level via structures 588. Each of the at least one through-memory-level via structure 588 vertically extends through the memory-level assembly.

Figure 40:
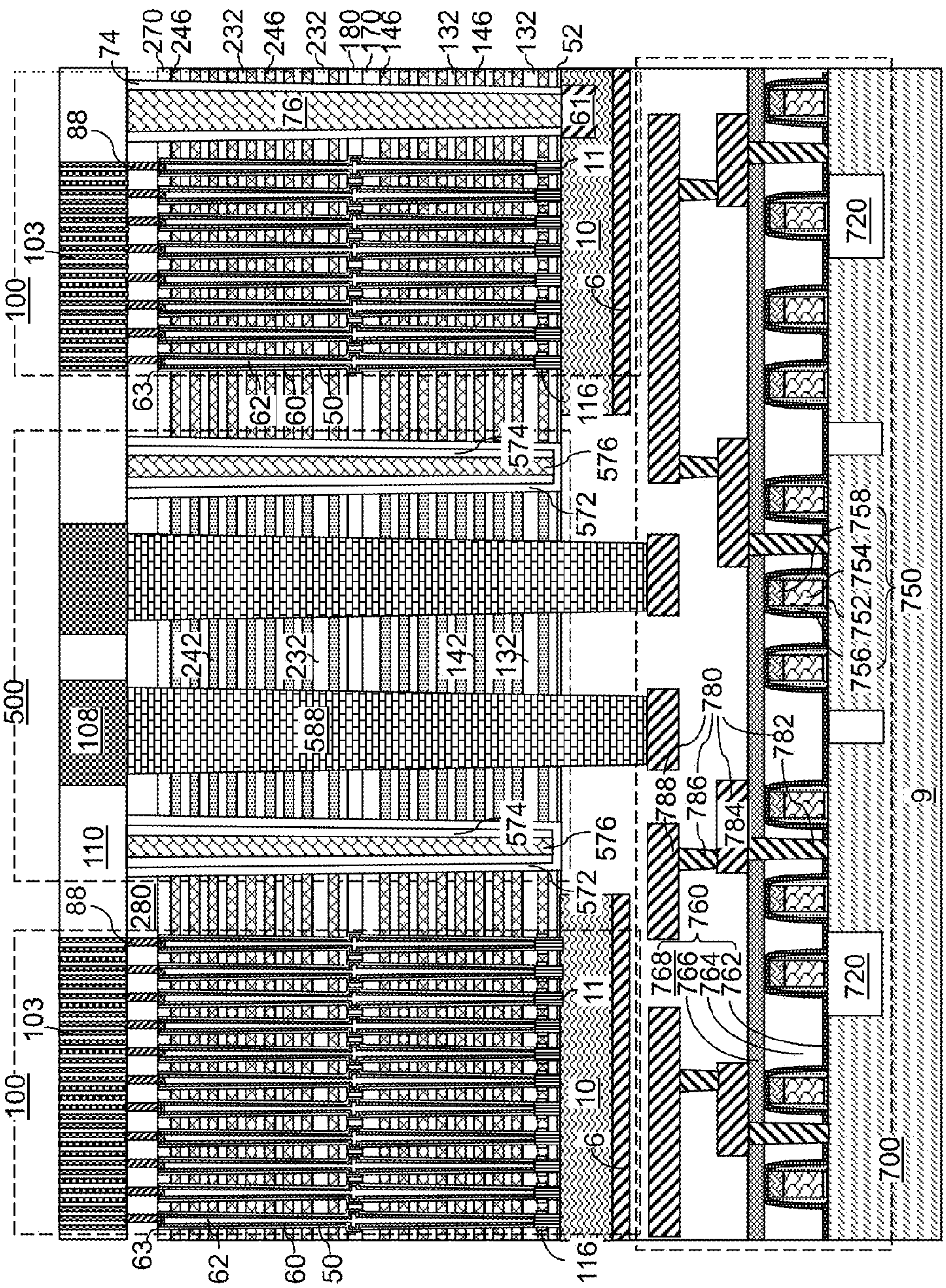
FIG. 40 is a vertical cross-sectional view of the fourth exemplary structure after formation of upper level metal interconnect structures according to the fourth embodiment of the present disclosure.

Referring to FIG. 40, drain contact via structures 88 and word line contact via structures can be formed as in the first through third embodiments. A line level dielectric layer 110 can be formed over the first contact level dielectric layer 280. Various metal interconnect structures can be formed can be formed in the line level dielectric layer 110 as in the first through third embodiments. The metal interconnect structures can include upper level metal interconnect structures 108 that may be formed on respective pairs of a word line contact via structure 86 and a through-memory-level via structure 588, bit lines 103 that extend along the second horizontal direction hd2 and perpendicular to the first horizontal direction hd1, and source connection line structures (not shown). Alternatively, the upper level metal interconnect structures 108 may comprise a source shunt line or a power strap that contact the through-memory-level via structure 588. A source shunt line may be a shunt line which extends parallel to and between the bit lines 103. A power strap may be any conductive line which connects the driver circuits to an external power source.

The fourth exemplary structure illustrated in FIG. 40 includes a semiconductor structure, which includes a memory-level assembly located over a semiconductor substrate 9 and comprising at least one first alternating stack of electrically conductive layers (146, 246) and first portions of insulating layers (132, 232), and further comprising memory stack structures 55 vertically extending through the at least one first alternating stack. Each of the memory stack structures 55 comprises a memory film 50 and a vertical semiconductor channel 60. The electrically conductive layers (146, 246) constitute word lines for the memory stack structures 55. The semiconductor structure further includes an insulating moat trench structure (572, 574, 576) vertically extending through the memory-level assembly and defining an area of a through-memory-level via region 500 that is laterally offset from the at least one first alternating stack (132, 146, 232, 246). The semiconductor structure further includes at least one second alternating stack located in the through-memory-level via region 500. The at least one second alternating stack includes alternating layers of dielectric spacer layers (142, 242) and second portions of the insulating layers (132, 232), and each of the dielectric spacer layers (142, 242) is located at a same level as a respective electrically conductive layer (146, 246). The semiconductor structure further comprises through-memory-level via structures 588 located within the through-memory-level via region 500 and vertically extending from a first horizontal plane including a topmost surface of the memory-level assembly and a bottommost surface of the memory-level assembly and comprising a conductive material.

In one embodiment, a plurality of laterally-elongated contact via structures 76 extending along the first horizontal direction hd1 can laterally divide the memory-level assembly into a plurality of laterally spaced-apart blocks, and each of the plurality of laterally-elongated contact via structures 76 can be laterally surrounded by an insulating spacer 74. The insulating moat trench structure (572, 574, 576) can comprises a conductive fill portion 576 comprising the same conductive material as the plurality of laterally-elongated contact via structures 76.

Figure 41:
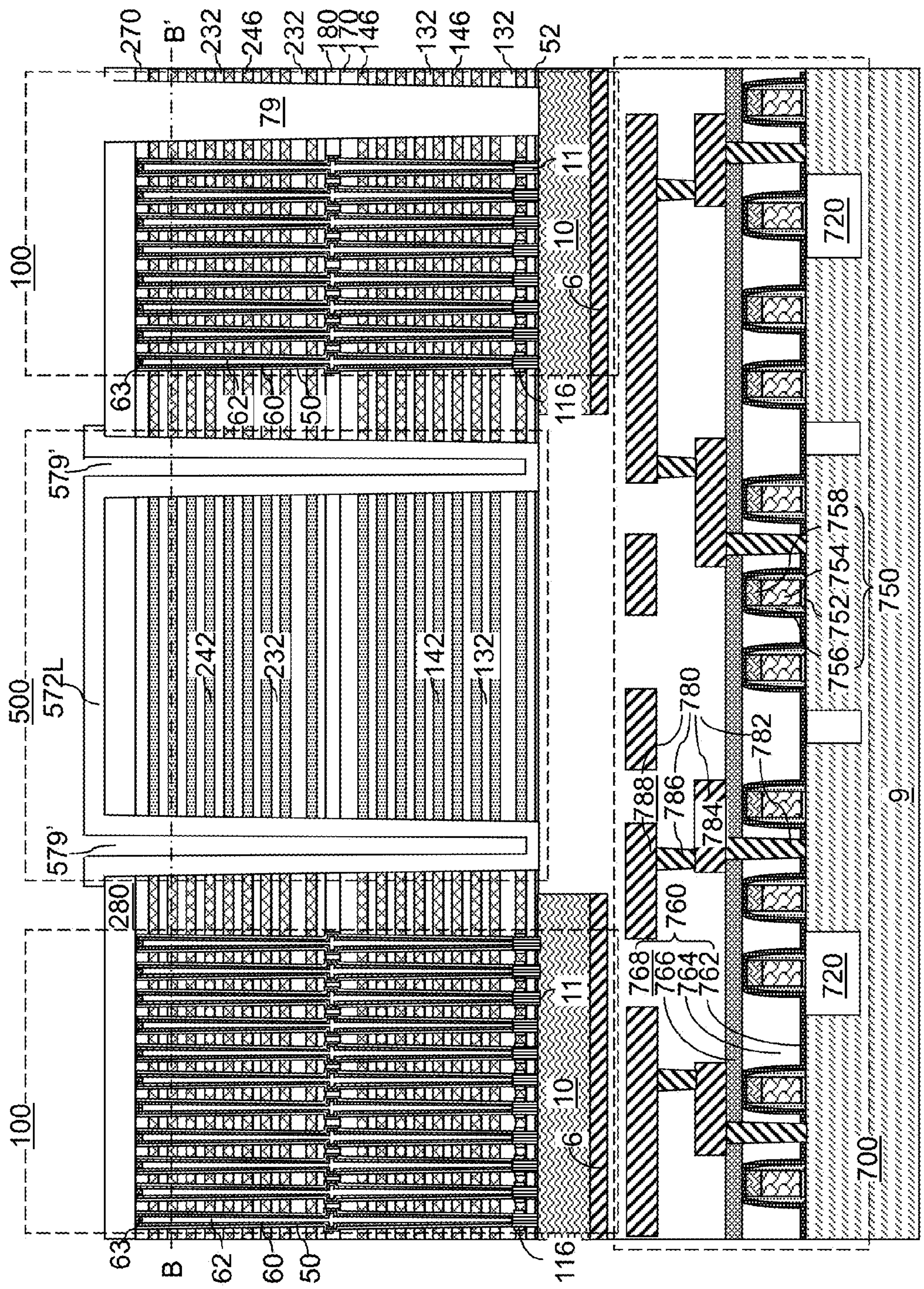
FIG. 41 is a vertical cross-sectional view of a first modification of the fourth exemplary structure after formation of patterned insulating liner layers according to the fourth embodiment of the present disclosure.

Referring to FIG. 41, a first modification of the fourth exemplary structure is illustrated, which can be derived from the fourth exemplary structure illustrated in FIGS. 37A and 37B by increasing the thickness of the insulating liner layer 572L. Specifically, the thickness of the insulating liner layers 572L is increased such that the maximum width of the trench cavity 579' after formation of the insulating liner layers 572L is less than twice of the insulating material layer to be deposited to form insulating spacers in the backside contact trenches 79.

Figure 42:
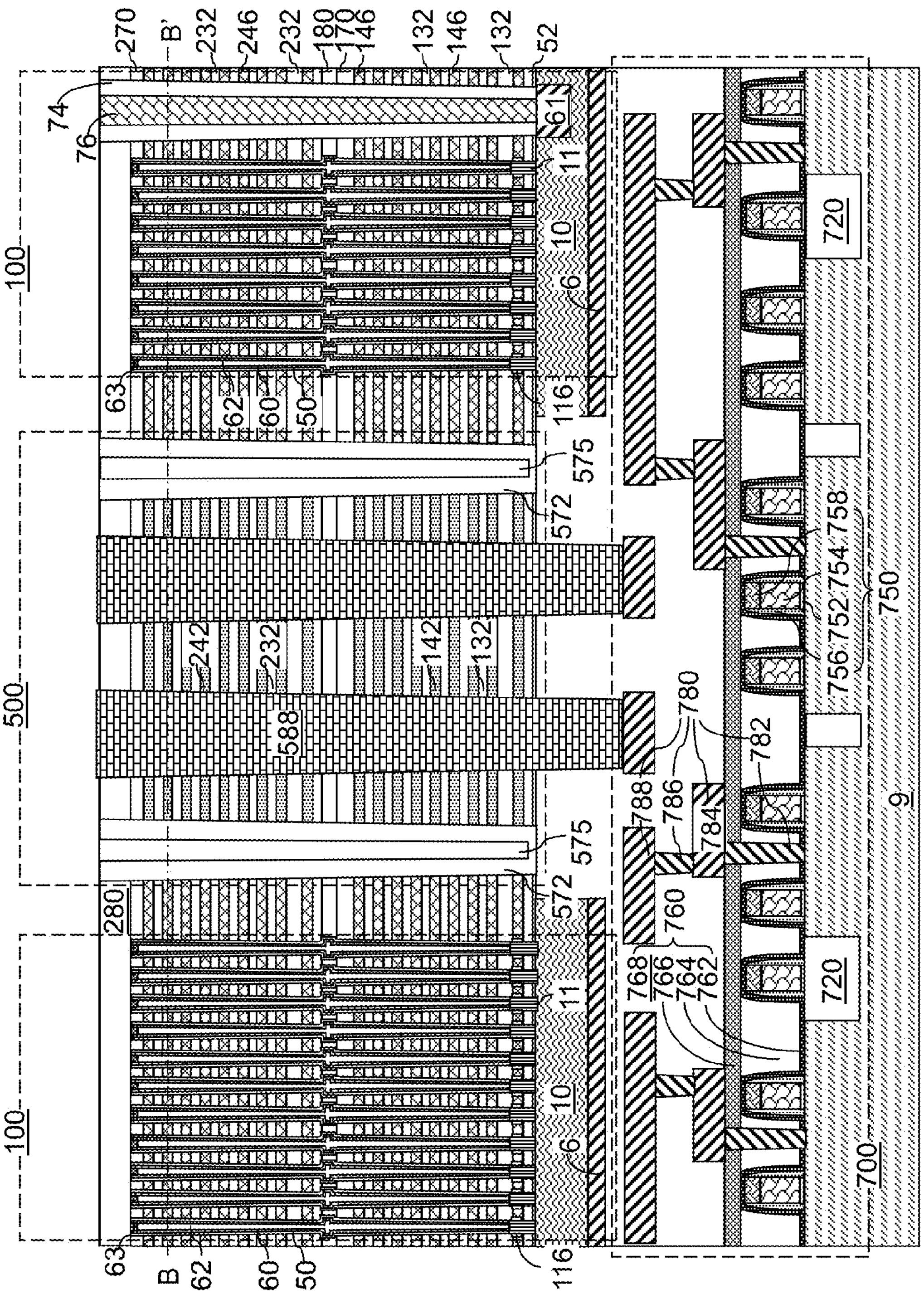
FIG. 42 is a vertical cross-sectional view of the first modification of the fourth exemplary structure after formation of insulating moat trench structures, laterally-elongated contact via structures, and through-memory-level via structures according to the fourth embodiment of the present disclosure.

Referring to FIG. 42, an insulating material layer is deposited at a thickness such that the insulating material layer does completely fill the backside contact trenches 79, while filling the mote trenches 579 completely. An anisotropic etch is performed to remove horizontal portions of the insulating material layer. Each remaining vertical portion of the insulating material layer in the backside contact trenches 79 constitutes an insulating spacer. Each remaining portion of the insulating material layer that fills the volume inside an insulating liner layer 572 constitutes an insulating material fill portion 575. Subsequently, a conductive material is deposited and planarized to form laterally-extending contact via structures 76. The remaining portion of each insulating liner layer 572L constitutes an outer insulating liner 572.

In one embodiment, insulating spacers 74 can be formed in the backside contact trenches 79 simultaneously with formation of the insulating material fill portions 575 in the moat trenches 579. The plurality of laterally-elongated contact via structures 76 can be formed on the insulating spacers 74. A remaining portion of the at least one in-process alternating stack (132, 142, 232, 242) remains within an area enclosed by each moat trench 579.

Subsequently, the processing steps of FIGS. 39A and 39B can be performed to form at least one through-memory-level via structure 588 inside each through-memory-level via region 500.

Figure 43:
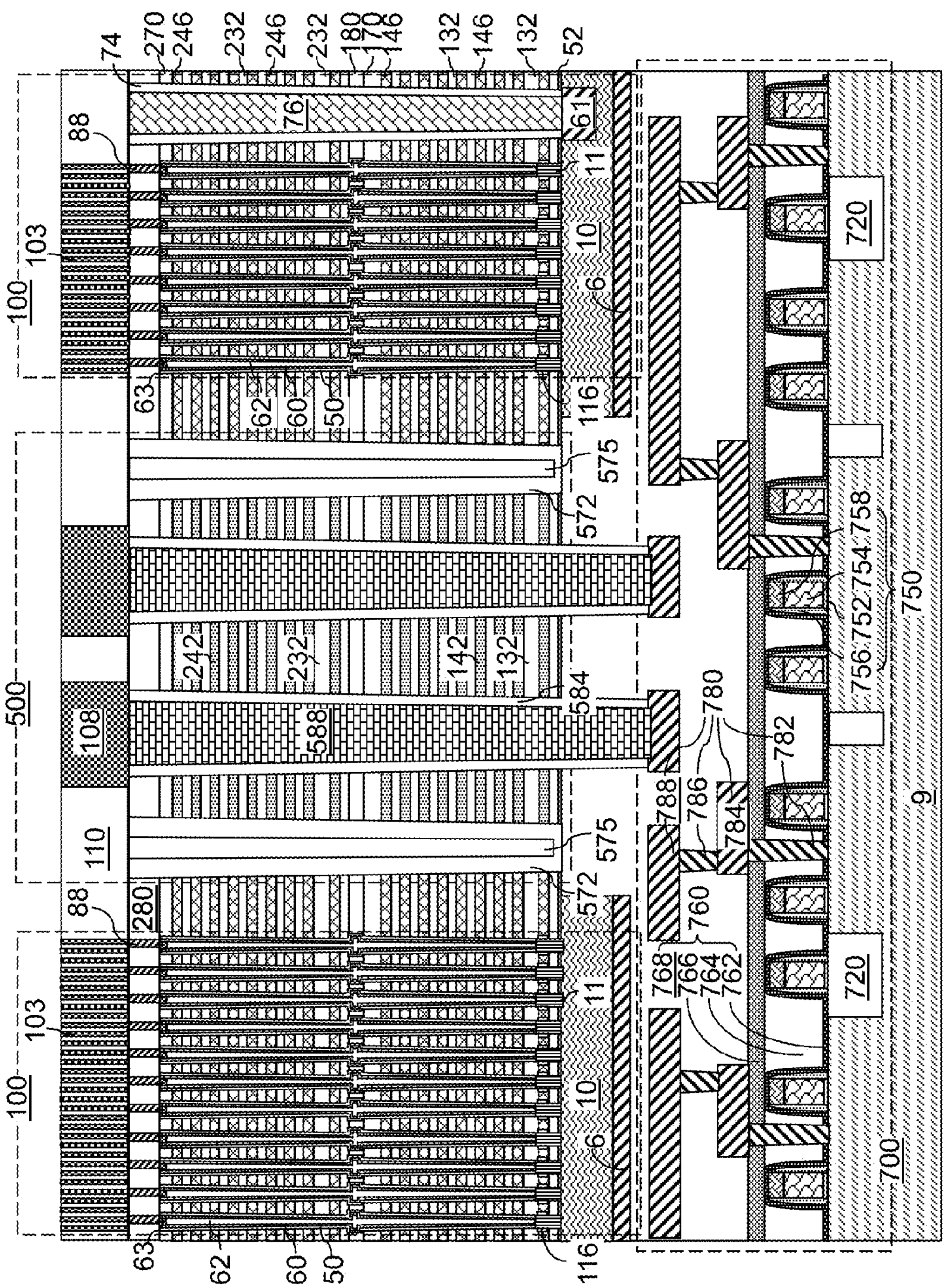
FIG. 43 is a vertical cross-sectional view of the first modification of the fourth exemplary structure after formation of upper level metal interconnect structures according to the fourth embodiment of the present disclosure.

Referring to FIG. 43, drain contact via structures 88 and word line contact via structures can be formed as in the first through third embodiments. A line level dielectric layer 110 can be formed over the first contact level dielectric layer 280. Various metal interconnect structures can be formed can be formed in the line level dielectric layer 110 as in the first through third embodiments. The metal interconnect structures can include upper level metal interconnect structures 108 that are either formed on respective pairs of a word line contact via structure 86 and a through-memory-level via structure 588 or which comprise a shunt line or power strap connected to structure 588, bit lines 103 that extend along the second horizontal direction hd2 and perpendicular to the first horizontal direction hd1, and source connection line structures (not shown).

The first modification of the fourth exemplary structure illustrated in FIG. 43 includes a semiconductor structure, which includes a memory-level assembly located over a semiconductor substrate 9 and comprising at least one first alternating stack of electrically conductive layers (146, 246) and first portions of insulating layers (132, 232), and further comprising memory stack structures 55 vertically extending through the at least one first alternating stack. Each of the memory stack structures 55 comprises a memory film 50 and a vertical semiconductor channel 60. The electrically conductive layers (146, 246) constitute word lines for the memory stack structures 55. The semiconductor structure further includes an insulating moat trench structure (572, 575) vertically extending through the memory-level assembly and defining an area of a through-memory-level via region 500 that is laterally offset from the at least one first alternating stack (132, 146, 232, 246). The semiconductor structure further includes at least one second alternating stack located in the through-memory-level via region 500. The at least one second alternating stack includes alternating layers of dielectric spacer layers (142, 242) and second portions of the insulating layers (132, 232), and each of the dielectric spacer layers (142, 242) is located at a same level as a respective electrically conductive layer (146, 246). The semiconductor structure further comprises through-memory-level via structures 588 located within the through-memory-level via region 500 and vertically extending from a first horizontal plane including a topmost surface of the memory-level assembly and a bottommost surface of the memory-level assembly and comprising a conductive material.

In one embodiment, a plurality of laterally-elongated contact via structures 76 extending along the first horizontal direction hd1 can laterally divide the memory-level assembly into a plurality of laterally spaced-apart blocks, and each of the plurality of laterally-elongated contact via structures 76 can be laterally surrounded by an insulating spacer 74. The insulating moat trench structure (572, 575) can consist essentially of dielectric materials.

Figure 44A:
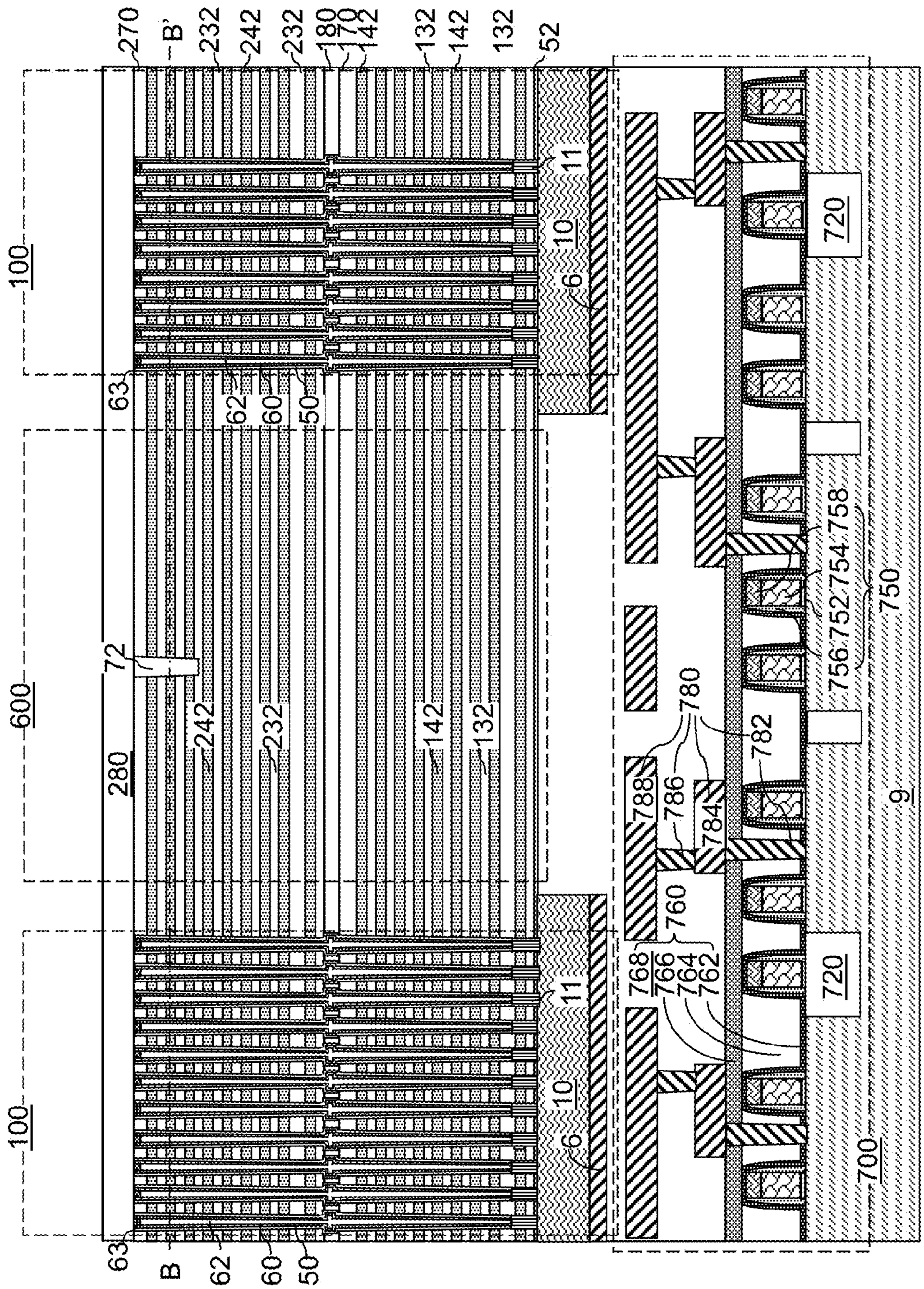
FIG. 44A is a vertical cross-sectional view of a second modification of the fourth exemplary structure after formation of a first-tier alternating stack, a second-tier alternating stack, memory stack structures, and drain-select-level shallow trench isolation structures according to the fourth embodiment of the present disclosure.
Figure 44B:
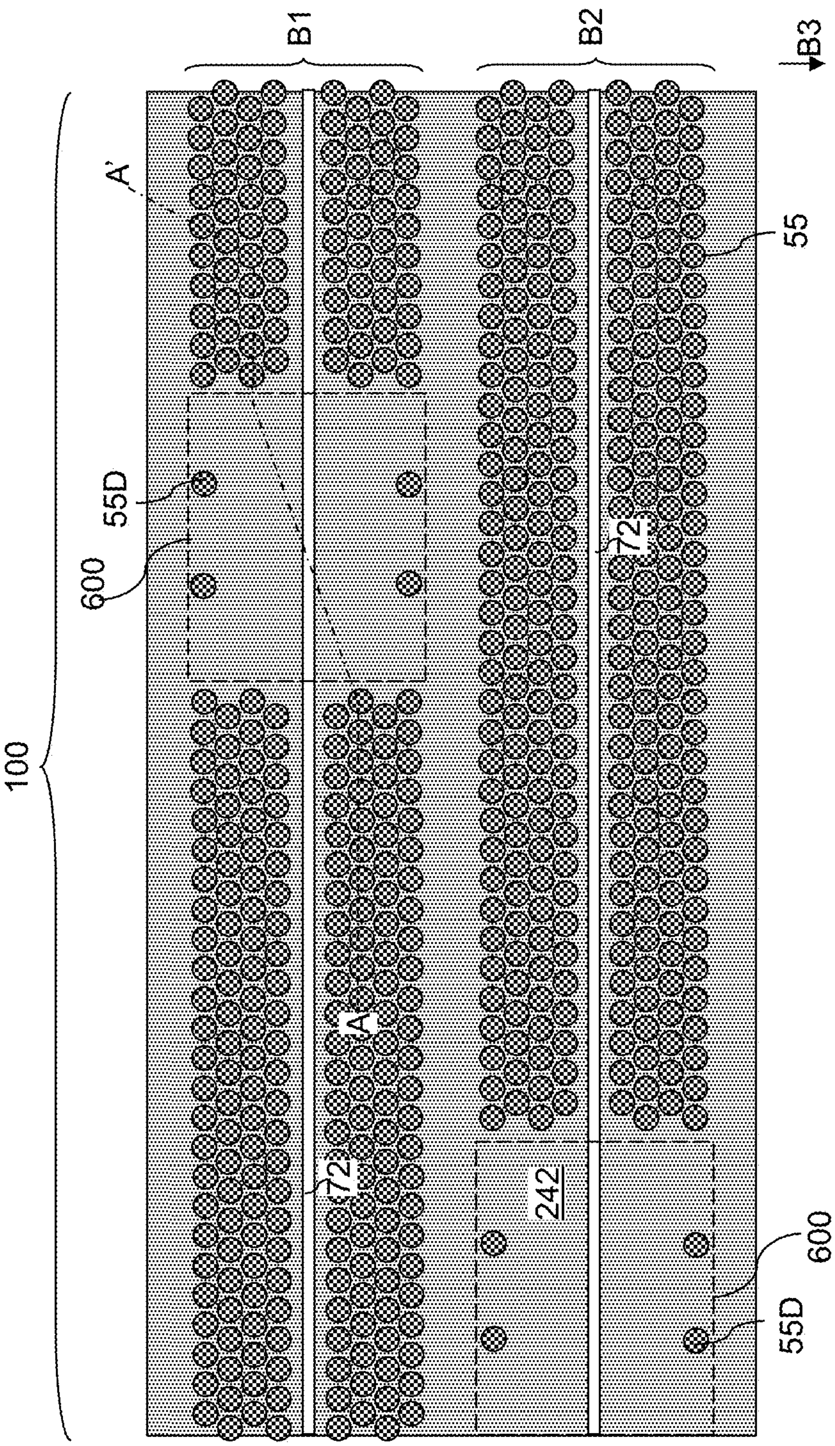
FIG. 44B is a horizontal cross-sectional view of the second modification of the fourth exemplary structure along the horizontal plane B-B' in FIG. 44A. The zig-zag vertical plane A-A' corresponds to the plane of the vertical cross-sectional view of FIG. 44A.

Referring to FIGS. 44A and 44B, a second modification of the fourth exemplary structure can the same as the fourth exemplary structure illustrated in FIGS. 33A and 33B. The second modification of the fourth exemplary structure can be formed concurrently with formation of any of the first, second, and third exemplary structures or modifications thereof, or can be formed as a stand-alone structure. At least one in-process alternating stack of insulating layers (132, 232) and dielectric spacer layers (which can be the sacrificial material layers (142, 242)) can be formed over the semiconductor substrate 9 as in previously described embodiments.

Through-memory-level via regions 600 that do not include memory stack structures 55 at respect center regions thereof can be formed within the memory array region 100. Each through-memory-level via region 600 can be formed entirely within a block (B1, B2, etc.). Dummy memory stack structures 55D can be provided at a periphery of the through-memory-level via regions 600. The dummy memory stack structures 55 are not active components of the semiconductor structure, but are employed to provide structural support during formation of the backside recesses (143, 243). The through-memory-level via regions 600 can be formed without forming additional through-memory-level via regions 400 of the first, second, and third embodiments, or can be formed in addition to the through-memory-level via regions 400 of the first, second, and third embodiments through the same memory-level assembly.

Figure 45A:
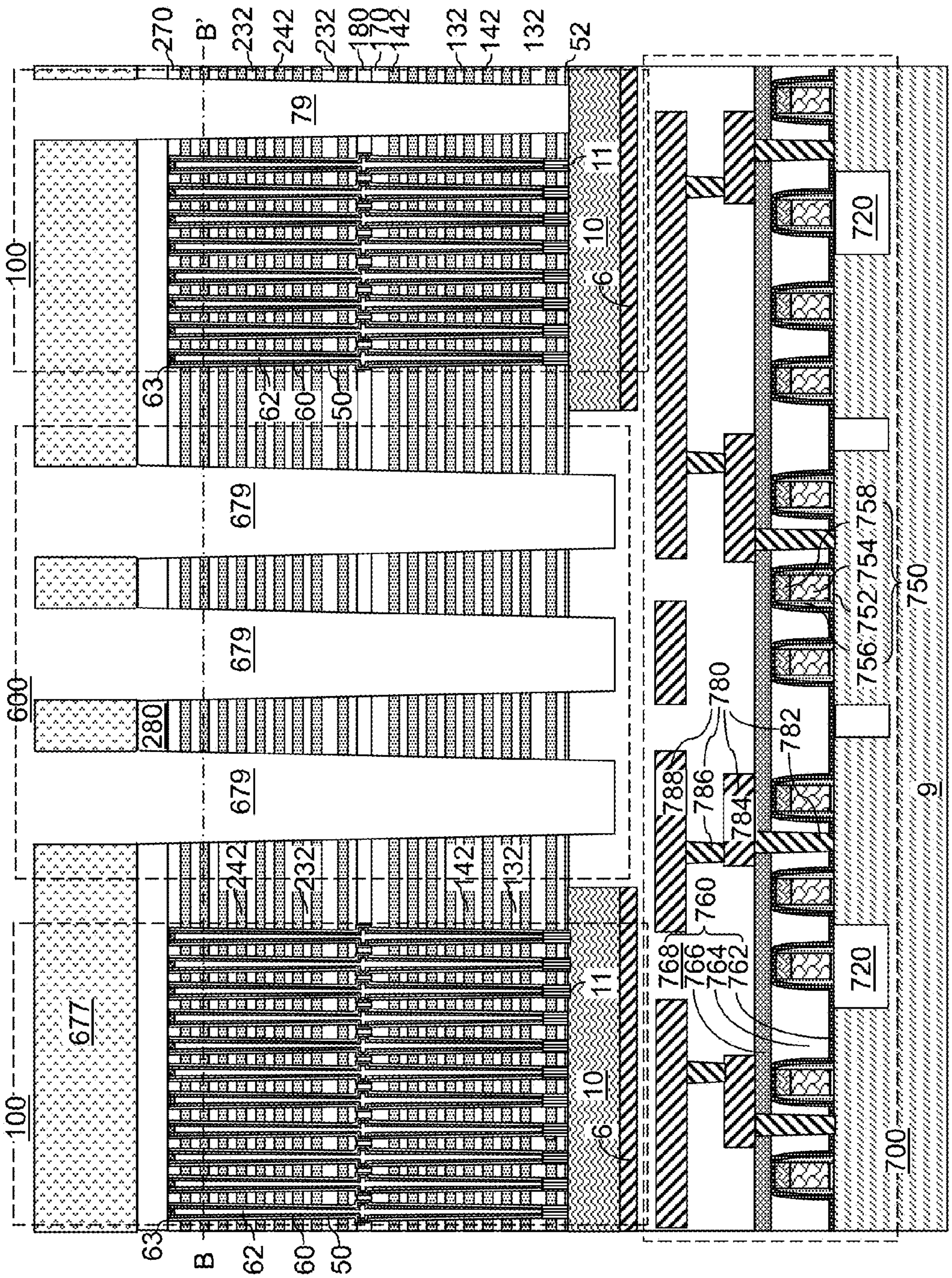
FIG. 45A is a vertical cross-sectional view of the second modification of the fourth exemplary structure after formation of through-memory-level openings and backside contact trenches according to the fourth embodiment of the present disclosure.
Figure 45B:
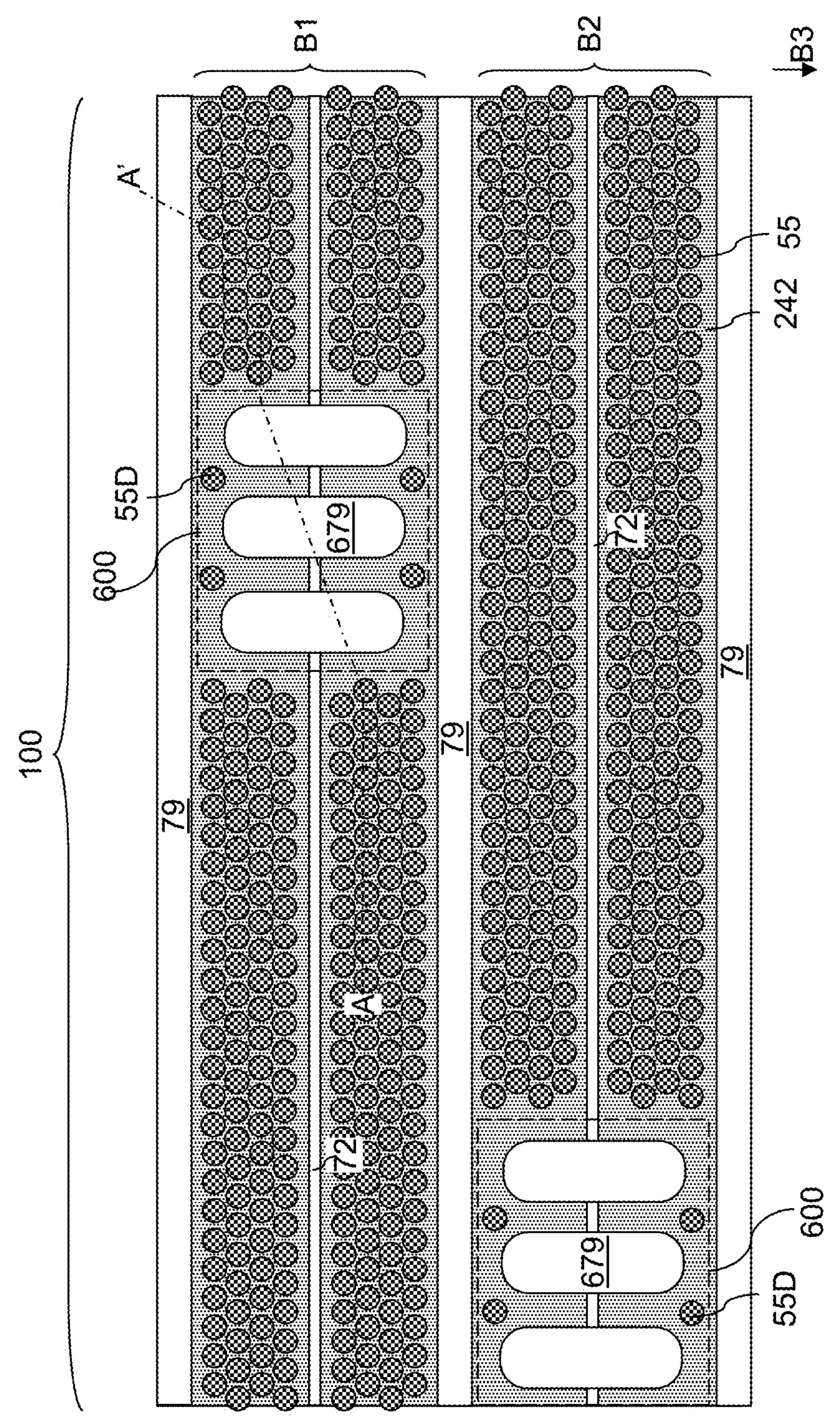
FIG. 45B is a horizontal cross-sectional view of the second modification of the fourth exemplary structure along the horizontal plane B-B' in FIG. 45A. The zig-zag vertical plane A-A' corresponds to the plane of the vertical cross-sectional view of FIG. 45A.

Referring to FIGS. 45A and 45B, a photoresist layer 677 can be applied over the first contact level dielectric layer 280, and can be lithographically patterned to form openings therein. The pattern of the openings include the pattern of the backside contact trenches 79 described above and the pattern of through-memory-level via structures to be subsequently formed in the through-memory-level regions 600.

The pattern in the photoresist layer 677 can be transferred through the first contact level dielectric layer 280 and through the in-process alternating stack of insulating layers (132, 232) and dielectric spacer material layers (142, 242) to form backside contact trenches 79 in the memory array region 100 and through-memory-level openings 679 in the through-memory-level via regions 600. A top surface of the planar semiconductor layer 10 can be physically exposed at the bottom of each backside contact trench 79. The backside contact trenches 79 can be formed concurrently with formation of the through-memory-level openings 679.

A top surface of the at least one lower level dielectric layer 760 can be physically exposed at the bottom of each through-memory-level opening 679. Top surfaces of the lower level metal interconnect structures 780 may, or may not, be physically exposed at the bottom of the through-memory-level openings 679. In one embodiment, the width of the through-memory-level openings 679 can be greater than the width of the backside contact trenches 79. In this case, more reactant can be supplied to the through-memory-level openings 679 during the anisotropic etch, and the bottom surfaces of the through-memory-level openings 679 can be located below the bottom surfaces of the backside contact trenches 79.

Figure 46A:
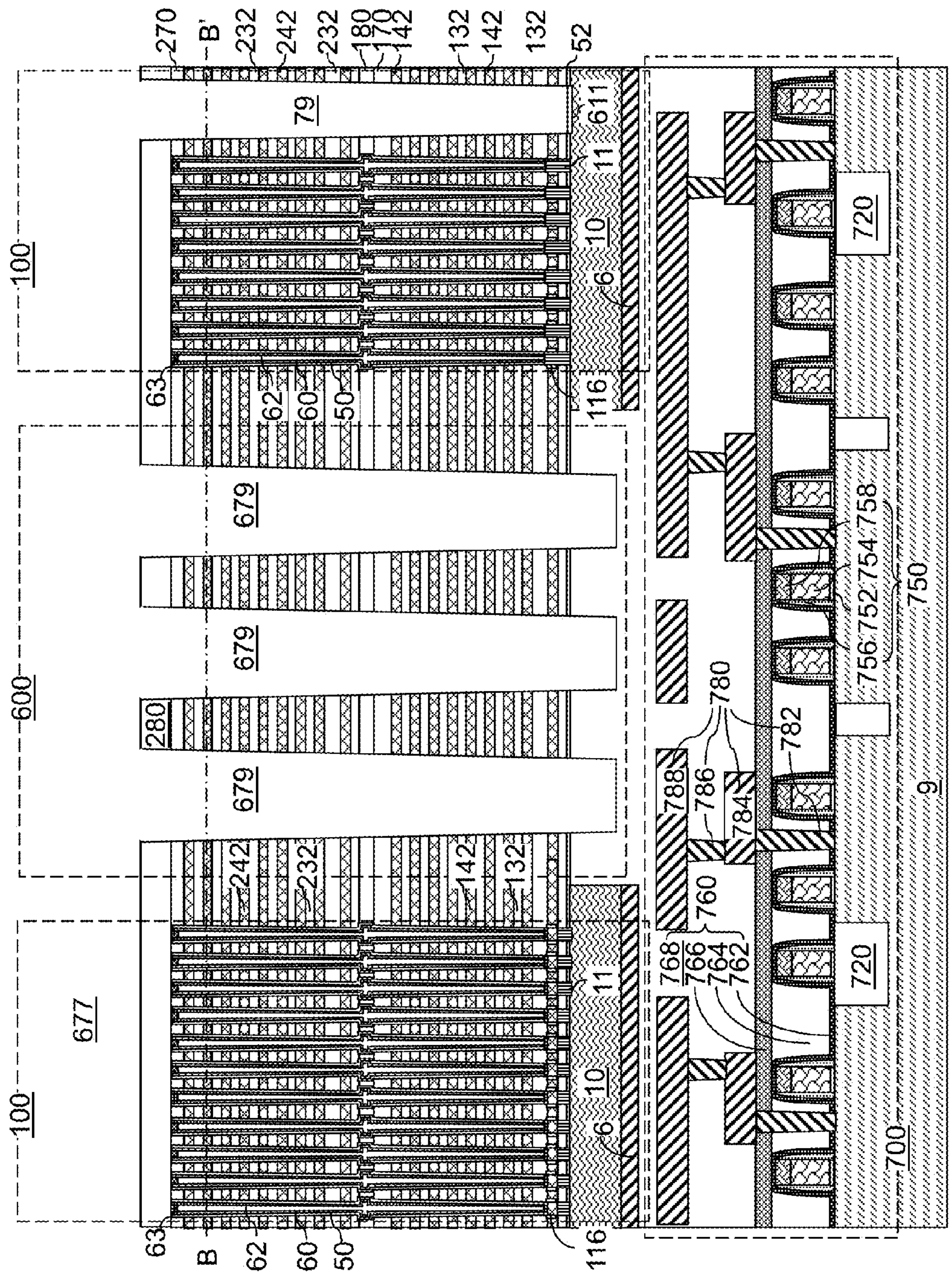
FIG. 46A is a vertical cross-sectional view of the second modification of the fourth exemplary structure after replacement of sacrificial material layers with electrically conductive layers according to the fourth embodiment of the present disclosure.
Figure 46B:
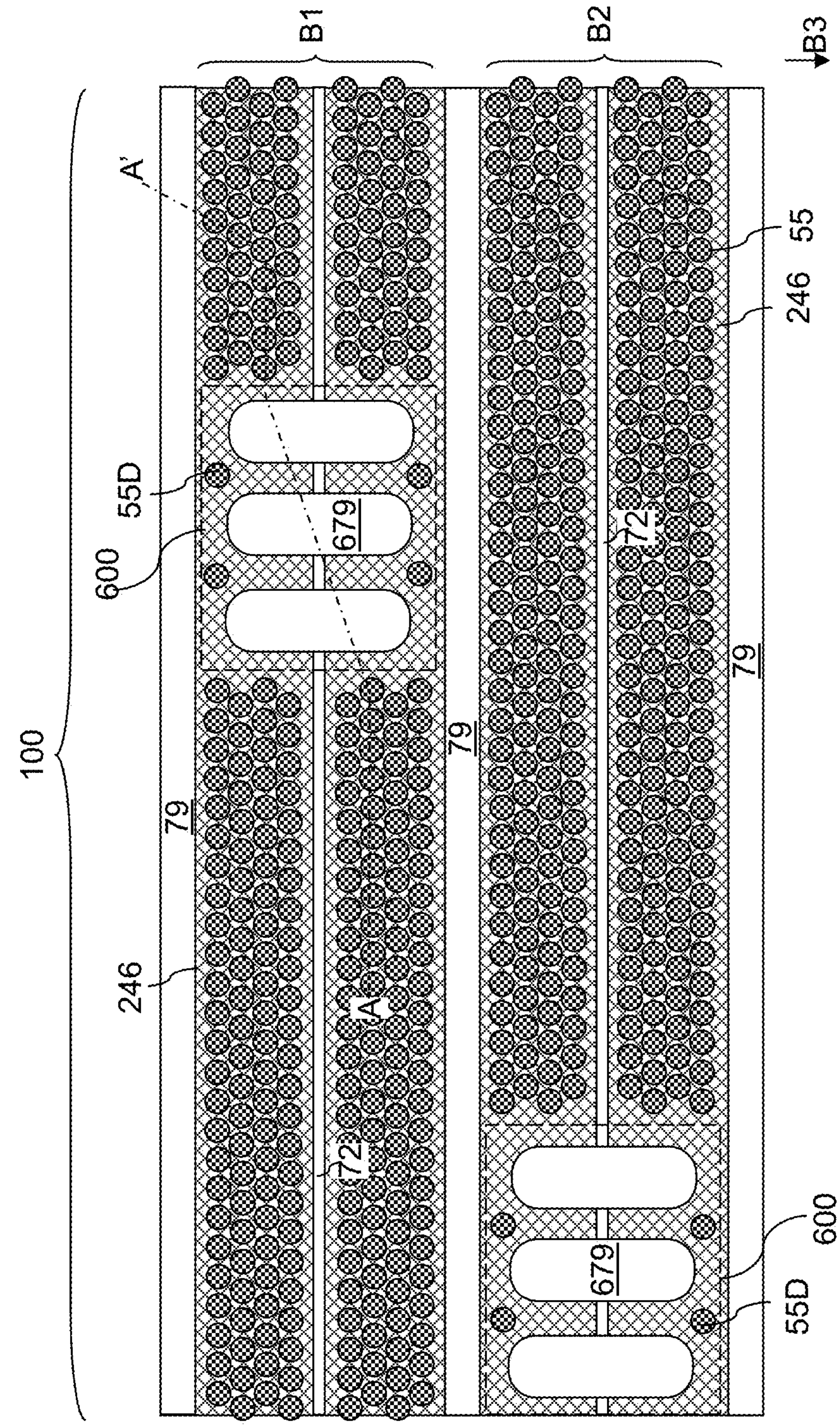
FIG. 46B is a horizontal cross-sectional view of the second modification of the fourth exemplary structure along the horizontal plane B-B' in FIG. 46A. The zig-zag vertical plane A-A' corresponds to the plane of the vertical cross-sectional view of FIG. 46A.

Referring to FIGS. 46A and 46B, the photoresist layer 677 can be removed, for example, by ashing. The processing steps of FIGS. 11A and 11B can be performed to remove the sacrificial material layers (142, 242) selective to the insulating layers (132, 232). In this case, the backside contact trenches 79 and the through-memory-level openings 679 can be employed to introduce etchants that etch the sacrificial material layers (142, 242) selective to the insulating layers (132, 232). Subsequently, the processing steps of FIGS. 12A and 12B can be performed to form electrically conductive layers (146, 246). Reactants can be introduced through the backside contact trenches 79 and the through-memory-level openings 679 to deposit the electrically conductive layers (146, 246). Excess portions of the deposited conductive material can be removed from inside the backside contact trenches 79 and the through-memory-level openings 679 and from above the first contact level dielectric layer 280 employing an etch-back process. An alternating stack (132, 146, 232, 246) of insulating layers (232, 232) and electrically conductive layers (146, 246) is thus formed.

Figure 47A:
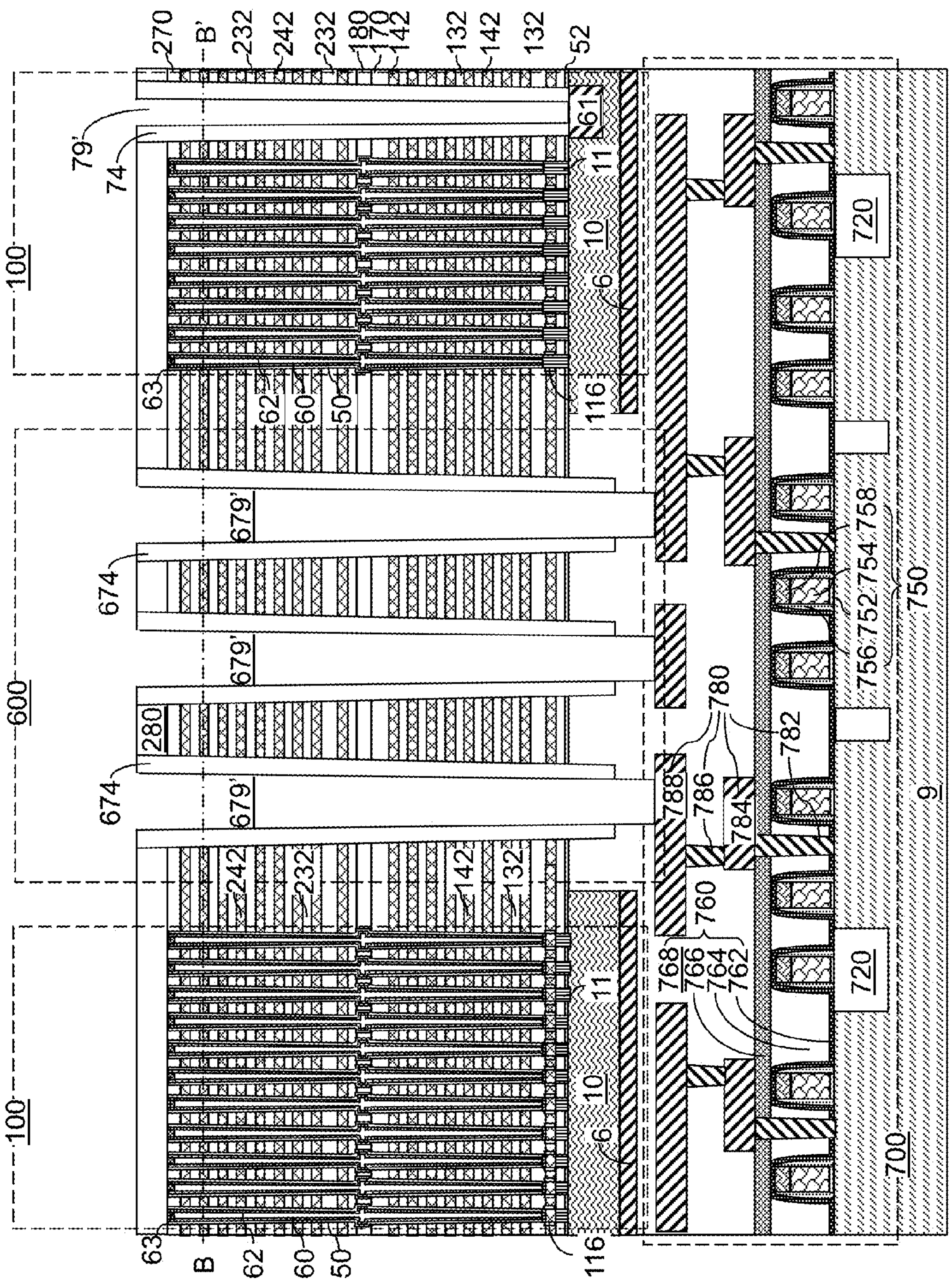
FIG. 47A is a vertical cross-sectional view of the second modification of the fourth exemplary structure after deposition of a conformal insulating layer and an anisotropic etch that removes horizontal portions of the conformal insulating layer and deepens the through-memory-level openings according to the fourth embodiment of the present disclosure.
Figure 47B:
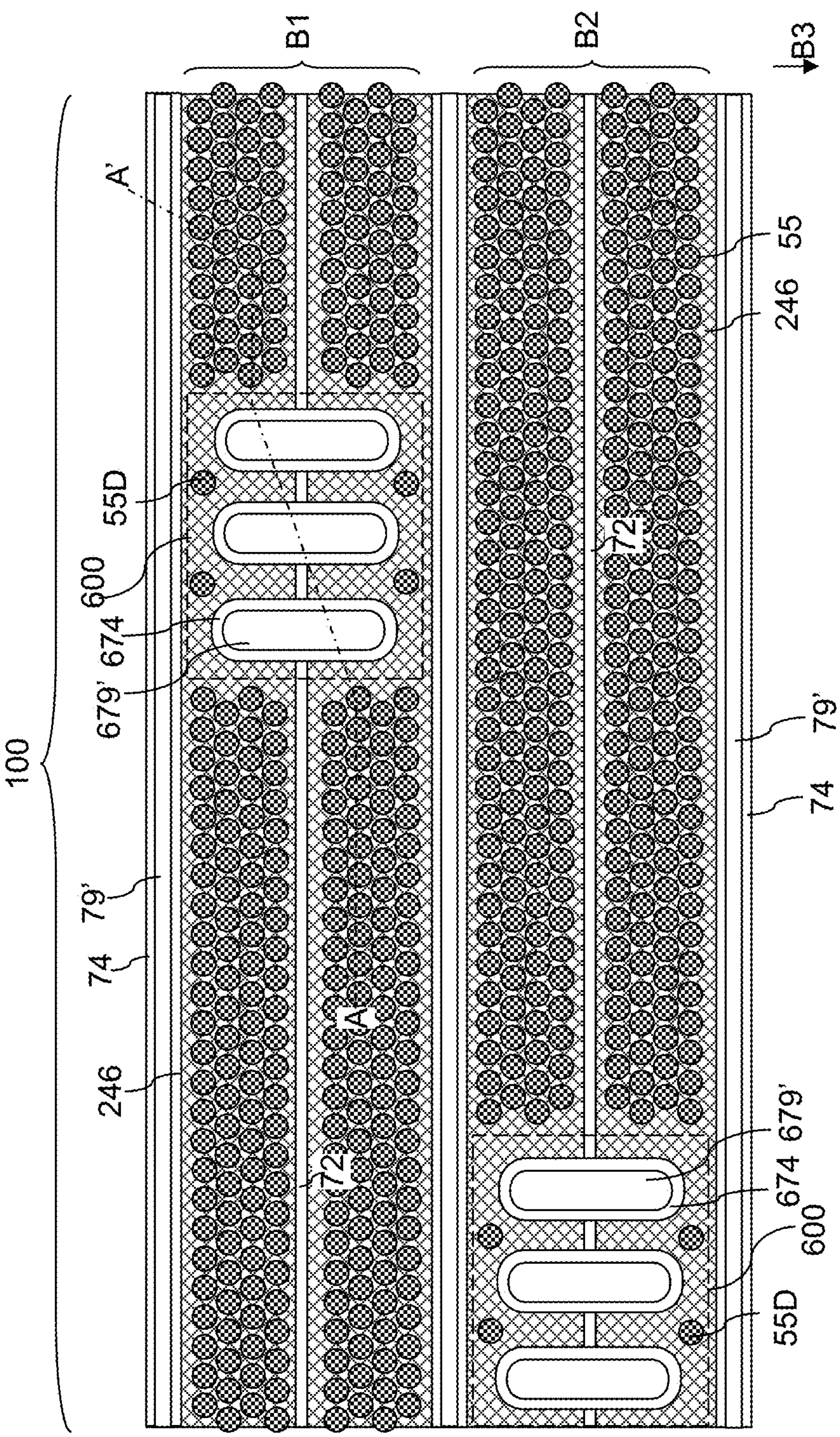
FIG. 47B is a horizontal cross-sectional view of the second modification of the fourth exemplary structure along the horizontal plane B-B' in FIG. 47A. The zig-zag vertical plane A-A' corresponds to the plane of the vertical cross-sectional view of FIG. 47A.

Referring to FIGS. 47A and 47B, a conformal insulating material layer is deposited in the backside contact trenches 79 and the through-memory-level openings 689 by a conformal deposition process such as chemical vapor deposition or atomic layer deposition. The conformal insulating material layer includes a dielectric material such as silicon oxide, silicon nitride, a dielectric metal oxide, or a combination thereof.

An anisotropic etch is performed to remove horizontal portions of the conformal insulating material layer. In case top surfaces of the lower level metal interconnect structures 780 are not physically exposed at the bottom of the through-memory-level openings 679 prior to the anisotropic etch, the anisotropic etch may remove additional material of the at least one lower level dielectric layer 760 to physically expose top surfaces of the lower level metal interconnect structures 780. In this case, the through-memory-level openings 679 can be extended downward while the conformal insulating material layer is anisotropically etched. A lower level metal interconnect structure 780 can be physically exposed at a bottom of one or more of the through-memory-level openings 679 during the anisotropic etch.

Each remaining portion of the conformal insulating material layer in a backside contact trench 79 constitutes an insulating spacer 74. Each remaining portion of the conformal insulating material layer in a through-memory-level opening 679 constitutes an insulating liner 674. The insulating spacers 74 and the insulating liners 674 are concurrently formed in the backside contact trenches 79 and the through-memory-level openings 679, respectively, after formation of the electrically conductive layers (146, 246). A backside cavity 79' is present within each insulating spacer 74. A through-memory-level cavity 679' is present within each insulating liner 674.

Figure 48A:
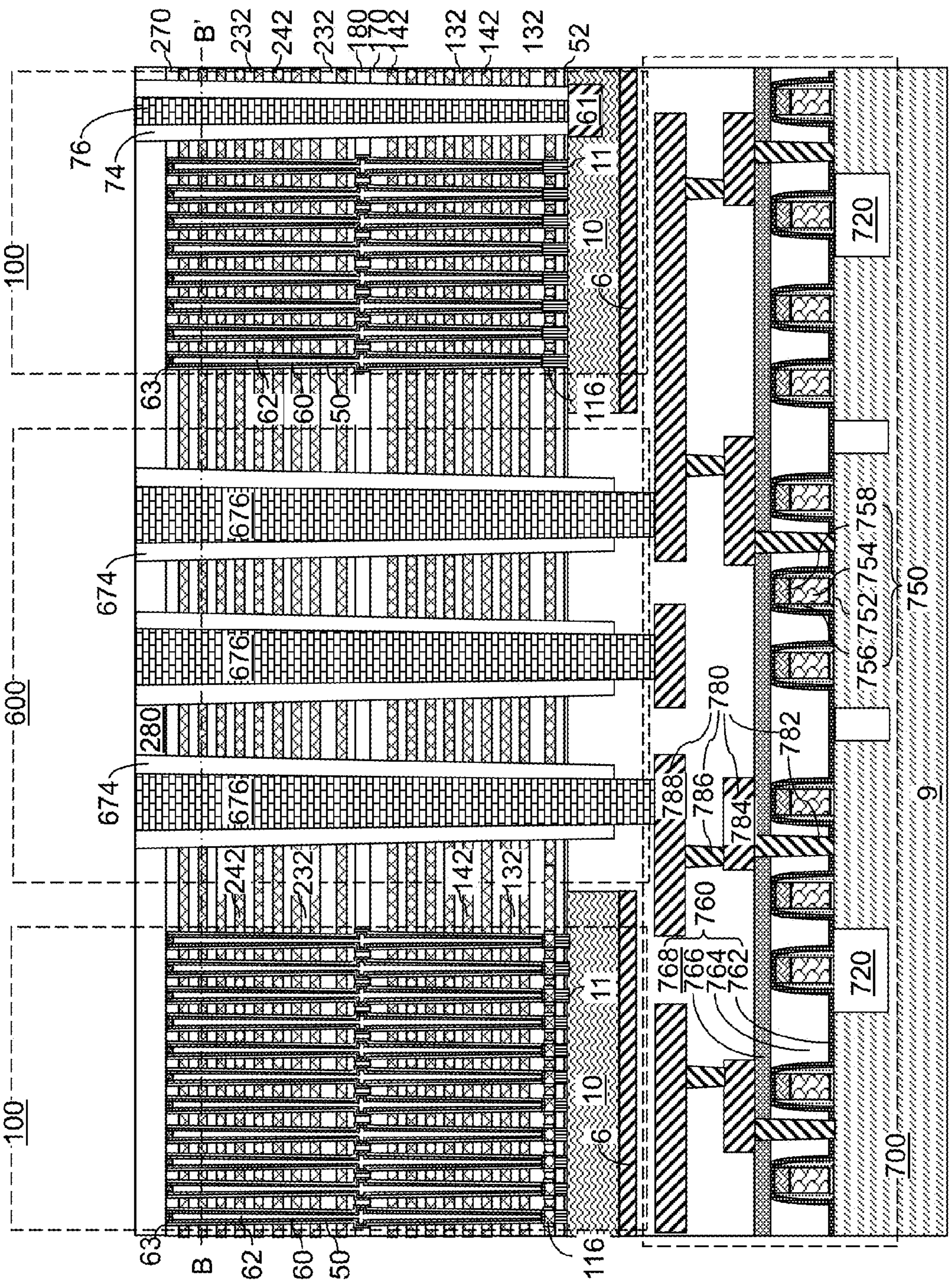
FIG. 48A is a vertical cross-sectional view of the second modification of the fourth exemplary structure after formation of laterally-elongated contact via structures and through-memory-level via structures according to the fourth embodiment of the present disclosure.
Figure 48B:
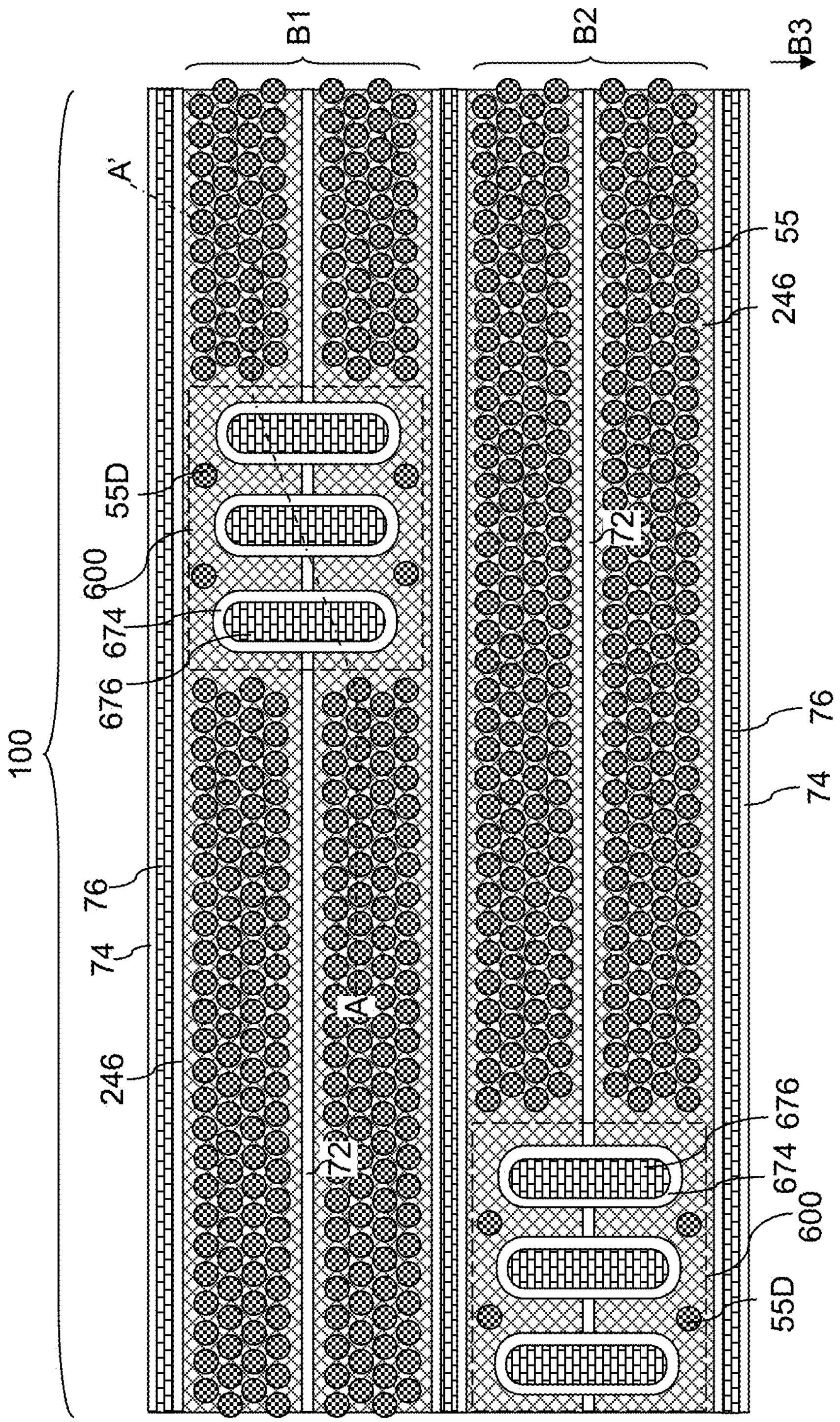
FIG. 48B is a horizontal cross-sectional view of the second modification of the fourth exemplary structure along the horizontal plane B-B' in FIG. 48A. The zig-zag vertical plane A-A' corresponds to the plane of the vertical cross-sectional view of FIG. 48A.

Referring to FIGS. 48A and 48B, at least one conductive material can be deposited in the backside cavities 79' and the through-memory-level cavities 679'. Excess portions of the at least one conductive material can be removed from above the horizontal plane including the top surface of the first contact level dielectric layer 280 by a planarization process such as chemical mechanical planarization. Each remaining portion of the at least one conductive material in a backside contact trench 79 constitutes a laterally elongated contact via structure 76. Each remaining portion of the at least one conductive material in a through-memory-level opening 679 constitutes a through-memory-level via structure 676. Each through-memory-level via structure 676 is a conductive fill material portion. The laterally-elongated contact via structures 76 and the through-memory-level via structures 676 can be formed simultaneously in the backside contact trenches 79 and within the through-memory-level openings 679, respectively.

Figure 49:
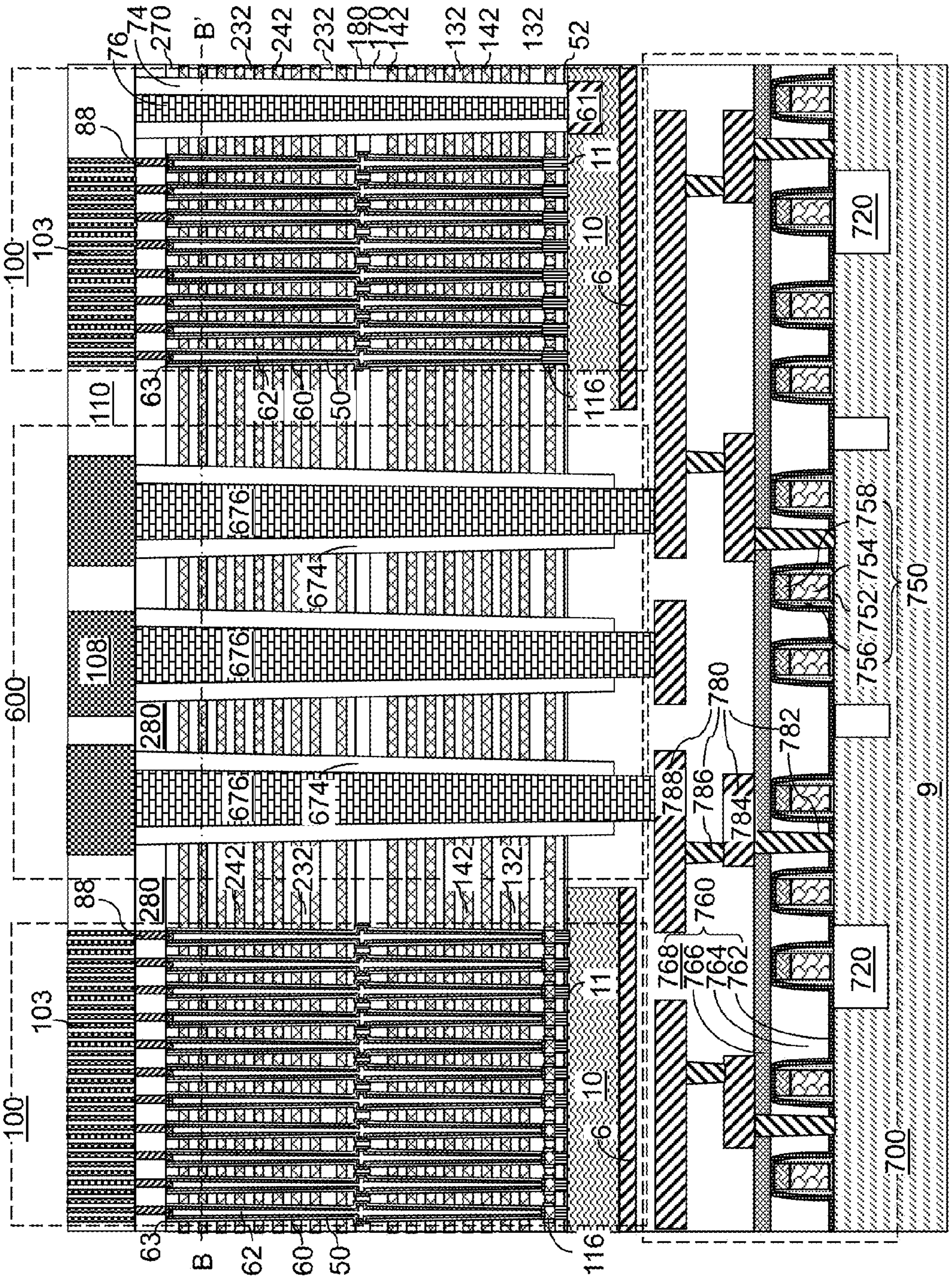
FIG. 49 is a vertical cross-sectional view of the second modification of the fourth exemplary structure after formation of upper level metal interconnect structures according to the fourth embodiment of the present disclosure.

Referring to FIG. 49, drain contact via structures 88 and word line contact via structures can be formed as in the first through third embodiments. A line level dielectric layer 110 can be formed over the first contact level dielectric layer 280. Various metal interconnect structures can be formed can be formed in the line level dielectric layer 110 as in the first through third embodiments. The metal interconnect structures can include upper level metal interconnect structures 108 that are either formed on respective pairs of a word line contact via structure 86 and a through-memory-level via structure 588 or which comprise a shunt line or power strap connected to structure 588, bit lines 103 that extend along the second horizontal direction and perpendicular to the first horizontal direction hd1, and source connection line structures (not shown).

Figure 50A:
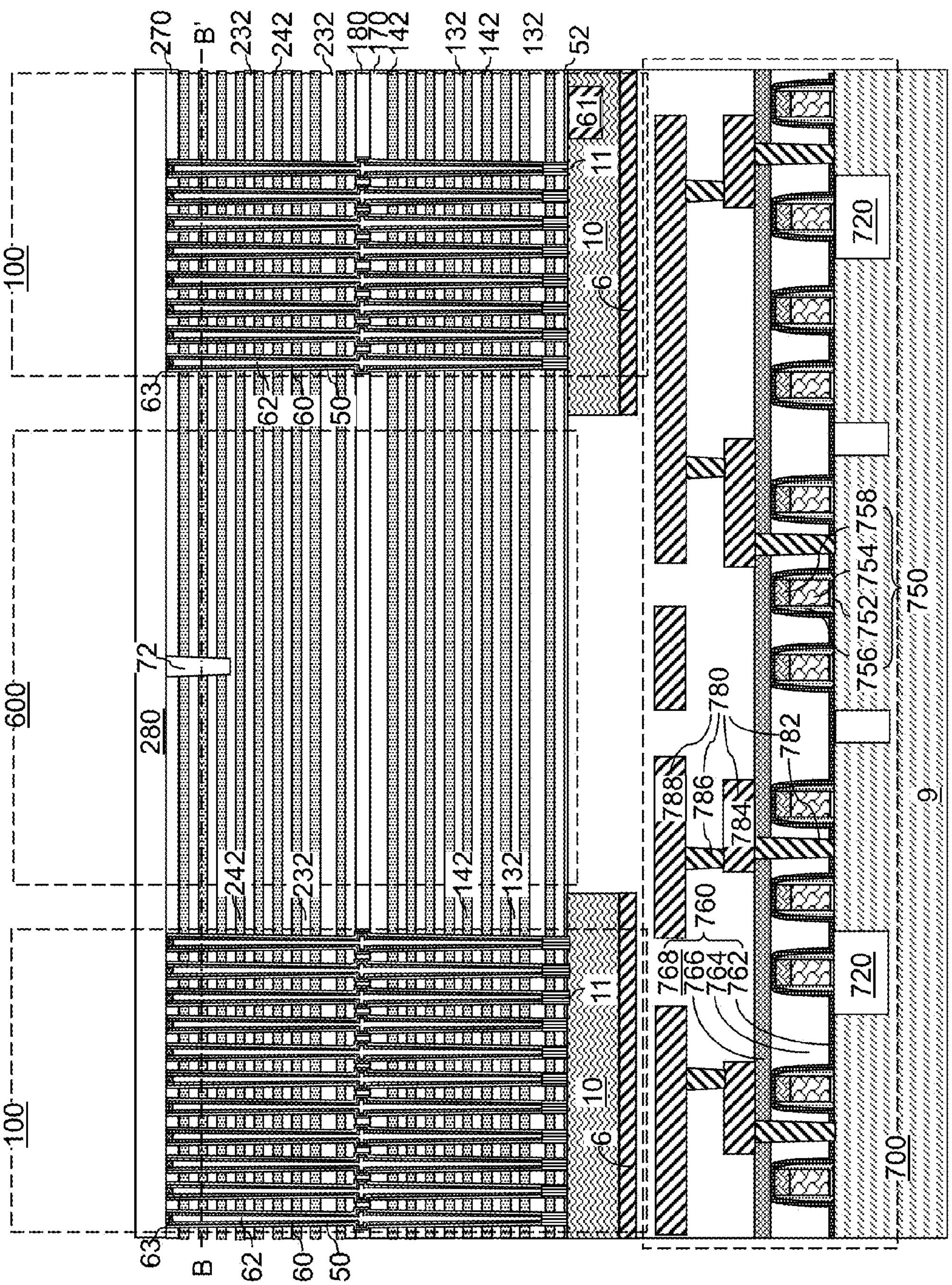
FIG. 50A is a vertical cross-sectional view of a third modification of the fourth exemplary structure after formation of a first-tier alternating stack, a second-tier alternating stack, memory stack structures, and drain-select-level shallow trench isolation structures according to the fourth embodiment of the present disclosure.
Figure 50B:
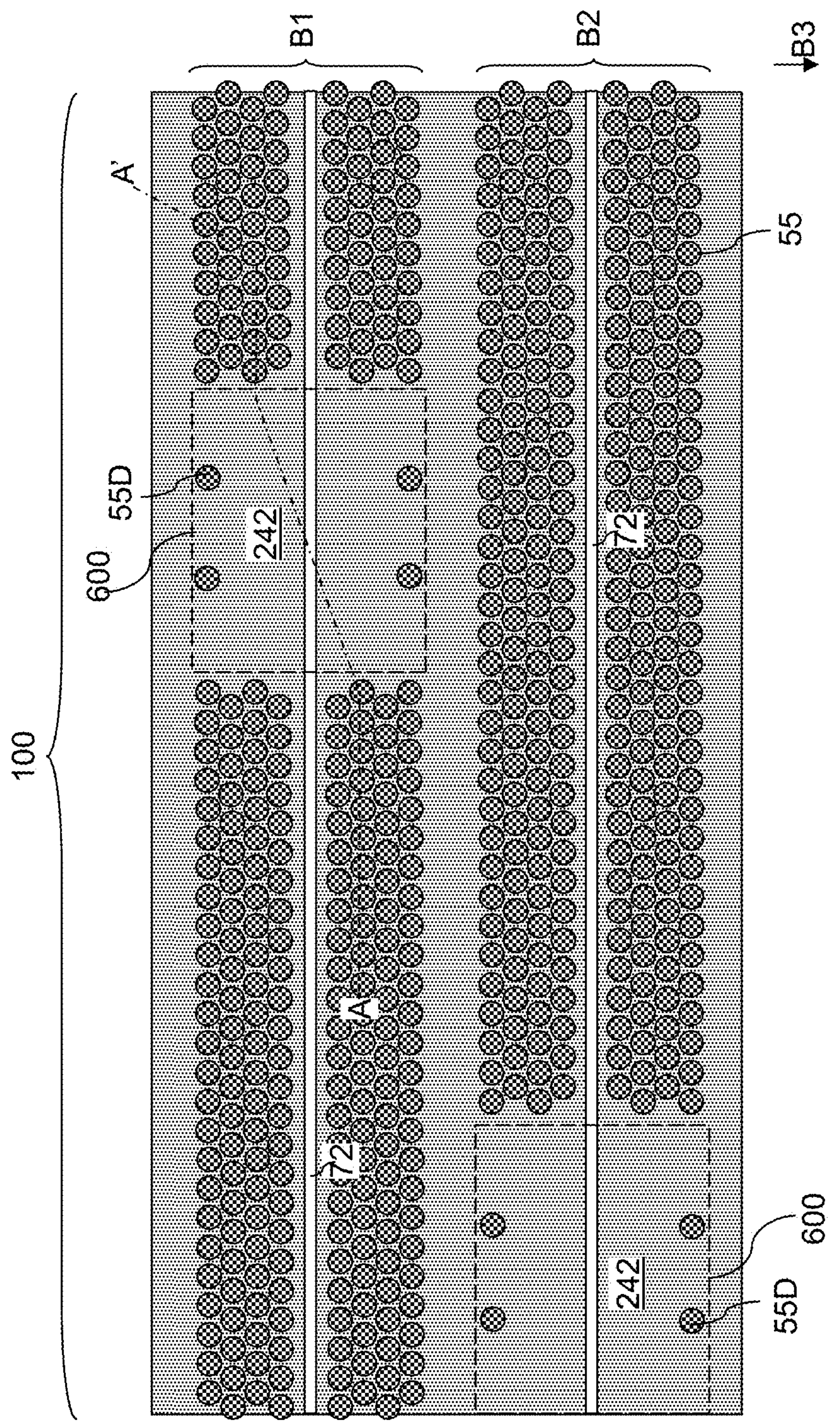
FIG. 50B is a horizontal cross-sectional view of the third modification of the fourth exemplary structure along the horizontal plane B-B' in FIG. 50A. The zig-zag vertical plane A-A' corresponds to the plane of the vertical cross-sectional view of FIG. 50A.

Referring to FIGS. 50A and 50B, a third modification of the fourth exemplary structure can be the same as the second modification of the fourth exemplary structure illustrated in FIGS. 44A and 44B with an optional modification in the pattern for the drain-select-level shallow trench isolation structures 72. A first-tier alternating stack (132, 242), a second-tier alternating stack (232, 242), memory stack structures 55, and drain-select-level shallow trench isolation structures 72 can be formed as described above.

Figure 51A:
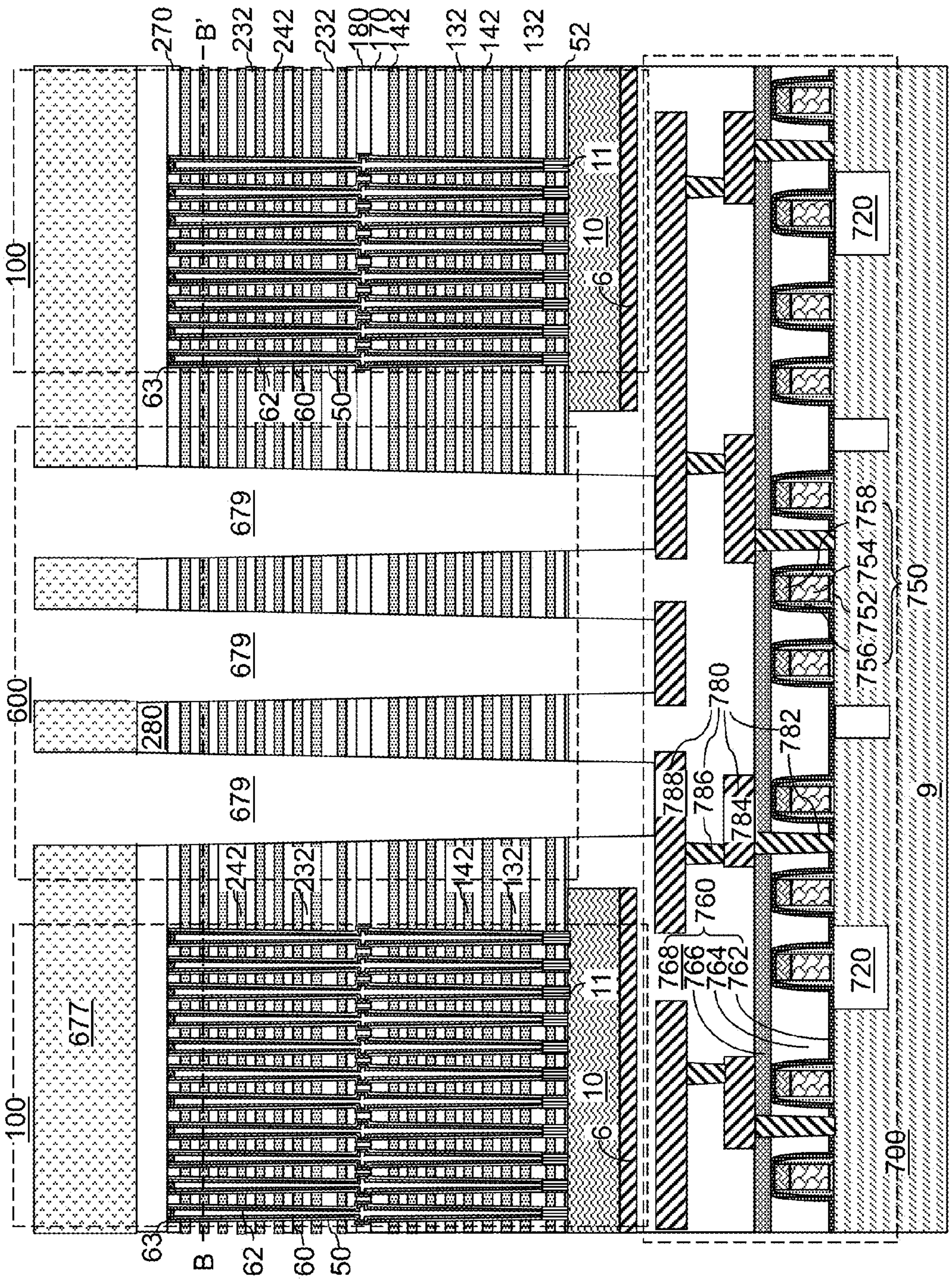
FIG. 51A is a vertical cross-sectional view of the third modification of the fourth exemplary structure after formation of through-memory-level openings according to the fourth embodiment of the present disclosure.
Figure 51B:
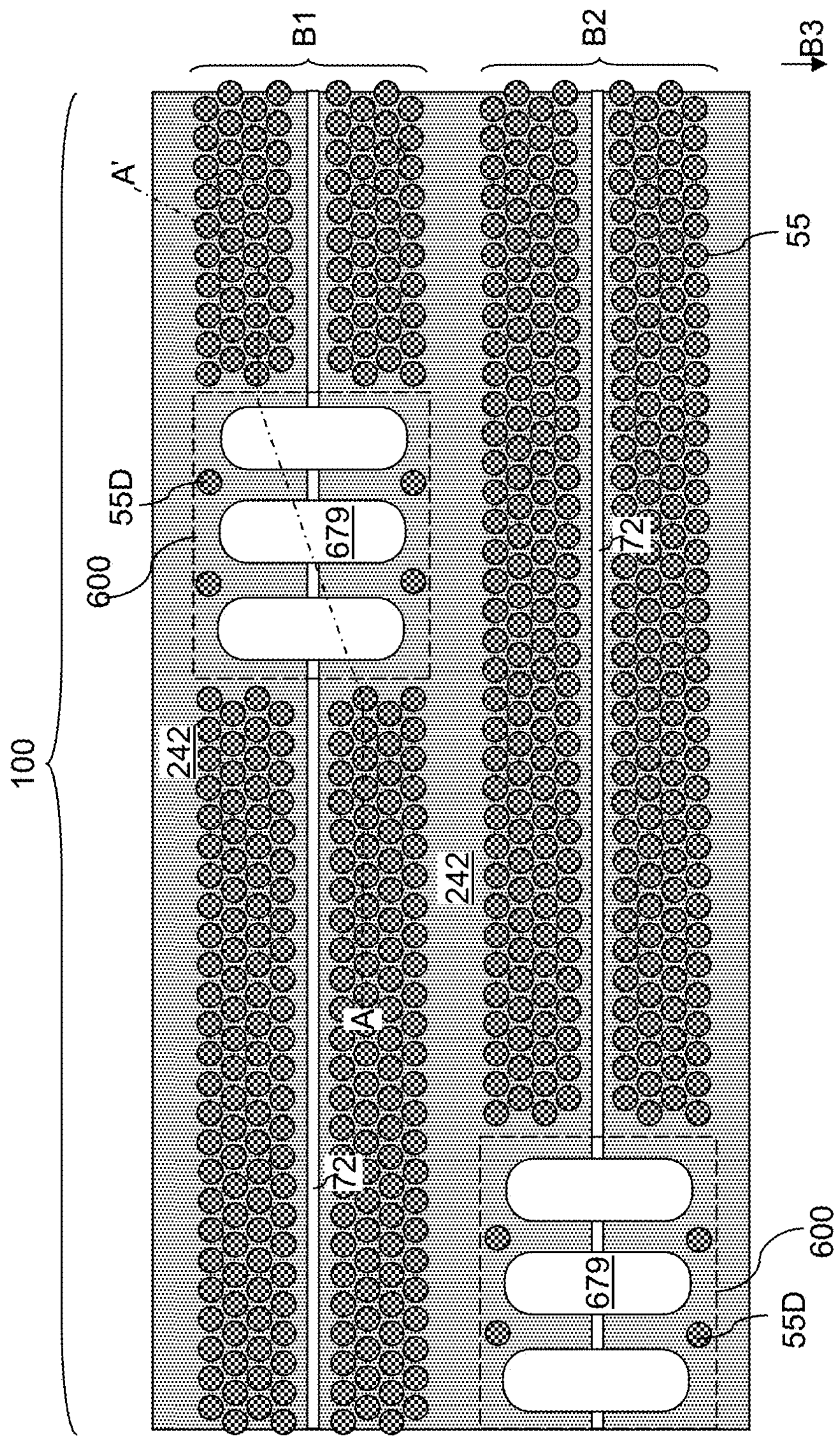
FIG. 51B is a horizontal cross-sectional view of the third modification of the fourth exemplary structure along the horizontal plane B-B' in FIG. 51A. The zig-zag vertical plane A-A' corresponds to the plane of the vertical cross-sectional view of FIG. 51A.

Referring to FIGS. 51A and 51B, a photoresist layer 677 can be applied and patterned only with the pattern of the through-memory-level openings 679 and without the pattern of the backside contact trenches 79 illustrated in FIGS. 45A and 45B. An anisotropic etch can be performed as in the processing steps of FIGS. 45A and 45B to transfer the pattern in the photoresist layer 677 though the alternating stack (132, 142, 232, 242) and into an upper portion of the at least one dielectric layer 760. Through-memory-level openings 679 are formed in the through-memory-level regions 600 without forming backside contact trenches in the semiconductor structure.

Figure 52A:
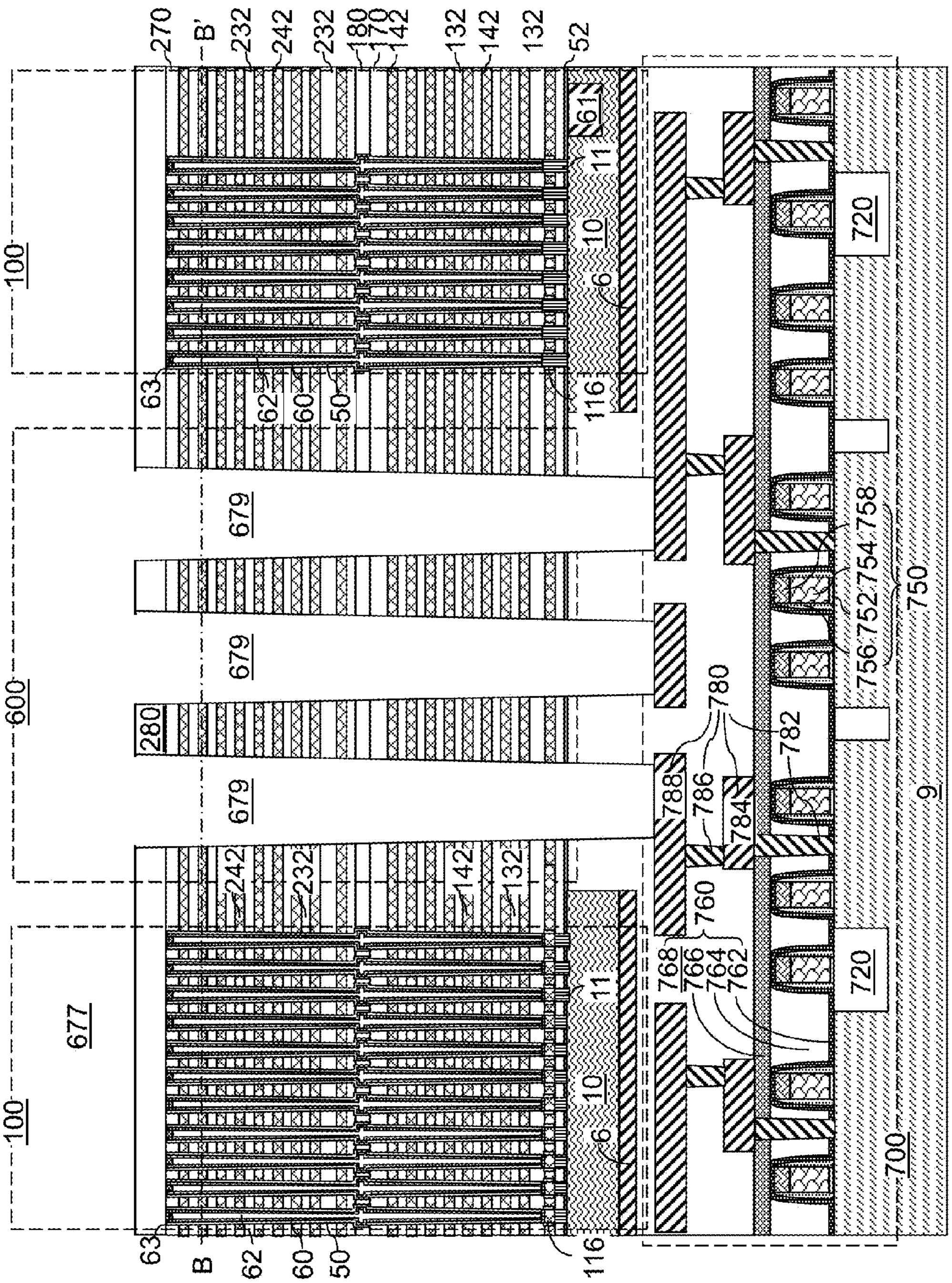
FIG. 52A is a vertical cross-sectional view of the third modification of the fourth exemplary structure after replacement of sacrificial material layers with electrically conductive layers according to the fourth embodiment of the present disclosure.
Figure 52B:
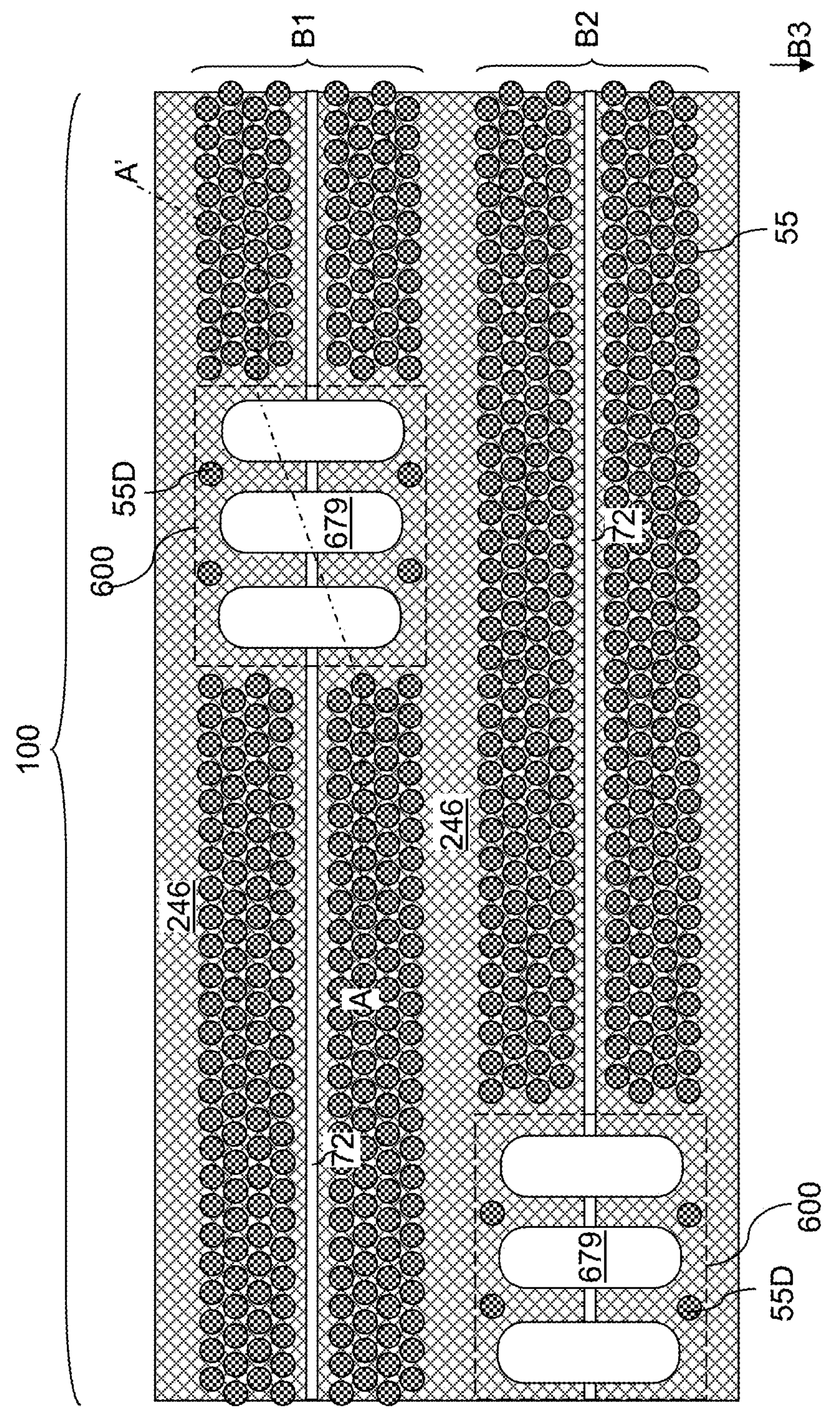
FIG. 52B is a horizontal cross-sectional view of the third modification of the fourth exemplary structure along the horizontal plane B-B' in FIG. 52A. The zig-zag vertical plane A-A' corresponds to the plane of the vertical cross-sectional view of FIG. 52A.

Referring to FIGS. 52A and 52B, the photoresist layer 677 can be removed, for example, by ashing. The processing steps of FIGS. 11A and 11B can be performed to remove the sacrificial material layers (142, 242) selective to the insulating layers (132, 232). In this case, the through-memory-level openings 679 can be employed to introduce etchants that etch the sacrificial material layers (142, 242) selective to the insulating layers (132, 232). Subsequently, the processing steps of FIGS. 12A and 12B can be performed to form electrically conductive layers (146, 246). Reactants can be introduced through the through-memory-level openings 679 to deposit the electrically conductive layers (146, 246). Excess portions of the deposited conductive material can be removed from inside the through-memory-level openings 679 and from above the first contact level dielectric layer 280 employing an etch-back process. An alternating stack (132, 146, 232, 246) of insulating layers (232, 232) and electrically conductive layers (146, 246) is thus formed.

Figure 53A:
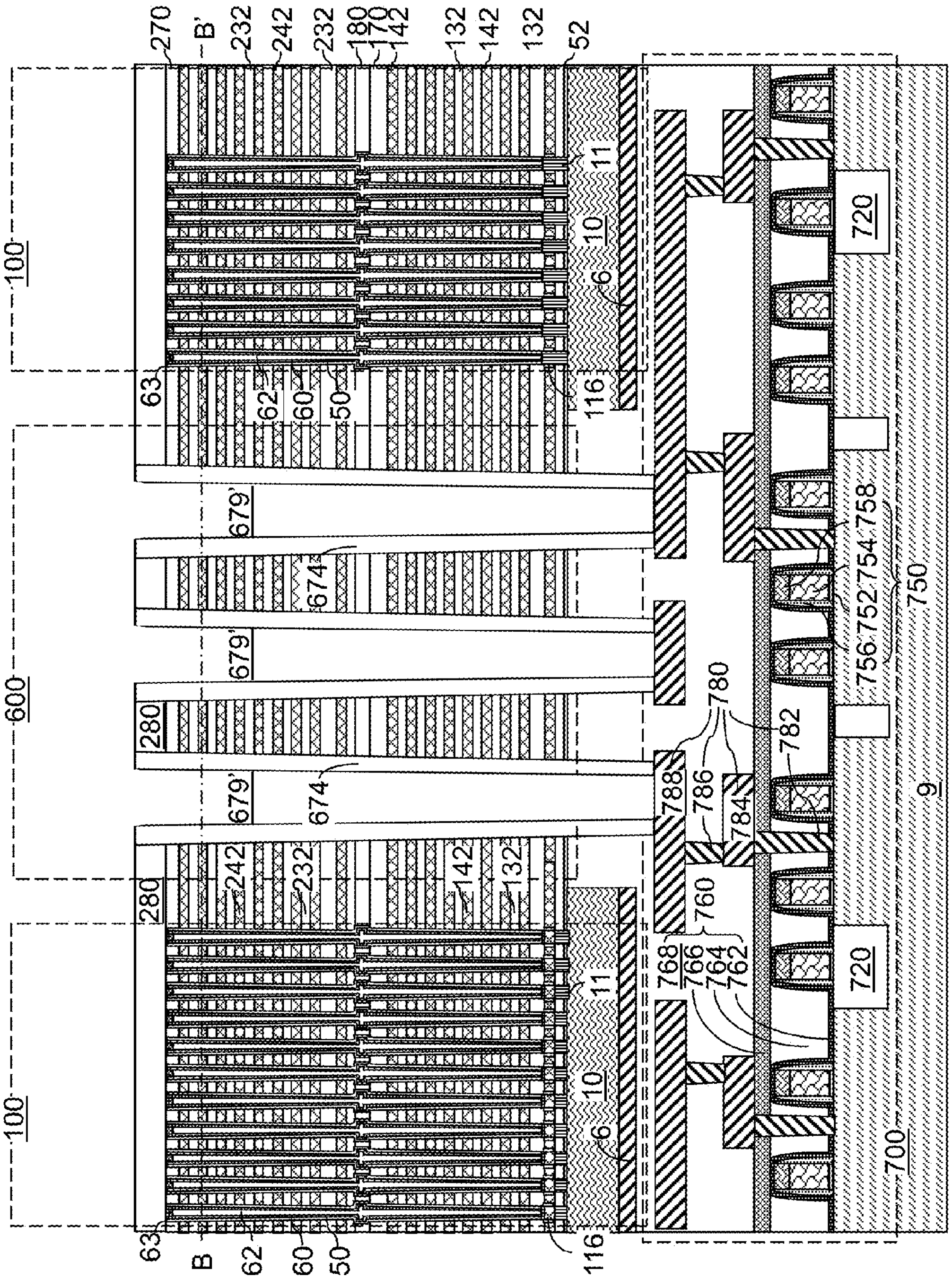
FIG. 53A is a vertical cross-sectional view of the third modification of the fourth exemplary structure after formation of insulating liners according to the fourth embodiment of the present disclosure.
Figure 54A:
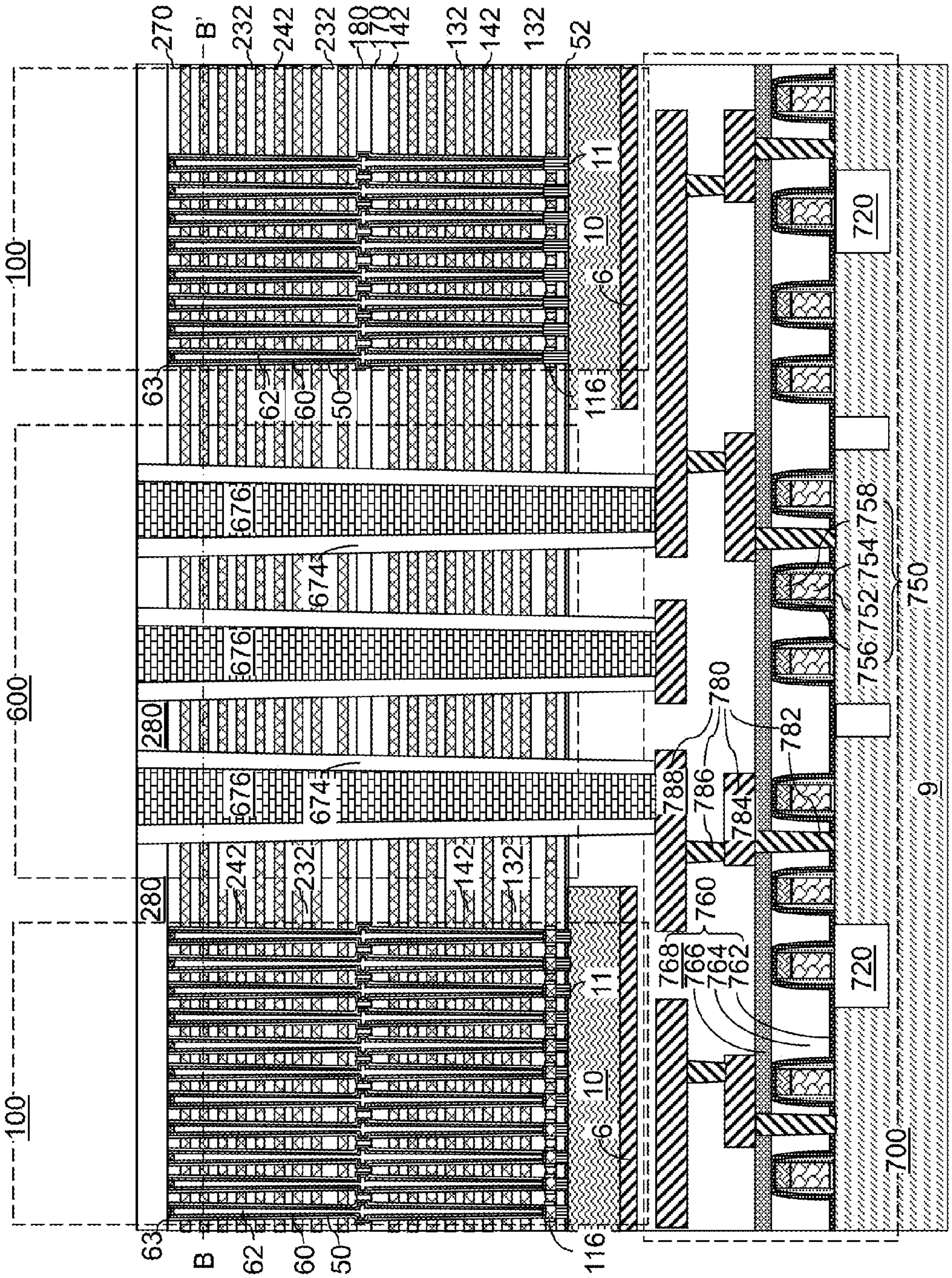
FIG. 54A is a vertical cross-sectional view of the third modification of the fourth exemplary structure after formation of through-memory-level via structures according to the fourth embodiment of the present disclosure.
Figure 54B:
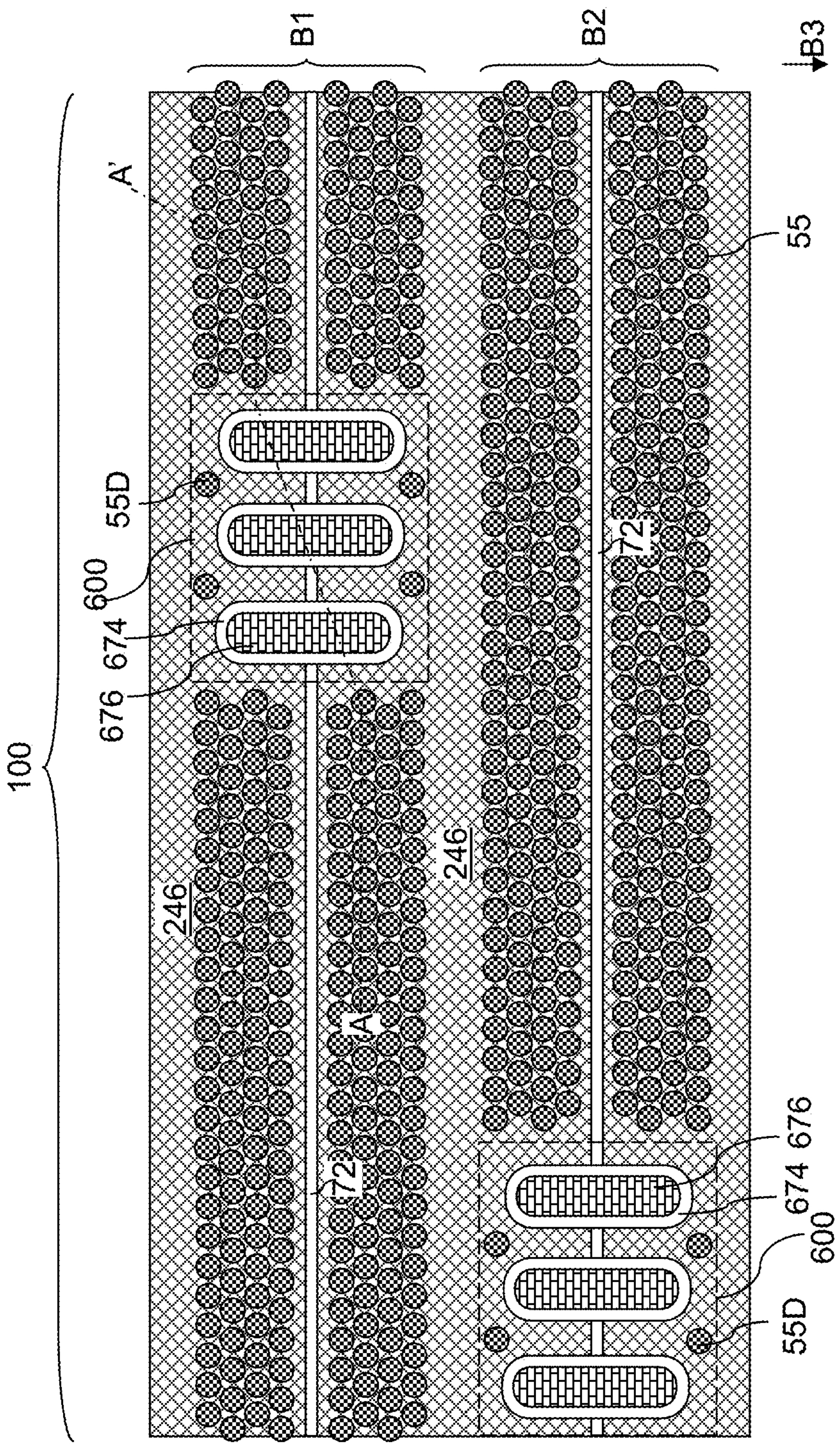
FIG. 54B is a horizontal cross-sectional view of the third modification of the fourth exemplary structure along the horizontal plane B-B' in FIG. 54A. The zig-zag vertical plane A-A' corresponds to the plane of the vertical cross-sectional view of FIG. 54A.

Referring to FIGS. 53A and 54B, a conformal insulating material layer is deposited in the through-memory-level openings 689 by a conformal deposition process such as chemical vapor deposition or atomic layer deposition. The conformal insulating material layer includes a dielectric material such as silicon oxide, silicon nitride, a dielectric metal oxide, or a combination thereof.

An anisotropic etch is performed to remove horizontal portions of the conformal insulating material layer. In case top surfaces of the lower level metal interconnect structures 780 are not physically exposed at the bottom of the through-memory-level openings 679 prior to the anisotropic etch, the anisotropic etch may remove additional material of the at least one lower level dielectric layer 760 to physically expose top surfaces of the lower level metal interconnect structures 780. In this case, the through-memory-level openings 679 can be extended downward while the conformal insulating material layer is anisotropically etched. A lower level metal interconnect structure 780 can be physically exposed at a bottom of one or more of the through-memory-level openings 679 during the anisotropic etch. Each remaining portion of the conformal insulating material layer in a through-memory-level opening 679 constitutes an insulating liner 674. A through-memory-level cavity 679' is present within each insulating liner 674.

Referring to FIGS. 54A and 54B, at least one conductive material can be deposited in the through-memory-level cavities 679'. Excess portions of the at least one conductive material can be removed from above the horizontal plane including the top surface of the first contact level dielectric layer 280 by a planarization process such as chemical mechanical planarization. Each remaining portion of the at least one conductive material in a through-memory-level opening 679 constitutes a through-memory-level via structure 676. Each through-memory-level via structure 676 is a conductive fill material portion.

Figure 55A:
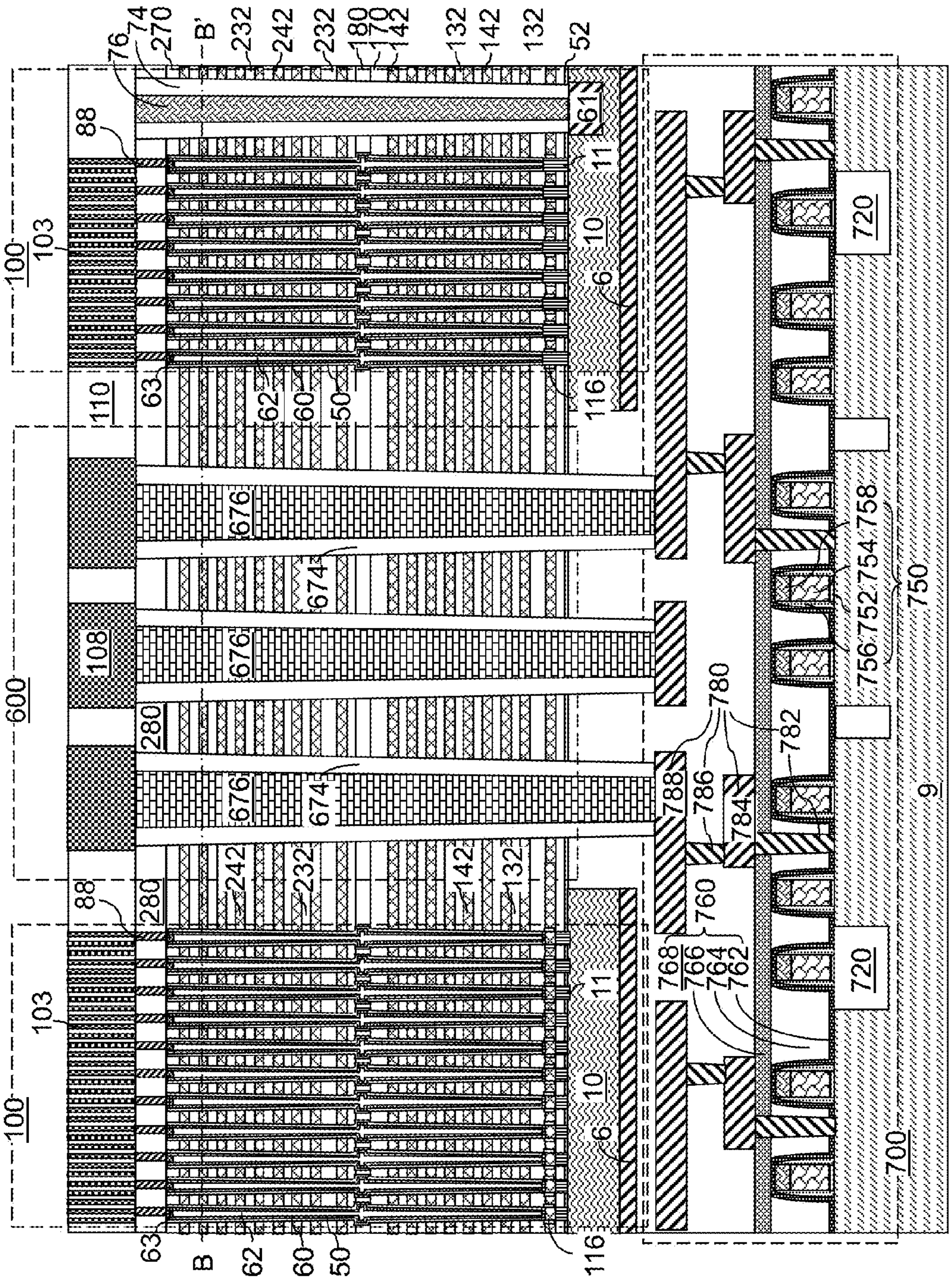
FIG. 55A is a vertical cross-sectional view of the third modification of the fourth exemplary structure after formation of laterally-elongated contact via structures and upper level metal interconnect structures according to the fourth embodiment of the present disclosure.
Figure 55B:
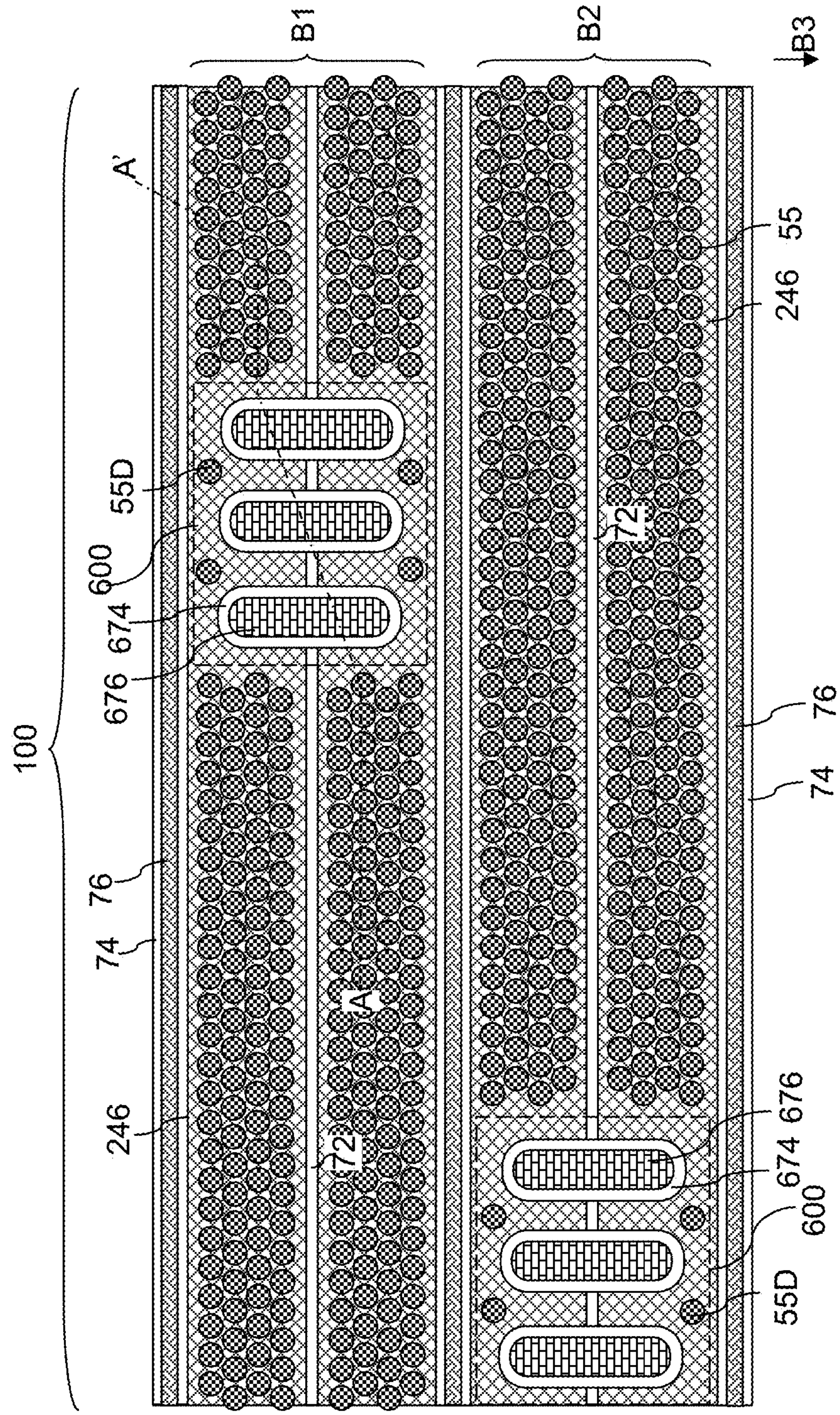
FIG. 55B is a horizontal cross-sectional view of the third modification of the fourth exemplary structure along the horizontal plane B-B' in FIG. 55A. The zig-zag vertical plane A-A' corresponds to the plane of the vertical cross-sectional view of FIG. 55A.

Referring to FIGS. 55A and 55B, a plurality of insulating spacers 74 and a plurality of laterally-extending contact via structures 76 located within a respective insulating spacer 74 can be formed. Backside contact trenches can be formed though the alternating stack (132, 146, 232, 246) of the insulating layers (132, 232) and electrically conductive layers (146, 246) employing the pattern illustrated in FIG. 11B. The insulating spacers 74 can be formed by deposition and an anisotropic etch of a dielectric material. Source regions 61 can be formed underneath each backside contact trench. The laterally-extending contact via structures 76 can be formed by deposition of at least one conductive material and removal of excess portions of the at least one conductive material employing a planarization process.

Subsequently, drain contact via structures 88 and word line contact via structures can be formed as in the first through third embodiments. A line level dielectric layer 110 can be formed over the first contact level dielectric layer 280. Various metal interconnect structures can be formed can be formed in the line level dielectric layer 110 as in the first through third embodiments. The metal interconnect structures can include upper level metal interconnect structures 108 that are either formed on respective pairs of a word line contact via structure 86 and a through-memory-level via structure 588 or which comprise a shunt line or power strap connected to structure 588, bit lines 103 that extend along the second horizontal direction and perpendicular to the first horizontal direction, and source connection line structures (not shown).

Figure 56A:
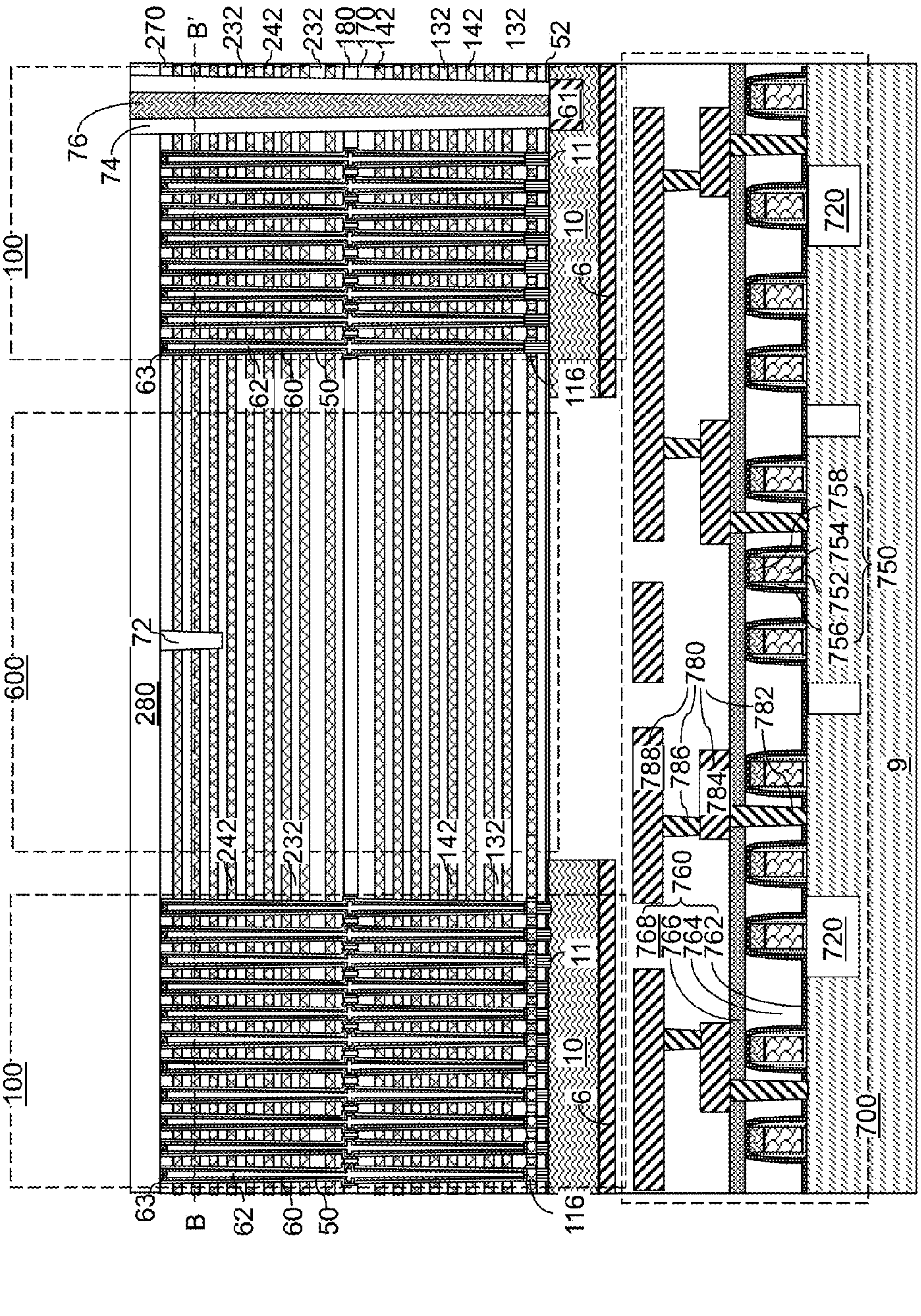
FIG. 56A is a vertical cross-sectional view of a fourth modification of the fourth exemplary structure after formation of memory stack structures and laterally-elongated contact via structures according to the fourth embodiment of the present disclosure.
Figure 56B:
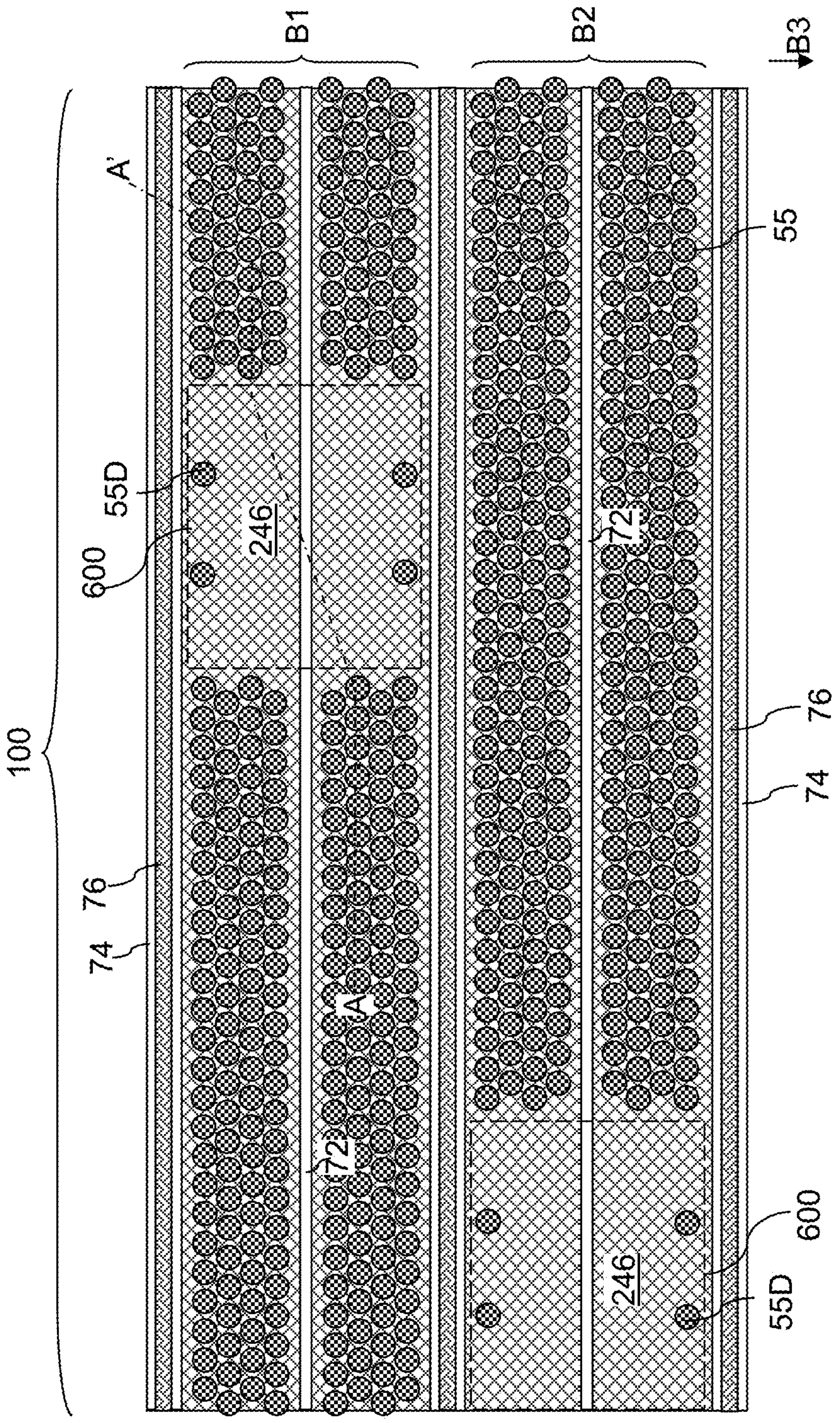
FIG. 56B is a horizontal cross-sectional view of the fourth modification of the fourth exemplary structure along the horizontal plane B-B' in FIG. 56A. The zig-zag vertical plane A-A' corresponds to the plane of the vertical cross-sectional view of FIG. 56A.

Referring to FIGS. 56A and 56B, a fourth modification of the fourth exemplary structure can be derived from the first exemplary structure illustrated in FIGS. 13A and 13B, or any of the second, third, and fourth exemplary structures or modifications thereof described above that corresponds to the processing steps of FIGS. 13A and 13B.

Through-memory-level via regions 600 that do not include memory stack structures 55 at respect center regions thereof can be formed within the memory array region 100. Each through-memory-level via region 600 can be formed entirely within a block (B1, B2, etc.). Dummy memory stack structures 55D can be provided at a periphery of the through-memory-level via regions 600. The dummy memory stack structures 55 are not active components of the semiconductor structure, but are employed to provide structural support during formation of the backside recesses (143, 243). The through-memory-level via regions 600 can be formed without forming additional through-memory-level via regions 400 of the first, second, and third embodiments, or can be formed in addition to the through-memory-level via regions 400 of the first, second, and third embodiments through the same memory-level assembly.

Figure 57A:
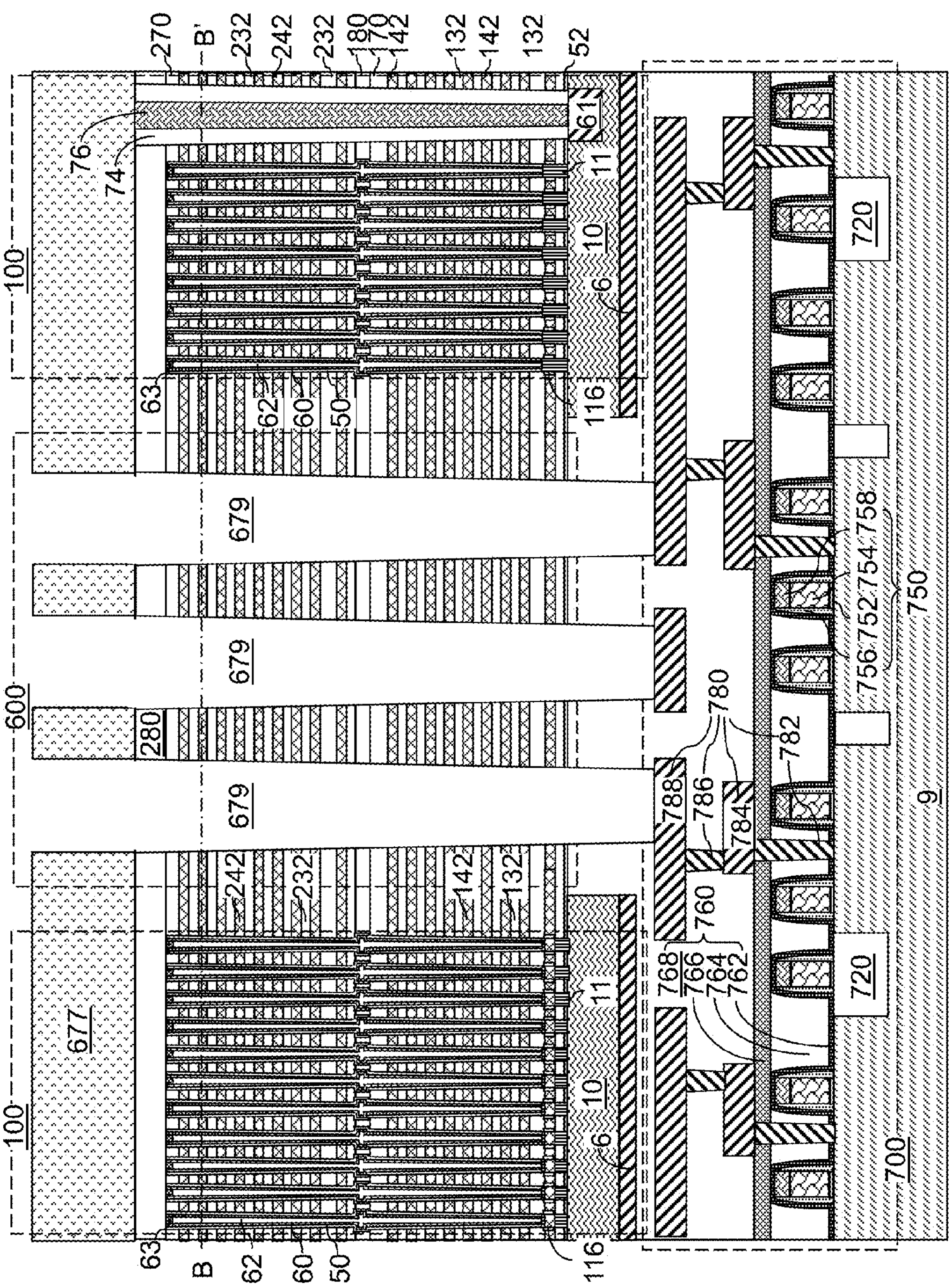
FIG. 57A is a vertical cross-sectional view of the fourth modification of the fourth exemplary structure after formation of through-memory-level openings according to the fourth embodiment of the present disclosure.
Figure 57B:
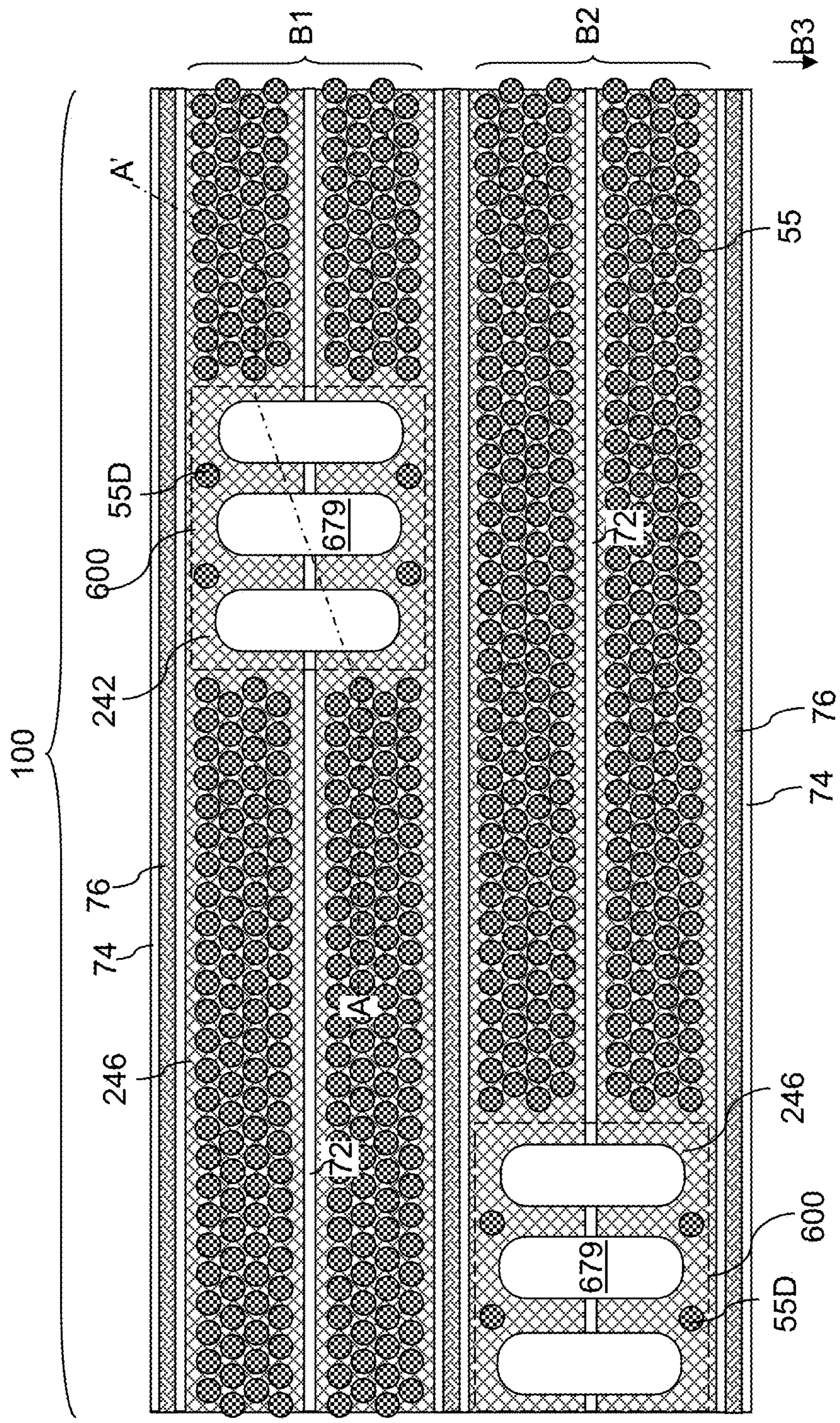
FIG. 57B is a horizontal cross-sectional view of the fourth modification of the fourth exemplary structure along the horizontal plane B-B' in FIG. 57A. The zig-zag vertical plane A-A' corresponds to the plane of the vertical cross-sectional view of FIG. 57A.

Referring to FIGS. 57A and 57B, a photoresist layer 677 can be applied and patterned with the pattern of the through-memory-level openings 679 illustrated in FIGS. 51A and 51B. An anisotropic etch can be performed to transfer the pattern in the photoresist layer 677 though the alternating stack (132, 146, 232, 246) and into an upper portion of the at least one dielectric layer 760. Through-memory-level openings 679 are formed in the through-memory-level regions 600 while a plurality of laterally-extending contact via structures 76 and insulating spacers 74 are present in the semiconductor structure. A top surface of an underlying lower level metal interconnect structure 780 may be physically exposed at the bottom of the through-memory-level openings 679.

Figure 53B:
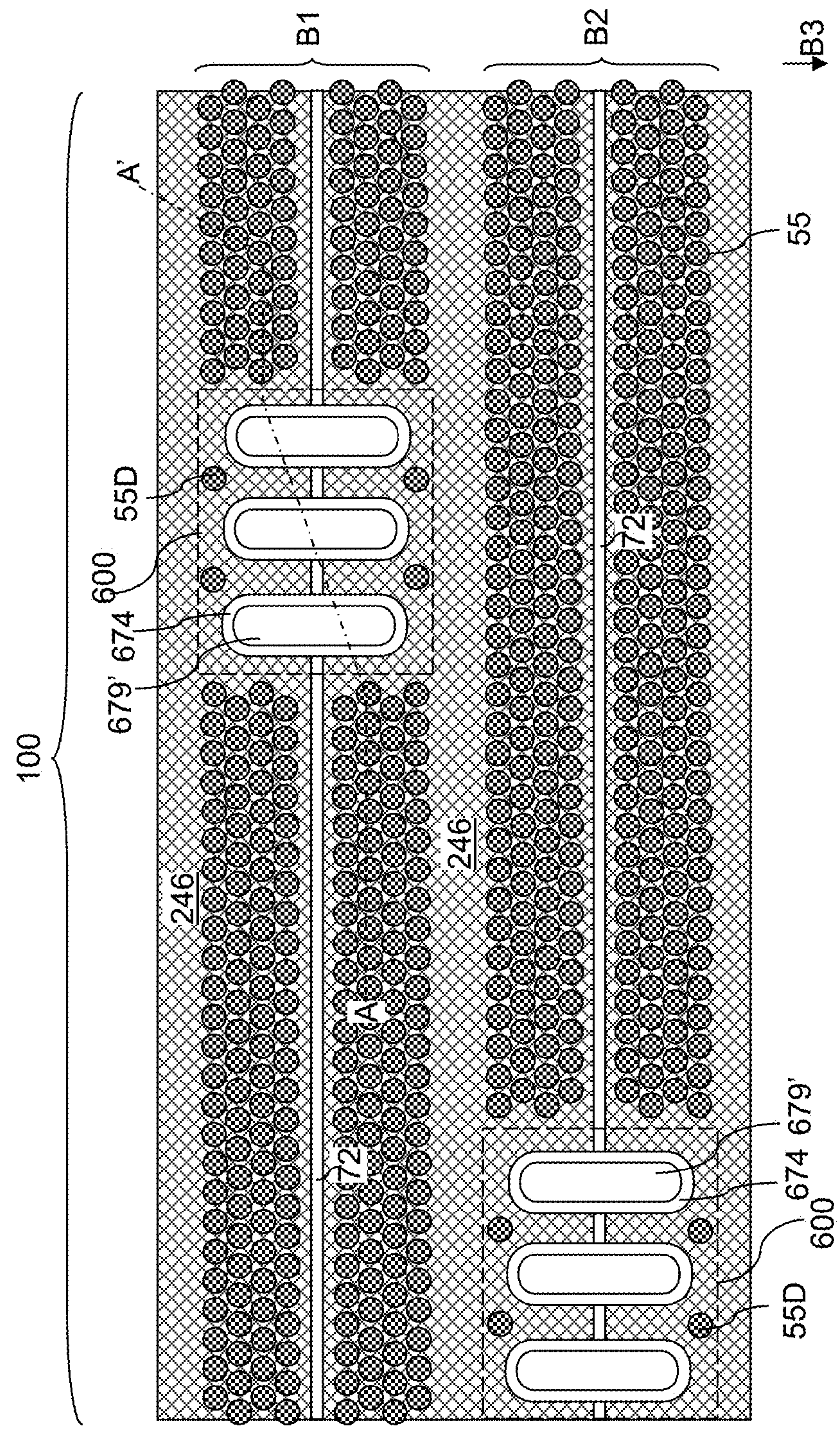
FIG. 53B is a horizontal cross-sectional view of the third modification of the fourth exemplary structure along the horizontal plane B-B' in FIG. 53A. The zig-zag vertical plane A-A' corresponds to the plane of the vertical cross-sectional view of FIG. 53A.
Figure 58A:
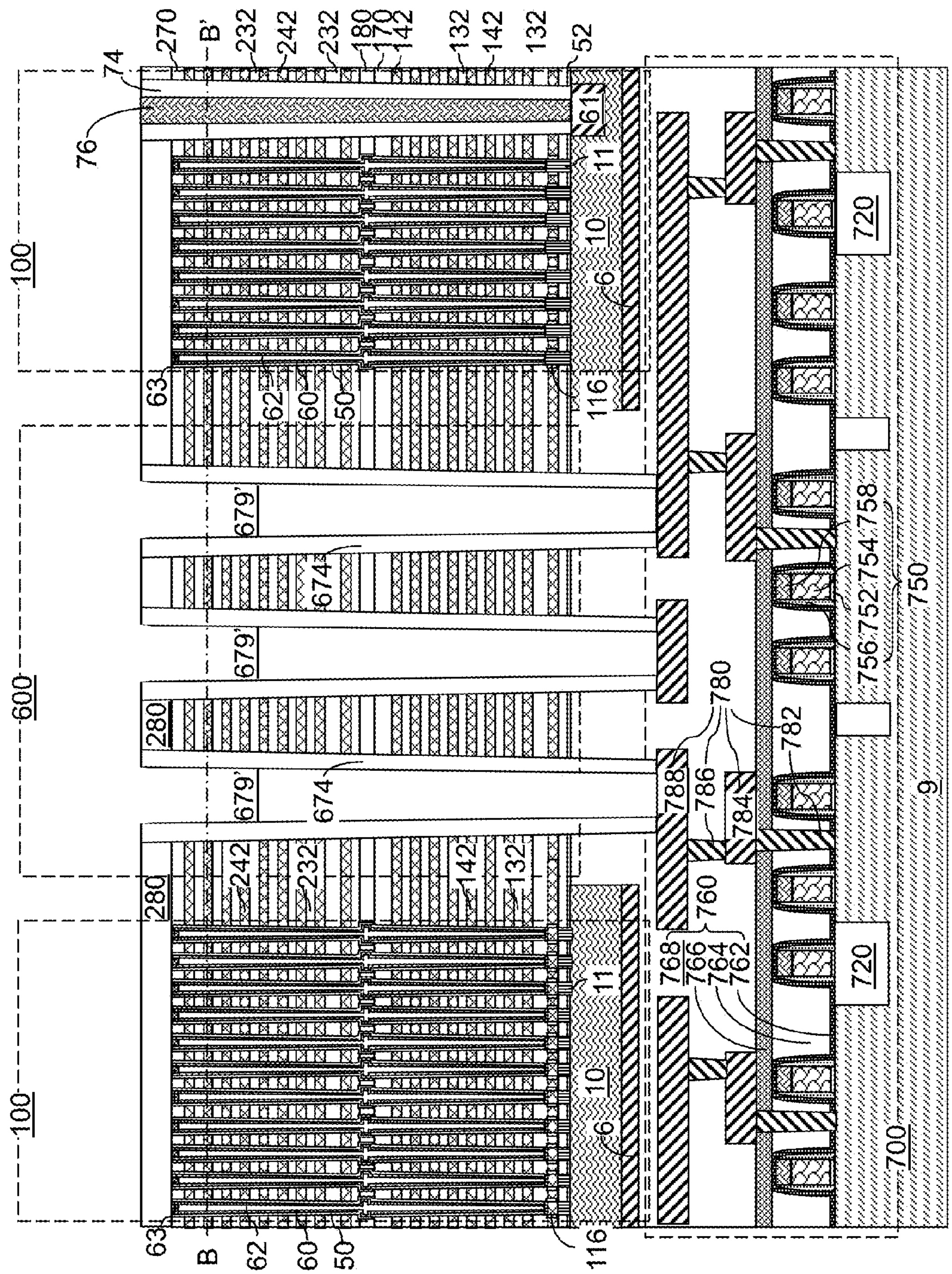
FIG. 58A is a vertical cross-sectional view of the fourth modification of the fourth exemplary structure after formation of insulating liners according to the fourth embodiment of the present disclosure.
Figure 58B:
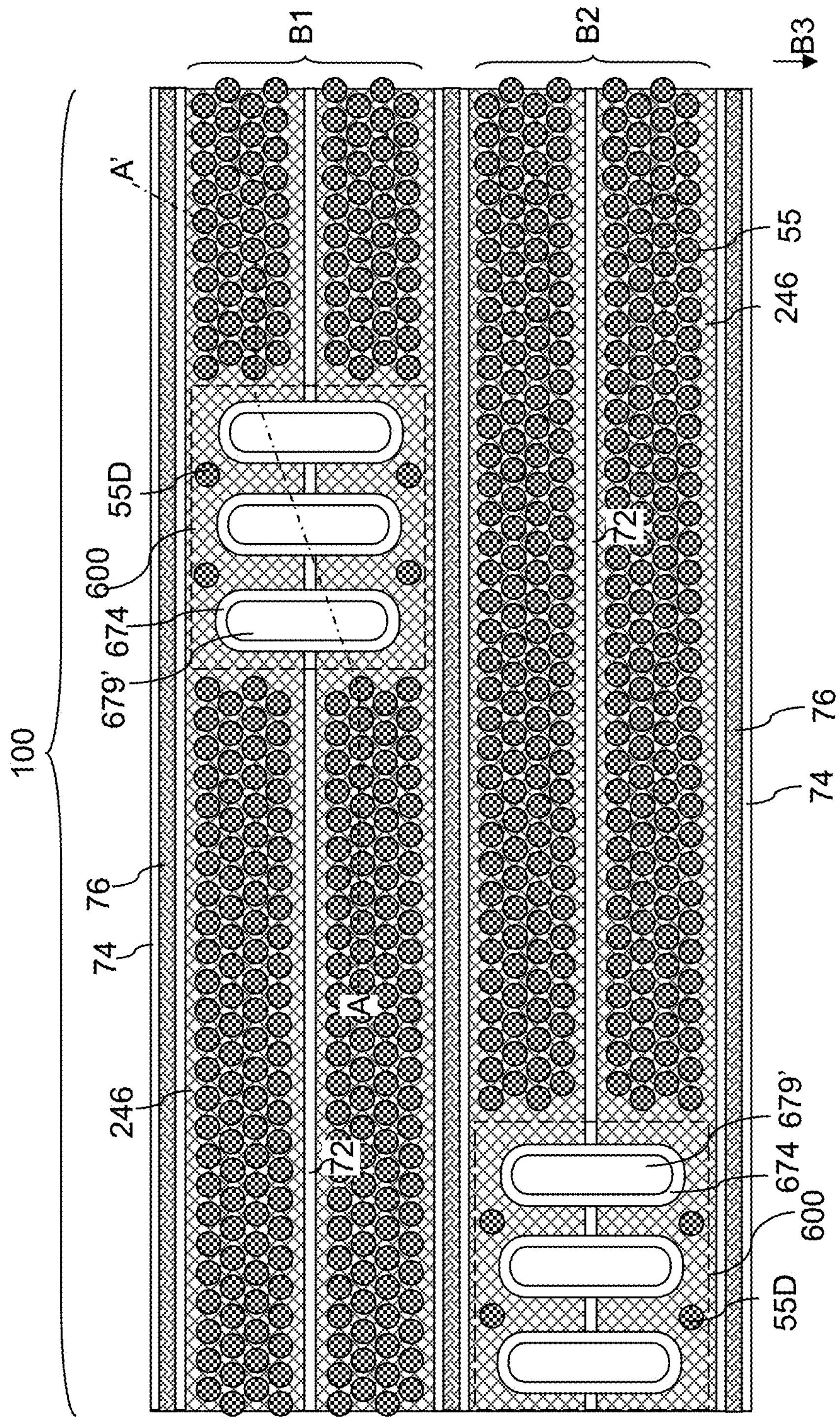
FIG. 58B is a horizontal cross-sectional view of the fourth modification of the fourth exemplary structure along the horizontal plane B-B' in FIG. 58A. The zig-zag vertical plane A-A' corresponds to the plane of the vertical cross-sectional view of FIG. 58A.

Referring to FIGS. 58A and 58B, the processing steps of FIGS. 53A and 53B can be performed to form insulating liners 674 that laterally surround a respective through-memory-level cavity 679'.

Figure 59A:
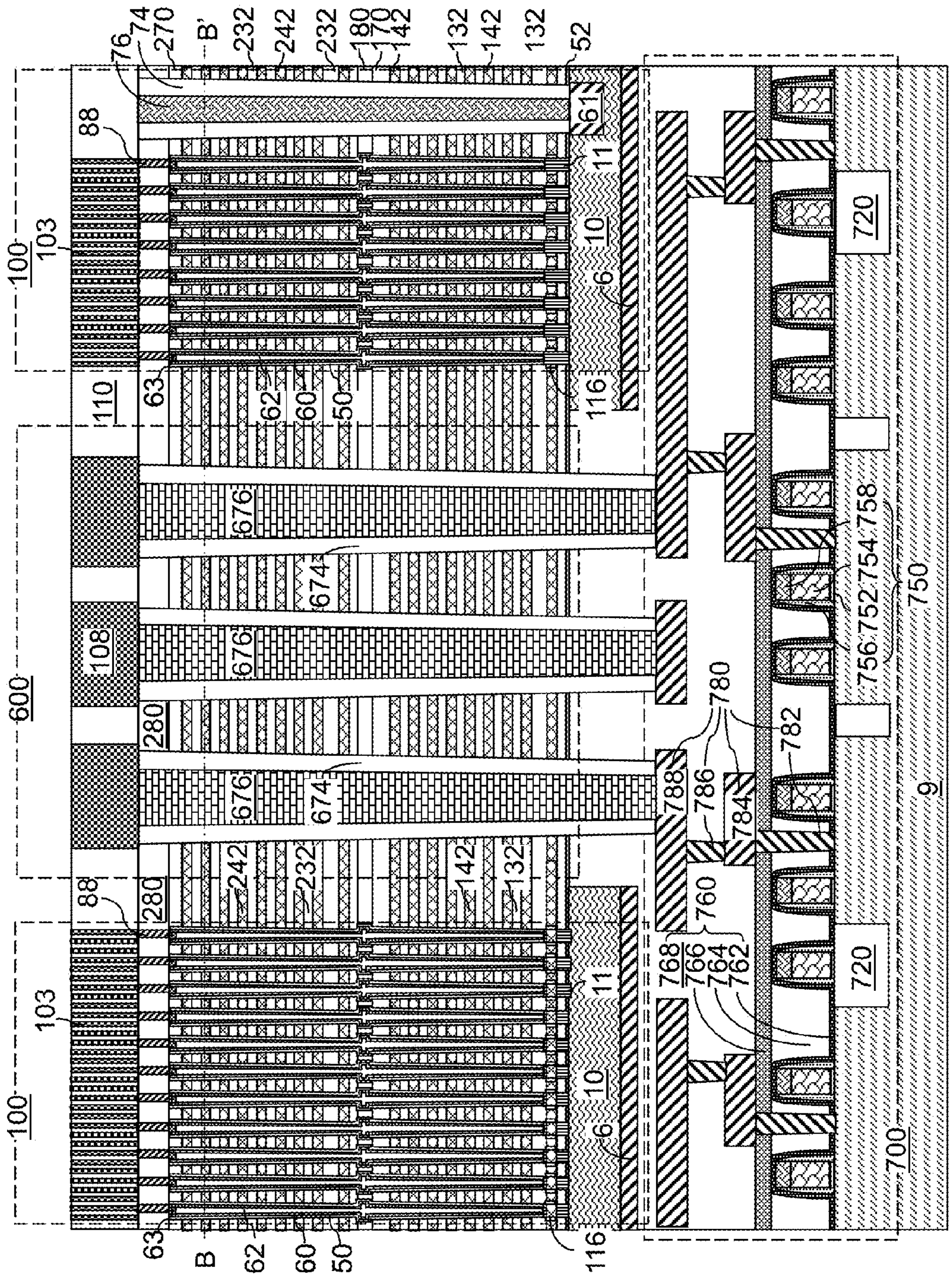
FIG. 59A is a vertical cross-sectional view of the fourth modification of the fourth exemplary structure after formation of through-memory-level via structures and upper level metal interconnect structures according to the fourth embodiment of the present disclosure.
Figure 59B:
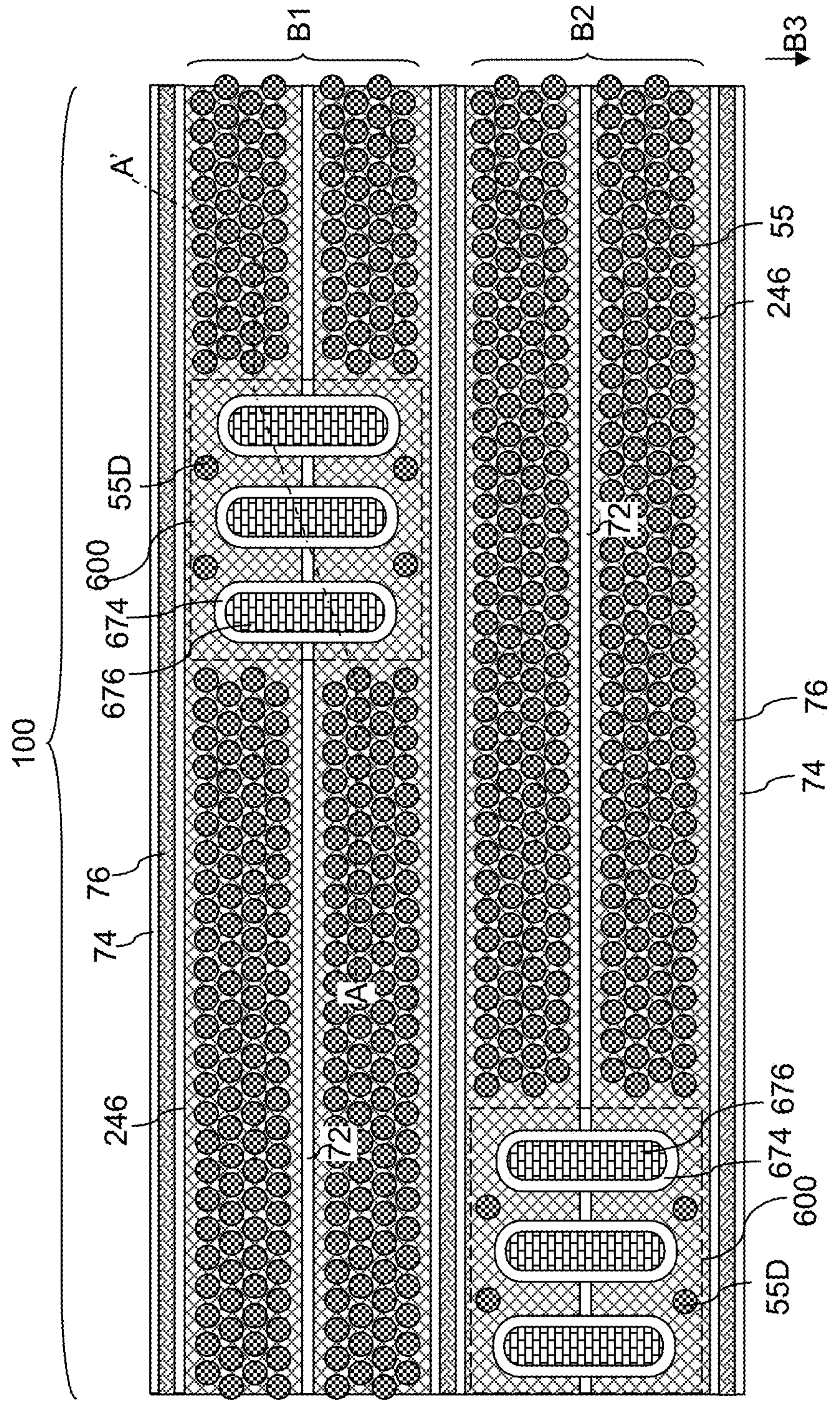
FIG. 59B is a horizontal cross-sectional view of the fourth modification of the fourth exemplary structure along the horizontal plane B-B' in FIG. 59A. The zig-zag vertical plane A-A' corresponds to the plane of the vertical cross-sectional view of FIG. 59A.

Referring to FIGS. 59A and 59B, drain contact via structures 88 and word line contact via structures can be formed as in the first through third embodiments. A line level dielectric layer 110 can be formed over the first contact level dielectric layer 280. Various metal interconnect structures can be formed can be formed in the line level dielectric layer 110 as in the first through third embodiments. The metal interconnect structures can include upper level metal interconnect structures 108 that are either formed on respective pairs of a word line contact via structure 86 and a through-memory-level via structure 588 or which comprise a shunt line or power strap connected to structure 588, bit lines 103 that extend along the second horizontal direction and perpendicular to the first horizontal direction, and source connection line structures (not shown).

Figure 60:
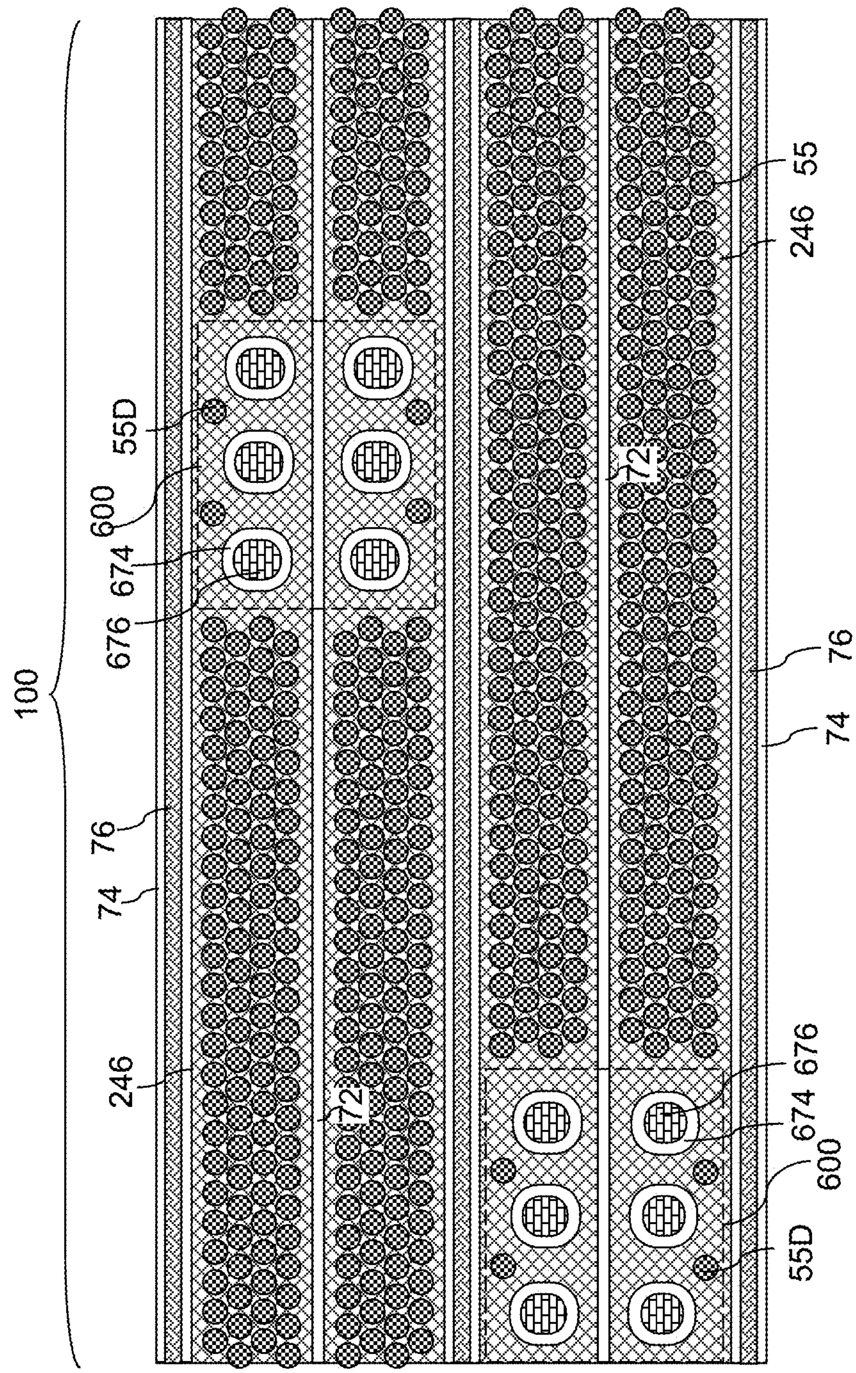
FIG. 60 is a horizontal cross-sectional view of a fifth modification of the fourth exemplary structure according to the fourth embodiment of the present disclosure.

Referring to FIG. 60, a fifth modification of the fourth exemplary structure according to the fourth embodiment of the present disclosure is illustrated, which can be derived from any of the second, third, and fourth modifications of the fourth exemplary structure by patterning the through-memory-level openings 679 in a manner that does not divide the drain-contact-level shallow trench isolation structures 72. In this case, the through-memory-level via structures 676 can be formed as a two-dimensional array.

Figure 61A:
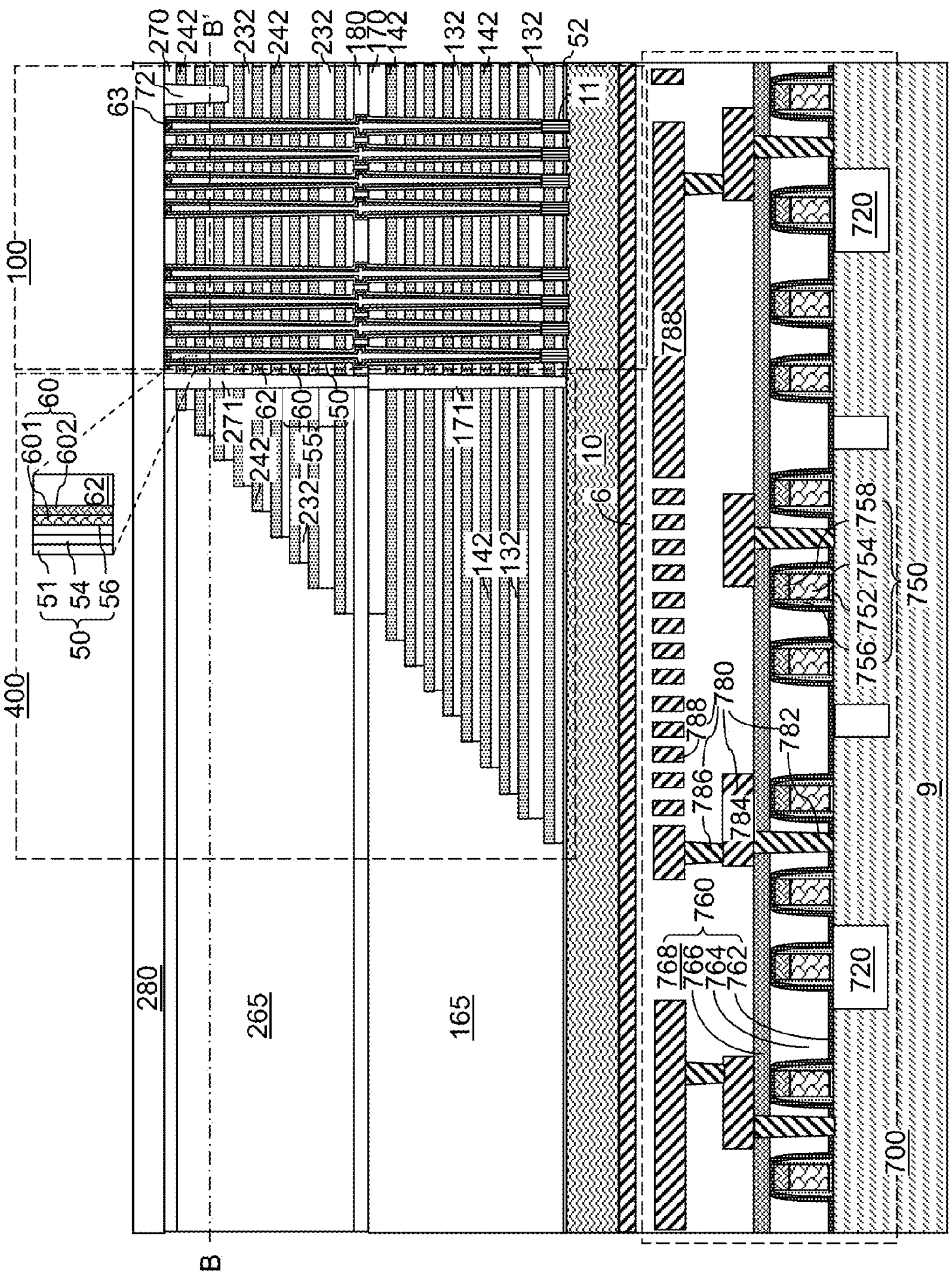
FIG. 61A is a vertical cross-sectional view of a second modification of the third exemplary structure after formation of memory stack structures according to the third embodiment of the present disclosure.
Figure 61B:
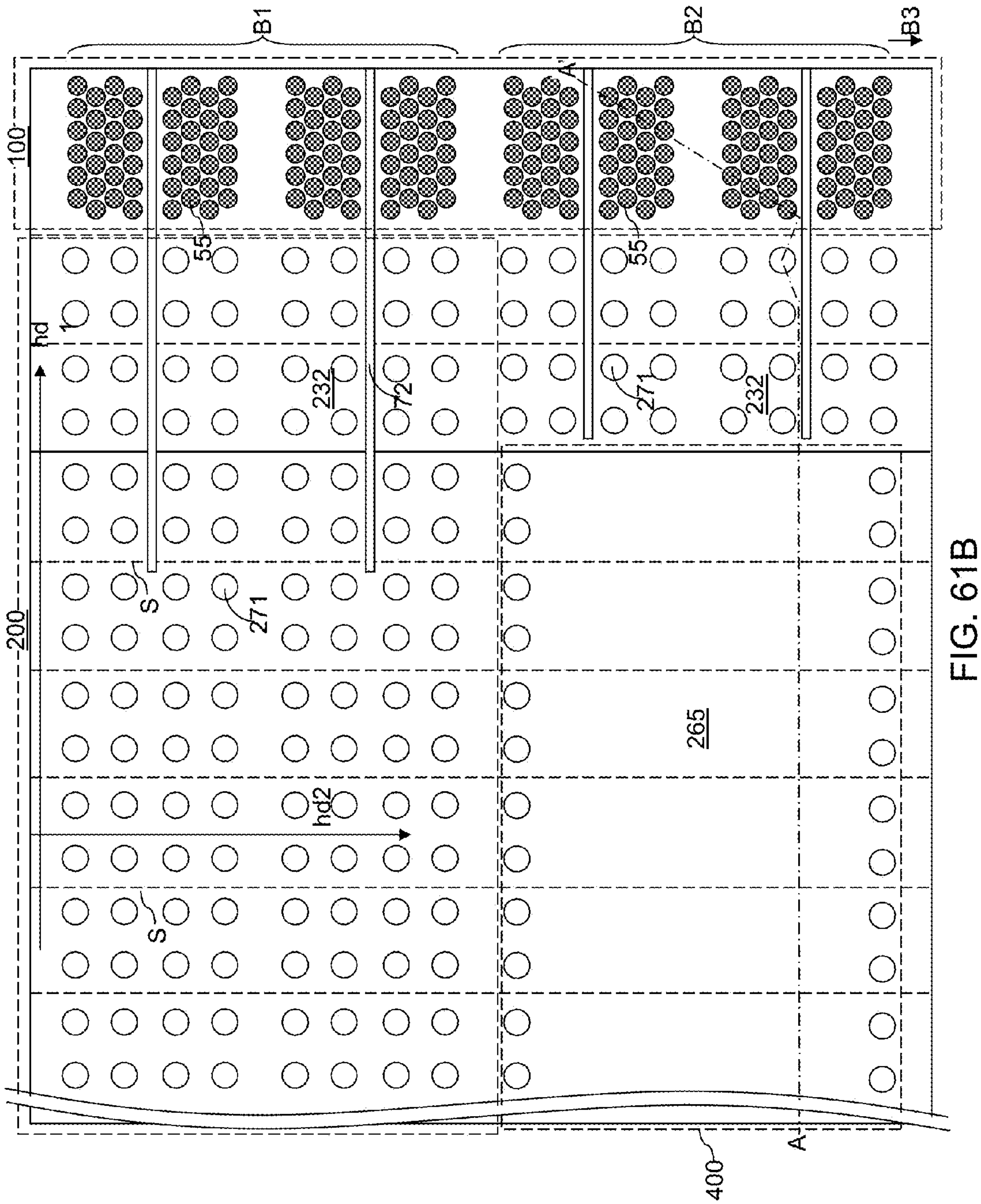
FIG. 61B is a horizontal cross-sectional view of the second modification of the third exemplary structure of FIG. 61A. The zig-zag vertical plane A-A' corresponds to the plane of the vertical cross-sectional view of FIG. 61A.

Referring to FIGS. 61A and 61B, a second modification of the third exemplary structure can be derived from the structure of FIGS. 10A and 10B, or from the structure of FIG. 22. The memory stack structures 55 and the first contact level dielectric layer 280 can be formed employing any of the methods described above.

Figure 62A:
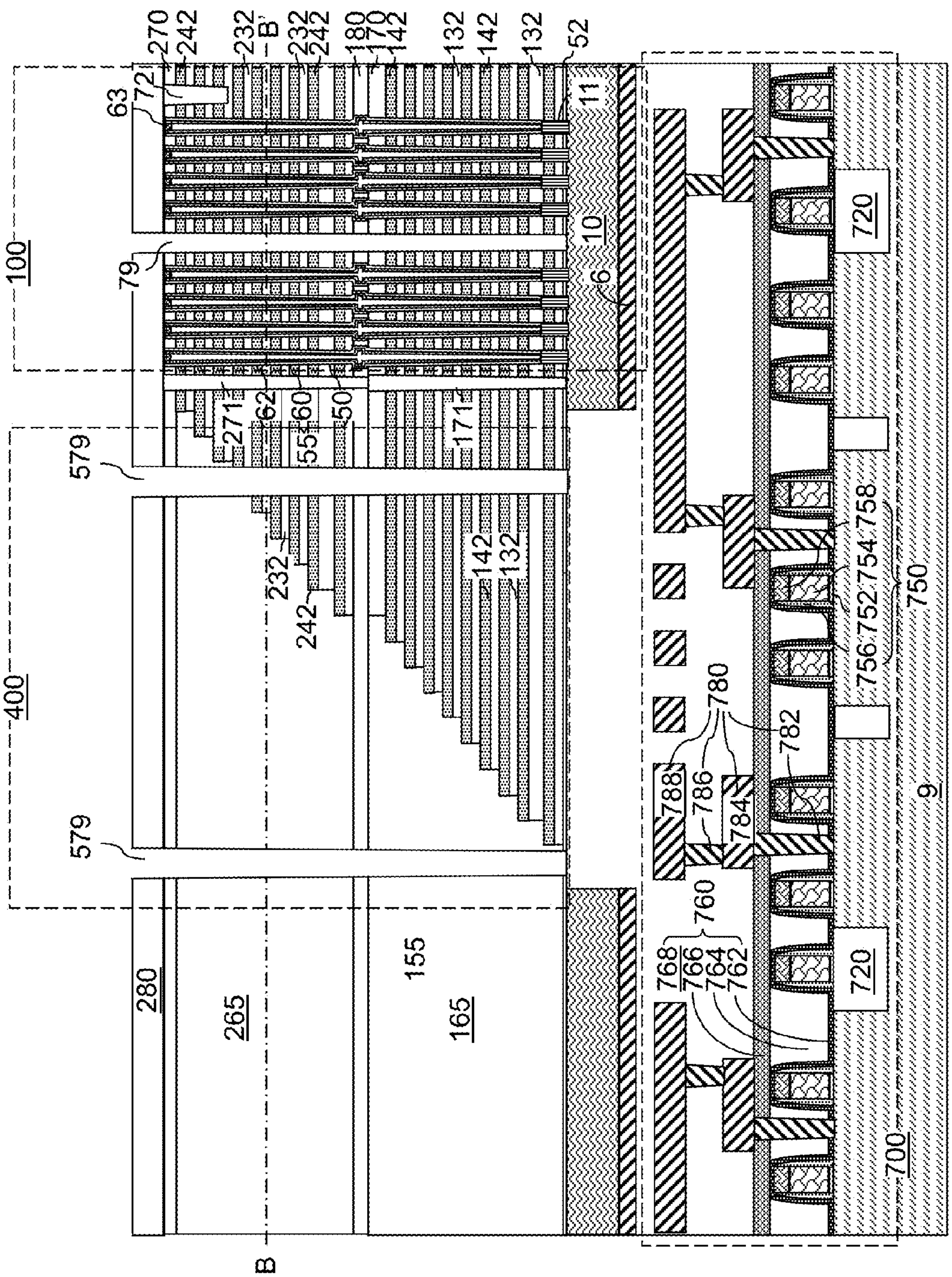
FIG. 62A is a vertical cross-sectional view of the second modification of the third exemplary structure after simultaneous formation of backside contact trenches and moat trenches according to the third embodiment of the present disclosure.
Figure 62B:
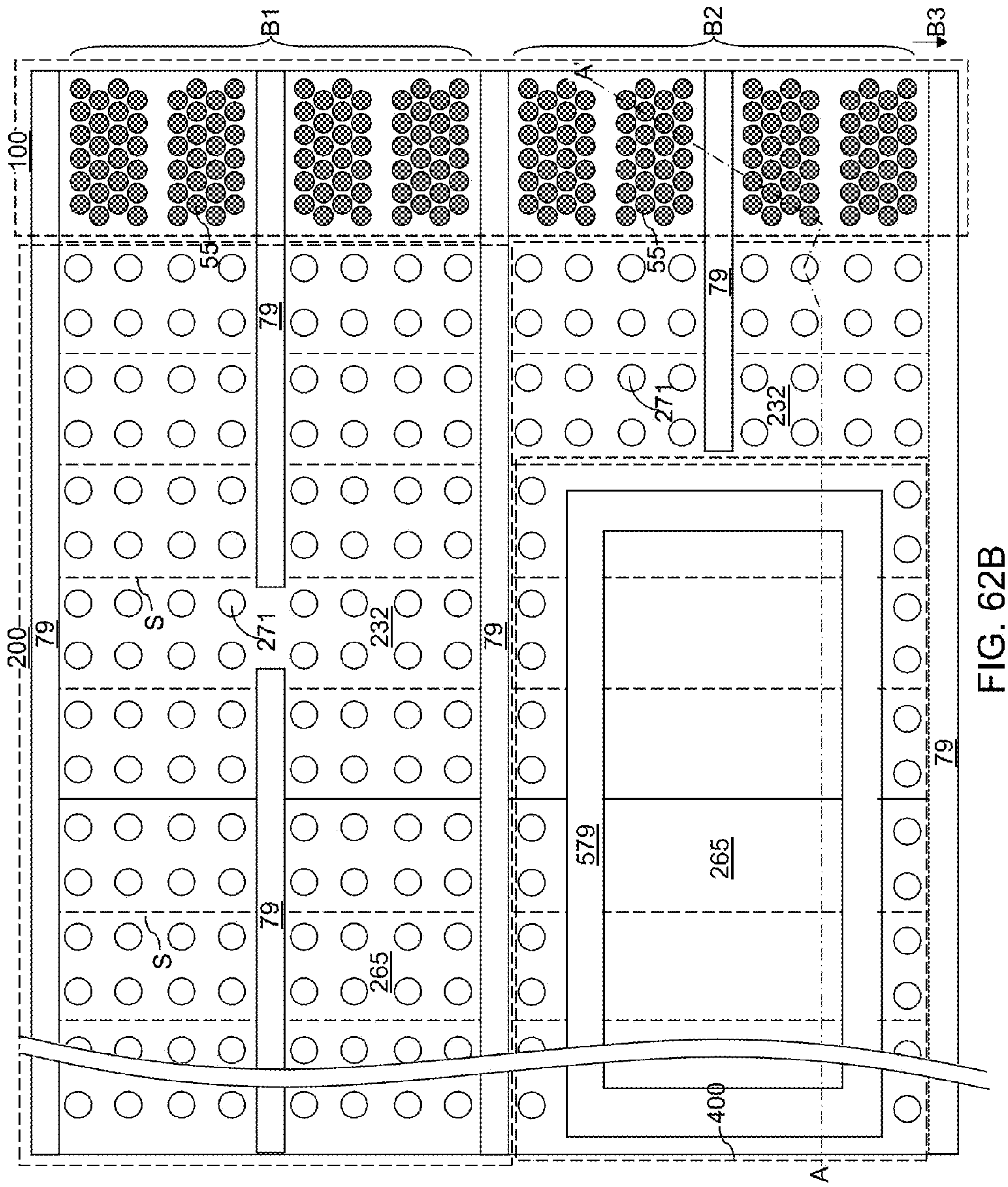
FIG. 62B is a horizontal cross-sectional view of the second modification of the third exemplary structure of FIG. 62A. The zig-zag vertical plane A-A' corresponds to the plane of the vertical cross-sectional view of FIG. 62A.

Referring to FIGS. 62A and 62B, the processing steps of FIGS. 34A and 34B can be performed to simultaneously form backside contact trenches 79 and moat trenches 579 through the memory-level assembly. In this embodiment, the locations of the moat trenches 579 is selected to be outside the memory array region 100 and within each through-memory-level via region 400, which can have the same locations as the through-memory-level via regions 400 in the first, second, and third embodiments.

For example, a photoresist layer can be applied over the first contact level dielectric layer 280, and can be lithographically patterned to form openings including the pattern of the backside contact trenches 79 as in the previous embodiments and the pattern of moat trenches 579. An anisotropic etch is performed to transfer the pattern in the patterned photoresist layer through the memory-level assembly, thereby forming the backside contact trenches 79 and the moat trenches 579. The photoresist layer can be subsequently removed, for example, by ashing. Each moat trench 579 can include an area of the through-memory-level via region 400 within an outer periphery thereof.

Figure 63A:
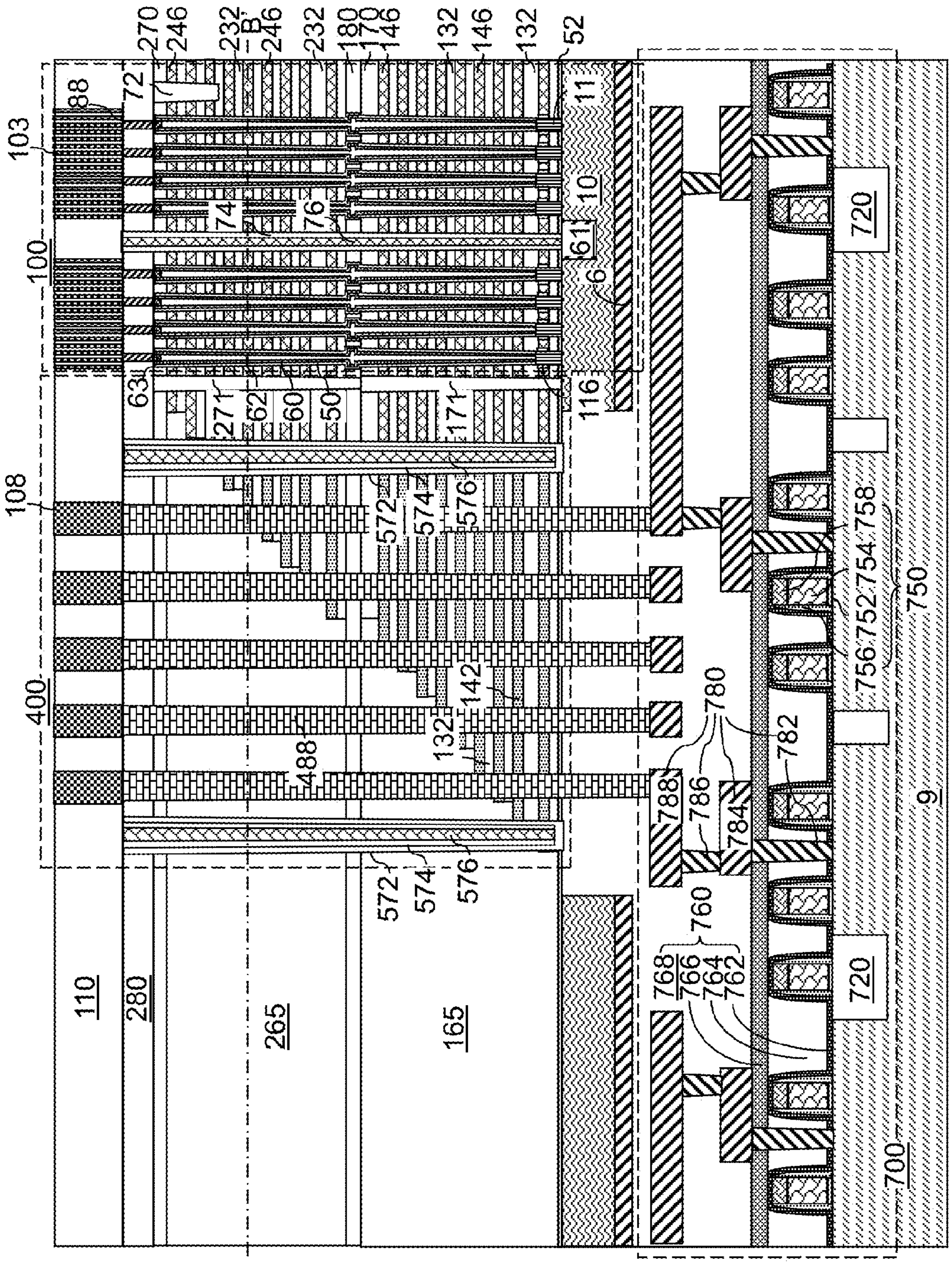
FIG. 63A is a vertical cross-sectional view of the second modification of the third exemplary structure after formation of upper level line structures according to the third embodiment of the present disclosure.
Figure 63B:
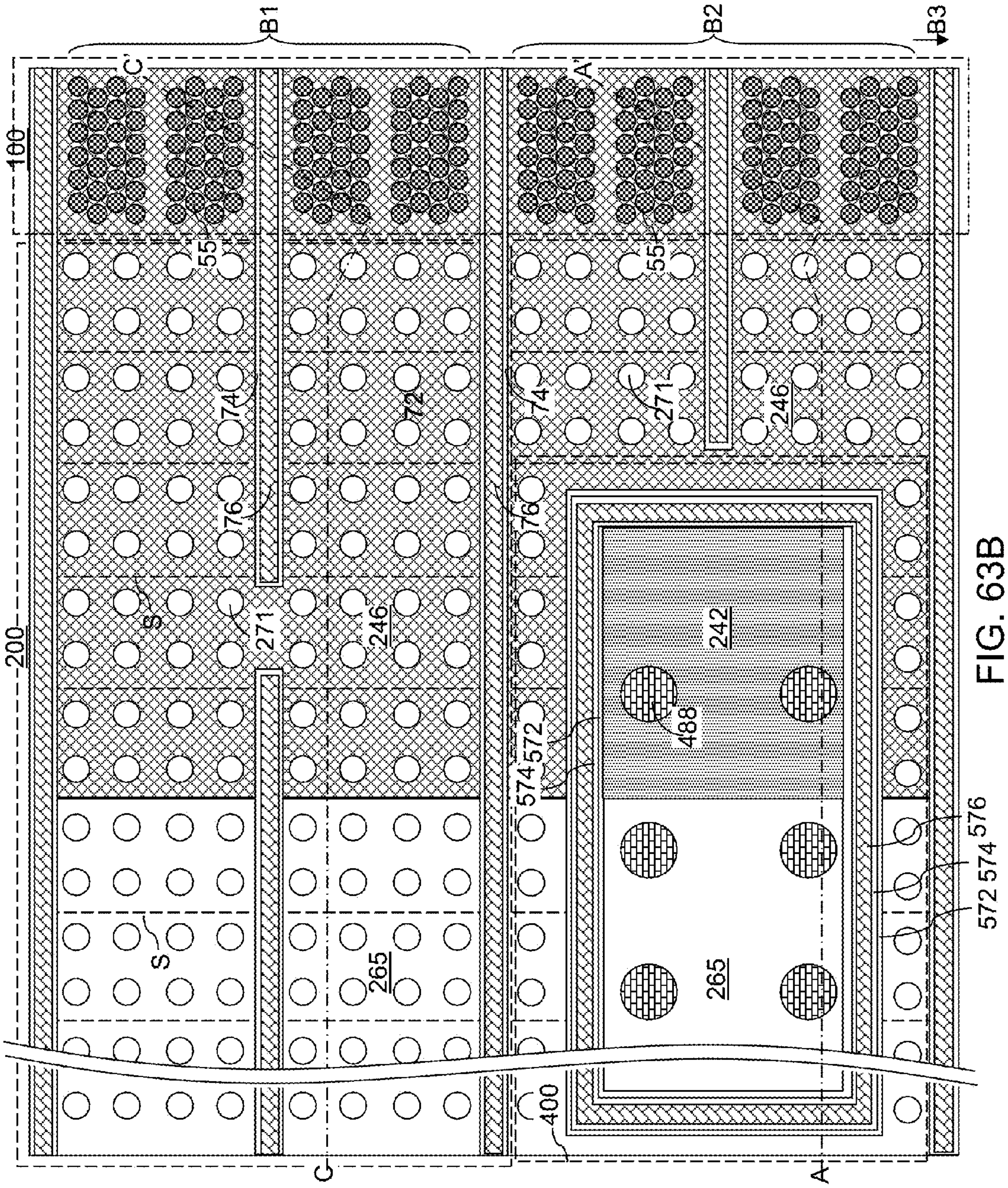
FIG. 63B is a horizontal cross-sectional view of second modification of the third exemplary structure along the horizontal plane B-B' in FIG. 63A. The zig-zag vertical plane A-A' corresponds to the plane of the vertical cross-sectional view of FIG. 63A.
Figure 63C:
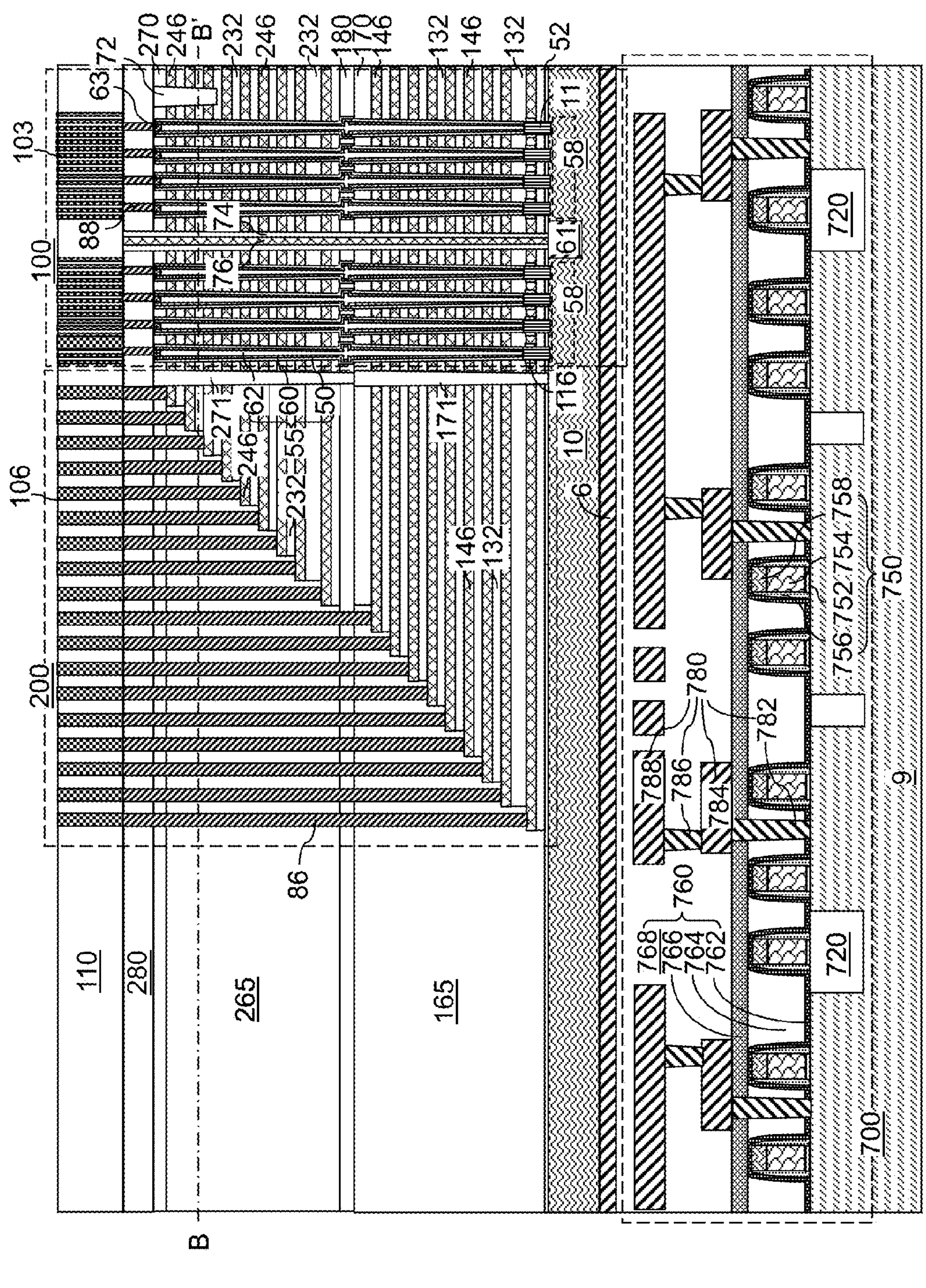
FIG. 63C is a vertical cross-sectional view of the second modification of the third exemplary structure along the zig-zag vertical plane C-C' in FIG. 63B according to the third embodiment of the present disclosure.

Referring to FIGS. 63A-63C, the processing steps of FIGS. 35A and 35B, 36A and 36B, 37A and 37B, 38A and 38B, 39A and 39B, and 40 can be sequentially performed to form a plurality of laterally-elongated contact via structures 76 through the memory-level assembly, and to fill each moat trench 579 with an insulating moat trench structure (572, 574, 576) that vertically extends through the memory-level assembly. Through-memory-level via structure 488 can be formed through each dielectric material assembly laterally enclosed by a respective insulating moat trench structure (572, 573, 576). Each dielectric material assembly can include the at least one alternating stack of insulating layers (132, 232) and spacer dielectric layers (142, 242), a second-tier retro-stepped dielectric material portion 265, and an optional first-tier retro-stepped dielectric material portion 165.

Various contact via structures (88, 86), a line level dielectric layer 110, and various metal interconnect structures and bit lines 103 extending through the line level dielectric layer 110 can be formed. The metal interconnect structures can include upper level metal interconnect structures 108. In one embodiment, a subset of the upper level metal interconnect structures 108 can be electrically coupled to (e.g., formed on or in physical contact with) respective pairs of a word line contact via structure 86 and a through-memory-level via structure 488. The bit lines 103 extend along the second horizontal direction hd2 and perpendicular to the first horizontal direction hd1. The word line interconnect structures 106 may include portions of the upper level metal interconnect structures 108 that are electrically shorted to the through-memory-level via structure 488, and/or may include metal lines that are connected to the peripheral circuitry for driving the word lines of the memory stack structures 55 in the memory array region 100. Alternatively or additionally, at least a subset of the through-memory-level via structure 488 may be employed for different purposes such as providing a power supply voltage, electrical ground, etc.

Figure 64:
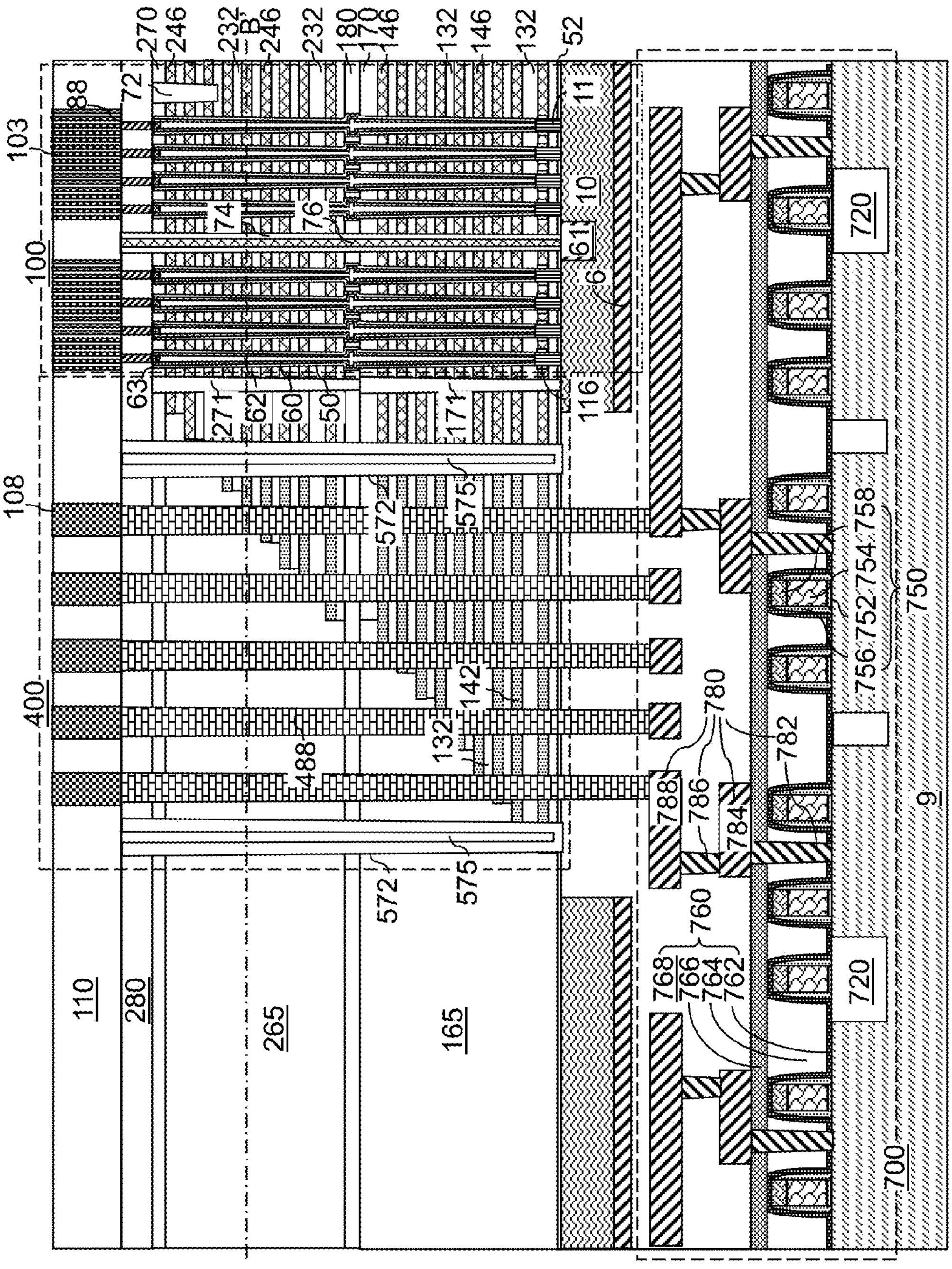
FIG. 64 is a vertical cross-sectional view of a third modification of the third exemplary structure after formation of upper level line structures according to the third embodiment of the present disclosure.

Referring to FIG. 64, a third modification of the third exemplary structure can be derived from the second modification of the third exemplary structure by performing the processing steps of FIGS. 41 and 42 to form insulating moat trench structures (572, 575), each of which includes a pair of an insulating liner 572 and an insulating material fill portion 575.

Figure 65A:
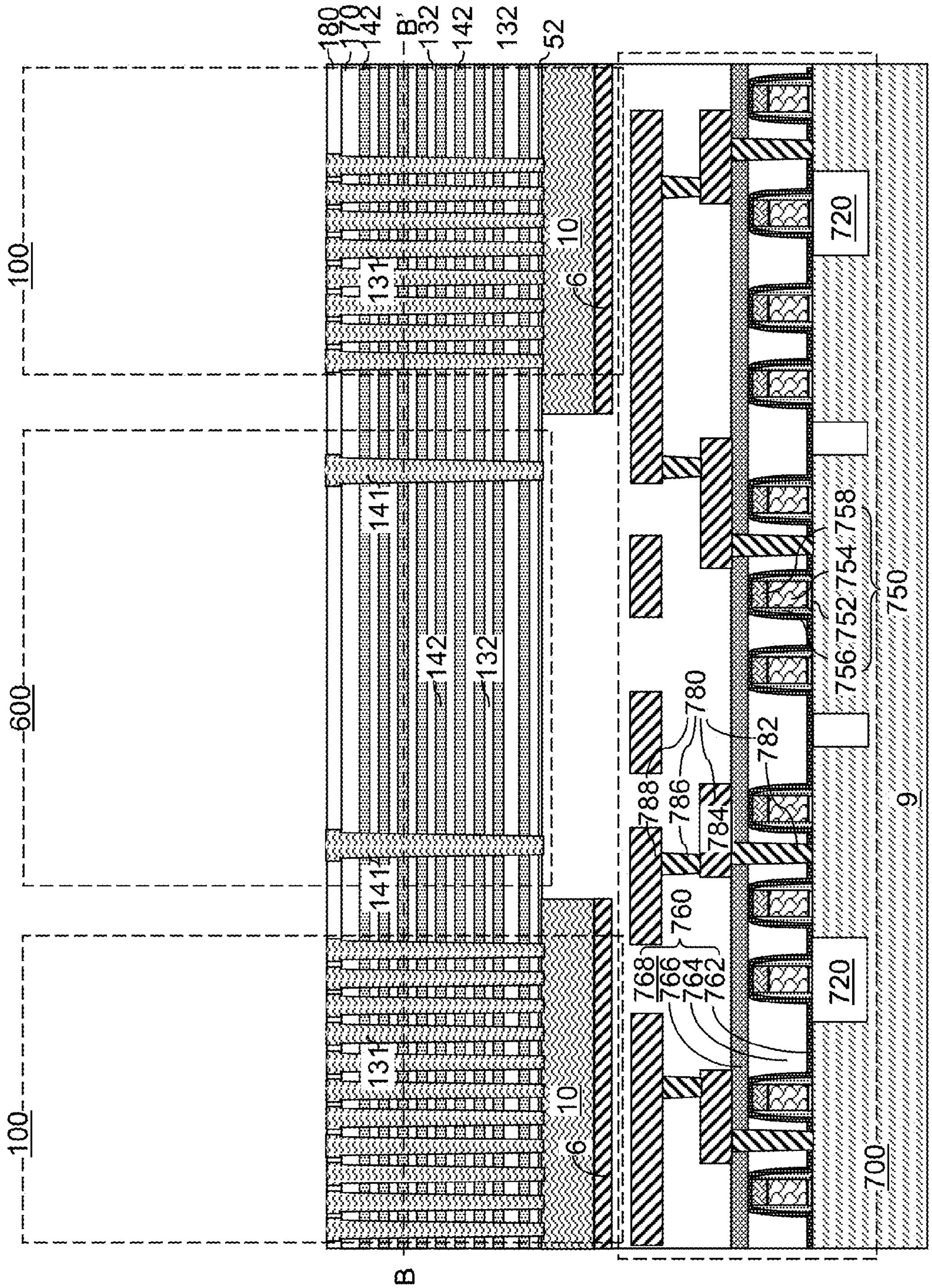
Figure 65B:
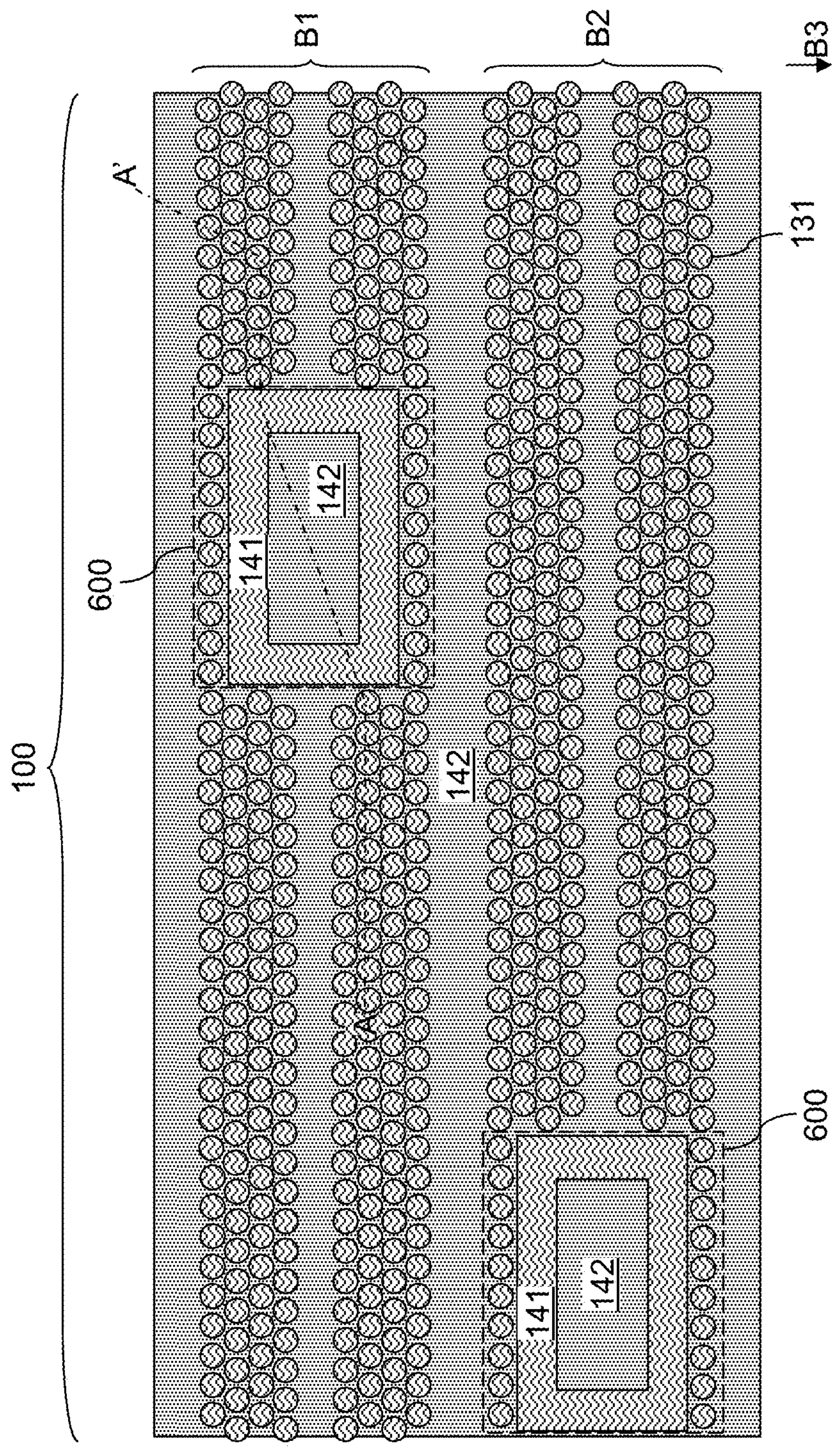

Referring to FIGS. 65A and 65B, sixth modification of the fourth exemplary structure can be derived from the third exemplary structure of FIGS. 24A and 24B by forming first-tier moat trenches within the through-memory-level via region 600 illustrated in FIG. 44B. Sacrificial moat trench fill portions 141 can be formed in the first-tier moat trenches employing the processing steps of FIGS. 24A and 24B.

Figure 66A:
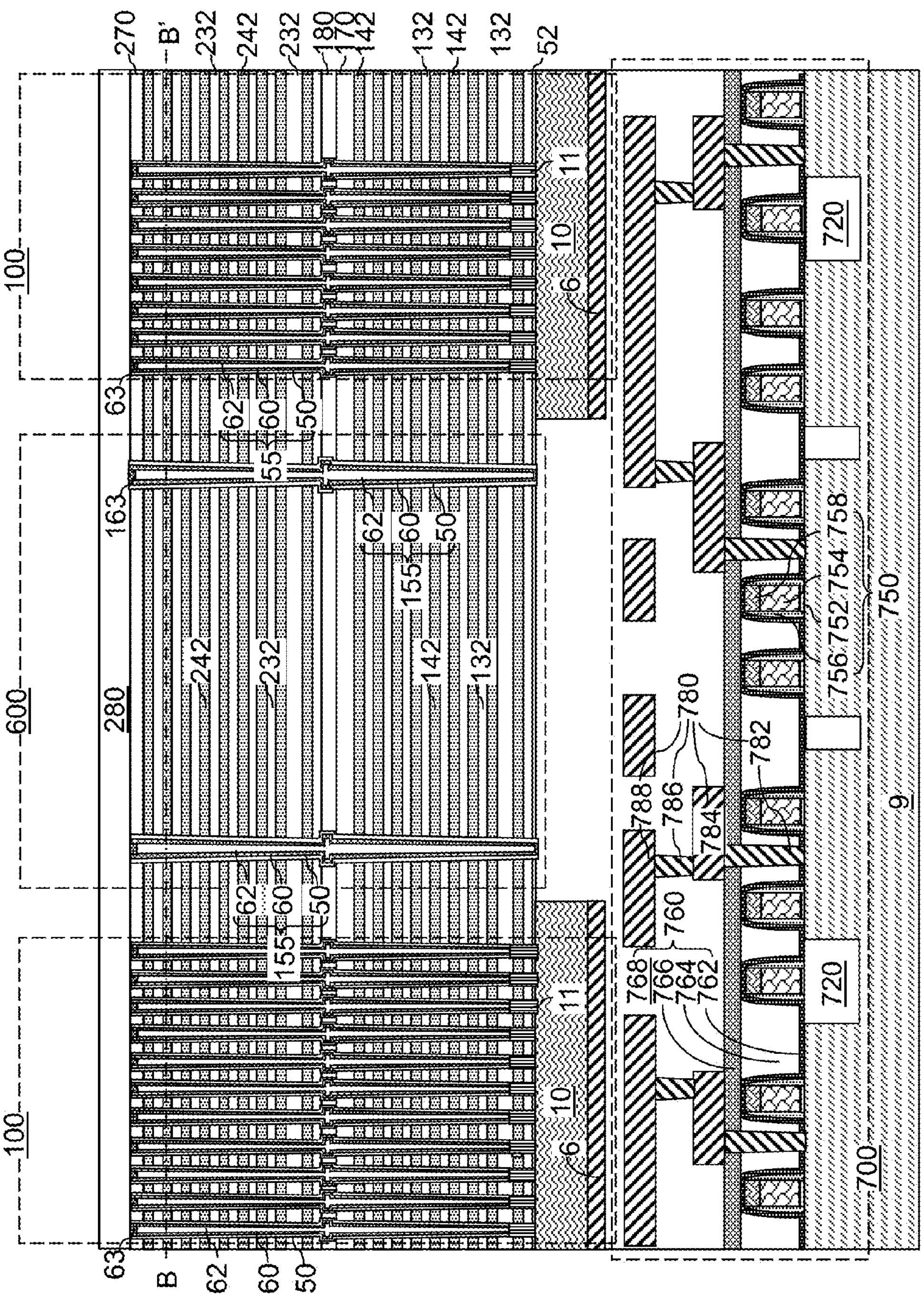
Figure 66B:
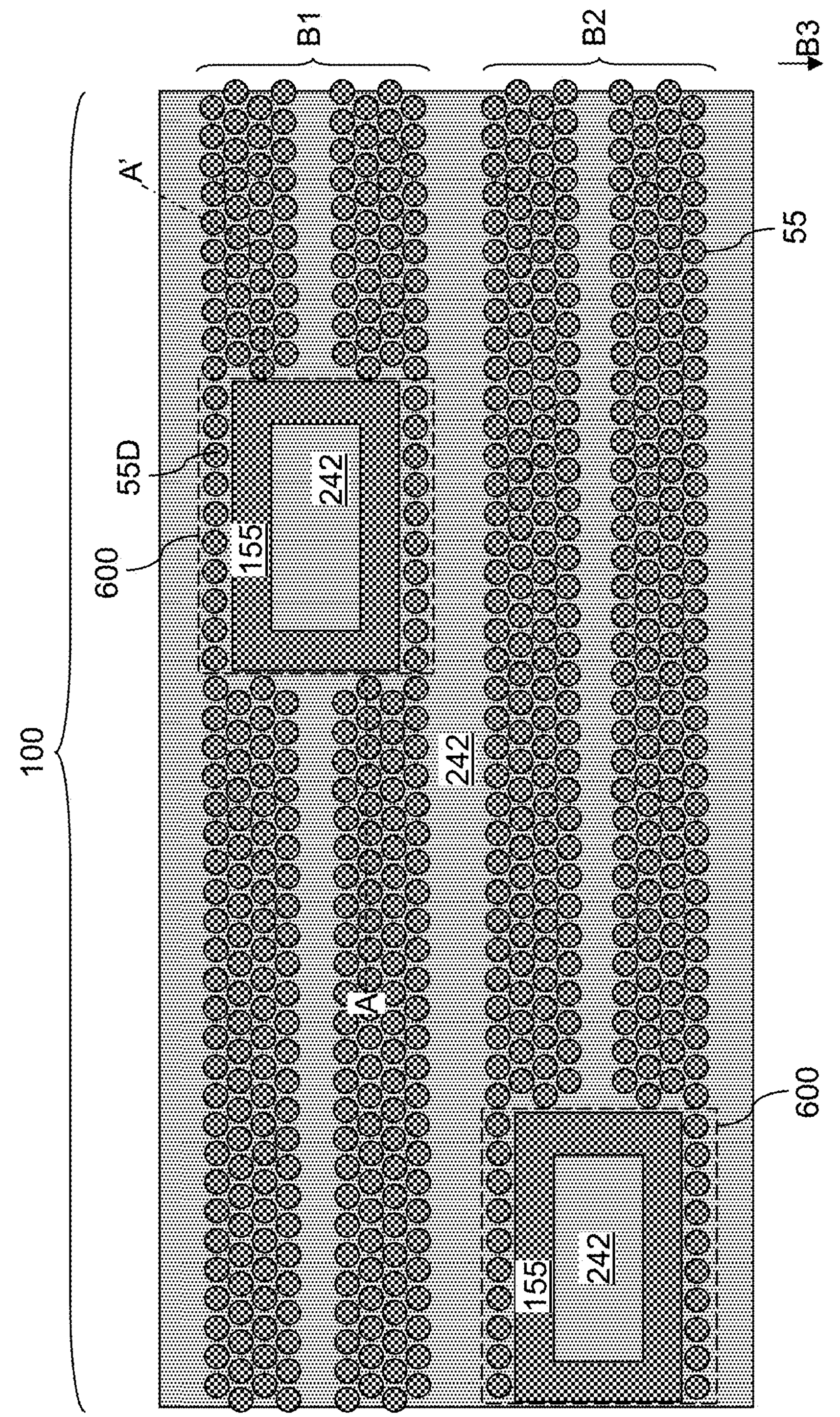

Referring to FIGS. 66A and 66B, a second-tier alternating stack (232, 242) and memory stack structures 55 and dummy memory stack structures 155 are formed by performing the processing steps of FIGS. 25A, 25B, 26A, and 26B. The dummy memory stack structures 155 are insulating moat trench structures that provide electrical isolation between the inside and the outside of the dummy memory stack structure 155.

Figure 67A:
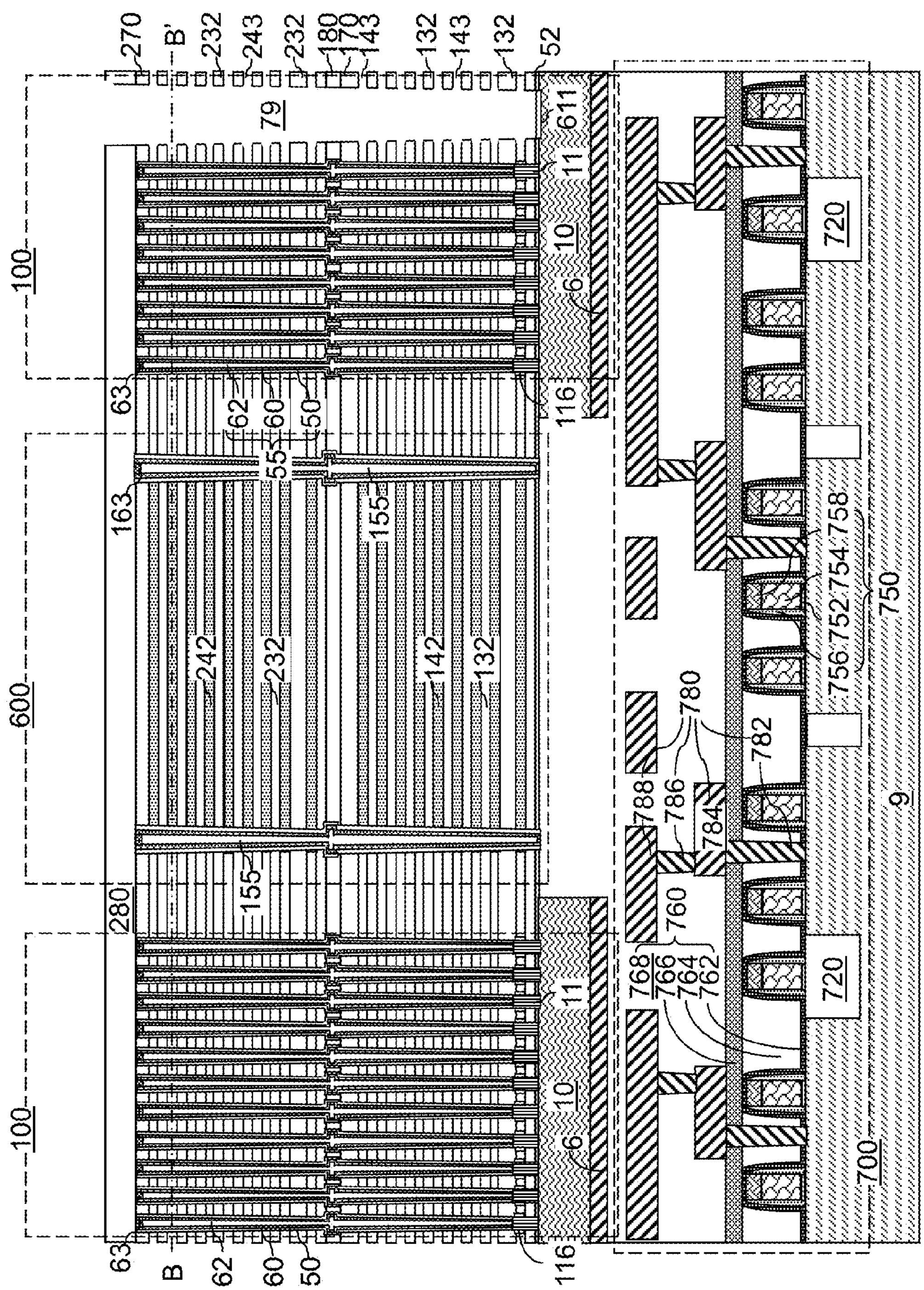
Figure 67B:
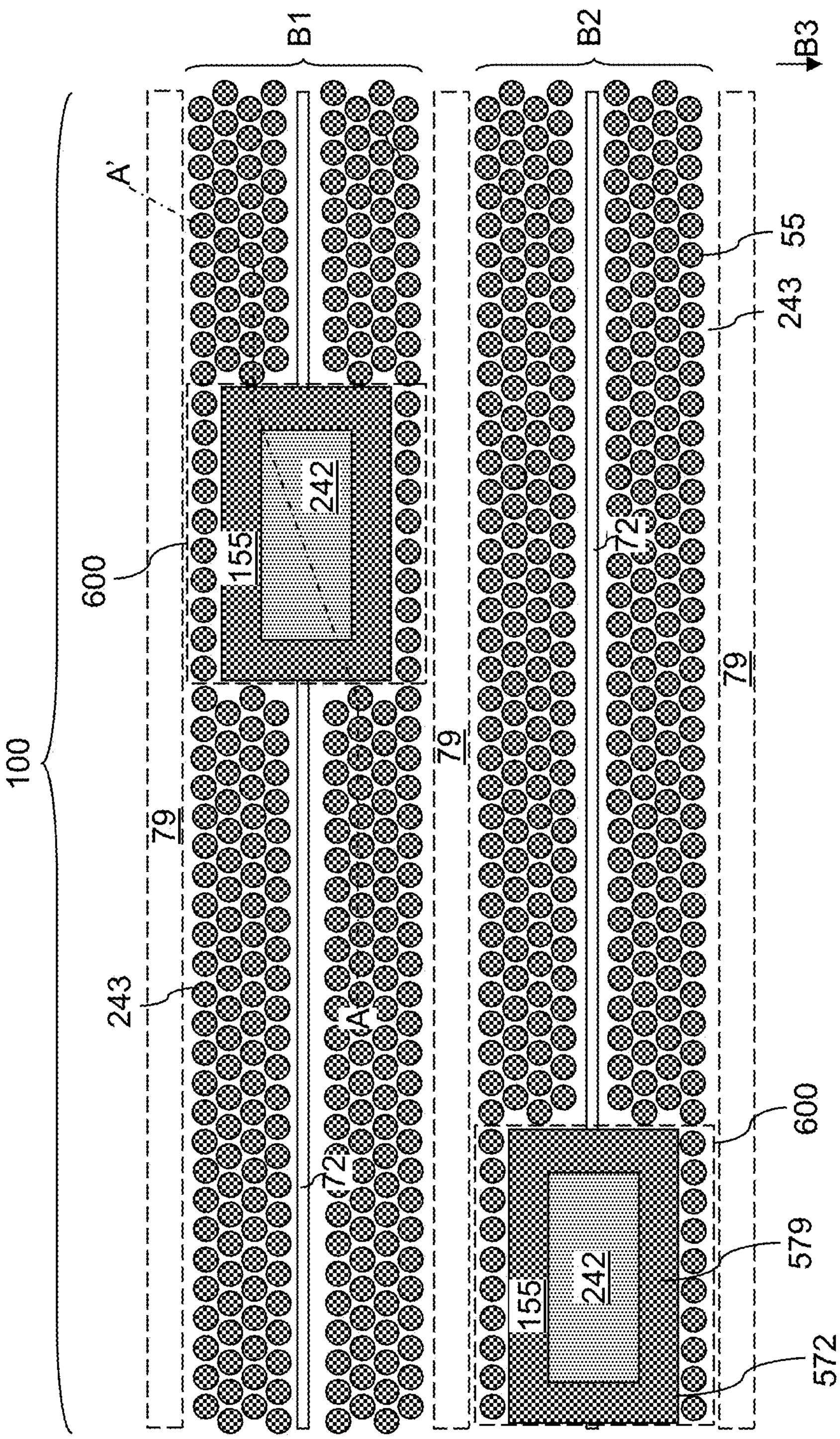

Referring to FIGS. 67A and 67B, the processing steps of FIGS. 27A and 27B, and a subset of the processing steps of FIGS. 28A and 28B can be performed to form backside recesses (143, 243).

Figure 68A:
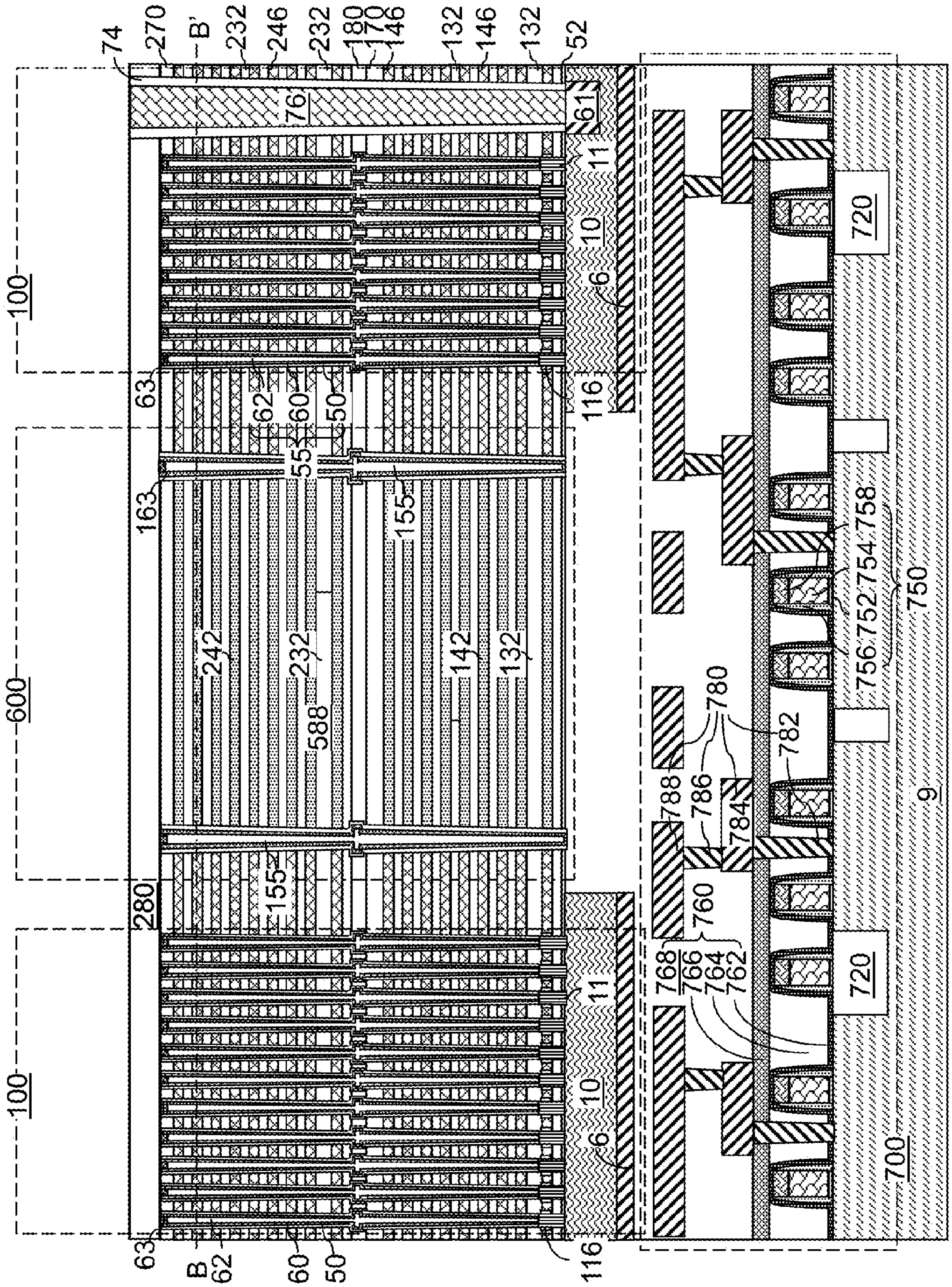
Figure 68B:
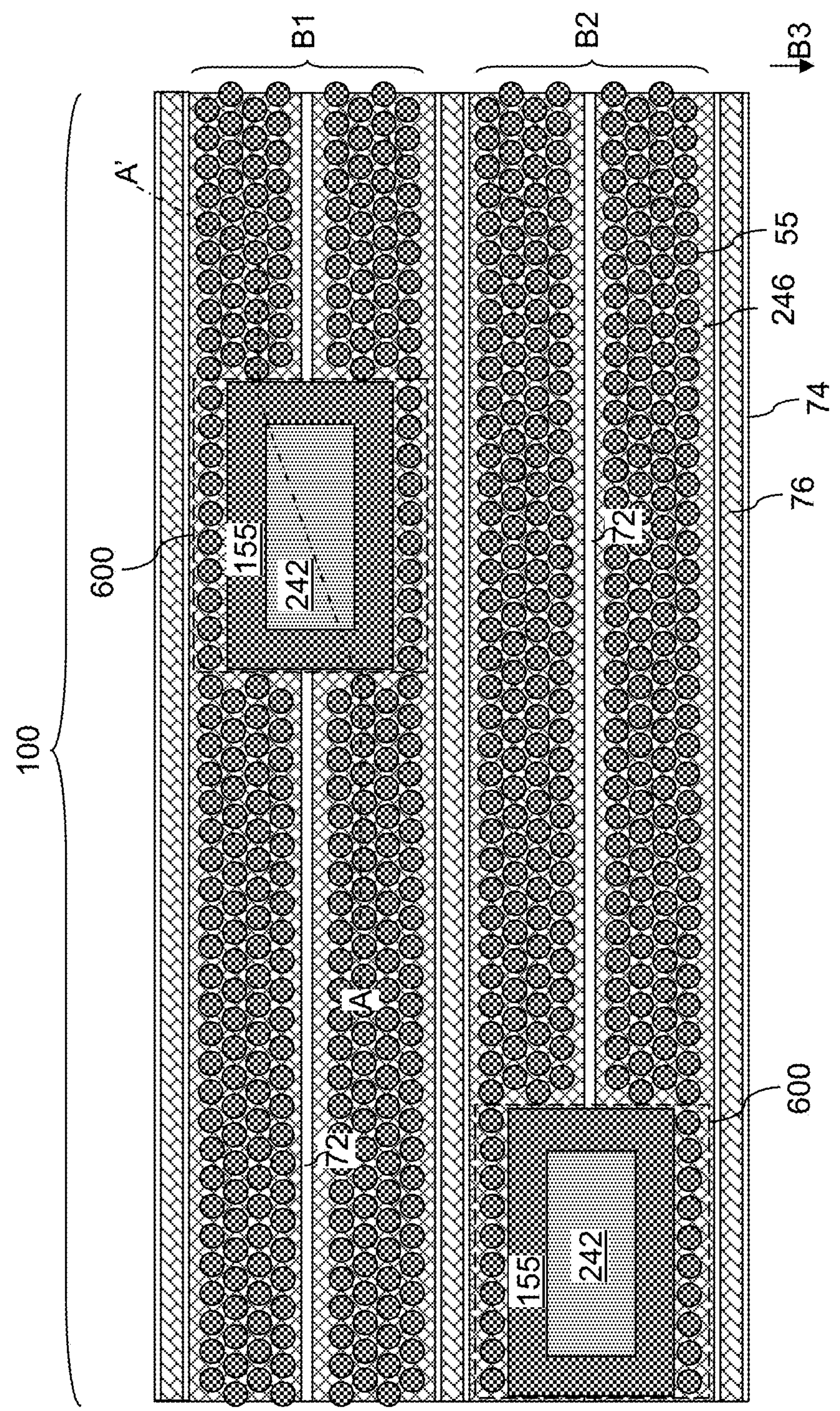

Referring to FIGS. 68A and 68B, the complementary subset of the processing steps of FIGS. 28A and 28B can be performed to form the electrically conductive layers (146, 246) outside the through-memory-level via regions 600. Insulating spacers 74 and laterally-extending contact via structures 76 can be formed in the backside contact trenches 79.

Figure 69A:
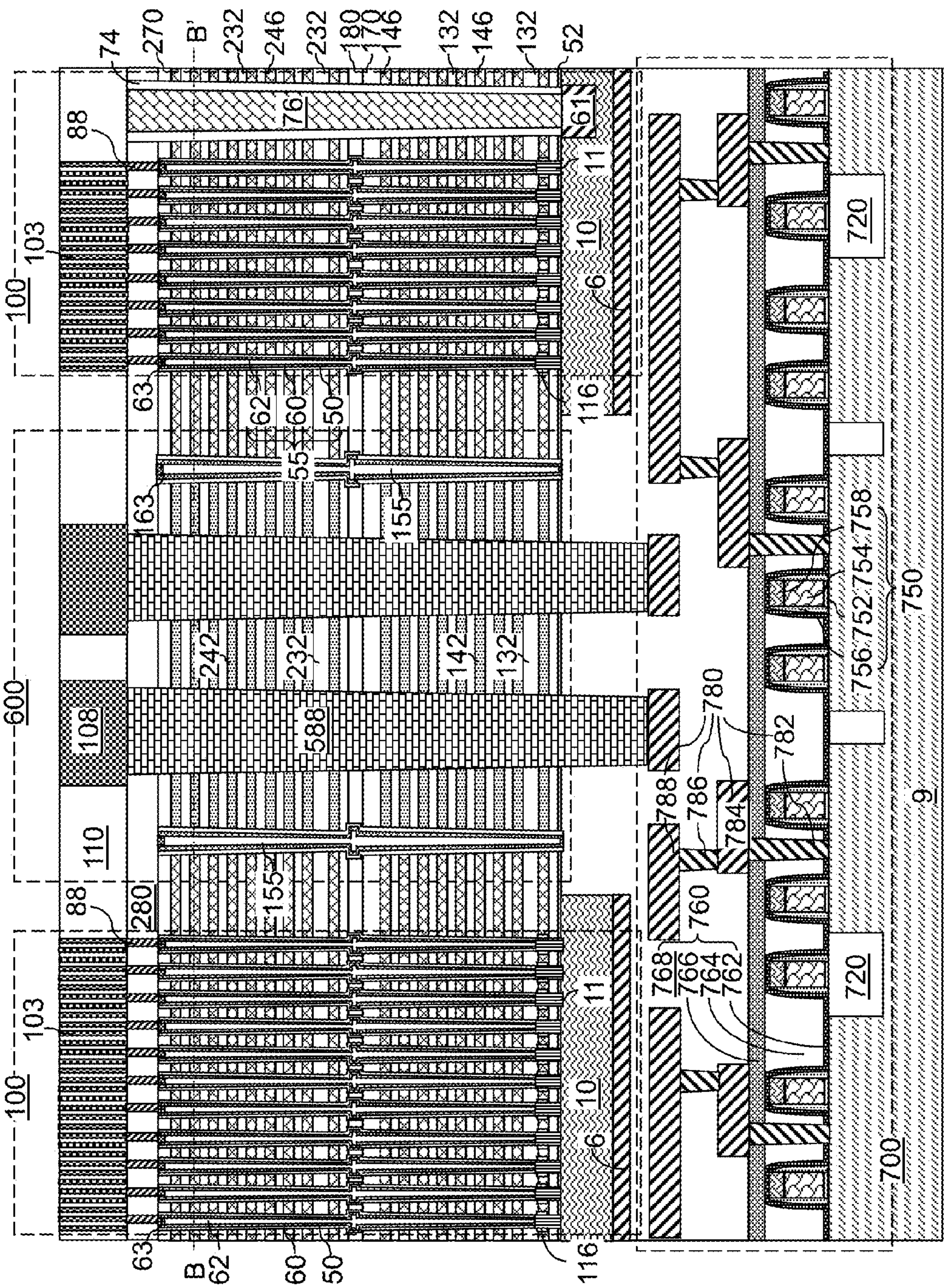
Figure 69B:
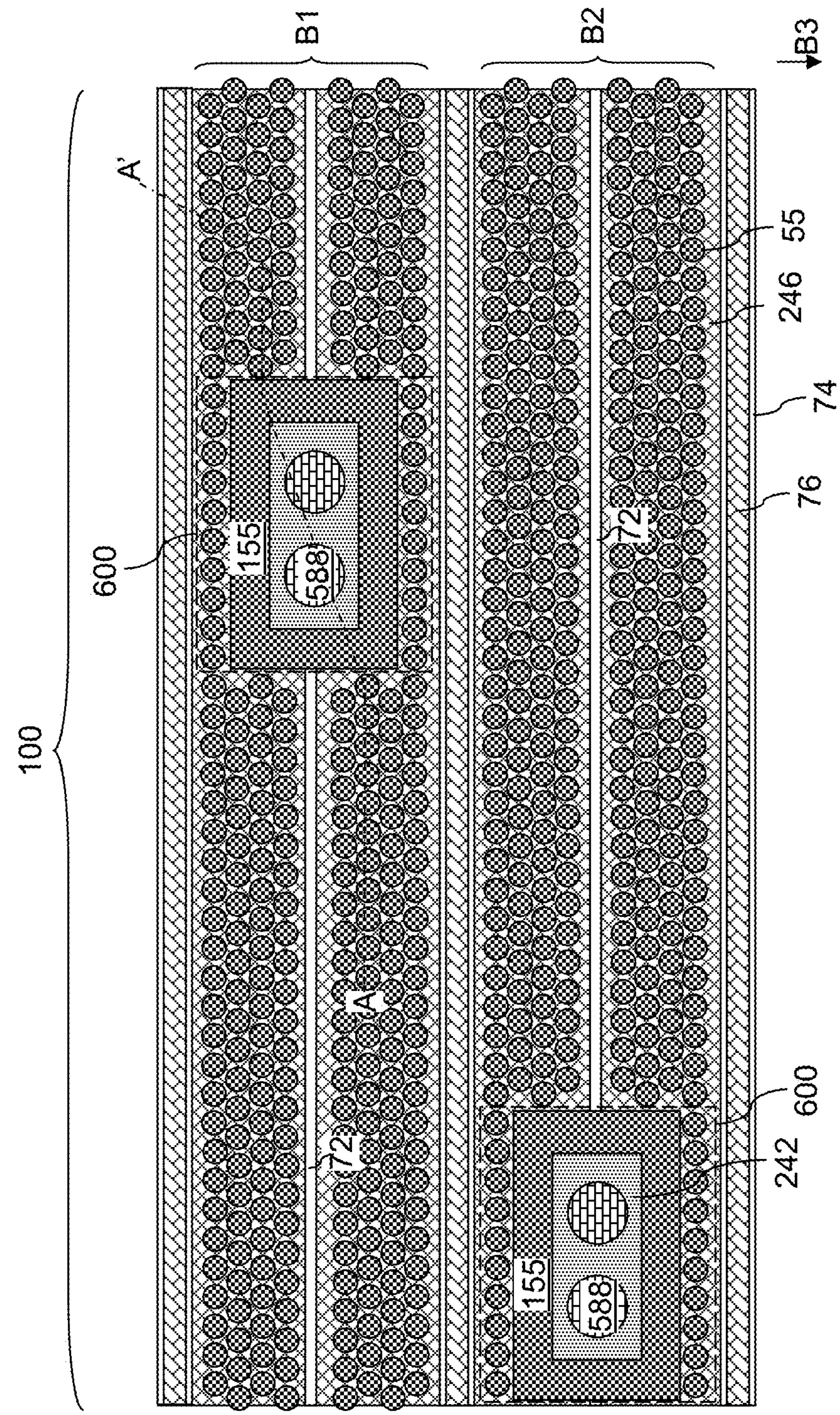

Referring to FIGS. 69A and 69B, at least one through-memory-level opening is formed through the memory-level assembly within the areas of each through-memory-level via region 600. A lithographically patterned mask including openings in the areas of the through-memory-level via regions 600 can be employed during an anisotropic etch that etches the material of the at least one alternating stack (132, 142, 232, 242) as originally formed at the processing steps of FIGS. 2 and 7 and the material of the at least one lower level dielectric layer 760. A top surface of lower level metal interconnect structures 780 can be physically exposed at the bottom of each through-memory-level opening. A conductive material is deposited in the through-memory-level cavities, and excess portions of the conductive material can be removed from above the horizontal plane including the top surface of the first contact level dielectric layer 280. Each remaining portion of the conductive material in the through-memory-level openings constitutes a through-memory-level via structure 588, which can contact a respective underlying lower level metal interconnect structure 780.

In one embodiment, at least one through-memory-level via structure 588 can be formed in a through-memory-level via region 600 in a block. The through-memory-level via region 600 can be provided between a pair of laterally-elongated contact via structures 76 and between two groups of memory stack structures 55 located in the block. The through-memory-level via region 600 can include through-memory-level via structures 588. Each of the at least one through-memory-level via structure 588 vertically extends through the memory-level assembly.

Drain contact via structures 88 and word line contact via structures can be formed as in the first through third embodiments. A line level dielectric layer 110 can be formed over the first contact level dielectric layer 280. Various metal interconnect structures can be formed can be formed in the line level dielectric layer 110 as in the first through third embodiments. The metal interconnect structures can include upper level metal interconnect structures 108 that are either formed on respective pairs of a word line contact via structure 86 and a through-memory-level via structure 588 or which comprise a shunt line or power strap connected to structure 588, bit lines 103 that extend along the second horizontal direction hd2 and perpendicular to the first horizontal direction hd1, and source connection line structures (not shown).

Figure 70A:
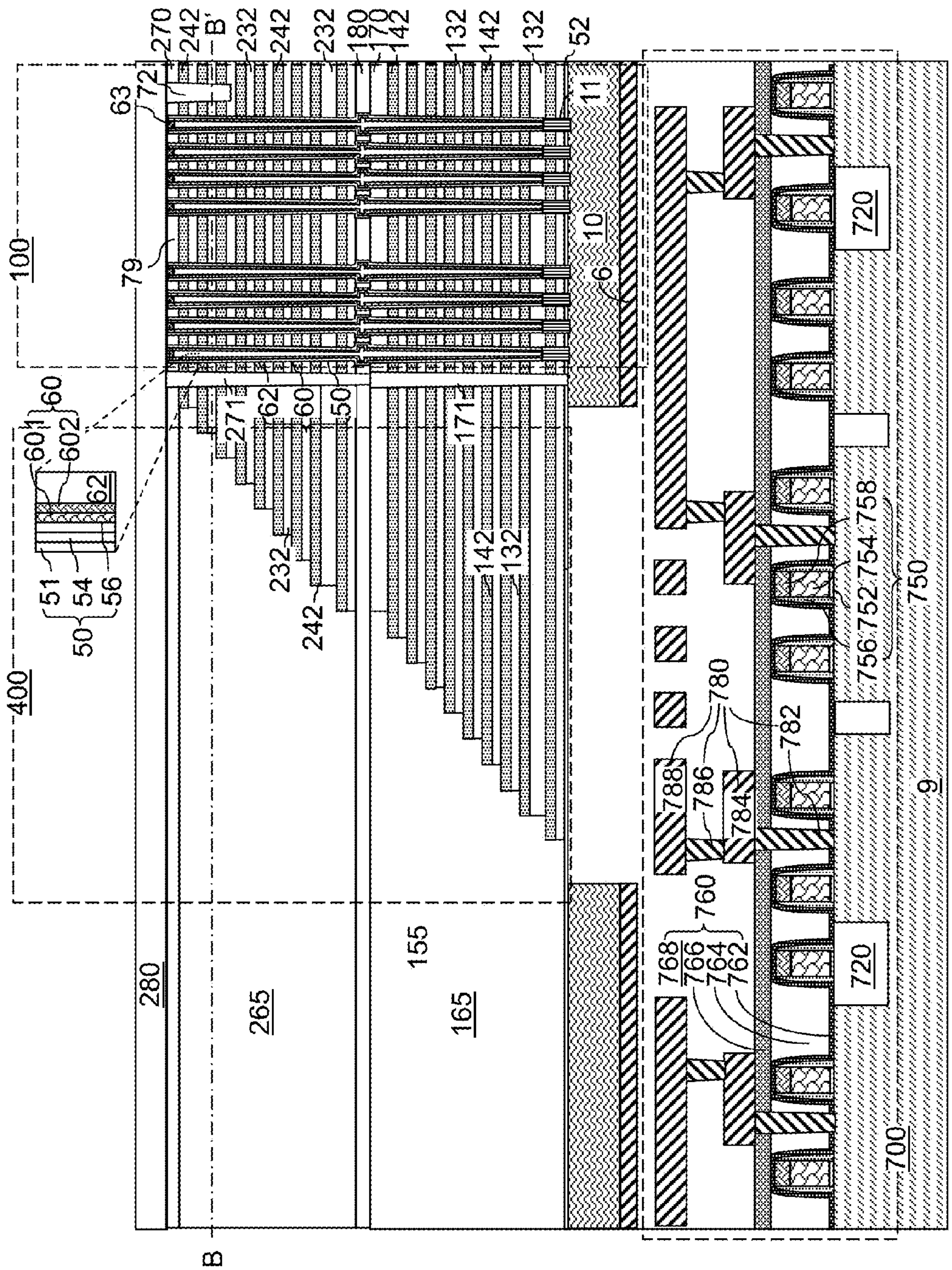
Figure 70B:
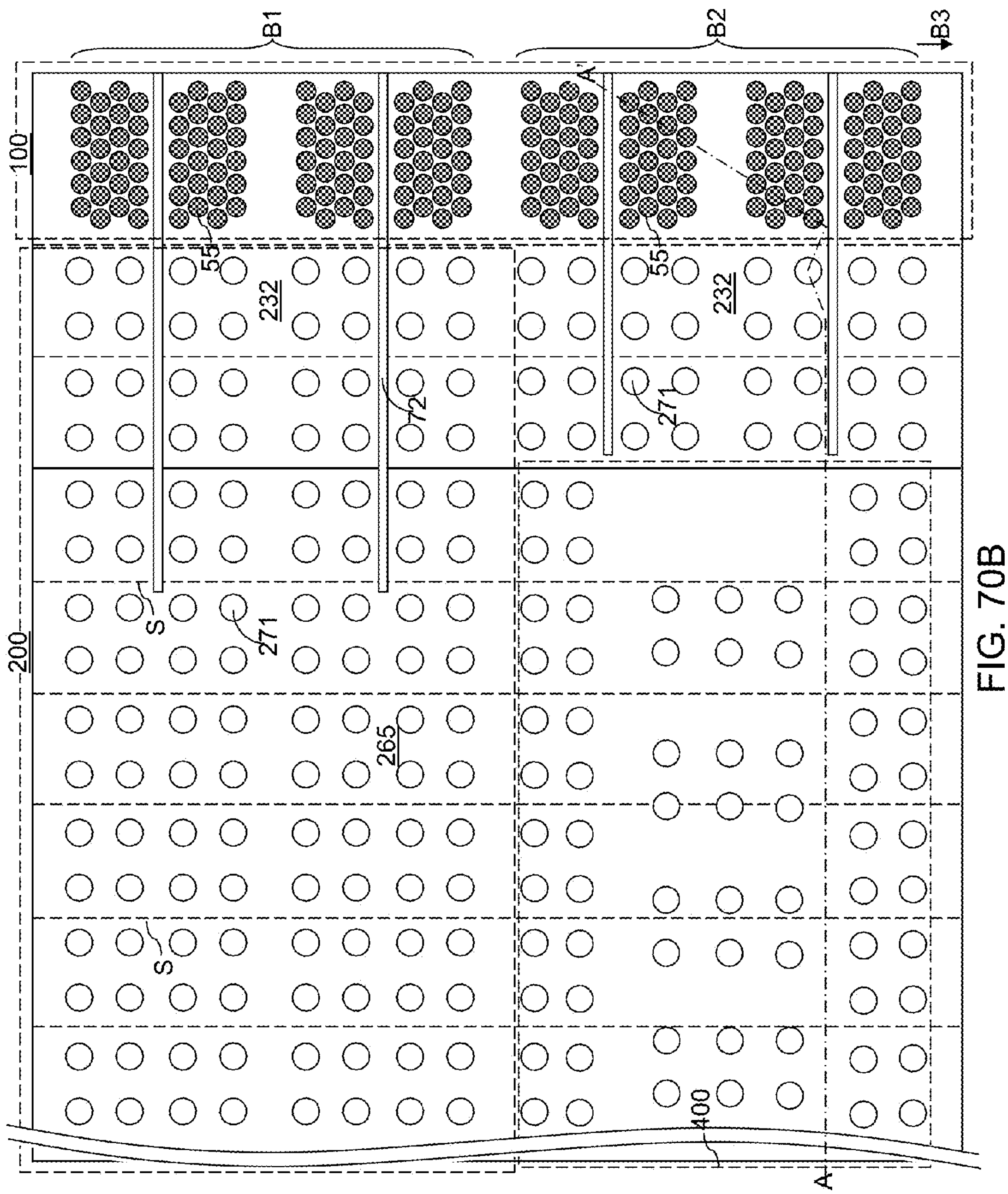

Referring to FIGS. 70A and 70B, a seventh modification of the fourth exemplary structure can be derived from the first exemplary structure illustrated in FIGS. 10A and 10B. Memory stack structures 55 and a first contact level dielectric layer 280 can be formed employing methods described above. The pattern of the support pillar structures (171, 271) may be modified to avoid areas of through-memory-level via structures to be subsequently formed.

Referring to FIGS. 71A and 71B, a photoresist layer is applied and lithographically patterned to form openings including the pattern of the backside contact trenches 79 described above and the pattern of through-memory-level via structures to be formed in each through-memory-level via regions 400. The pattern in the photoresist layer is transferred through the memory-level assembly to simultaneously form backside contact trenches 79 and through-memory-level via cavities 479. In one embodiment, the anisotropic etch can be selective to the semiconductor material of the planar semiconductor layer 10 to enable etching of the physically exposed portions of the at least one lower level dielectric layer 760. In one embodiment, top surfaces of the lower level metal interconnect structures 780 can be physically exposed at the bottom of the through-memory-level via cavities 479.

Referring to FIGS. 72A and 72B, the processing steps of FIGS. 52A and 52B can be performed to replace the sacrificial material layers (142, 242) with electrically conductive layers (146, 246). Each of the through-memory-level via cavities 479 and the backside contact trenches 79 can be employed to provide an etchant to remove the material of the sacrificial material layers (142, 242) to form backside recesses (143, 243), and to provide a reactant to deposit the conductive material of the electrically conductive layers (146, 246).

Referring to FIGS. 73A-73C, a conformal insulating material layer including a dielectric material (such as silicon oxide) can be deposited and anisotropically etched to simultaneously form insulating liners 474 in the through-memorylevel via cavities 479 and insulating spacers 74 in the backside contact trenches 79. Source regions 61 can be formed by implantation of electrical dopants in physically exposed portions of the planar semiconductor material layer 10. A through-memory-level via structure 476 can be formed in each remaining volume of the through-memory-level via cavities 479, and a laterally-extending contact via structure 76 can be formed in each remaining volume of the backside contact trenches 79 by deposition and planarization of at least one conductive material such as TiN and W. Various contact via structures (86, 88) can be formed employing the methods described above.

Referring to FIG. 74, a line level dielectric layer 110 and various metal interconnect structures and bit lines 103 extending through the line level dielectric layer 110 can be formed. The metal interconnect structures can include upper level metal interconnect structures 108. In one embodiment, a subset of the upper level metal interconnect structures 108 can be electrically coupled to (e.g., formed on or in physical contact with) respective pairs of a word line contact via structure 86 and a through-memory-level via structure 476. The bit lines 103 extend along the second horizontal direction hd2 and perpendicular to the first horizontal direction hd1. The word line interconnect structures may include portions of the upper level metal interconnect structures 108 that are electrically shorted to the through-memory-level via structure 476, and/or may include metal lines that are connected to the peripheral circuitry for driving the word lines of the memory stack structures 55 in the memory array region 100. Alternatively or additionally, at least a subset of the through-memory-level via structure 476 may be employed for different purposes such as providing a power supply voltage, electrical ground, etc.

Referring to FIGS. 75A and 75B, an eighth modification of the fourth exemplary structure can be derived from the seventh modification of the fourth exemplary structure of FIGS. 70A and 70B by postponing formation of the backside contact trenches 79 until after formation of the insulating liners 474 and the through-memory-level via structures 476.

Referring to FIG. 76, backside contact trenches 79, insulating spacers 74, source regions 61, laterally-extending contact via structures 76, additional contact via structures 88, a line level dielectric layer 110 and various metal interconnect structures 108 and bit lines 103 extending therethrough can be formed as described above.

The various through-memory-level via structures (588, 676) of the fourth exemplary structure or modifications thereof can be employed to provide vertical electrically conductive paths inside selected areas of a memory array region 100. The through-memory-level via structures (588, 676) may be employed as a portion of a power distribution network, or can be employed to provide various control signals for a three-dimensional memory device in a manner that shortens the signal path, and thus, minimizes signal loss and capacitive coupling.

The fourth exemplary structure or any of the modifications thereof can include a semiconductor structure, which comprises a memory-level assembly located over a semiconductor substrate 9 and comprising at least one alternating stack of electrically conductive layers (146, 246) and first portions of insulating layers (132, 232), and further comprising memory stack structures 55 vertically extending through the at least one alternating stack. Each of the memory stack structures 55 comprises a memory film 50 and a vertical semiconductor channel 60. The electrically conductive layers (146, 246) constitute word lines for the memory stack structures 55. A plurality of laterally-elongated contact via structures 76 vertically extends through the memory-level assembly, laterally extends along a first horizontal direction hd1, and laterally divides the at least one alternating stack into a plurality of laterally spaced-apart blocks (B1, B2, B3, . . . ) within the memory-level assembly. At least one through-memory-level via structure (588, 676) is located in a through-memory-level via region 400 in a block. The through-memory-level via region 400 is located between a pair of laterally-elongated contact via structures 76 and between two groups of memory stack structures 55 located in the block. Each of the at least one through-memory-level via structure (588, 676) vertically extends through the memory-level assembly.

Semiconductor devices can be located on the semiconductor substrate 9. Lower level metal interconnect structures 680 can be electrically shorted to nodes of the semiconductor devices, and can be embedded in at least one lower level dielectric layer 760 that overlies the semiconductor substrate 9. The lower level metal interconnect structures 680 can contact the at least one through-memory-level via structure (588, 676). A planar semiconductor material layer 10 can overlie the at least one lower level dielectric layer 760, and can include horizontal semiconductor channels 58 connected to vertical semiconductor channels 60 within the memory stack structures 55.

In one embodiment, each of the at least one through-memory-level via structure 676 can be laterally electrically isolated from the electrically conductive layers (146, 246) by a respective insulating liner 674. In one embodiment, a bottom portion of each sidewall of the at least one through-memory-level via structure (588, 676) is in physical contact with the at least one lower level dielectric layer 760. In some embodiments, each insulating liner 674 can have a lesser vertical extent than a respective through-memory-level via structure 676 enclosed by the insulating liner 674 as illustrated in FIG. 49.

In one embodiment, each of the plurality of laterally-elongated contact via structures 76 is laterally electrically isolated from the at least one alternating stack (132, 246, 232, 246) by an insulating spacer 74. In one embodiment, each of the at least one through-memory-level via structure 676 is laterally electrically isolated from the at least one alternating stack (132, 246, 232, 246) by an insulating liner 674 having a same material composition and a same thickness as the insulating spacer 74.

The planar semiconductor material layer 10 can overlie the semiconductor substrate 9, and can include horizontal semiconductor channels 58 connected to vertical semiconductor channels 60 within the memory stack structures 55. The at least one through-memory-level via structure (588, 686) can extend through an opening in the planar semiconductor material layer 10. In one embodiment, the plurality of laterally-elongated contact via structures 76 can terminate on a top surface of the planar semiconductor material layer 10. The plurality of laterally-elongated contact via structures 76 can comprise source lines contacting respective underlying source regions 61 that contact respective horizontal channels. 58 located within the planar semiconductor material layer 10.

In some embodiments, at least one second alternating stack (132, 142, 232, 242) can be located in the through-memory-level via region 400. The at least one second alternating stack (132, 142, 232, 242) includes alternating layers of dielectric spacer layers (142, 242) and second portions of the insulating layers (132, 232), and each of the dielectric spacer layers (142, 242) is located at a same level as a respective electrically conductive layer (146, 246). The through-memory-level via region 400 can comprise an insulating moat trench structure {(572, 574, 576), (572. 575)} that laterally encloses the at least one second alternating stack (132, 142, 232, 242).

Inner sidewalls of the insulating moat trench structure {(572, 574, 576), (572. 575)} and sidewalls of the at least one through-memory-level via structure 588 are in physical contact with the at least one second alternating stack (132, 142, 232, 242).

In one embodiment, the insulating moat trench structure (572, 574, 576) can comprise an outer insulating liner 572 and an inner insulating liner 574. Each of the plurality of laterally-elongated contact via structures 76 can be laterally surrounded by an insulating spacer 74 that comprises a dielectric material having a same composition and a same thickness as the inner insulating liner 574.

In one embodiment, the insulating moat trench structure (572, 574, 576) can comprise a conductive fill portion 576 having a same material composition as the plurality of laterally-elongated contact via structures 76.

In one embodiment, the insulating moat trench structure (572, 575) can consist of an outer insulating liner 572 and an inner insulating fill portion 565, and each of the plurality of laterally-elongated contact via structures 76 can be laterally surrounded by an insulating spacer 74 that comprises a same dielectric material as the inner insulating fill portion 574.

Each of the exemplary structures and modifications thereof can include a three-dimensional memory structure. The memory stack structures 55 can comprise memory elements of a vertical NAND device. The electrically conductive layers (146, 246) can comprise, or can be electrically connected to, a respective word line of the vertical NAND device. The semiconductor substrate 9 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (58, 11, 60) extends substantially perpendicular to a top surface of the semiconductor substrate 9, a plurality of charge storage elements (as embodied as portions of the memory material layer 54 located at each word line level), each charge storage element located adjacent to a respective one of the plurality of semiconductor channels (58, 11, 60), and a plurality of control gate electrodes (as embodied as a subset of the electrically conductive layers (146, 246) having a strip shape extending substantially parallel to the top surface of the semiconductor substrate 9 (e.g., along the first horizontal direction hd1), the plurality of control gate electrodes comprise at least a first control gate electrode located in the first device level and a second control gate electrode located in the second device level.

The via contact structures located in regions 400, 500 and/or 600 described above provide an electrical contact to the driver circuit devices located under the memory array to decrease the overall device size/footprint over the substrate and utilize device area that is not fully utilized in prior art devices, which decreases the device cost.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three dimensional NAND memory device, comprising:
- word line driver devices located on or over a substrate;
- at least one lower level dielectric layer overlying the word line driver devices;
- lower level metal interconnect structures embedded in the at least one lower level dielectric layer;
- a planar semiconductor material layer overlying the at least one lower level dielectric layer;
- an alternating stack of word lines and insulating layers located over the word line driver devices and the planar semiconductor material layer;
- a plurality of memory stack structures extending through the alternating stack, each memory stack structure comprising a memory film and a vertical semiconductor channel; and
- through-memory-level via structures which electrically couple the word lines in a first memory block to the word line driver devices;

wherein:
- each of the through-memory-level via structures vertically extend at least from a first horizontal plane including a topmost surface of the alternating stack to a second horizontal plane including top surfaces of a subset of the lower level metal interconnect structures that is located below the planar semiconductor material layer through a through-memory-level via region located between a staircase region of the first memory block and a staircase region of another memory block.

2. The device of claim 1, wherein the through-memory-level via structures extend through a dielectric fill material portion located in the through-memory-level via region.

3. The device of claim 2, wherein the word line driver devices are located under the dielectric fill material portion located in the through-memory-level via region.

4. The device of claim 1, wherein the alternating stack of word lines and insulating layers and the plurality of memory stack structures are located over the word line driver devices.

5. The device of claim 1, wherein the through-memory-level via structures extend through at least one second alternating stack located in the through-memory-level via region.

6. The device of claim 5, wherein:
- the at least one second alternating stack includes alternating layers of dielectric spacer layers and second portions of the insulating layers, and each of the dielectric spacer layers is located at a same level as a respective word line; and
- the at least one second alternating stack is at least partially surrounded by an insulating moat trench structure.

7. The device of claim 1, wherein:

the through-memory-level via structures extend through the alternating stack of word lines and insulating layers which extends into the through-memory-level via region; and each of the at least one through-memory-level via structures is laterally electrically isolated from the word lines by a respective insulating liner.

8. The device of claim 1, further comprising:

word line contact via structures extending through a dielectric material portion that overlies the staircase region of the first memory block and contacting the word lines in the first memory block; and upper level metal interconnect structures electrically shorting respective pairs of a word line contact via structure and a through-memory-level via structure, wherein the upper level metal interconnect structures overly the alternating stack, and straddle the first memory block and the dielectric fill material portion.

9. The device of claim 8, wherein the through-memory-level via region is located in a second memory block at a first end of memory array region, and wherein no word line contact via structures are located in the through-memory-level via region in the second memory block at the first end of memory array region.

10. The device of claim 9, further comprising:

a second staircase region in the second memory block at a second end of memory array region; and second word line contact via structures extending through a dielectric material portion that overlies the staircase region of the second memory block and contacting the word lines in the second memory block.

11. The device of claim 1, wherein the staircase region of the first memory block and the staircase region of another memory block ascend in a same diagonal direction.

12. The device of claim 1, wherein the continuous vertical sidewall of the dielectric material vertically extends at least from the first horizontal plane to the second horizontal plane.

13. The device of claim 1, wherein the dielectric material is embodied as a dielectric fill material portion that vertically extends at least from the first horizontal plane to the second horizontal plane and laterally bounded by the vertical sidewalls of the dielectric material, and each layer of the alternating stack does not extend into the through-memory-level via region.

14. The device of claim 13, wherein the dielectric fill material portion includes sidewalls that vertically extends at least from the first horizontal plane to the second horizontal plane.

15. The device of claim 13, wherein all surfaces of the through-memory-level via structures between the first horizontal plane and the second horizontal plane directly contacts the dielectric fill material portion.

16. The device of claim 1, wherein the dielectric material is embodied as a single insulating liner layer that laterally surrounds each of the through-memory-level via structures, and each layer of the alternating stack does not extend into the through-memory-level via region.

17. The device of claim 16, wherein the single insulating liner layer is located within a moat trench that laterally surrounds first material layers and second material layers, wherein the first material layers include a same material as the insulating layers, and the second material layers include a dielectric material.

18. The device of claim 1, wherein the dielectric material is embodies as a plurality of insulating liners, and each of the plurality of insulating liners laterally surrounds a respective one of the through-memory-level via structures.

19. The device of claim 1, further comprising:

word line contact via structures contacting a top surface of a respective one of the electrically conductive layers; and upper level metal interconnect structures overlying the staircase region of the first memory block and contacting top surfaces of a subset of the through-memory-level via structures.

20. The device of claim 1, further comprising a dielectric material located in the through-memory-level via region, wherein a continuous vertical sidewall of the dielectric material contacts sidewalls of each layer within the alternating stack.

* * * * *